US011917903B2

(12) United States Patent
Stoessel et al.

(10) Patent No.: US 11,917,903 B2
(45) Date of Patent: Feb. 27, 2024

(54) METAL COMPLEXES

(71) Applicant: UDC IRELAND LIMITED, Ballycoolin (IE)

(72) Inventors: Philipp Stoessel, Frankfurt am Main (DE); Christian Ehrenreich, Darmstadt (DE); Armin Auch, Darmstadt (DE)

(73) Assignee: UDC Ireland Limited, Dublin (IE)

( * ) Notice: Subject to any disclaimer, the term of this patent is extended or adjusted under 35 U.S.C. 154(b) by 730 days.

(21) Appl. No.: 16/982,089

(22) PCT Filed: Mar. 18, 2019

(86) PCT No.: PCT/EP2019/056648

§ 371 (c)(1),
(2) Date: Sep. 18, 2020

(87) PCT Pub. No.: WO2019/179909

PCT Pub. Date: Sep. 26, 2019

(65) Prior Publication Data

US 2021/0111345 A1 Apr. 15, 2021

(30) Foreign Application Priority Data

Mar. 19, 2018 (EP) .................................... 18162438

(51) Int. Cl.

| | |
|---|---|
| ***H10K 85/30*** | (2023.01) |
| ***C07F 15/00*** | (2006.01) |
| ***C09K 11/06*** | (2006.01) |
| *H10K 50/11* | (2023.01) |
| *H10K 101/10* | (2023.01) |

(52) U.S. Cl.

CPC ....... *H10K 85/361* (2023.02); *C07F 15/0086* (2013.01); *C09K 11/06* (2013.01); *C09K 2211/1007* (2013.01); *C09K 2211/1029* (2013.01); *C09K 2211/1044* (2013.01); *C09K 2211/185* (2013.01); *H10K 50/11* (2023.02); *H10K 2101/10* (2023.02)

(58) Field of Classification Search

CPC ............ H10K 85/361; C09K 2211/185; C09K 2211/1029; C09K 2211/1044; C09K 2211/1007; C07F 15/0086

See application file for complete search history.

(56) References Cited

U.S. PATENT DOCUMENTS

| | | | | |
|---|---|---|---|---|
| 9,029,539 | B2 | 5/2015 | Stössel et al. | |
| 2003/0152802 | A1* | 8/2003 | Tsuboyama ......... | C07F 15/0046 428/917 |
| 2006/0220004 | A1 | 10/2006 | Stossel et al. | |
| 2015/0069334 | A1 | 3/2015 | Xia et al. | |
| 2018/0026209 | A1 | 1/2018 | Stoessel et al. | |
| 2019/0202851 | A1 | 7/2019 | Stoessel et al. | |
| 2019/0292210 | A1* | 9/2019 | Stoessel ................. | H10K 50/11 |

FOREIGN PATENT DOCUMENTS

| | | | |
|---|---|---|---|
| CN | 1759120 | A | 4/2006 |
| CN | 107207550 | A | 9/2017 |
| CN | 107698623 | | 2/2018 |
| CN | 109641926 | A | 4/2019 |
| JP | 2003073388 | | 3/2003 |
| JP | 2006298999 | | 11/2006 |
| JP | 6999655 | | 2/2022 |
| WO | 2005042444 | A2 | 5/2005 |
| WO | WO-2005042550 | A1 | 5/2005 |
| WO | 2005/076380 | A2 | 8/2005 |
| WO | WO-2016124304 | A1 | 8/2016 |
| WO | 2018/041769 | A1 | 3/2018 |

OTHER PUBLICATIONS

International Search Report for PCT/EP2019/056648 dated May 8, 2019.

Written Opinion of the International Searching Authority for PCT/EP2019/056648 dated May 8, 2019.

* cited by examiner

*Primary Examiner* — Khanh T Nguyen

(74) *Attorney, Agent, or Firm* — Riverside Law LLP

(57) ABSTRACT

The present invention relates to binuclear, trinuclear and tetranuclear metal complexes and to electronic devices, especially organic electroluminescent devices, comprising these metal complexes.

19 Claims, No Drawings

METAL COMPLEXES

CROSS-REFERENCE TO RELATED APPLICATIONS

This application is a national stage application (under 35 U.S.C. § 371) of PCT/EP2019/056648, filed Mar. 18, 2019, which claims benefit of European Application No. 18162438.8, filed Mar. 19, 2018, both of which are incorporated herein by reference in their entirety.

The present invention relates to metal complexes suitable for use as emitters in organic electroluminescent devices and organic sensors.

According to the prior art, triplet emitters used in phosphorescent organic electroluminescent devices (OLEDs) are, in particular, bis- and tris-ortho-metallated iridium complexes and bis-ortho-metallated platinum complexes having aromatic ligands, where the ligands bind to the metal via a negatively charged carbon atom and an uncharged nitrogen atom or via a negatively charged carbon atom and an uncharged carbene carbon atom. Examples of such complexes are tris(phenylpyridyl)iridium(III) and derivatives thereof, where the ligands used are, for example, 1- or 3-phenylisoquinolines, 2-phenyquinolines or phenylcarbenes. In this case, the iridium complexes generally have quite a long luminescence lifetime in the region of well above 1 μs. For use in OLEDs, however, short luminescence lifetimes are desired in order to be able to operate the OLED at high brightness with low roll-off characteristics. There is still need for improvement in efficiency as well, especially of red-emitting phosphorescent emitters. As a result of the low triplet level $T_1$ in the case of customary red-phosphorescing emitters, the photoluminescence quantum yield is frequently well below the value theoretically possible since, with low $T_1$, non-radiative channels play a greater role, especially when the complex has a high luminescence lifetime. An improvement by increasing the radiative levels is desirable here, which can in turn be achieved by a reduction in the photoluminescence lifetime.

An improvement in the stability of the iridium complexes can be achieved by the use of polypodal ligands as described, for example, in WO 2016/124304. In the case of platinum complexes, an improvement can be achieved by the use of tetradentate ligands as described, for example, in WO 2005/042550. According to the ligand structure, these complexes show red, orange, yellow, green or blue emission. In the case of complexes with polypodal or tetradentate ligands too, improvements are still desirable in relation to the properties in the case of use in an organic electroluminescent device, especially in relation to the luminescence lifetime of the excited state and/or the efficiency, but also the voltage and/or lifetime.

A technical problem that is yet to be satisfactorily solved is still the provision of organic or organometallic compounds that efficiently emit light in the infrared region of the spectrum, and further improvements are still desirable in the case of deep red-emitting compounds as well. Particularly compounds that emit in the infrared region of the spectrum are of interest for use for sensors, for example for fingerprint sensors or iris sensors. For IR iris sensors, the eyes are illuminated with IR light, and the characteristic pattern of the IR light reflected by the eye is detected by an IR camera. Light sources used for this purpose may be organic electroluminescent devices that emit in the infrared region of the spectrum, and so the provision of infrared emitters is required for this purpose.

The problem addressed by the present invention is therefore that of providing novel metal complexes suitable as emitters for use in OLEDs and in sensors. It is a particular object to provide emitters which exhibit improved properties in relation to luminescence lifetime, efficiency, operating voltage and/or lifetime. A further problem addressed is that of providing emitters that emit in the deep red or infrared region of the spectrum.

It has been found that, surprisingly, the binuclear, trinuclear and tetranuclear iridium/platinum complexes described below show improvements in photophysical properties compared to corresponding mononuclear complexes and hence also lead to improved properties when used in an organic electroluminescent device. More particularly, the compounds of the invention have an improved photoluminescence quantum yield and a distinctly reduced luminescence lifetime. A shorter luminescence lifetime leads to improved roll-off characteristics of the organic electroluminescent device. Furthermore, the complexes show oriented emission, and so the emission thereof has improved efficiency. Furthermore, these complexes emit in the deep red or infrared region of the spectrum, and so especially complexes that exhibit high-efficiency infrared emission are also obtainable. The present invention provides these complexes and organic electroluminescent devices and sensors comprising these complexes.

The invention provides a compound of the following formula (1):

formula (1)

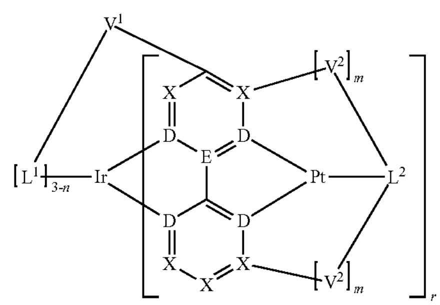

where the symbols and indices used are as follows:

D is the same or different at each instance and is C or N;

X is the same or different at each instance and is CR or N;

$L^1$, $L^2$ is the same or different at each instance and is a bidentate sub-ligand;

$V^1$ is a trivalent group that joins the central sub-ligand(s), according to the choice of n, to one another and to $L^1$;

$V^2$ is a bivalent group or a single bond that joins the central sub-ligand and $L^2$ to one another;

n is 1, 2 or 3;

m is the same or different at each instance and is 0 or 1, where, when m=1, the atom X to which the corresponding $V^2$ group is bonded is C, with the proviso that at least one m=1 in every platinum sub-complex;

R is the same or different at each instance and is H, D, F, Cl, Br, I, $N(R^1)_2$, CN, $NO_2$, $OR^1$, $SR^1$, $COOR^1$, $C({=}O)N(R^1)_2$, $Si(R^1)_3$, $B(OR^1)_2$, $C({=}O)R^1$, $P({=}O)(R^1)_2$, $S({=}O)R^1$, $S({=}O)_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals, where one or more nonadjacent $CH_2$ groups may be replaced by $Si(R^1)_2$, C═O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, CN, $NO_2$, $OR^2$, $SR^2$, $Si(R^2)$, $B(OR^2)_2$, $COOR^2$, $C(═O)R^2$, $P(═O)(R^2)_2$, $S(═O)R^2$, $S(═O)_2R^2$, $OSO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals, where one or more nonadjacent $CH_2$ groups may be replaced by $Si(R^2)_2$, C═O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic or heteroaromatic organic radical, especially a hydrocarbyl radical, having 1 to 20 carbon atoms, in which one or more hydrogen atoms may also be replaced by F.

When two R or $R^1$ radicals together form a ring system, it may be mono- or polycyclic, and aliphatic, heteroaliphatic, aromatic or heteroaromatic. In this case, the radicals which together form a ring system may be adjacent, meaning that these radicals are bonded to the same carbon atom or to carbon atoms directly bonded to one another, or they may be further removed from one another. Preference is given to this kind of ring formation in radicals bonded to carbon atoms directly bonded to one another or to the same carbon atom.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

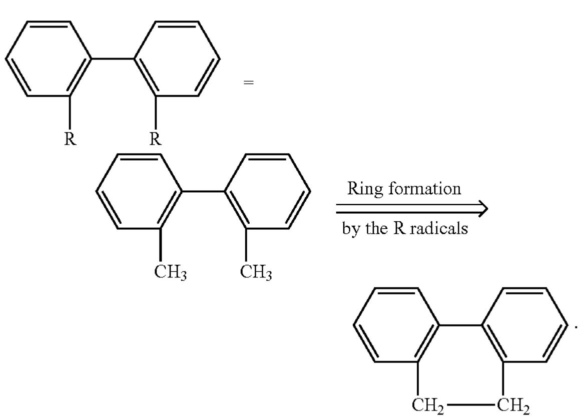

In addition, however, the abovementioned wording shall also be understood to mean that, if one of the two radicals is hydrogen, the second radical binds to the position to which the hydrogen atom was bonded, forming a ring. This shall be illustrated by the following scheme:

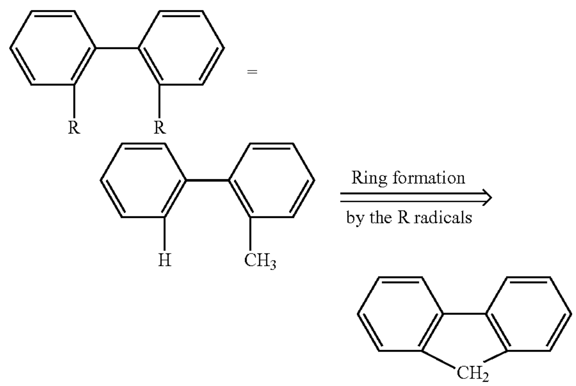

The formation of an aromatic ring system shall be illustrated by the following scheme:

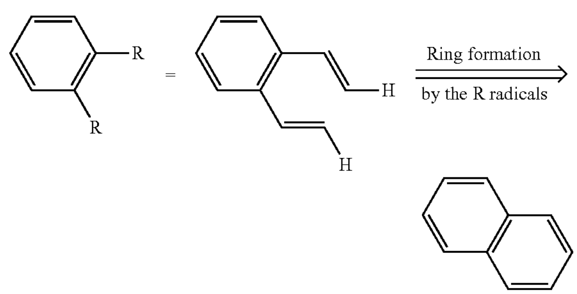

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system. Preferred aromatic or heteroaromatic ring systems are aryl or heteroaryl groups and systems in which two or more aryl or heteroaryl groups are bonded directly to one another, and fluorene and spirobifluorene groups.

A cyclic alkyl group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be replaced by the abovementioned groups is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{20}$-alkoxy group as present for $OR^1$ or $OR^2$ is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The expression "bidentate sub-ligand" for $L^1$ or $L^2$ in the context of this application means that this unit would be a bidentate ligand if the $V^1$ or $V^2$ group were not present. However, as a result of the formal abstraction of a hydrogen atom from this bidentate ligand and the joining to $V^1$ or $V^2$, it is not a separate ligand but is part of the higher polydentate ligand which thus arises, and so the term "sub-ligand" is used therefor.

The term "central sub-ligand" is used above and in the description that follows. This is understood in accordance with the invention to mean any sub-ligand within the compound of the formula (1) that coordinates simultaneously to Ir and Pt.

For further illustration of the compound of the invention, two simple structures of formula (1) are shown and elucidated in full hereinafter:

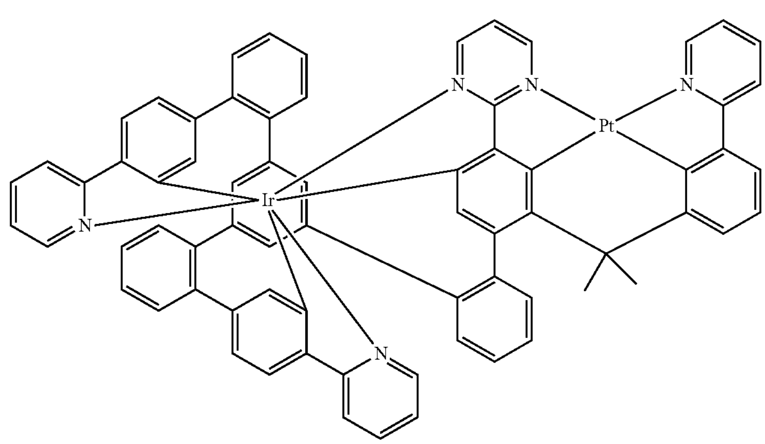

-continued

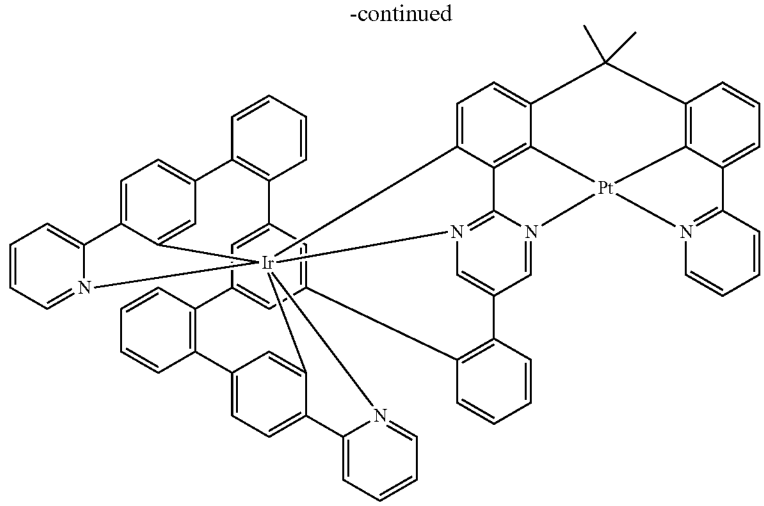

In these structures, the central sub-ligand that coordinates to iridium and platinum is a 2-phenylpyrimidine group. The $V^1$ group that bridges the central sub-ligand and the two sub-ligands $L^1$ is a 1,3,5-triphenylbenzene group. The $V^2$ group that bridges the central sub-ligand and the sub-ligands $L^2$ is $C(CH_3)_2$. Two sub-ligands $L^1$ are also bonded to the V group, and these in the structures depicted above are each phenylpyridine. One sub-ligand $L^2$ is also bonded to the $V^2$ group, and this in the structures depicted above is phenylpyridine. The index n is 1, meaning that the structure contains just one platinum atom. In each of the two structures, one index m=1 and the other index m=0, where, in the first structure, the $V^2$ group is bonded to the same cycle as the $V^1$ group and, in the second structure, the $V^1$ and $V^2$ groups are bonded to the two different cycles of the central sub-ligand. In the structures depicted above, the iridium is thus coordinated to two phenylpyridine sub-ligands and one phenylpyrimidine sub-ligand, and the platinum is coordinated to one phenylpyridine sub-ligand and one phenylpyrimidine sub-ligand. The phenyl group and the pyrimidine group of the phenylpyrimidine here coordinate both to the iridium and the platinum.

The bond of the ligand to the iridium or platinum may either be a coordinate bond or a covalent bond, or the covalent fraction of the bond may vary according to the ligand. When it is said in the present application that the ligand or sub-ligand coordinates or binds to iridium or platinum, this refers in the context of the present application to any kind of bond of the ligand or sub-ligand to the metal, irrespective of the covalent fraction of the bond.

The compounds of the invention are preferably uncharged, meaning that they are electrically neutral. This is achieved in that the charge of the sub-ligands compensates for the charge of the metal atoms. It is therefore preferable when the iridium atom in the +III oxidation state coordinates to three bidentate sub-ligands having a total of three negative charges, and when the platinum atom in the +II oxidation state coordinates to two bidentate sub-ligands having a total of two negative charges, where the central sub-ligand that coordinates simultaneously to Ir and Pt preferably has two negative charges. It is preferable here when each of the sub-ligands $L^1$ and $L^2$ is monoanionic. Alternatively, it is possible that, for example, the central sub-ligand that coordinates to Ir and Pt coordinates to the Pt via two uncharged nitrogen atoms and $L^2$ coordinates to the Pt via two anionic carbon atoms. It is likewise possible that, for example, the central sub-ligand that coordinates to Ir and Pt coordinates to the Pt via two anionic carbon atoms and $L^2$ coordinates to the Pt via two uncharged nitrogen atoms.

When n=1, the compound of the invention is a binuclear compound having one iridium atom and one platinum atom. When n=2, the compound of the invention is a trinuclear compound having one iridium atom and two platinum atoms. When n=3, the compound of the invention is a tetranuclear compound having one iridium atom and three platinum atoms. In a preferred embodiment of the invention, n=1.

In a preferred embodiment of the invention, the compounds of the formula (1) are selected from the compounds of the following formula (1'):

formula (1')

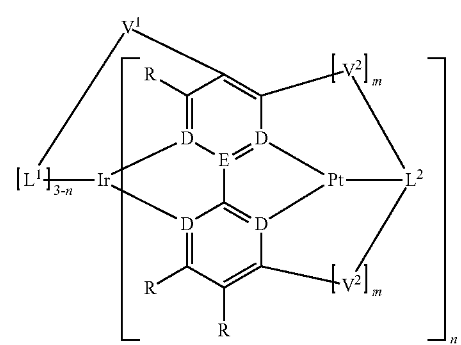

where, when m=0, an R radical is bonded to the carbon atom to which the corresponding $V^2$ would have been bonded, the R radicals in the ortho position to D are the same or different at each instance and are selected from the group consisting of H, D (deuterium), F, $CH_3$ and $CD_3$ and are preferably H, and the other symbols and indices used have the definitions detailed above.

In a preferred embodiment of the formula (1), the Ir is coordinated by one carbon atom and one nitrogen atom of the central sub-ligand. In a further preferred embodiment of the formula (1), the Pt is coordinated by one carbon atom and one nitrogen atom or by two carbon atoms of the central sub-ligand. The compound of the formula (1) thus preferably has a structure of one of the following formulae (1a) to (1f):

formula (1a)

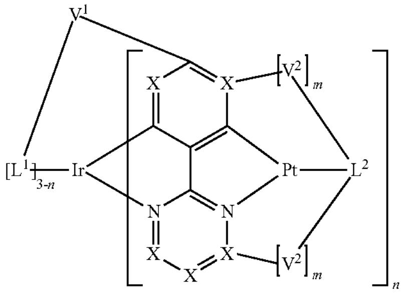

formula (1b)

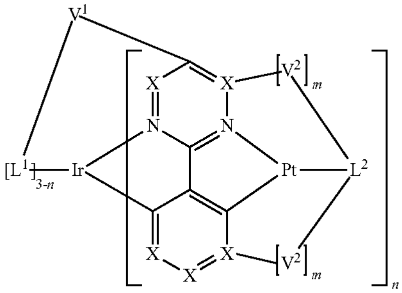

formula (1c)

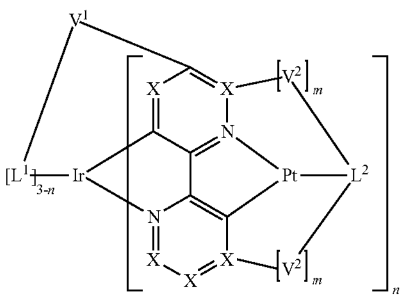

formula (1d)

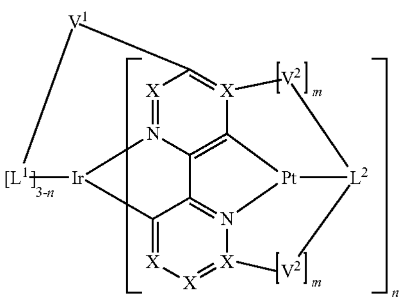

formula (1e)

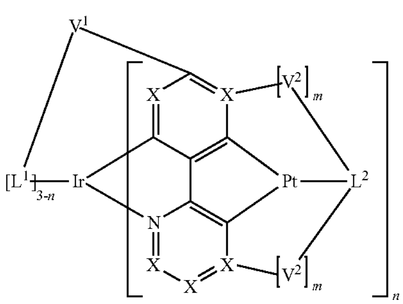

-continued formula (1f)

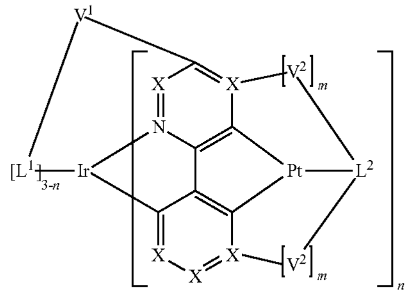

where the symbols and indices used have the definitions given above. Since the central sub-ligand in the formulae (1e) and (1f) coordinates to Pt via two anionic carbon atoms, it is preferable when the sub-ligand $L^2$ in these structures coordinates to Pt via two uncharged atoms, especially via two uncharged nitrogen atoms.

More preferably, both the Ir and the Pt are coordinated by one carbon atom and one nitrogen atom of the central sub-ligand, and so preferred embodiments are the structures of the formulae (1a) to (1d).

In a preferred embodiment, one index m=1 and the other index m=0, and so the compound of the invention preferably has exactly one $V^2$ group per platinum sub-complex. In addition, in compounds having just one $V^2$ group, it is preferable when this group is bonded on the central sub-ligand to the aryl or heteroaryl group that coordinates to the Ir via a carbon. Preferred compounds are thus the compounds of the following formulae (1a-1) to (1f-1):

formula (1a-1)

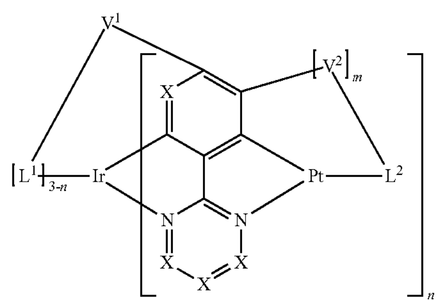

formula (1b-1)

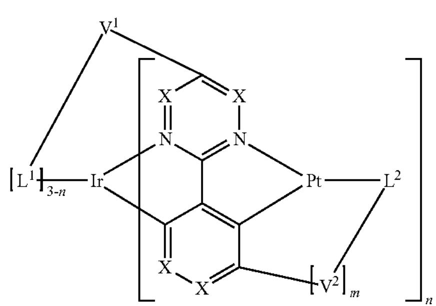

-continued
formula (1c-1)
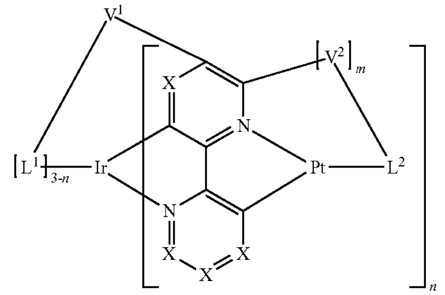
formula (1d-1)
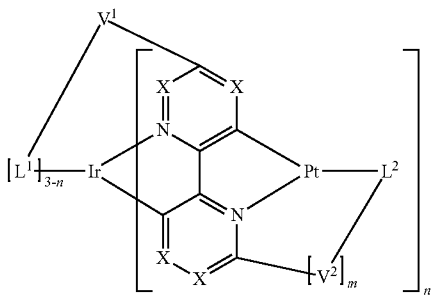
formula (1e-1)
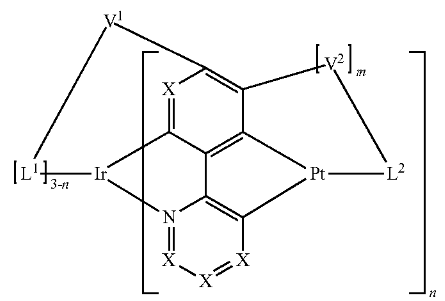
formula (1f-1)
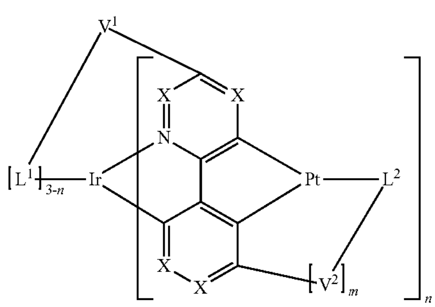
where the symbols and indices used have the definitions given above.
In a preferred embodiment of the invention, Xin the formulae (1a) to (1f) is CR, and so the structures are preferably selected from the compounds of the formulae (1a-2) to (1f-2)
formula (1a-2)
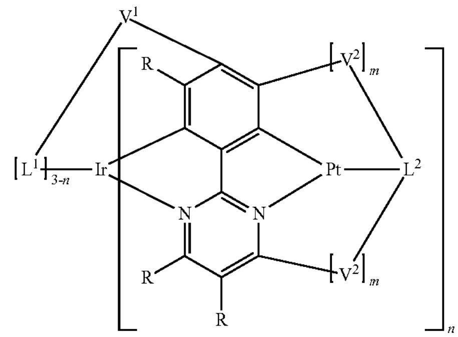
formula (1b-2)
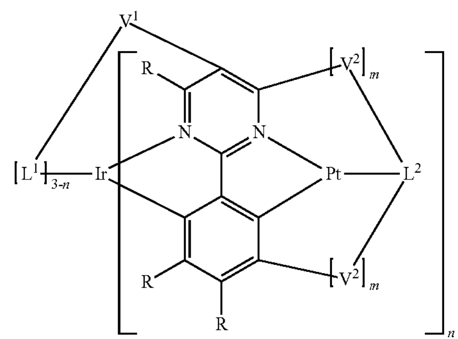
formula (1c-2)
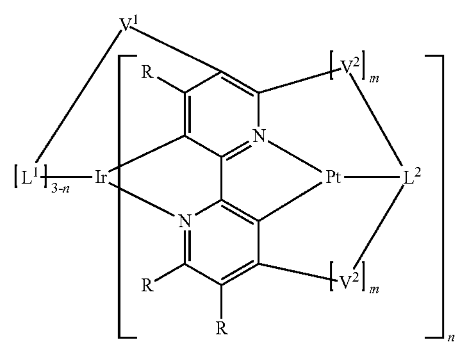
formula (1d-2)
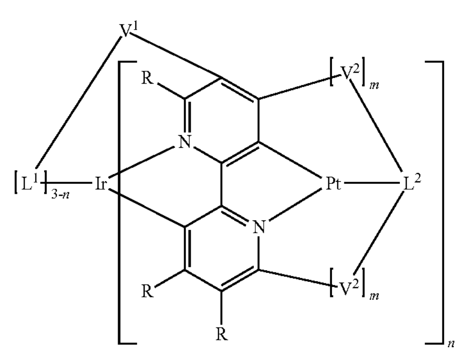

-continued formula (1e-2)

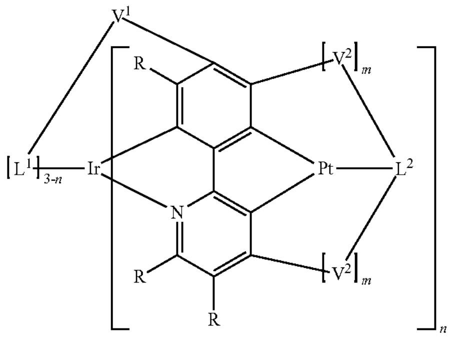

formula (1f-2)

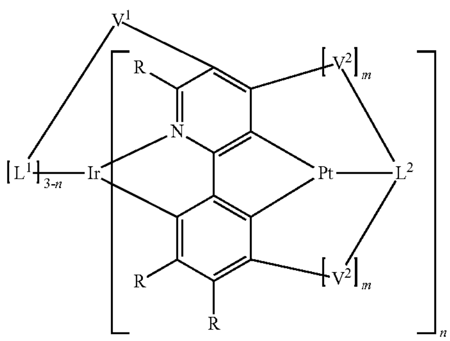

where, when m=0, an R radical is bonded to the carbon atom to which the corresponding $V^2$ would have been bonded, the R radicals in the ortho position to D are the same or different at each instance and are selected from the group consisting of H, D (deuterium), F, $CH_3$ and $CD_3$ and are preferably H, and the other symbols and indices used have the definitions detailed above.

Particular preference is given to the compounds of the following formulae (1a-3) to (1f-3):

formula (1a-3)

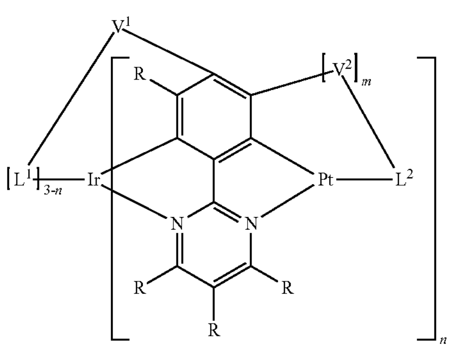

-continued formula (1b-3)

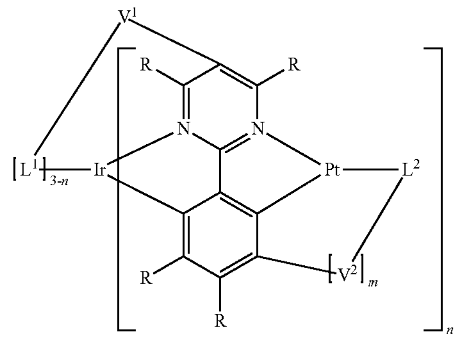

formula (1c-3)

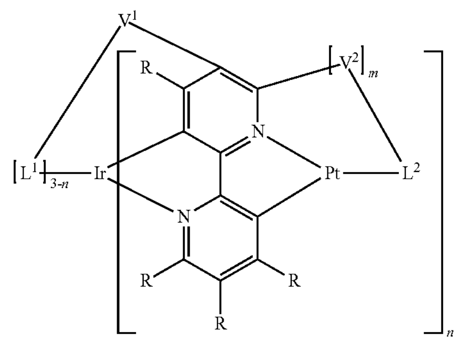

formula (1d-3)

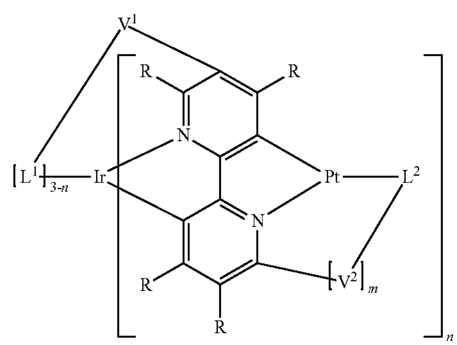

formula (1e-3)

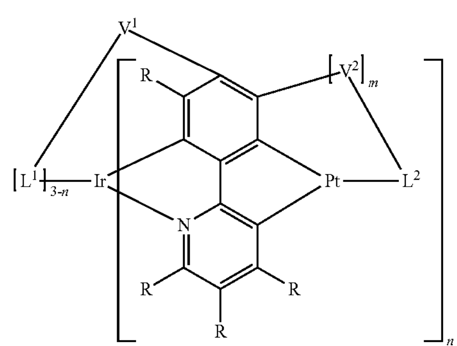

-continued formula (1f-3)

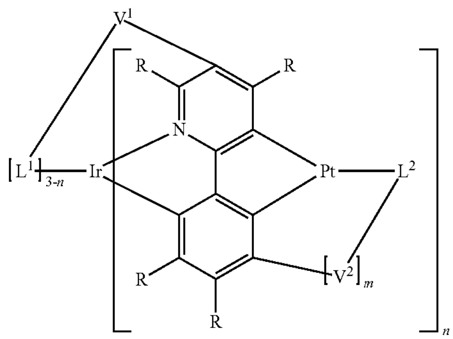

wherein the symbols and indices used have the definitions give above. The R radicals here in the ortho position to D are preferably the same or different at each instance and are selected from the group consisting of H, D (deuterium), F, $CH_3$ and $CD_3$ and are more preferably H.

There follows a description of preferred embodiments of the $V^1$ group. As described above, $V^1$ is a trivalent group that joins the central sub-ligand and the two sub-ligands $L^1$ to one another when n=1, or joins the two central sub-ligands and the sub-ligand $L^1$ to one another when n=2, or joins the three central sub-ligands to one another when n=3.

In a preferred embodiment of the invention, $V^1$ is selected from the groups of the following formulae (2) and (3):

formula (2)

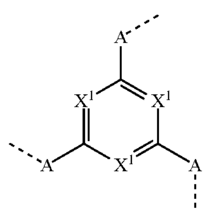

formula (3)

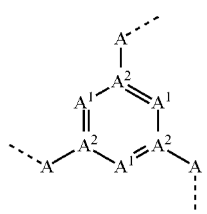

where the dotted bonds represent the bonds to the central sub-ligand or to the sub-ligand(s) $L^1$, R has the definitions given above and the other symbols used are as follows:

A is the same or different at each instance and is —CR=CR—, —C(=O)—NR'—, —C(=O)—O—, —$CR_2$—$CR_2$—, —$CR_2$—O— or a group of the following formula (4):

formula (4)

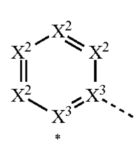

where the dotted bond represents the position of the bond of the central sub-ligand or of a sub-ligand $L^1$ to this structure and * represents the position of the linkage of the unit of the formula (4) to the central cyclic group, i.e. the group explicitly included in formula (2) or (3);

$X^1$ is the same or different at each instance and is CR or N;

$X^2$ is the same or different at each instance and is CR or N, or two adjacent $X^2$ groups together are NR, O or S, thus forming a five-membered ring, and the remaining $X^2$ are the same or different at each instance and are CR or N; or two adjacent $X^2$ groups together are CR or N when one of the $X^3$ groups in the cycle is N, thus forming a five-membered ring; with the proviso that not more than two adjacent $X^2$ groups are N;

$X^3$ is C at each instance or one $X^3$ group is N and the other $X^3$ groups in the same cycle are C; with the proviso that two adjacent $X^2$ groups together are CR or N when one of the $X^3$ groups in the cycle is N;

$A^1$ is the same or different at each instance and is $C(R)_2$ or O;

$A^2$ is the same or different at each instance and is CR, P(=O), B or SiR, with the proviso that, when $A^2$=P(=O), B or SiR, the symbol $A^1$ is O and the symbol A bonded to this $A^2$ is not —C(=O)—NR'— or —C(=O)—O—;

R' is the same or different at each instance and is H, D, a straight-chain alkyl group having 1 to 20 carbon atoms or a branched or cyclic alkyl group having 3 to 20 carbon atoms, where the alkyl group in each case may be substituted by one or more $R^1$ radicals and where one or more nonadjacent $CH_2$ groups may be replaced by $Si(R^1)_2$, or an aromatic or heteroaromatic ring system which has 5 to 40 aromatic ring atoms and may be substituted in each case by one or more $R^1$ radicals.

When $A^2$ in formula (3) is CR, especially when all $A^2$ are CR, very particularly when, in addition, 0, 1, 2 or 3, especially 3, of the $A^1$ are $CR_2$, the R radicals on $A^2$ may assume different positions depending on the configuration. Preference is given here to small R radicals such as H or D. It is preferable that they are either all directed away from the metal (apical) or all directed inward toward the metal (endohedral). This is illustrated hereinafter by an example in which the A groups are each an ortho-phenylene group.

apical

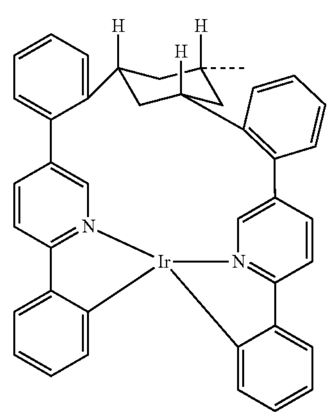

-continued endohedral

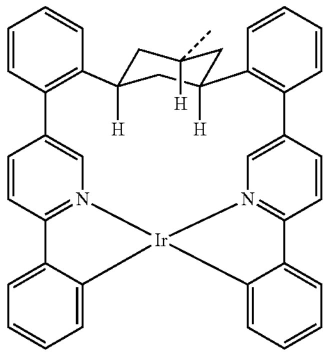

The third sub-ligand that coordinates either to Ir or to Pt is not shown for the sake of clarity, but is merely indicated by the dotted bond. Preference is therefore given to complexes that can assume at least one of the two configurations. These are complexes in which all three sub-ligands are arranged equatorially on the central ring.

Suitable embodiments of the group of the formula (2) are the structures of the following formulae (5) to (8), and suitable embodiments of the group of the formula (3) are the structures of the following formulae (9) to (13):

formula (5)

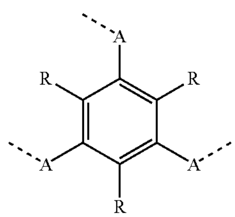

formula (6)

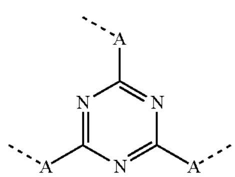

formula (7)

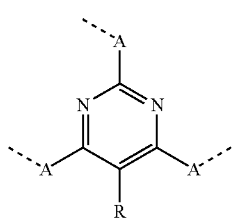

formula (8)

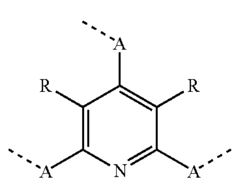

-continued formula (9)

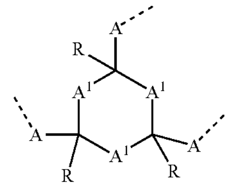

formula (10)

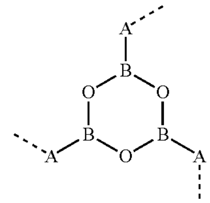

formula (11)

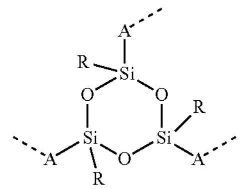

formula (12)

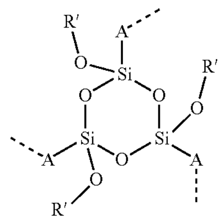

formula (13)

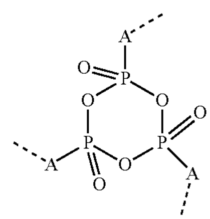

where the symbols have the definitions given above.

Preferred R radicals in the formulae (2), (3) and (5) to (13) are as follows:

R is the same or different at each instance and is H, D, F, CN, $OR^1$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^1$ radicals, or an aromatic or heteroaromatic ring system which has 5 to 24 aromatic ring atoms and may be substituted in each case by one or more $R^1$ radicals;

$R^1$ is the same or different at each instance and is H, D, F, CN, $OR^2$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic, aromatic or heteroaromatic organic radical having 1 to 20 carbon atoms, in which one or more hydrogen atoms may also be replaced by F.

Particularly preferred R radicals in the formulae (2), (3) and (5) to (13) are as follows:

R is the same or different at each instance and is H, D, F, CN, a straight-chain alkyl group having 1 to 4 carbon atoms or a branched or cyclic alkyl group having 3 to 6 carbon atoms, each of which may be substituted by one or more $R^1$ radicals, or an aromatic or heteroaromatic ring system which has 6 to 12 aromatic ring atoms and may be substituted in each case by one or more R radicals;

$R^1$ is the same or different at each instance and is H, D, F, CN, a straight-chain alkyl group having 1 to 4 carbon atoms or a branched or cyclic alkyl group having 3 to 6 carbon atoms, each of which may be substituted by one or more $R^2$ radicals, or an aromatic or heteroaromatic ring system which has 6 to 12 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic or aromatic hydrocarbyl radical having 1 to 12 carbon atoms.

In a preferred embodiment of the invention, all $X^1$ groups in the group of the formula (2) are CR, and so the central trivalent cycle of the formula (2) is a benzene. More preferably, all $X^1$ groups are CH or CD, especially CH. In a further preferred embodiment of the invention, all $X^1$ groups are a nitrogen atom, and so the central trivalent cycle of the formula (2) is a triazine. Preferred embodiments of the formula (2) are thus the structures of the formulae (5) and (6) depicted above. More preferably, the structure of the formula (5) is a structure of the following formula (5'):

formula (5')

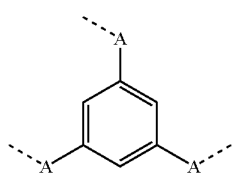

where the symbols have the definitions given above.

In a further preferred embodiment of the invention, all $A^2$ groups in the group of the formula (3) are CR. More preferably, all $A^2$ groups are CH. Preferred embodiments of the formula (3) are thus the structures of the formula (9) depicted above. More preferably, the structure of the formula (9) is a structure of the following formula (9') or (9''):

formula (9')

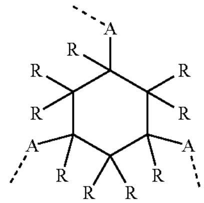

-continued formula (9'')

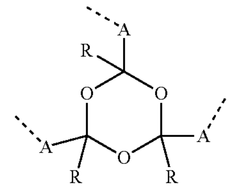

where the symbols have the definitions given above and R is preferably H.

As already described above, R radicals in these structures may also form a ring system with one another. For example, through ring formation by the R radicals in formula (9'), the formation of an adamantane bridgehead is possible, as shown in the following two formulae:

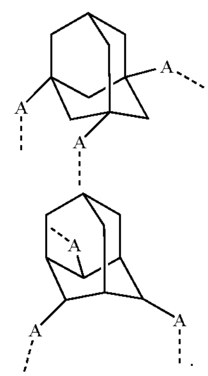

There follows a description of preferred A groups as occur in the structures of the formulae (2) and (3) and (5) to (13). The A group may be the same or different at each instance and may be an alkenyl group, an amide group, an ester group, an alkylene group, a methylene ether group or an ortho-bonded arylene or heteroarylene group of the formula (4). When A is an alkenyl group, it is a cis-bonded alkenyl group. In the case of unsymmetric A groups, any orientation of the groups is possible. For example, when A=—C(═O)—O—, it is possible that either the carbon atom or the carbonyl group binds to the central sub-ligand or to the sub-ligands $L^1$. The same applies analogously when A=—N($R^1$)—C(═O)—.

In a preferred embodiment of the invention, the A groups are the same or different, preferably the same, at each instance and are selected from the group consisting of —$R_2$—$CR_2$—, —C(═O)—O—, —C(═O)—NR'— or a group of the formula (4). More preferably, all A groups are the same and also have the same substitution. Preferred combinations for the A groups within a formula (2) or (3) and the preferred embodiments are:

| A | A | A |
|---|---|---|
| Formula (4) | Formula (4) | Formula (4) |
| —$CR_2$—$CR_2$— | —$CR_2$—$CR_2$— | —$CR_2$—$CR_2$— |
| —C(═O)—O— | —C(═O)—O— | —C(═O)—O— |
| —C(═O)—NR'— | —C(═O)—NR'— | —C(═O)—NR'— |
| —C(═O)—O— | Formula (4) | Formula (4) |
| —C(═O)—NR'— | Formula (4) | Formula (4) |
| —$CR_2$—$CR_2$— | Formula (4) | Formula (4) |
| —$CR_2$—$CR_2$— | —$CR_2$—$CR_2$— | Formula (4) |

-continued

| A | A | A |
|---|---|---|
| —C(═O)—O— | —C(═O)—O— | Formula (4) |
| —C(═O)—NR'— | —C(═O)—NR'— | Formula (4) |
| —$CR_2$—$CR_2$— | —$CR_2$—$CR_2$— | —C(═O)—NR'— |
| —$CR_2$—$CR_2$— | —$CR_2$—$CR_2$— | —C(═O)—O— |
| —$CR_2$—$CR_2$— | —C(═O)—NR'— | —C(═O)—NR'— |
| —$CR_2$—$CR_2$— | —C(═O)—O— | —C(═O)—O— |

When A is —C(═O)—NR'—, R' is preferably the same or different at each instance and is a straight-chain alkyl group having 1 to 10 carbon atoms or a branched or cyclic alkyl group having 3 to 10 carbon atoms or an aromatic or heteroaromatic ring system which has 6 to 24 aromatic ring atoms, and may be substituted in each case by one or more $R^1$ radicals. More preferably, R' is the same or different at each instance and is a straight-chain alkyl group having 1 to 5 carbon atoms or a branched or cyclic alkyl group having 3 to 6 carbon atoms or an aromatic or heteroaromatic ring system which has 6 to 12 aromatic ring atoms and may be substituted in each case by one or more $R^1$ radicals, but is preferably unsubstituted.

Preferred embodiments of the group of the formula (4) are described hereinafter. The group of the formula (4) may represent a heteroaromatic five-membered ring or an aromatic or heteroaromatic six-membered ring. In a preferred embodiment of the invention, the group of the formula (4) contains not more than two heteroatoms in the aromatic or heteroaromatic unit, more preferably not more than one heteroatom. This does not mean that any substituents bonded to this group cannot also contain heteroatoms. In addition, this definition does not mean that formation of rings by substituents cannot give rise to fused aromatic or heteroaromatic structures, for example naphthalene, benzimidazole, etc.

When both $X^3$ groups in formula (4) are carbon atoms, preferred embodiments of the group of the formula (4) are the structures of the following formulae (14) to (30), and, when one $X^3$ group is a carbon atom and the other $X^3$ group in the same cycle is a nitrogen atom, preferred embodiments of the group of the formula (4) are the structures of the following formulae (31) to (38):

formula (14)

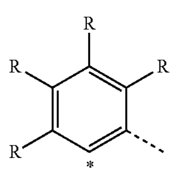

formula (15)

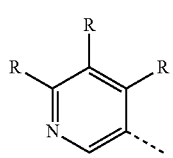

formula (16)

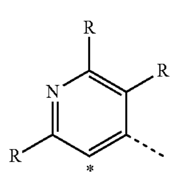

-continued formula (17)

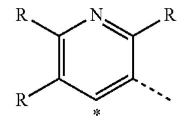

formula (18)

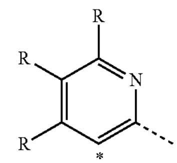

formula (19)

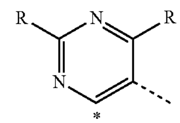

formula (20)

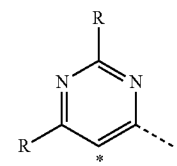

formula (21)

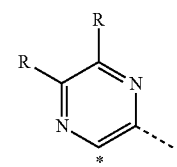

formula (22)

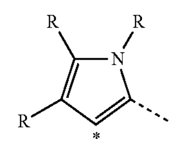

formula (23)

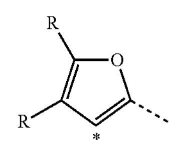

formula (24)

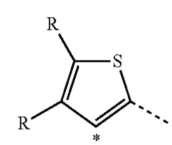

formula (25)

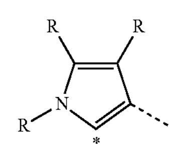

formula (26)

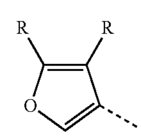

-continued formula (27)

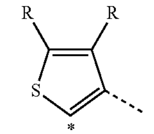

formula (28)

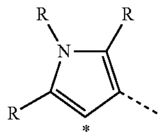

formula (29)

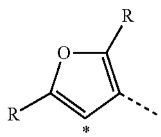

formula (30)

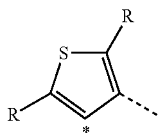

formula (31)

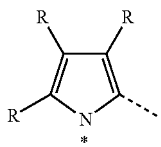

formula (32)

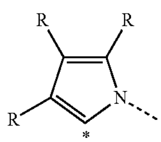

formula (33)

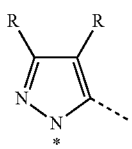

formula (34)

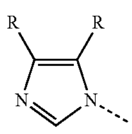

formula (35)

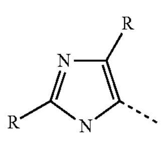

formula (36)

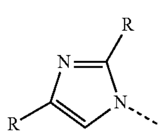

-continued formula (37)

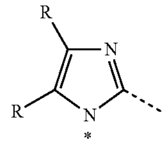

formula (38)

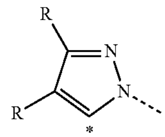

where the symbols have the definitions given above.

Particular preference is given to the six-membered aromatic rings and heteroaromatic rings of the formulae (14) to (18) depicted above. Very particular preference is given to ortho-phenylene, i.e. a group of the abovementioned formula (14).

At the same time, it is also possible for adjacent R substituents together to form a ring system, such that it is possible to form fused structures, including fused aryl and heteroaryl groups, for example naphthalene, quinoline, benzimidazole, carbazole, dibenzofuran or dibenzothiophene. Such ring formation is shown schematically below in groups of the abovementioned formula (14), which can lead, for example, to groups of the following formulae (14a) to (14j):

formula (14a)

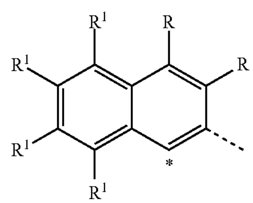

formula (14b)

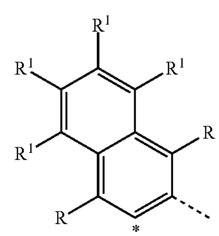

formula (14c)

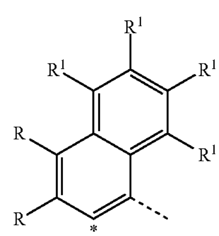

-continued formula (14d)

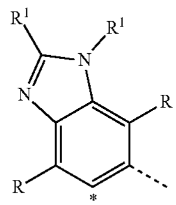

formula (14e)

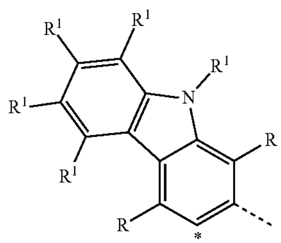

formula (14f)

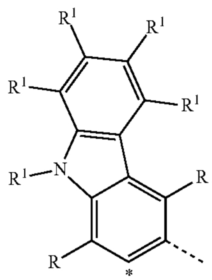

formula (14g)

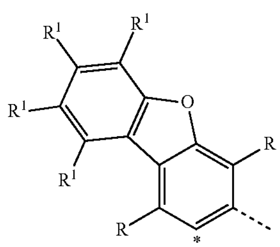

formula (14h)

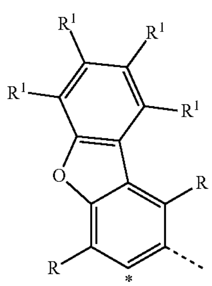

formula (14i)

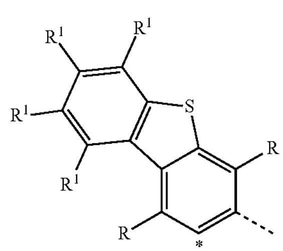

-continued formula (14j)

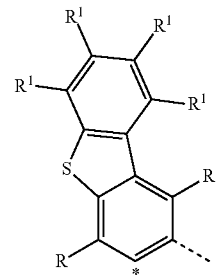

where the symbols have the definitions given above.

In general, the groups fused on may be fused onto any position in the unit of formula (4), as shown by the fused-on benzo group in the formulae (14a) to (14c). The groups as fused onto the unit of the formula (4) in the formulae (14d) to (14j) may therefore also be fused onto other positions in the unit of the formula (4).

Preferred groups of the formula (2) are the groups of the formula (5), and preferred groups of the formula (3) are the groups of the formula (9). The group of the formula (5) can more preferably be represented by the following formulae (5a) to (5x), and the group of the formula (9) can more preferably be represented by the following formulae (9a) to (9x):

formula (5a)

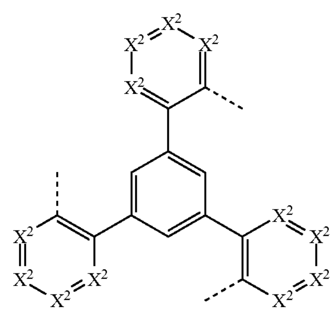

formula (5b)

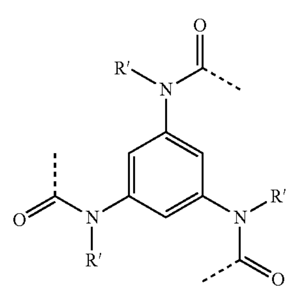

formula (5c)

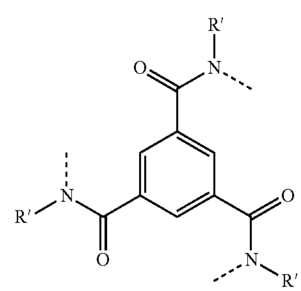

-continued
formula (5d)
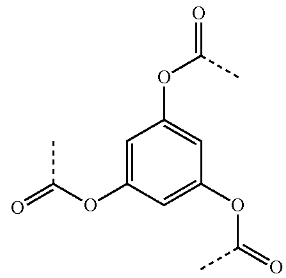
formula (5e)
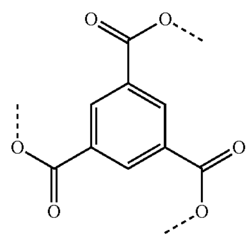
formula (5f)
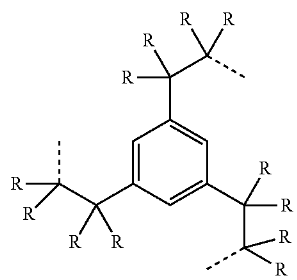
formula (5g)
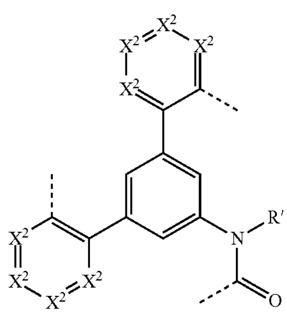
formula (5h)
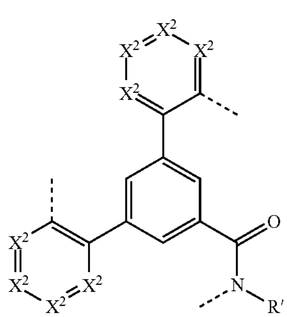
-continued
formula (5i)
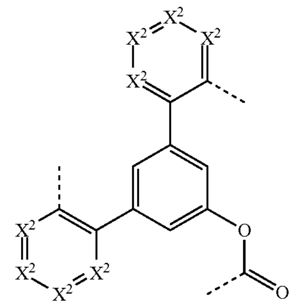
formula (5j)
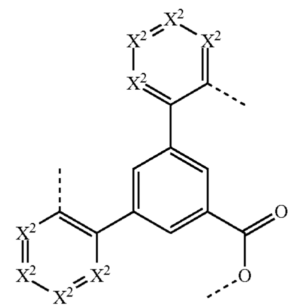
formula (5k)
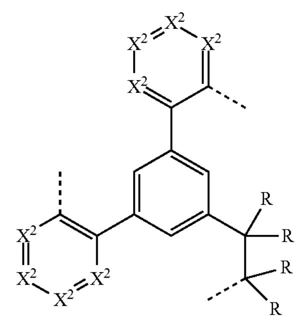
formula (5l)
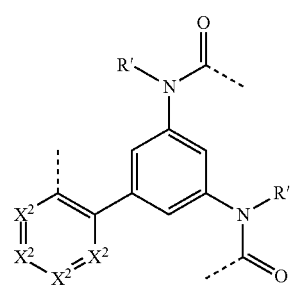
formula (5m)
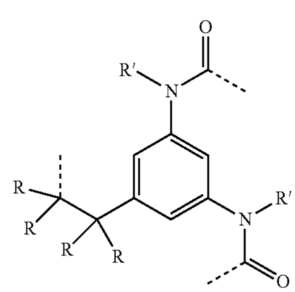

-continued
formula (5n)
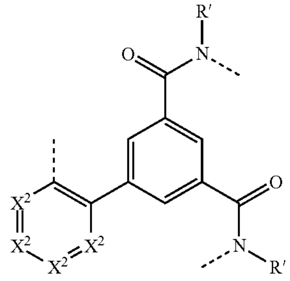
formula (5o)
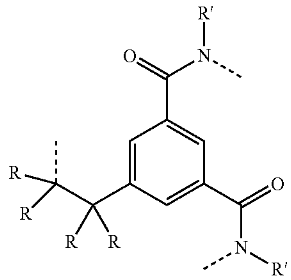
formula (5p)
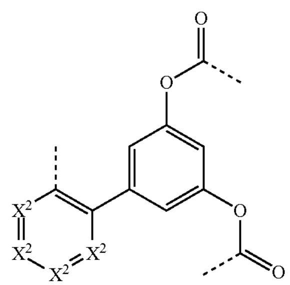
formula (5q)
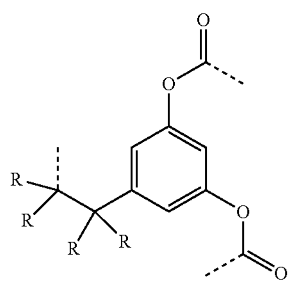
formula (5r)
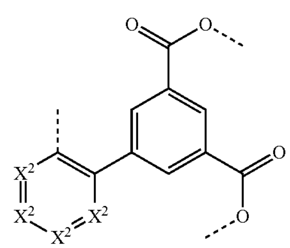
formula (5s)
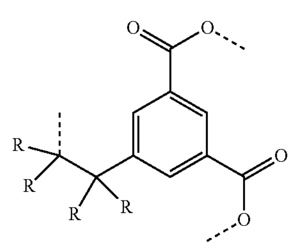
-continued
formula (5t)
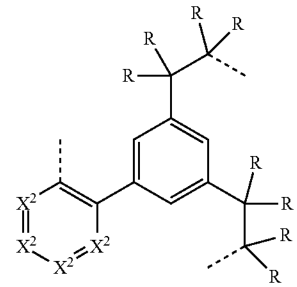
formula (5u)
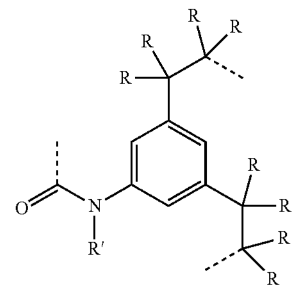
formula (5v)
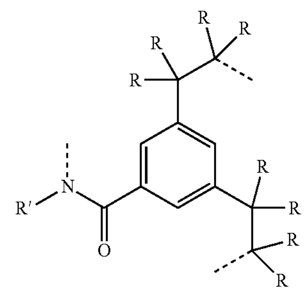
formula (5w)
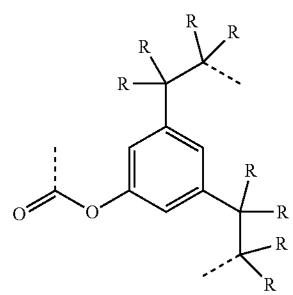
formula (5x)
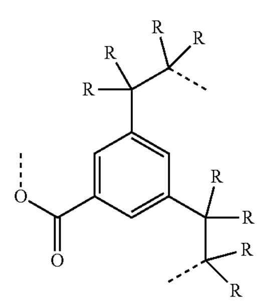

-continued
formula (9a)
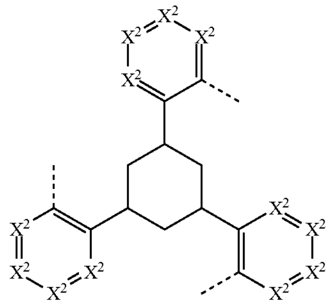
formula (9b)
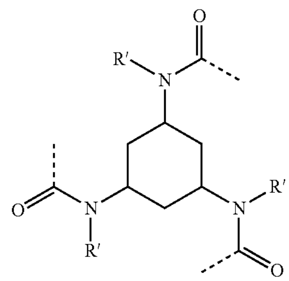
formula (9c)
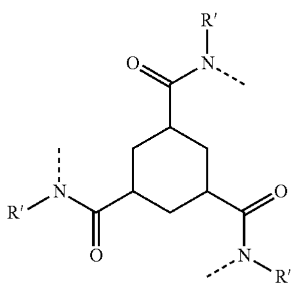
formula (9d)
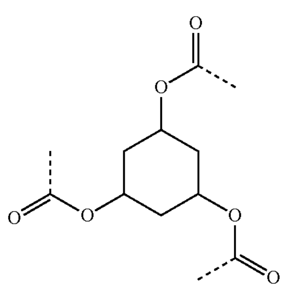
formula (9e)
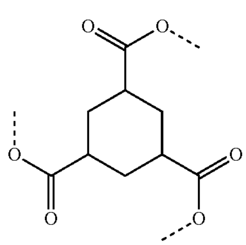
-continued
formula (9f)
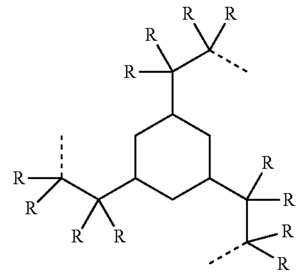
formula (9g)
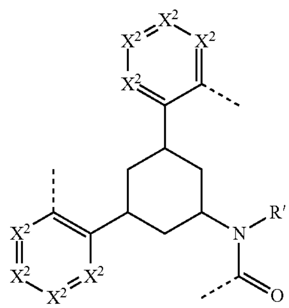
formula (9h)
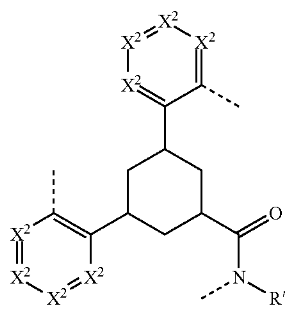
formula (9i)
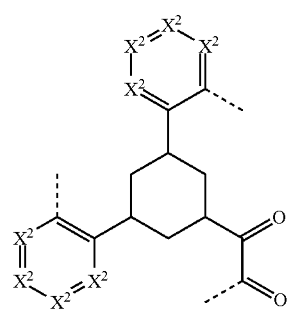
formula (9j)
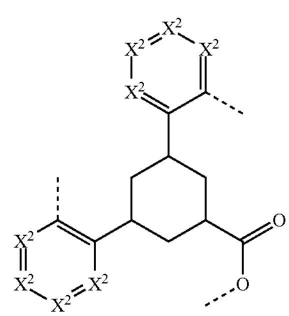

-continued
formula (9k)
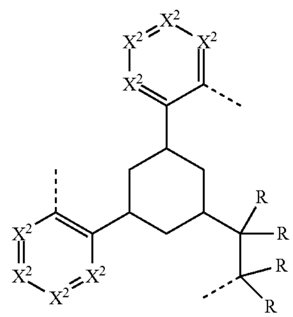
formula (9l)
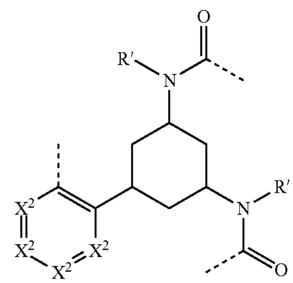
formula (9m)
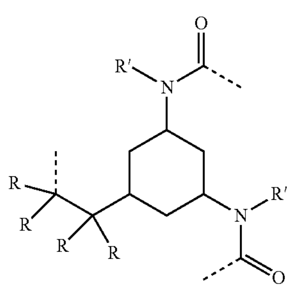
formula (9n)
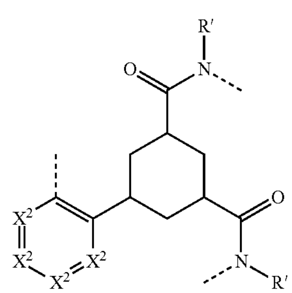
formula (9o)
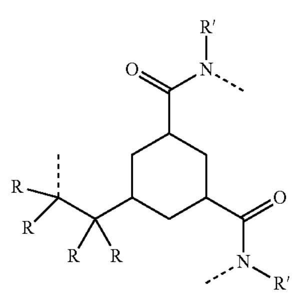
-continued
formula (9p)
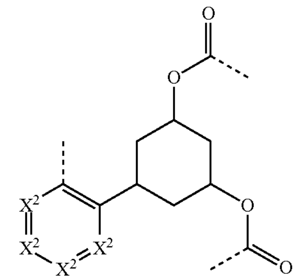
formula (9q)
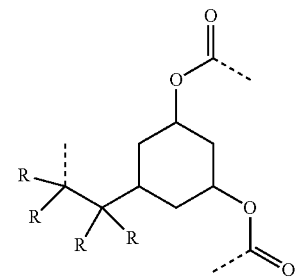
formula (9r)
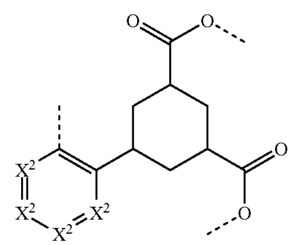
formula (9s)
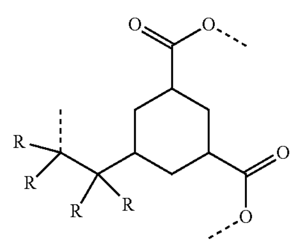
formula (9t)
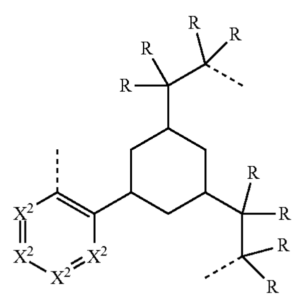
formula (9u)
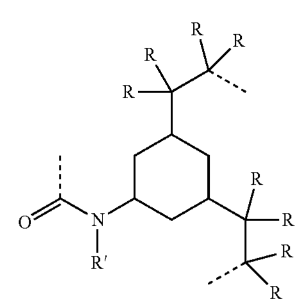

-continued formula (9v)

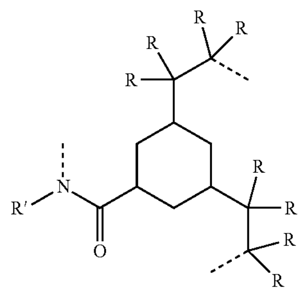

formula (9w)

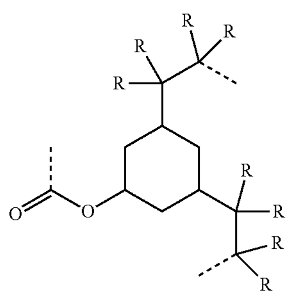

formula (9x)

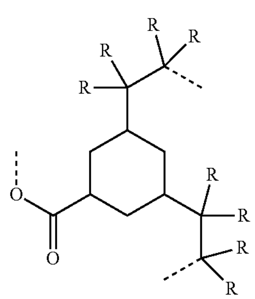

where the symbols have the definitions given above. Preferably, $X^2$ is the same or different at each instance and is CR, especially CH.

In the structures depicted above in which two A groups are the same and the third A group is different from the first two A groups, it is preferable, when n=1, when the identical A groups both bind to $L^1$ and the A group different from the first two A groups binds to the central sub-ligand. In addition, it is preferable, when n=2, when the two identical A groups both bind to the central sub-ligand and the A group different from the first two A groups binds to $L^1$.

A particularly preferred embodiment of the group of the formula (2) is the group of the following formula (5a"):

formula (5a")

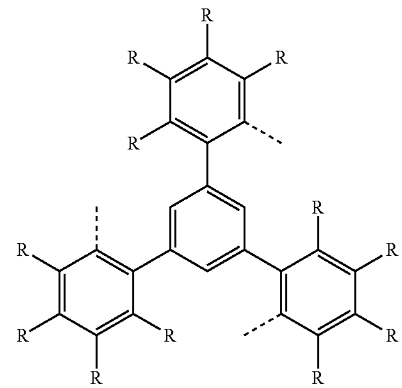

where the symbols have the definitions given above.

More preferably, the R groups in the abovementioned formulae are the same or different and are H, D or an alkyl group having 1 to 4 carbon atoms. Most preferably, R═H. Very particular preference is thus given to the structure of the following formula (5a'"):

formula (5a''')

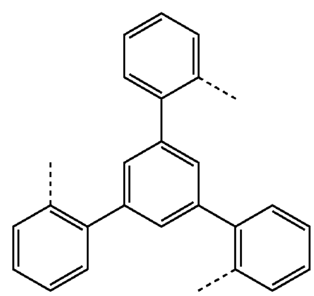

where the symbols have the definitions given above.

Further suitable bridgeheads $V^1$ are the structures of the following formula ($V^1$-a):

formula ($V^1$-a)

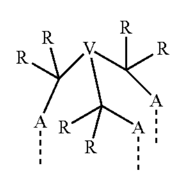

where A and R have the definitions given above and V is CR, N, SiR, P or P═O, preferably CR or N. In this case, the substituents R shown explicitly on the methylene groups are preferably H.

There follows a description of preferred embodiments of the $V^2$ group. As described above, $V^2$ is a bivalent group or a single bond that joins the central sub-ligand and the sub-ligand $L^2$ to one another.

In a preferred embodiment of the invention, $V^2$ is a bivalent group. This is preferably selected from the group consisting of $CR_2$, NR, O, S, Se, —$CR_2$—$CR_2$—, —$R_2$—O—, —CR═CR— or an ortho-bonded arylene or heteroarylene group which has 5 or 6 aromatic ring atoms and may be substituted by one or more R radicals. When $V^2$ is an ortho-bonded arylene or heteroarylene group, preferred embodiments are the groups as set out above as preferred embodiments for structures of the formula (4).

When one index m=1 and the other index m=0, it is preferable when the corresponding $V^2$ group, when m=1, is selected from the group consisting of NR, $CR_2$, O and S, more preferably NR, $CR_2$ and O.

When both indices m=1, it is preferable when one of the $V^2$ groups is selected from the group consisting of $CR_2$, NR, O or S more preferably $CR_2$ or NR, and the other $V^2$ group is selected from the group consisting of —$CR_2$—$CR_2$—, —$CR_2$—O—, —CR═CR— or an ortho-bonded arylene or heteroarylene group which as 5 or 6 aromatic ring atoms and may be substituted by one or more R radicals.

When $V^2$ is a $CR_2$, —$CR_2$—$CR_2$—, —$CR_2$—O— or —CR═CR— group, preferred R radicals are the same or different at each instance and are selected from the group consisting of H, an alkyl group which has 1 to 10 carbon atoms and may also be substituted by one or more $R^1$ radicals, or an aromatic or heteroaromatic ring system which has 5 to 13 aromatic ring atoms and may be substituted by one or more $R^1$ radicals. It is also possible here for multiple R radicals that bind to the same carbon atom or two adjacent carbon atoms to form a ring system with one another. More preferably, these R radicals are the same or different at each instance and are selected from the group consisting of H, an alkyl group having 1 to 5 carbon atoms and an aromatic or heteroaromatic ring system which has 5 to 10 aromatic ring atoms and may be substituted by one or more $R^1$ radicals. It is also possible here for multiple R radicals that bind to the same carbon atom or two adjacent carbon atoms to form a ring system with one another.

When $V^2$ is an NR group, preferred R radicals are selected from the group consisting of an alkyl group which has 1 to 10 carbon atoms and may also be substituted by one or more $R^1$ radicals, or an aromatic or heteroaromatic ring system which has 5 to 24 aromatic ring atoms and may be substituted by one or more $R^1$ radicals. More preferably, these R radicals are selected from an aromatic or heteroaromatic ring system having 5 to 13 aromatic ring atoms, more preferably having 6 to 10 aromatic ring atoms, which may be substituted in each case by one or more $R^1$ radicals.

There follows a description of the bidentate sub-ligands $L^1$ and $L^2$. The sub-ligands $L^1$ and $L^2$ may be the same or different. It is preferable here when, in compounds containing two sub-ligands $L^1$, these are the same and also have the same substitution. In a preferred embodiment of the invention, the bidentate sub-ligands $L^1$ are monoanionic. In a further preferred embodiment of the invention, the bidentate sub-ligands $L^2$ are monoanionic or uncharged.

In a further preferred embodiment of the invention, the coordinating atoms of the bidentate sub-ligands $L^1$ and $L^2$ are the same or different at each instance and are selected from C, N, P, O, S and/or B, more preferably C, N and/or O and most preferably C and/or N. The bidentate sub-ligands $L^1$ preferably each have one carbon atom and one nitrogen atom or two carbon atoms or two nitrogen atoms or two oxygen atoms or one oxygen atom and one nitrogen atom as coordinating atoms. In addition, the bidentate sub-ligands $L^2$ preferably each have one carbon atom and one nitrogen atom or two nitrogen atoms as coordinating atoms. In this case, the coordinating atoms of each of the sub-ligands $L^1$ and $L^2$ may be the same, or they may be different. Preferably, at least one of the bidentate sub-ligands $L^1$ has one carbon atom and one nitrogen atom or two carbon atoms as coordinating atoms, especially one carbon atom and one nitrogen atom. More preferably, all bidentate sub-ligands $L^1$ and $L^2$ have one carbon atom and one nitrogen atom or two carbon atoms as coordinating atoms, especially one carbon atom and one nitrogen atom. Particular preference is thus given to a metal complex in which all sub-ligands are ortho-metallated, i.e. form a metallacycle with the Ir or Pt in which at least one metal-carbon bond is present.

It is further preferable when the metallacycle which is formed from the iridium or platinum and the bidentate sub-ligand $L^1$ or $L^2$ is a five-membered ring, which is preferable particularly when the coordinating atoms are C and N, N and N, or N and O. When the coordinating atoms are O, a six-membered metallacyclic ring may also be preferred. This is shown schematically hereinafter:

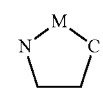

five-membered ring

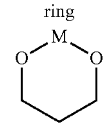

six-membered ring where M is Ir or Pt, N is a coordinating nitrogen atom, C is a coordinating carbon atom and O represents coordinating oxygen atoms, and the carbon atoms shown are atoms of the bidentate sub-ligand $L^1$ or $L^2$.

In a preferred embodiment of the invention, $L^2$ and at least one of the bidentate sub-ligands $L^1$ and more preferably all bidentate sub-ligands $L^1$ are the same or different at each instance and are selected from the structures of the following formulae (L-1), (L-2) and (L-3):

formula (L-1)

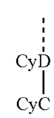

formula (L-2)

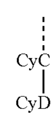

formula (L-3)

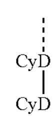

where the dotted bond represents the bond of the sub-ligand $L^1$ to $V^1$ or the bond of the sub-ligand $L^2$ to $V^2$ and the other symbols used are as follows:

CyC is the same or different at each instance and is a substituted or unsubstituted aryl or heteroaryl group which has 5 to 14 aromatic ring atoms and coordinates to M via a carbon atom and is bonded to CyD via a covalent bond;

CyD is the same or different at each instance and is a substituted or unsubstituted heteroaryl group which has 5 to 14 aromatic ring atoms and coordinates to M via a nitrogen atom or via a carbene carbon atom and is bonded to CyC via a covalent bond;

at the same time, two or more of the optional substituents together may form a ring system; in addition, the optional radicals are preferably selected from the abovementioned R radicals.

At the same time, CyD in the sub-ligands of the formulae (L-1) and (L-2) preferably coordinates via an uncharged nitrogen atom or via a carbene carbon atom, especially via an uncharged nitrogen atom. Further preferably, one of the two CyD groups in the ligand of the formula (L-3) coordinates via an uncharged nitrogen atom and the other of the two CyD groups via an anionic nitrogen atom, or both CyD groups coordinate via uncharged nitrogen atoms. Further preferably, CyC in the sub-ligands of the formulae (L-1) and (L-2) coordinates via anionic carbon atoms.

When two or more of the substituents, especially two or more R radicals, together form a ring system, it is possible for a ring system to be formed from substituents bonded to directly adjacent carbon atoms. In addition, it is also possible that the substituents on CyC and CyD in the formulae (L-1) and (L-2) or the substituents on the two CyD groups in formula (L-3) together form a ring, as a result of which CyC and CyD or the two CyD groups may also together form a single fused aryl or heteroaryl group as bidentate ligand.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, especially a phenyl group, which coordinates to the metal via a carbon atom, which may be substituted by one or more R radicals and which is bonded to CyD via a covalent bond.

Preferred embodiments of the CyC group are the structures of the following formulae (CyC-1) to (CyC-20):

(CyC-1)

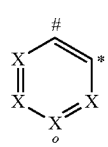

(CyC-2)

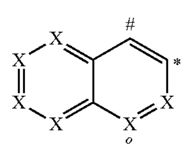

(CyC-3)

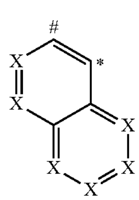

(CyC-4)

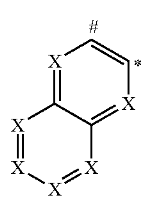

-continued (CyC-5)

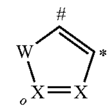

(CyC-6)

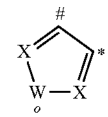

(CyC-7)

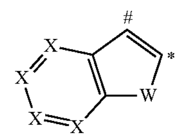

(CyC-8)

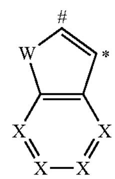

(CyC-9)

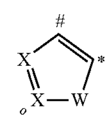

(CyC-10)

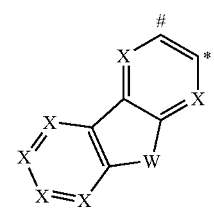

(CyC-11)

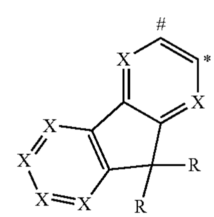

(CyC-12)

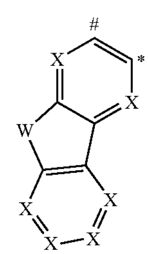

-continued (CyC-13)

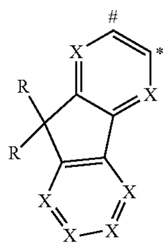

(CyC-14)

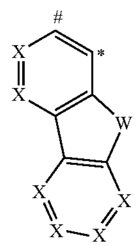

(CyC-15)

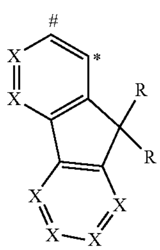

(CyC-16)

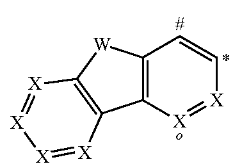

(CyC-17)

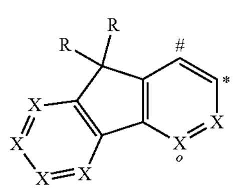

(CyC-18)

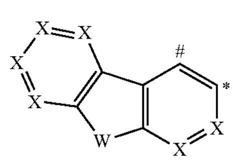

(CyC-19)

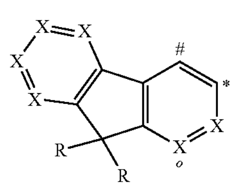

-continued (CyC-20)

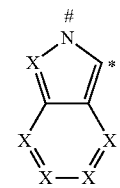

where CyC binds in each case to the position in CyD indicated by # and coordinates to the metal at the position indicated by *, R has the definitions given above and the further symbols used are as follows:

X is the same or different at each instance and is CR or N, with the proviso that not more than two symbols X per cycle are N;

W is NR, O or S;

with the proviso that, when the sub-ligand $L^1$ is bonded to $V^1$ via CyC, one symbol X is C and V is bonded to this carbon atom, and additionally with the proviso that, when the sub-ligand $L^2$ is bonded to $V^2$ via CyC, one symbol X is C and $V^2$ is bonded to this carbon atom. When the sub-ligand $L^1$ is bonded to $V^1$ via the CyC group, the bond is preferably via the position marked "o" in the formulae depicted above, and so the symbol X marked "o" in that case is preferably C. The above-depicted structures for $L^1$ which do not contain any symbol X marked "o" are preferably not bonded directly to $V^1$, since such a bond to the bridge is not advantageous for steric reasons. When the sub-ligand $L^2$ is bonded to $V^2$ via the CyC group, the bond is preferably via the position ortho to the coordination to the Pt.

Preferably, a total of not more than two symbols X in CyC are N, more preferably not more than one symbol X in CyC is N, and most preferably all symbols X are CR, with the proviso that, when CyC is bonded to $V^1$ or $V^2$, one symbol X is C and V or $V^2$ is bonded to this carbon atom.

Particularly preferred CyC groups are the groups of the following formulae (CyC-1a) to (CyC-20a):

(CyC-1a)

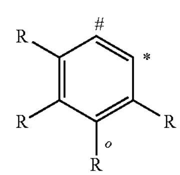

(CyC-1b)

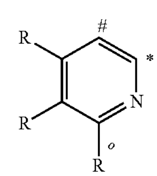

(CyC-1c)

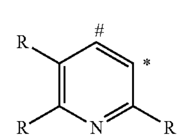

-continued
(CyC-1d)
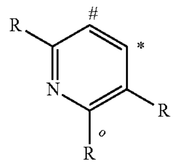
(CyC-1e)
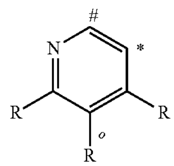
(CyC-1f)
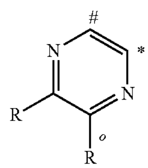
(CyC-1g)
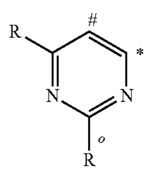
(CyC-1h)
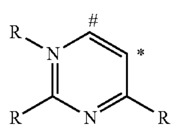
(CyC-2a)
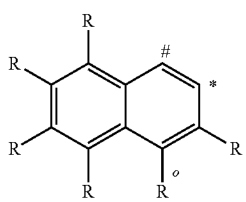
(CyC-2b)
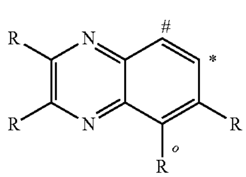
(CyC-3a)
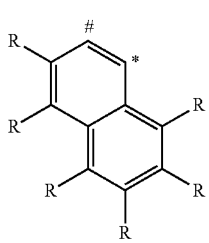
-continued
(CyC-3b)
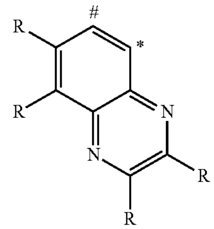
(CyC-4a)
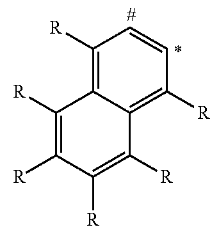
(CyC-4b)
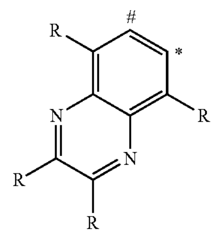
(CyC-5a)
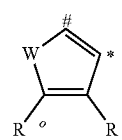
(CyC-6a)
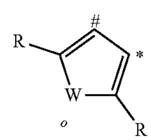
(CyC-7a)
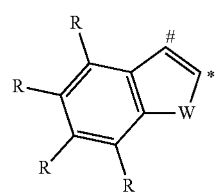
(CyC-8a)
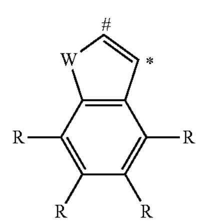
(CyC-9a)
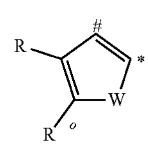

-continued (CyC-10a)

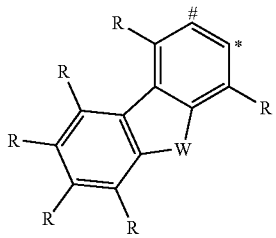

(CyC-11a)

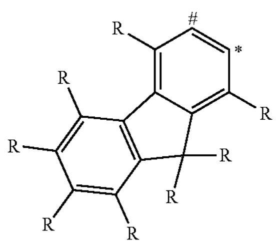

(CyC-12a)

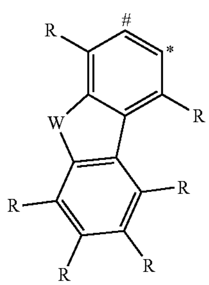

(CyC-13a)

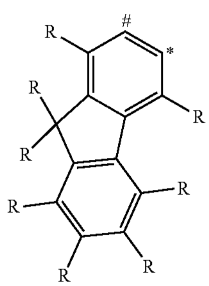

(CyC-14a)

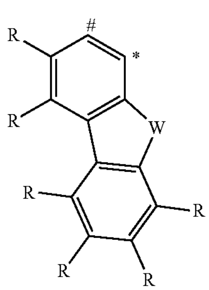

(CyC-15a)

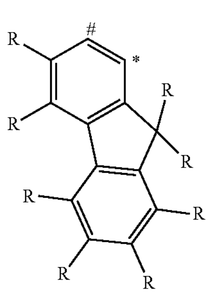

-continued (CyC-16a)

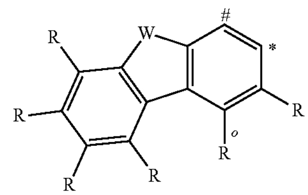

(CyC-17a)

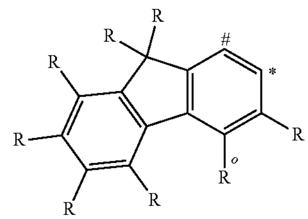

(CyC-18a)

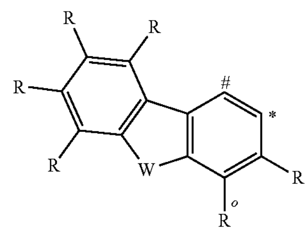

(CyC-19a)

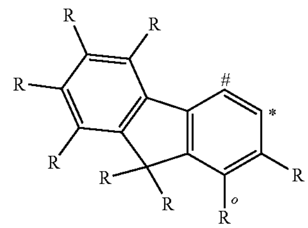

(CyC-20a)

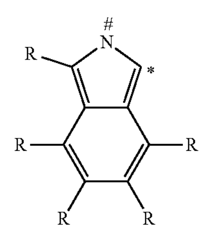

where the symbols have the definitions given above, with the proviso that, when the sub-ligand $L^1$ is bonded to $V^1$ via CyC, one R radical is absent and $V^1$ is bonded to the corresponding carbon atom, and additionally with the proviso that, when the sub-ligand $L^2$ is bonded to $V^2$ via CyC, one R radical is absent and $V^2$ is bonded to the corresponding carbon atom. When the sub-ligand $L^1$ is bonded to $V^1$ via the CyC group, the bond is preferably via the position marked "o" in the formulae depicted above, and so the R radical in the position marked "o" in that case is preferably absent. The above-depicted structures for $L^1$ which do not contain any carbon atom marked "o" are preferably not bonded directly to $V^1$, since such a bond to the bridge is not advantageous for steric reasons. When the sub-ligand $L^2$ is bonded to $V^2$ via CyC, the bond is preferably via the position ortho to the coordination to the Pt.

Preferred groups among the (CyC-1) to (CyC-20) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-14):

(CyD-1)

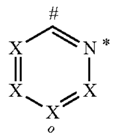

(CyD-2)

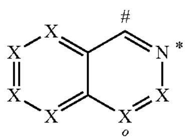

(CyD-3)

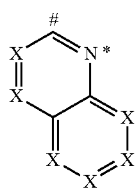

(CyD-4)

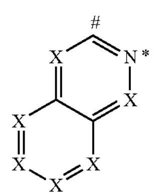

(CyD-5)

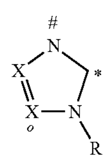

(CyD-6)

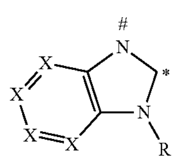

(CyD-7)

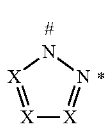

(Cyd-8)

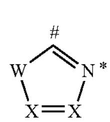

-continued (Cyd-9)

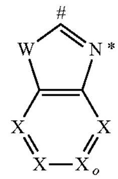

(CyD-10)

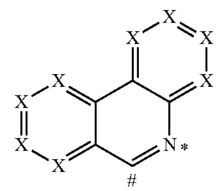

(CyD-11)

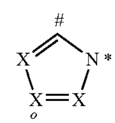

(CyD-12)

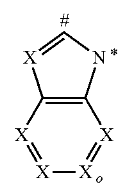

(CyD-13)

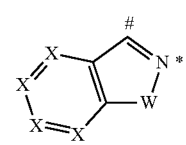

(CyD-14)

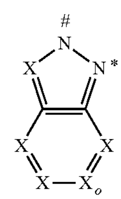

where the CyD group binds in each case to the position in CyC indicated by # and coordinates to the metal at the position indicated by *, and where X, W and R have the definitions given above, with the proviso that, when the sub-ligand $L^1$ is bonded to $V^1$ via CyD, one symbol X is C and $V^1$ is bonded to this carbon atom, and additionally with the proviso that, when the sub-ligand $L^2$ is bonded to $V^2$ via CyD, one symbol X is C and $V^2$ is bonded to this carbon atom. When the sub-ligand $L^1$ is bonded to $V^1$ via the CyD group, the bond is preferably via the position marked "o" in the formulae depicted above, and so the symbol X marked "o" in that case is preferably C. The above-depicted structures for $L^1$ which do not contain any symbol X marked "o" are preferably not bonded directly to $V^1$, since such a bond to the bridge is not advantageous for steric reasons. When the sub-ligand $L^2$ is bonded to $V^2$ via CyD, the bond is preferably via the position ortho to the coordination to the Pt.

In this case, the (CyD-1) to (CyD-4), (CyD-7) to (CyD-10), (CyD-13) and (CyD-14) groups coordinate to the metal via an uncharged nitrogen atom, the (CyD-5) and (CyD-6)

groups via a carbene carbon atom and the (CyD-11) and (CyD-12) groups via an anionic nitrogen atom.

Preferably, a total of not more than two symbols Xin CyD are N, more preferably not more than one symbol Xin CyD is N, and especially preferably all symbols X are CR, with the proviso that, when CyD is bonded to $V^1$ or $V^2$, one symbol X is C and $V^1$ or $V^2$ is bonded to this carbon atom.

Particularly preferred CyD groups are the groups of the following formulae (CyD-11a) to (CyD-14b):

(CyD-1a)

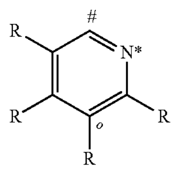

(CyD-2a)

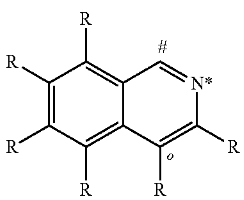

(CyD-3a)

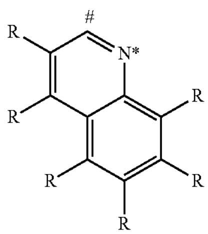

(CyD-3b)

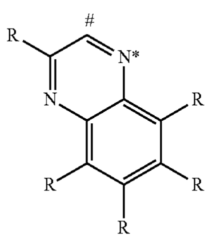

(CyD-4a)

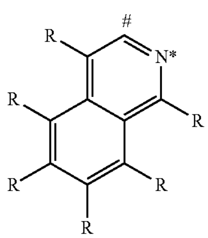

(CyD-5a)

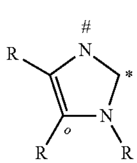

-continued (CyD-6a)

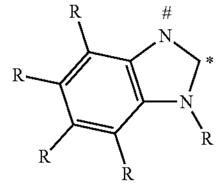

(CyD-7a)

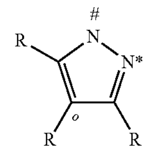

(CyD-8a)

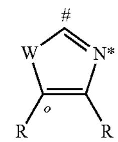

(CyD-9a)

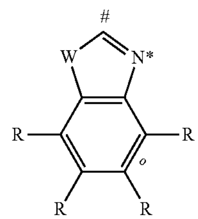

(CyD-10a)

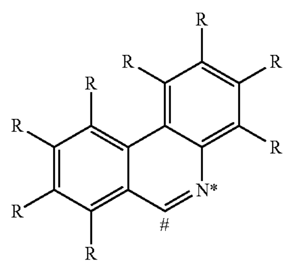

(CyD-11a)

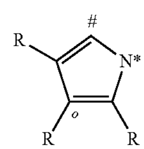

(CyD-11b)

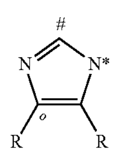

(CyD-11c)

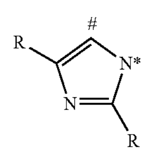

(CyD-11d)

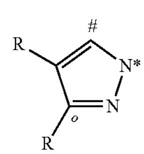

-continued (CyD-12a)

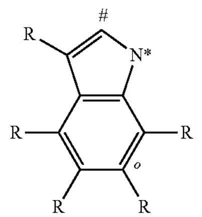

(CyD-12b)

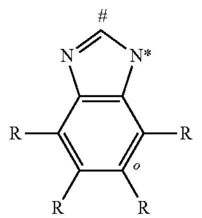

(CyD-13a)

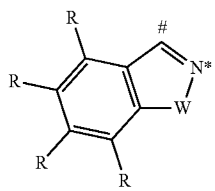

(CyD-14a)

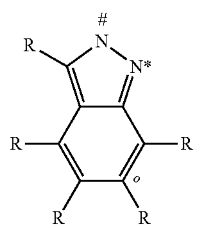

(CyD-14b)

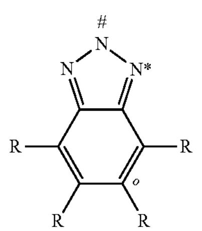

where the symbols used have the definitions given above and, when CyD is bonded to $V^1$ or $V^2$, one R radical is absent and $V^1$ or $V^2$ is bonded to the corresponding carbon atom. When the sub-ligand $L^1$ is bonded to $V^1$ via the CyD group, the bond is preferably via the position marked "o" in the formulae depicted above, and so the corresponding R radical in that case is preferably absent. The above-depicted structures for $L^1$ which do not contain any carbon atom marked "o" are preferably not bonded directly to $V^1$, since such a bond to the bridge is not advantageous for steric reasons. When the sub-ligand $L^2$ is bonded to $V^2$ via the CyD group, the bond is preferably via the position ortho to the coordination to the Pt.

Preferred groups among the (CyD-1) to (CyD-14) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, especially phenyl, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-14) groups may be combined with one another as desired in the sub-ligands of the formulae (L-1) and (L-2), provided that at least one of the CyC or CyD groups has a suitable attachment site to the $V^1$ or $V^2$ groups. It is especially preferable when the CyC and CyD groups specified above as particularly preferred, i.e. the groups of the formulae (CyC-1a) to (CyC-20a) and the groups of the formulae (CyD1-a) to (CyD-14b), are combined with one another, provided that at least one of the preferred CyC or CyD groups has a suitable attachment site to $V^1$ or $V^2$.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred sub-ligands (L-1) are the structures of the following formulae (L-1-1) and (L-1-2), and preferred sub-ligands (L-2) are the structures of the following formulae (L-2-1) to (L-2-3):

(L-1-1)

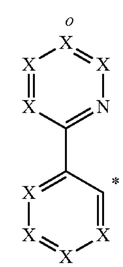

(L-1-2)

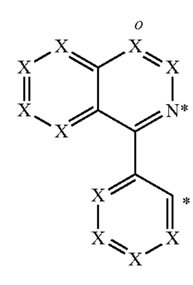

(L-2-1)

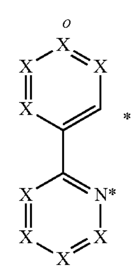

-continued (L-2-2)

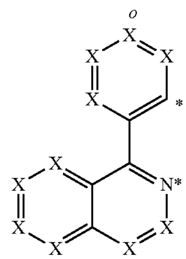

(L-2-3)

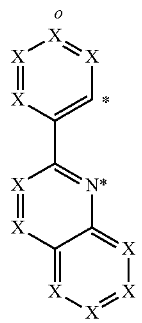

where the symbols used have the definitions given above, * indicates the position of the coordination to the Ir or the Pt and "o" represents the position of the bond to $V^1$ if the structures are an embodiment of $L^1$. If the structures are an embodiment of $L^2$, $V^2$ is preferably bonded in a position ortho to the coordination to the Pt. In that case, the symbol X to which $V^1$ or $V^2$ is bonded is C.

More preferably, in these structures, X is the same or different at each instance and is CR, and so the structures are preferably those of the following formulae (L-1-1a) to (L-2-3a):

(L-1-1a)

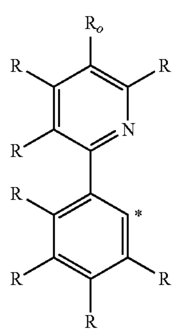

(L-1-2a)

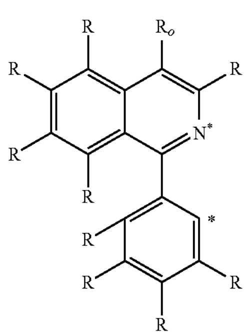

-continued (L-2-1a)

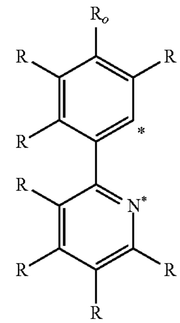

(L-2-2a)

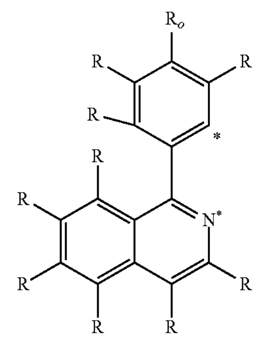

(L-2-3a)

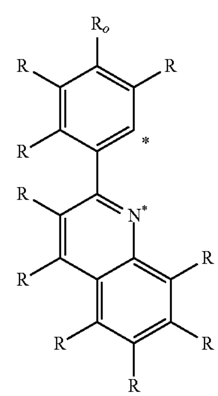

where the symbols used have the definitions given above and "o" represents the position of the bond to $V^1$ if the structures are an embodiment of $L^1$. If the structures are an embodiment of $L^2$, $V^2$ is preferably bonded in a position ortho to the coordination to the Pt. In that case, the R radical on the carbon atom to which $V^1$ or $V^2$ is bonded is absent.

It is likewise possible for the abovementioned preferred CyD groups in the sub-ligands of the formula (L-3) to be combined with one another as desired, by combining an uncharged CyD group, i.e. a (CyD-1) to (CyD-10), (CyD-13) or (CyD-14) group, with an anionic CyD group, i.e. a (CyD-11) or (CyD-12) group, or by combining two uncharged CyD groups with one another, provided that at least one of the CyD groups has a suitable attachment site to $V^1$ or $V^2$.

When two R radicals, one of them bonded to CyC and the other to CyD in the formulae (L-1) and (L-2) or one of them bonded to one CyD group and the other to the other CyD group in formula (L-3), form an aromatic ring system with one another, this may result in bridged sub-ligands and also in sub-ligands which represent a single larger heteroaryl group overall, for example benzo[h]quinoline, etc. The ring formation between the substituents on CyC and CyD in the formulae (L-1) and (L-2) or between the substituents on the two CyD groups in formula (L-3) is preferably via a group according to one of the following formulae (39) to (48):

formula (39)

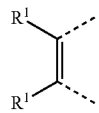

formula (40)

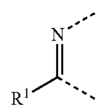

formula (41)

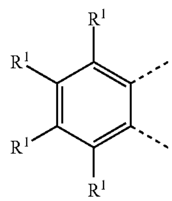

formula (42)

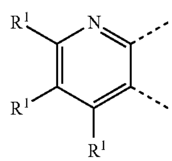

formula (43)

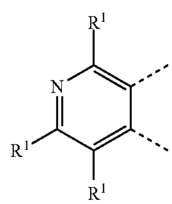

formula (44)

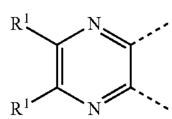

formula (45)

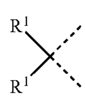

formula (46)

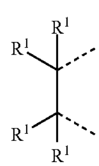

formula (47)

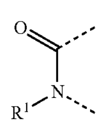

formula (48)

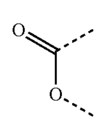

where $R^1$ has the definitions given above and the dotted bonds signify the bonds to CyC or CyD. At the same time, the unsymmetric groups among those mentioned above may be incorporated in each of the two possible orientations; for example, in the group of the formula (48), the oxygen atom may bind to the CyC group and the carbonyl group to the CyD group, or the oxygen atom may bind to the CyD group and the carbonyl group to the CyC group.

At the same time, the group of the formula (45) is preferred particularly when this results in ring formation to give a six-membered ring, as shown below, for example, by the formulae (L-22) and (L-23).

Preferred ligands which arise through ring formation between two R radicals in the different cycles are the structures of the formulae (L-4) to (L-31) shown below:

(L-4)

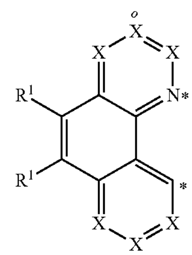

(L-5)

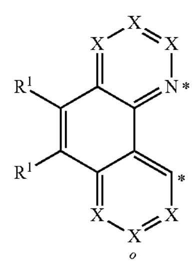

(L-6)

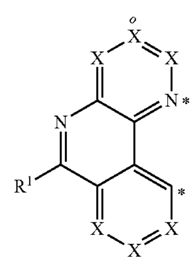

(L-7)

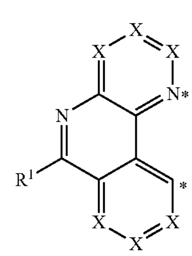

-continued
(L-8)
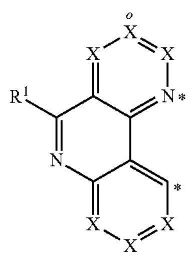
(L-9)
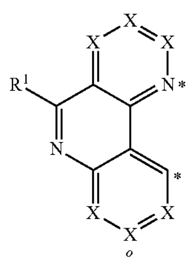
(L-10)
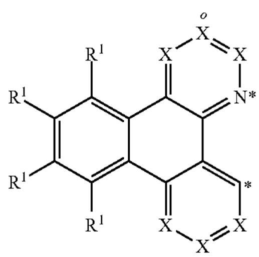
(L-11)
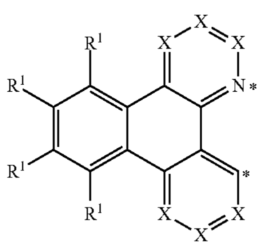
(L-12)
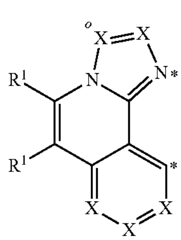
(L-13)
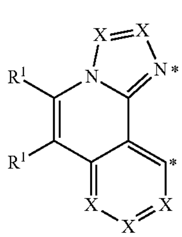
-continued
(L-14)
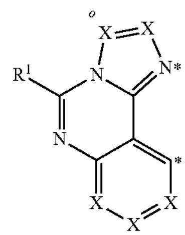
(L-15)
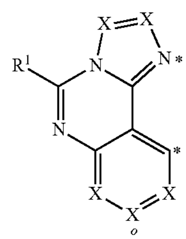
(L-16)
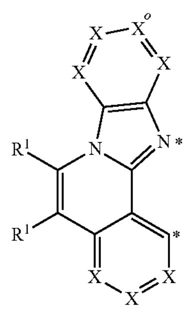
(L-17)
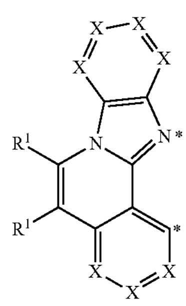
(L-18)
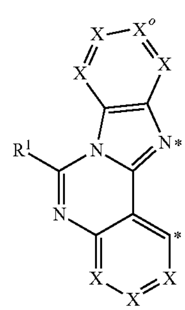

(L-19)
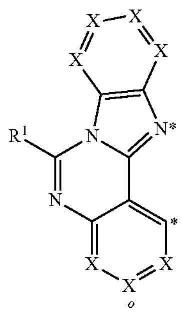
(L-20)
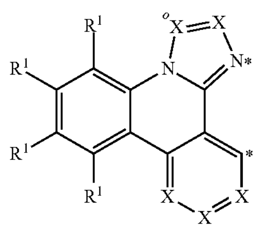
(L-21)
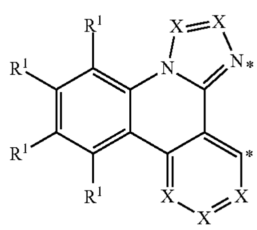
(L-22)
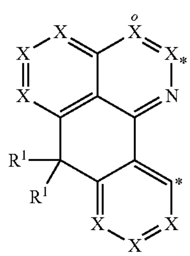
(L-23)
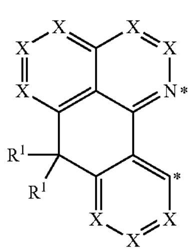
(L-24)
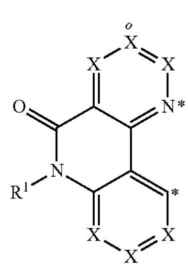
(L-25)
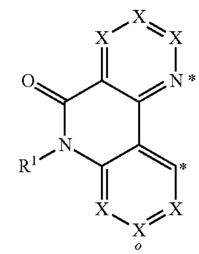
(L-26)
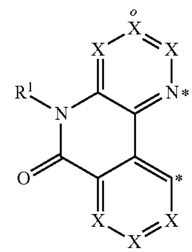
(L-27)
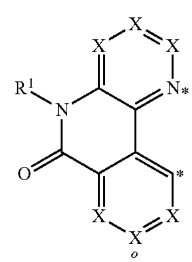
(L-28)
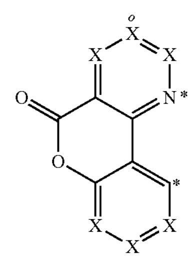
(L-29)
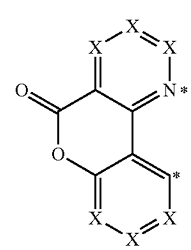
(L-30)
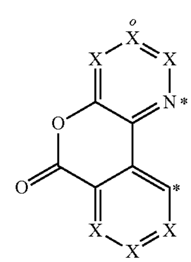

-continued (L-31)

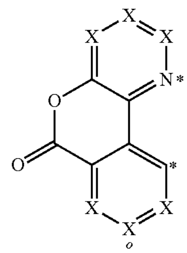

where the symbols used have the definitions given above and "o" gives the position at which this sub-ligand is joined to $V^1$ in the case of an embodiment of $L^1$. If the structures are an embodiment of $L^2$, $V^2$ is preferably bonded in a position ortho to the coordination to the Pt. In that case, the symbol X to which $V^1$ or $V^2$ is bonded is carbon.

In a preferred embodiment of the sub-ligands of the formulae (L-4) to (L-31), a total of one symbol X is N and the other symbols X are CR, or all symbols X are CR.

In a further embodiment of the invention, it is preferable if, in the groups (CyC-1) to (CyC-20) or (CyD-1) to (CyD-14) or in the sub-ligands (L-1-1) to (L-2-3), (L-4) to (L-31), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. In this case, this substituent R is preferably a group selected from $CF_3$, $OR^1$ where $R^1$ is an alkyl group having 1 to 10 carbon atoms, alkyl groups having 1 to 10 carbon atoms, especially branched or cyclic alkyl groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

Further suitable bidentate sub-ligands $L^1$ or $L^2$ are the sub-ligands of the following formulae (L-32) or (L-33):

(L-32)

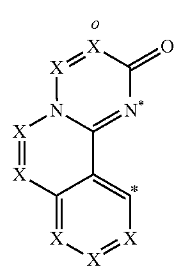

(L-33)

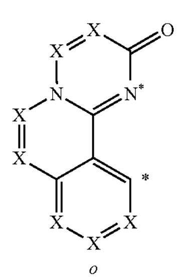

where R has the definitions given above, * represents the position of coordination to the metal, "o" represents the position of linkage of the sub-ligand to $V^1$ in the case of an embodiment of $L^1$, and the other symbols used are as follows:

X is the same or different at each instance and is CR or N, with the proviso that not more than one symbol X per cycle is N, and additionally with the proviso that one symbol X is C and the sub-ligand is bonded to $V^1$ or $V^2$ via this carbon atom.

When (L-32) or (L-33) is an embodiment of $L^2$, the bond to $V^2$ on the cycle that coordinates to the Pt via the carbon atom is in the ortho position to this carbon atom.

When two R radicals bonded to adjacent carbon atoms in the sub-ligands (L-32) and (L-33) form an aromatic cycle with one another, this cycle together with the two adjacent carbon atoms is preferably a structure of the following formula (49):

formula (49)

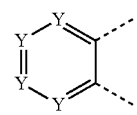

where the dotted bonds symbolize the linkage of this group within the sub-ligand and Y is the same or different at each instance and is $CR^1$ or N, where preferably not more than one symbol Y is N. In a preferred embodiment of the sub-ligand (L-32) or (L-33), not more than one group of the formula (50) is present. In a preferred embodiment of the invention, in the sub-ligand of the formulae (L-32) and (L-33), a total of 0, 1 or 2 of the symbols X and, if present, Y are N. More preferably, a total of 0 or 1 of the symbols X and, if present, Y are N.

Further suitable bidentate sub-ligands $L^1$ or $L^2$ are the structures of the following formulae (L-34) to (L-38), where preferably not more than one of the two bidentate sub-ligands L is one of these structures, (L-34)

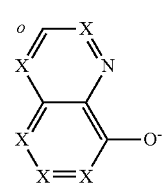

(L-35)

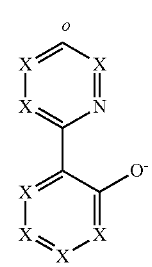

-continued (L-36)

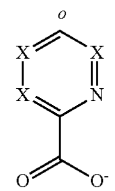

(L-37)

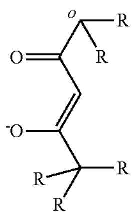

(L-38)

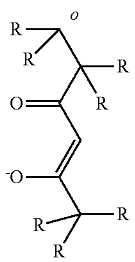

where the sub-ligands (L-34) to (L-36) each coordinate to the metal via the nitrogen atom explicitly shown and the negatively charged oxygen atom, and the sub-ligands (L-37) and (L-38) coordinate to the metal via the two oxygen atoms, X has the definitions given above and "o" indicates the position via which the sub-ligand $L^1$ is joined to $V^1$ or the sub-ligand $L^2$ to $V^2$. When (L-35) is an embodiment of $L^2$, it is also preferable when $V^2$ is a single bond.

Preferred sub-ligands of the formulae (L-34) to (L-36) are the sub-ligands of the following formulae (L-34a) to (L-36a):

(L-34a)

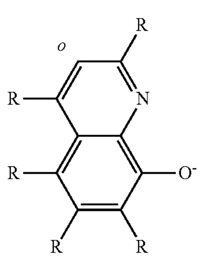

(L-35a)

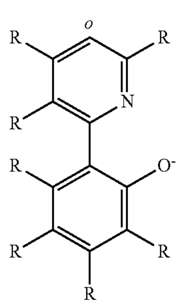

-continued (L-36a)

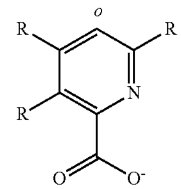

where the symbols used have the definitions given above and "o" indicates the position via which the sub-ligand $L^1$ is joined to $V^1$ or the sub-ligand $L^2$ to $V^2$.

More preferably, in these formulae, R is hydrogen, where "o" indicates the position via which the sub-ligand $L^1$ is joined to $V^1$ or $L^2$ to $V^2$, and so the structures are those of the following formulae (L-34b) to (L-36b):

(L-34b)

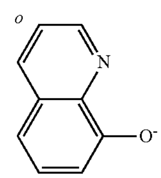

(L-35b)

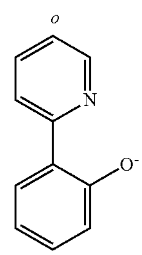

(L-36b)

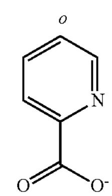

where the symbols used have the definitions given above.

When the sub-ligands $L^1$ and/or $L^2$ as monoanionic sub-ligands coordinate to the iridium or platinum via two nitrogen atoms, they are preferably the same or different and are sub-ligands of one of the following formulae (L-39), (L-40) and (L-41):

(L-39)

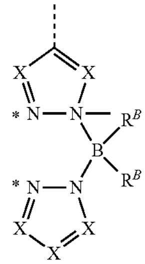

-continued (L-40)

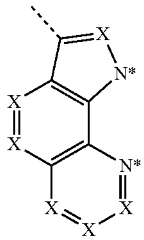

(L-41)

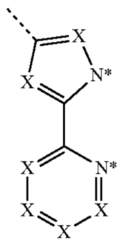

where X and $R^1$ have the definitions given above, and where not more than one X group per ring is N, and $R^B$ is the same or different at each instance and is selected from the group consisting of F, $OR^1$, a straight-chain alkyl group having 1 to 10 carbon atoms or a branched or cyclic alkyl group having 3 to 10 carbon atoms, where the alkyl group may be substituted in each case by one or more $R^1$ radicals, or an aromatic or heteroaromatic ring system which has 5 to 24 aromatic ring atoms and may be substituted in each case by one or more $R^1$ radicals; at the same time, the two $R^B$ radicals together may also form a ring system. In this case, the sub-ligands coordinate to the iridium or platinum via the two nitrogen atoms marked by *.

There follows a description of preferred substituents as may be present on the above-described sub-ligands, but also on A when A is a group of the formula (4).

In one embodiment of the invention, the compound of the invention contains two substituents R which are bonded to adjacent carbon atoms and together form an aliphatic ring according to one of the formulae described hereinafter. In this case, the two R substituents which form this aliphatic ring may be present on the bridge of the formulae (2) or (3) or the preferred embodiments and/or on one or more of the bidentate sub-ligands $L^1$ and/or $L^2$. The aliphatic ring which is formed by the ring formation by two substituents R together is preferably described by one of the following formulae (50) to (56):

formula (50)

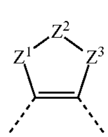

formula (51)

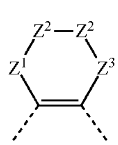

-continued formula (52)

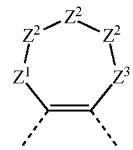

formula (53)

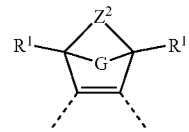

formula (54)

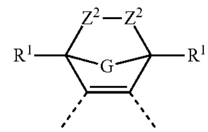

formula (55)

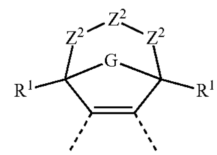

formula (56)

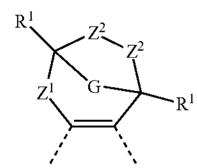

where $R^1$ and $R^2$ have the definitions given above, the dotted bonds signify the linkage of the two carbon atoms in the ligand and, in addition:

Z, $Z^3$ is the same or different at each instance and is $C(R)_2$, O, S, $NR^3$ or C(=O);

$Z^2$ is $C(R^1)_2$, O, S, $NR^3$ or C(=O);

G is an alkylene group which has 1, 2 or 3 carbon atoms and may be substituted by one or more $R^2$ radicals, $—CR^2=CR^2—$ or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C=CR^2$, C≡C, $Si(R^2)_2$, C=O, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system;

with the proviso that no two heteroatoms in these groups are bonded directly to one another and no two C=O groups are bonded directly to one another.

In a preferred embodiment of the invention, $R^3$ is not H.

In the above-depicted structures of the formulae (50) to (56) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (50) to (52) is achieved by virtue of $Z^1$ and $Z^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention.

Thus, the absence of acidic benzylic protons in formulae (53) to (56) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (53) to (56) is H, this is therefore a non-acidic proton in the context of the present application.

In a preferred embodiment of the structure of the formulae (50) to (56), not more than one of the $Z^1$, $Z^2$ and $Z^3$ groups is a heteroatom, especially O or $NR^3$, and the other groups are $C(R)_2$ or $C(R^1)_2$, or $Z^1$ and $Z^3$ are the same or different at each instance and are O or $NR^3$ and $Z^2$ is $C(R)_2$. In a particularly preferred embodiment of the invention, $Z^1$ and $Z^3$ are the same or different at each instance and are $C(R^3)_2$, and $Z^2$ is $C(R)_2$ and more preferably $C(R^3)_2$ or $CH_2$.

Preferred embodiments of the formula (50) are thus the structures of the formulae (50-A), (50-B), (50-C) and (50-D), and a particularly preferred embodiment of the formula (50-A) is the structures of the formulae (50-E) and (50-F):

formula (50-A)

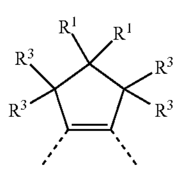

formula (50-B)

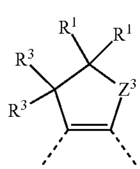

-continued formula (50-C)

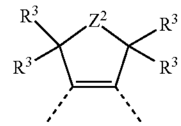

formula (50-D)

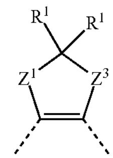

formula (50-E)

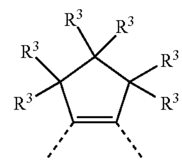

formula (50-F)

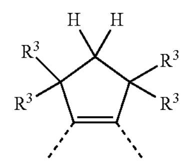

where $R^1$ and $R^3$ have the definitions given above and $Z^1$, $Z^2$ and $Z^3$ are the same or different at each instance and are O or $NR^3$.

Preferred embodiments of the formula (51) are the structures of the following formulae (51-A) to (51-F):

formula (51-A)

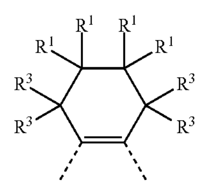

formula (51-B)

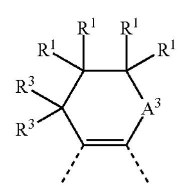

formula (51-C)

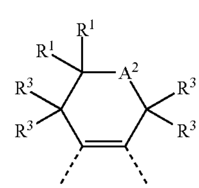

formula (51-D)

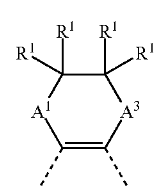

-continued formula (51-E)

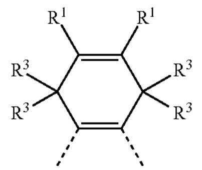

formula (51-F)

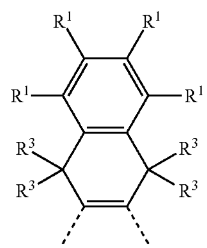

where $R^1$ and $R^3$ have the definitions given above and $Z^1$, $Z^2$ and $Z^3$ are the same or different at each instance and are O or $NR^3$.

Preferred embodiments of the formula (52) are the structures of the following formulae (52-A) to (52-E):

formula (52-A)

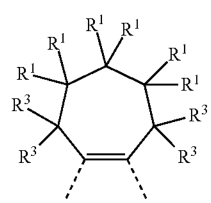

formula (52-B)

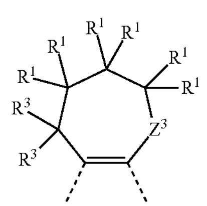

formula (52-C)

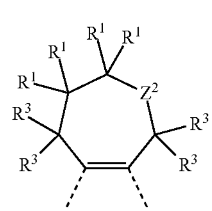

formula (52-D)

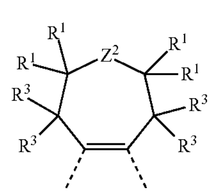

-continued formula (52-E)

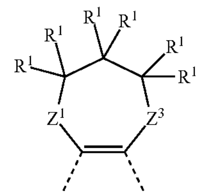

where $R^1$ and $R^3$ have the definitions given above and $Z^1$, $Z^2$ and $Z^3$ are the same or different at each instance and are O or $NR^3$.

In a preferred embodiment of the structure of formula (53), the $R^1$ radicals bonded to the bridgehead are H, D, F or $CH_3$. Further preferably, $Z^2$ is $C(R^1)_2$ or O, and more preferably $C(R^3)_2$. Preferred embodiments of the formula (53) are thus structures of the formulae (53-A) and (53-B), and a particularly preferred embodiment of the formula (53-A) is a structure of the formula (53-C):

formula (53-A)

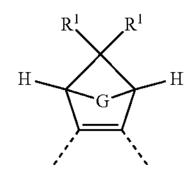

formula (53-B)

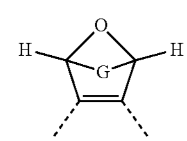

formula (53-C)

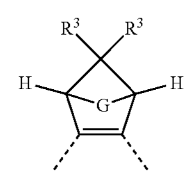

where the symbols used have the definitions given above.

In a preferred embodiment of the structure of formulae (54), (55) and (56), the $R^1$ radicals bonded to the bridgehead are H, D, F or $CH_3$. Further preferably, $Z^2$ is $C(R^1)_2$. Preferred embodiments of the formulae (54), (55) and (56) are thus the structures of the formulae (54-A), (55-A) and (56-A):

formula (54-A)

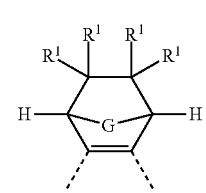

-continued formula (55-A)

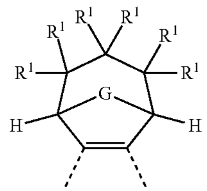

formula (56-A)

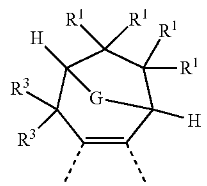

where the symbols used have the definitions given above.

Further preferably, the G group in the formulae (53), (53-A), (53-B), (53-C), (54), (54-A), (55), (55-A), (56) and (56-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (50) to (56) and in the preferred embodiments is the same or different at each instance and is F, a straight-chain alkyl group having 1 to 10 carbon atoms or a branched or cyclic alkyl group having 3 to 20 carbon atoms, where one or more nonadjacent $CH_2$ groups in each case may be replaced by $R^2C{=}CR^2$ and one or more hydrogen atoms may be replaced by D or F, or an aromatic or heteroaromatic ring system which has 5 to 14 aromatic ring atoms and may be substituted in each case by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (50) to (56) and in the preferred embodiments is the same or different at each instance and is F, a straight-chain alkyl group having 1 to 3 carbon atoms, especially methyl, or an aromatic or heteroaromatic ring system which has 5 to 12 aromatic ring atoms and may be substituted in each case by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (50) are the groups depicted below:

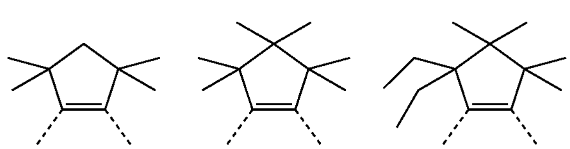

-continued

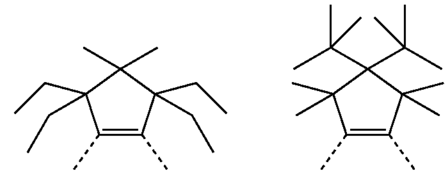

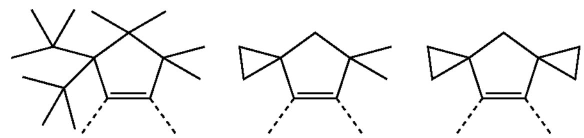

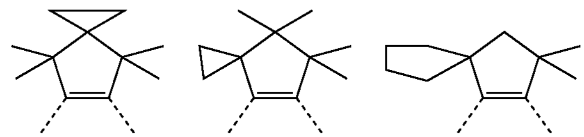

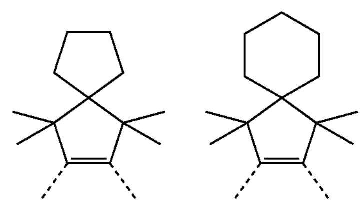

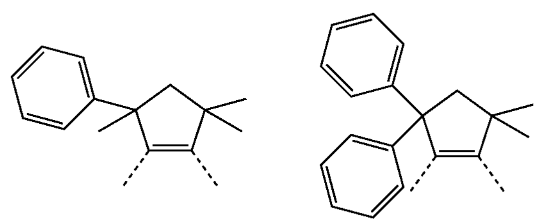

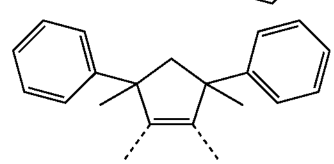

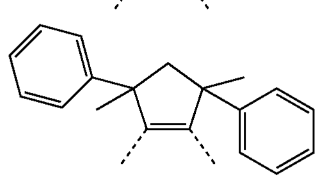

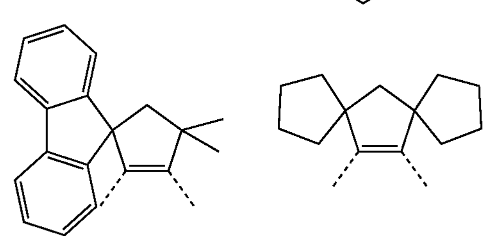

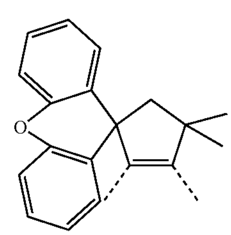

-continued
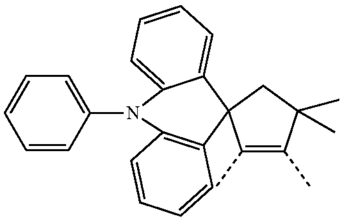
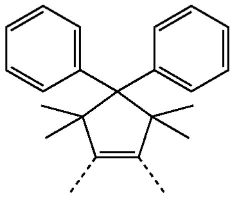
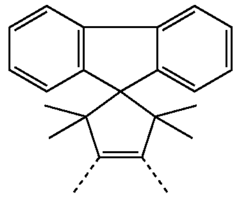
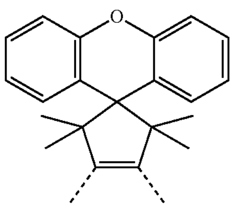
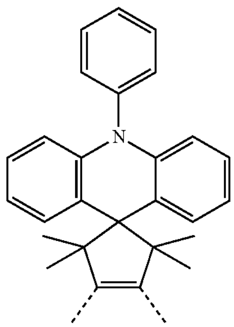
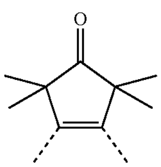
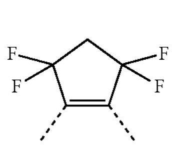
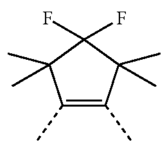
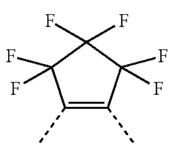
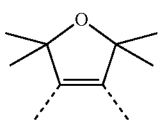
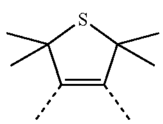
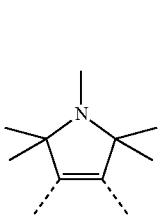
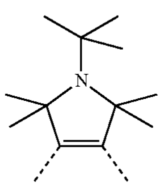
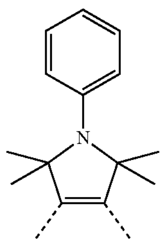
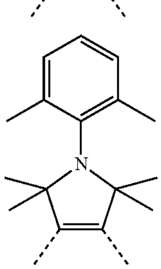
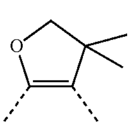
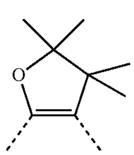
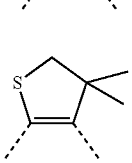
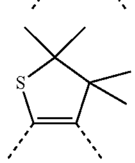
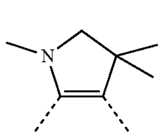
-continued
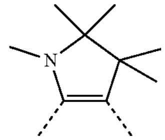
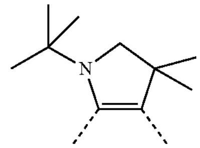
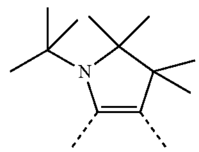
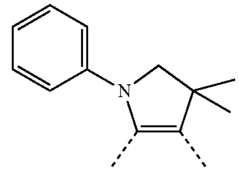
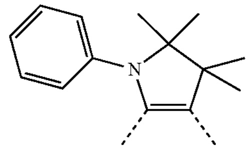
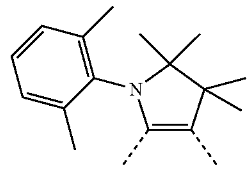
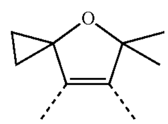
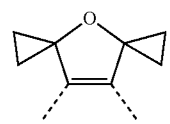
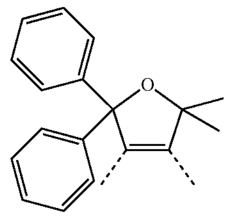
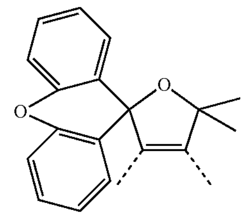
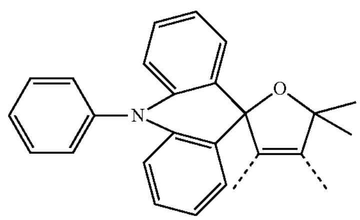
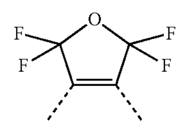
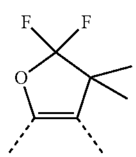
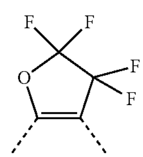
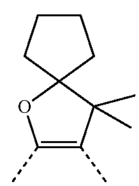
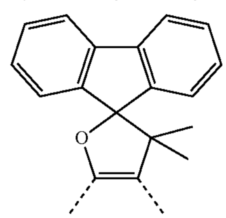
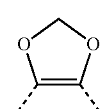
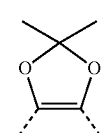
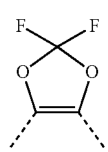
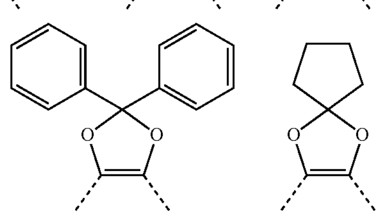

-continued
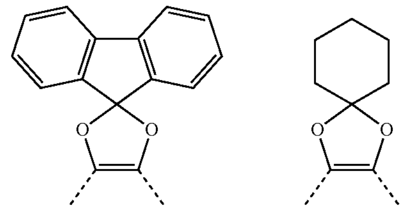
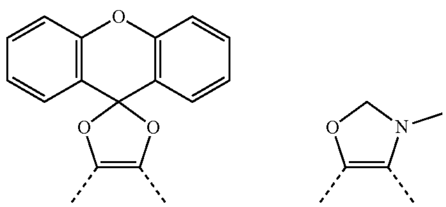
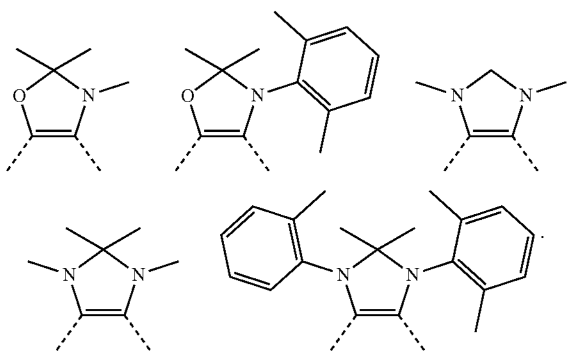
Examples of particularly suitable groups of the formula (51) are the groups depicted below:
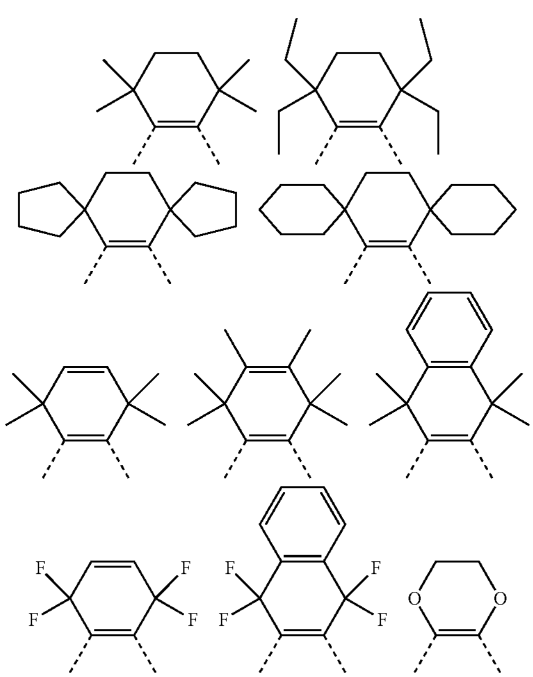
-continued
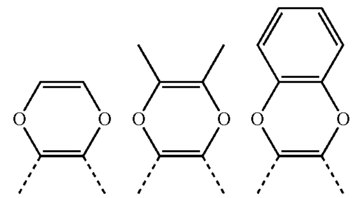
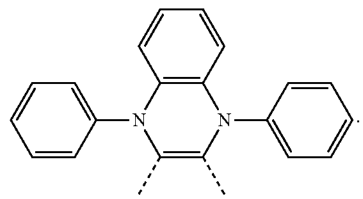
Examples of particularly suitable groups of the formulae (52), (55) and (56) are the groups depicted below:
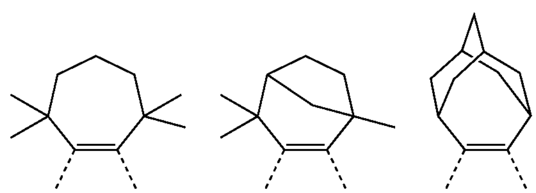
Examples of particularly suitable groups of the formula (53) are the groups depicted below:
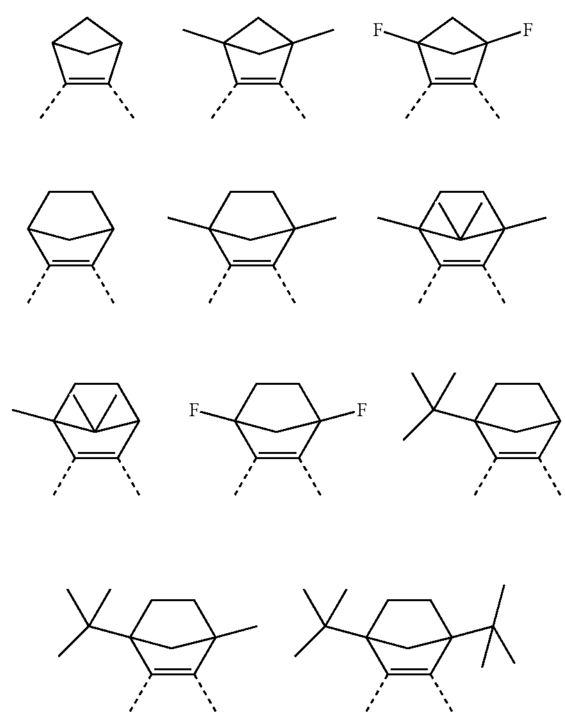

-continued

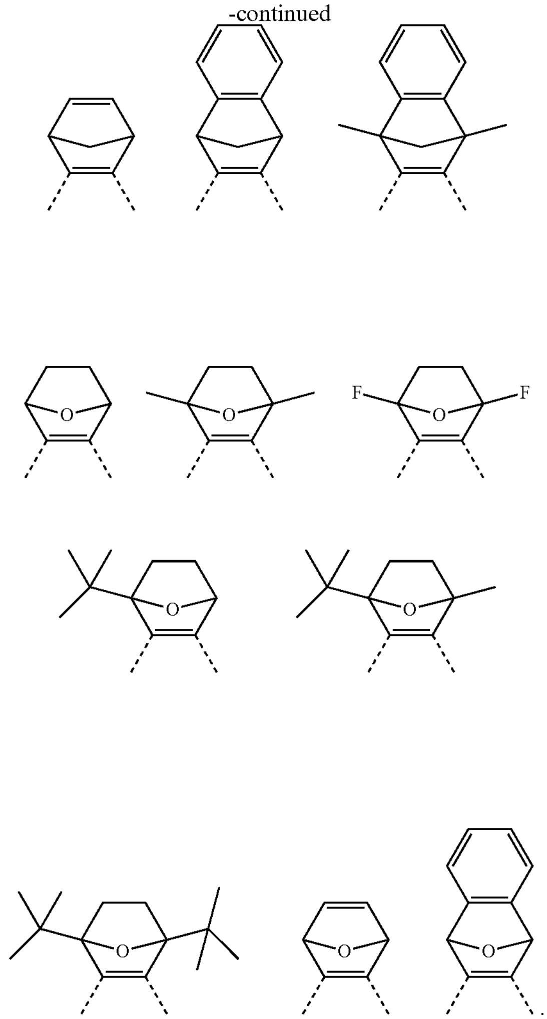

Examples of particularly suitable groups of the formula (54) are the groups depicted below:

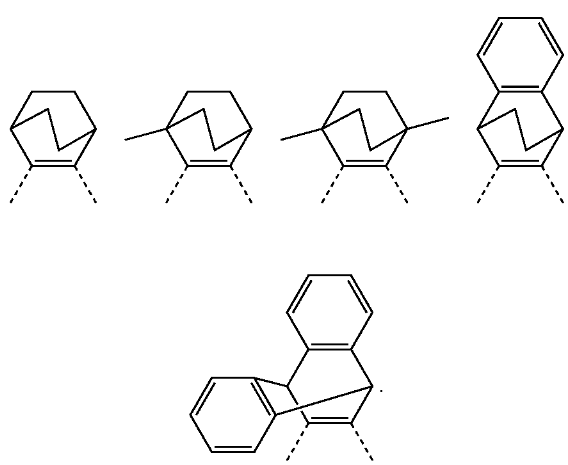

When R radicals are bonded within the bidentate sub-ligands or ligands or within the bivalent arylene or heteroarylene groups of the formula (4) bonded within the formulae (2) to (3) or the preferred embodiments, these R radicals are the same or different at each instance and are preferably selected from the group consisting of H, D, F, Br, I, $N(R^1)_2$, $OR^1$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms, preferably 6 to 13 aromatic ring atoms, and may be substituted in each case by one or more R radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, $OR^2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13 aromatic ring atoms, preferably 6 to 13 aromatic ring atoms, and may be substituted in each case by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

The abovementioned preferred embodiments are combinable with one another as desired within the limits of Claim 1. In a particularly preferred embodiment of the invention, the abovementioned preferred embodiments apply simultaneously.

Examples of compounds of the invention are the structures adduced below.

1
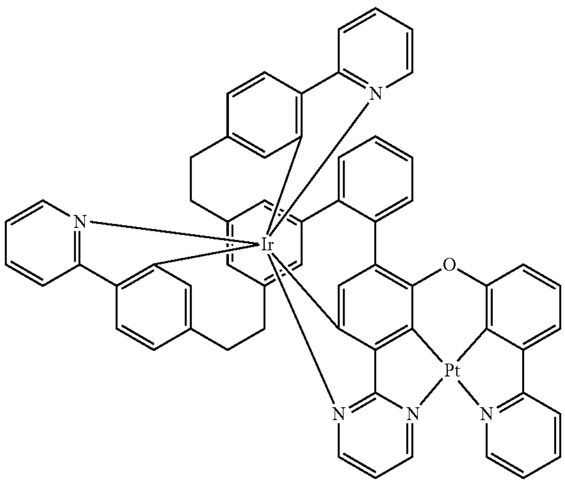
2
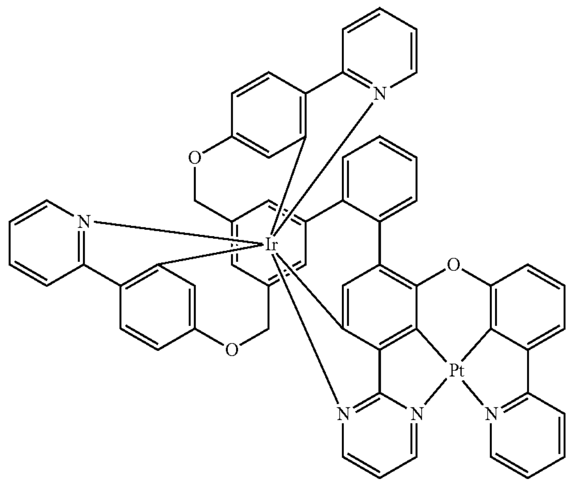
3
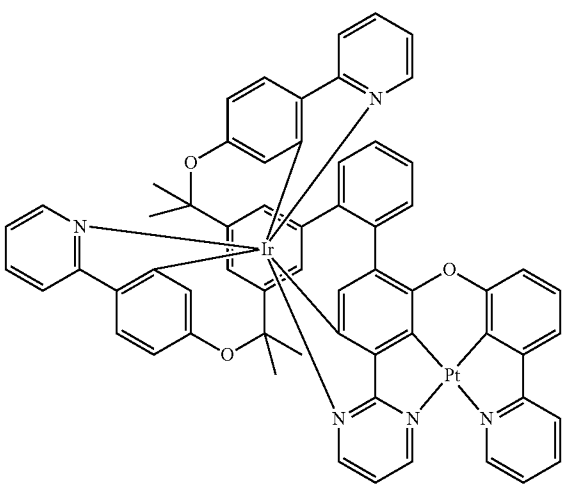
4
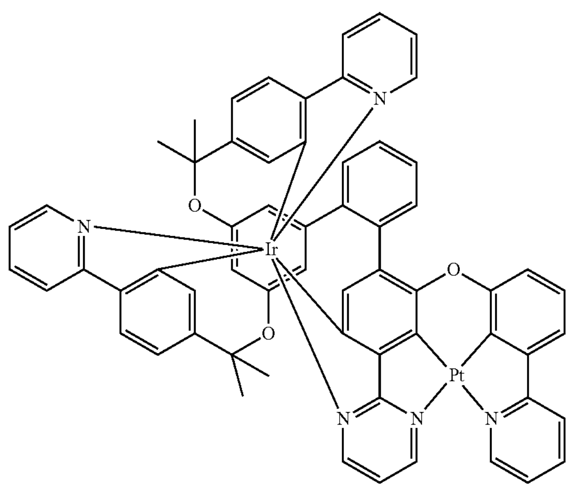
5
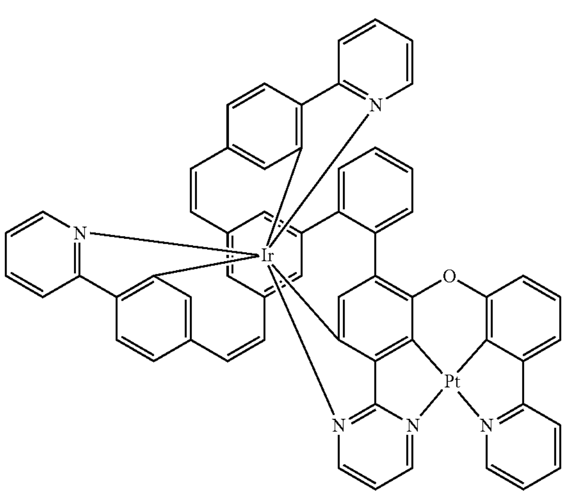
6
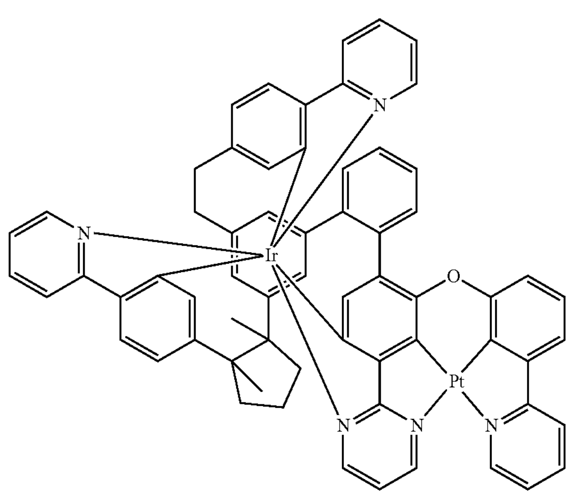

-continued
7
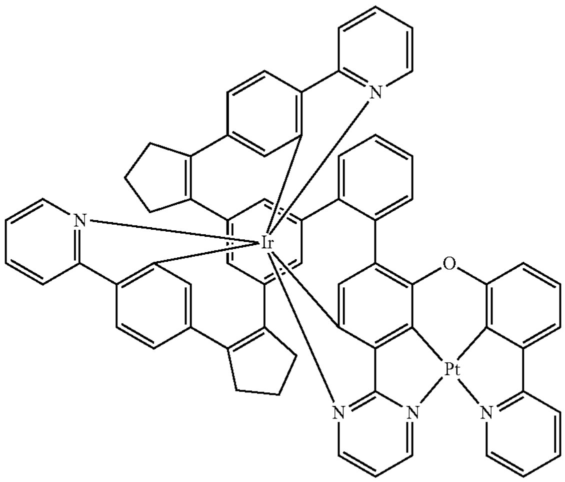
8
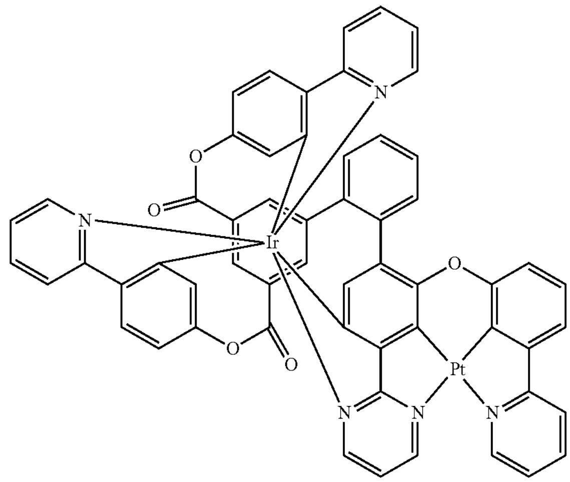
9
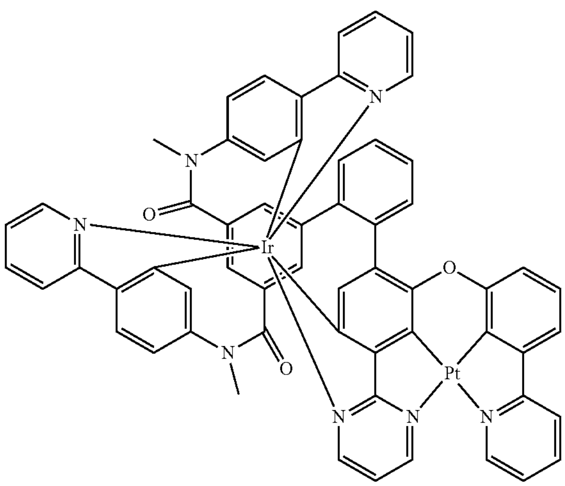
10
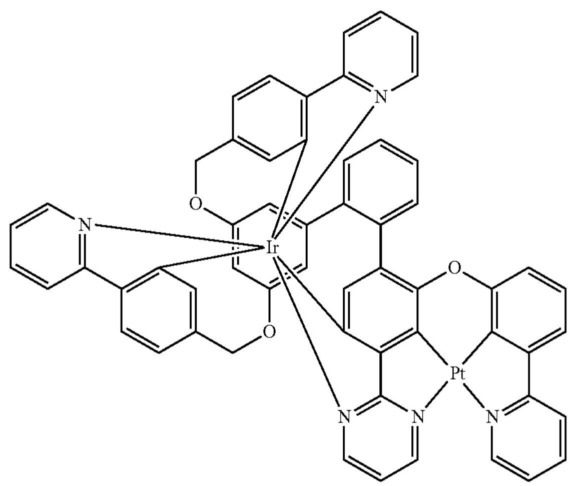
11
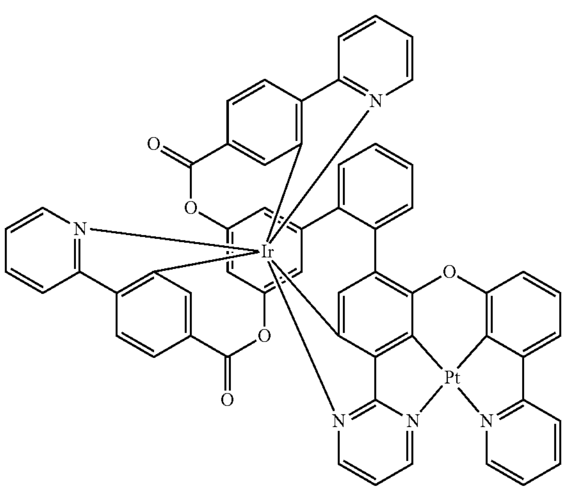
12
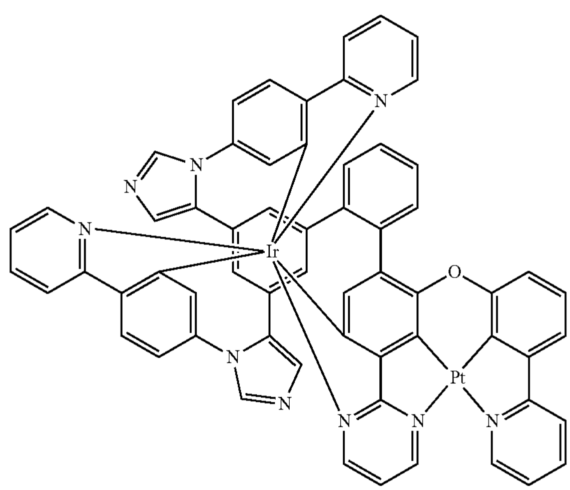

-continued
13
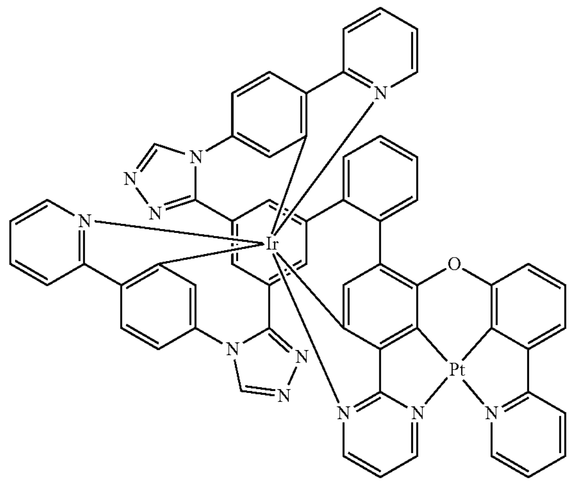
14
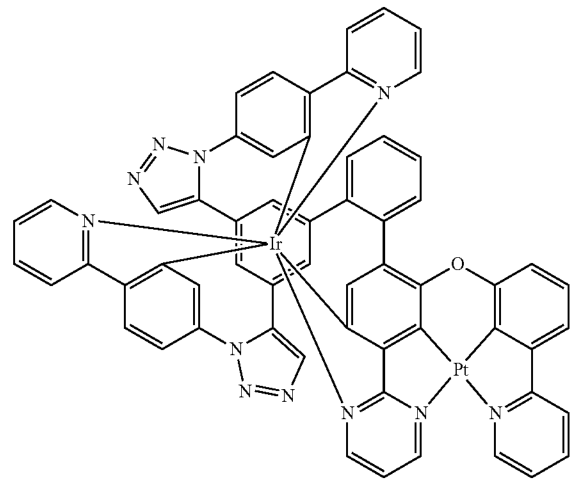
15
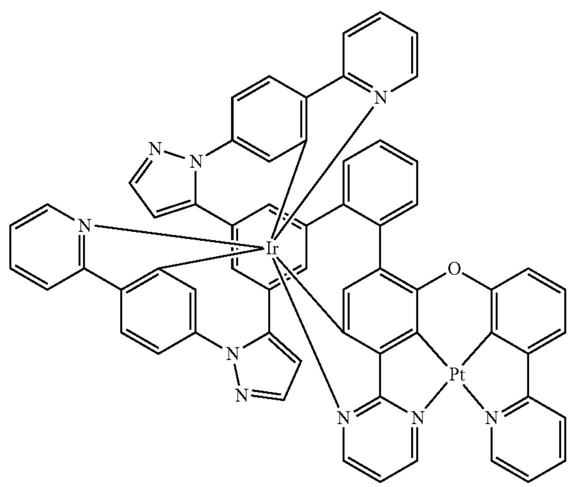
16
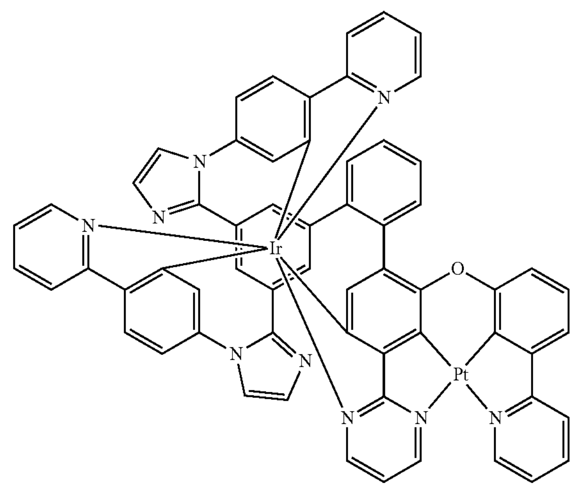
17
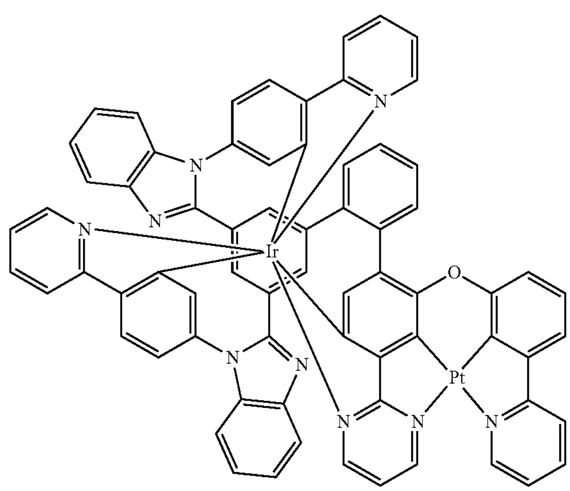
18
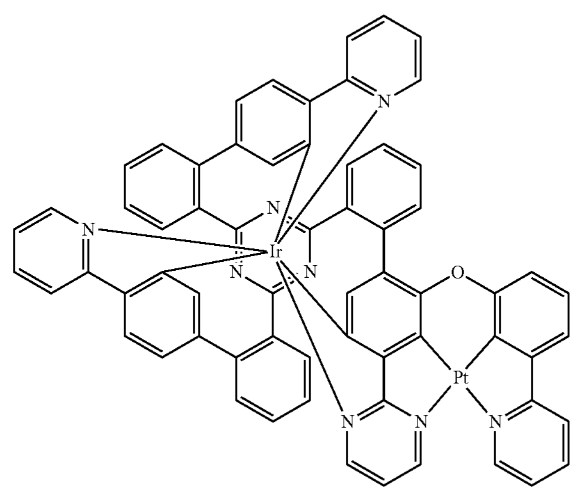

-continued
19
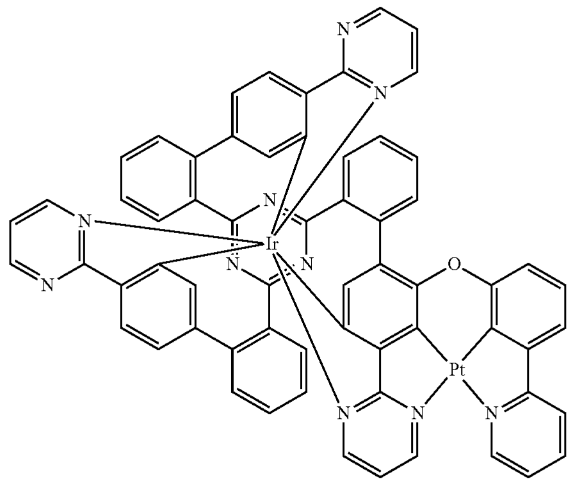
20
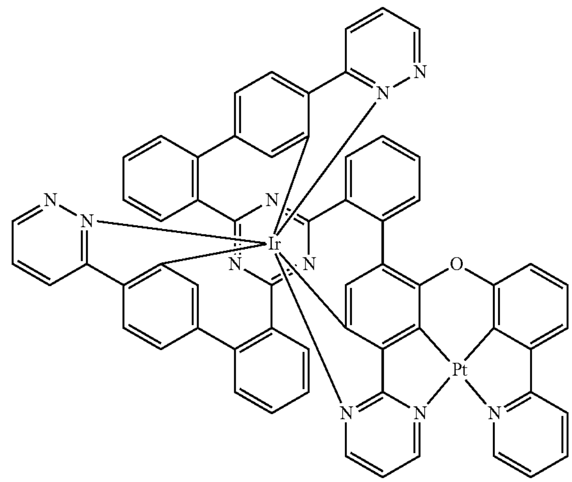
21
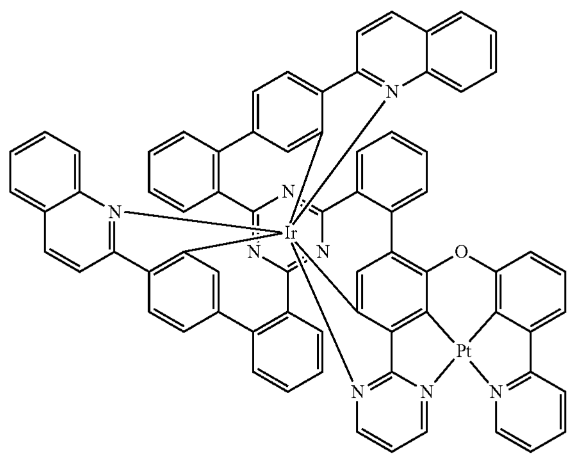
22
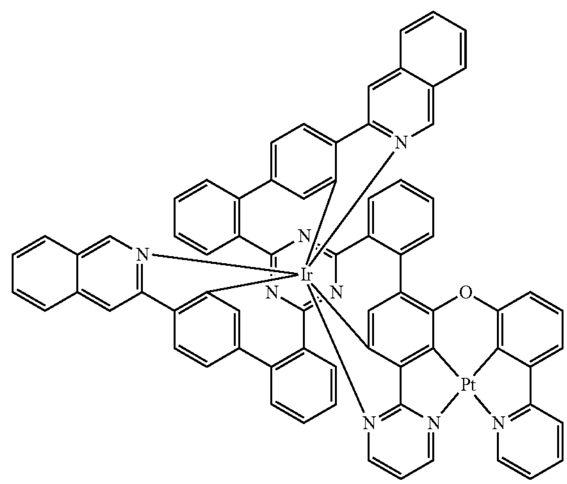
23
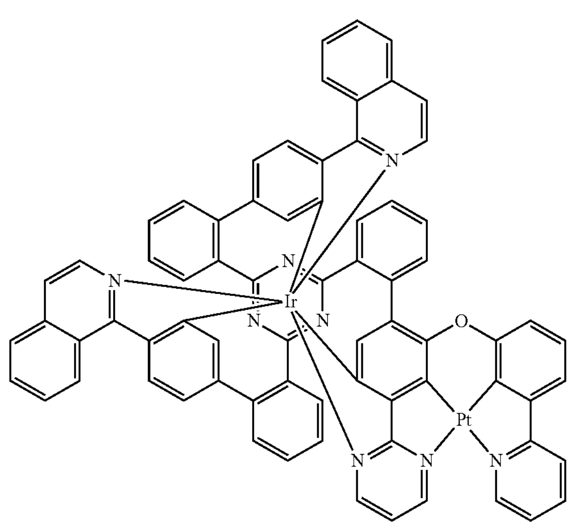
24
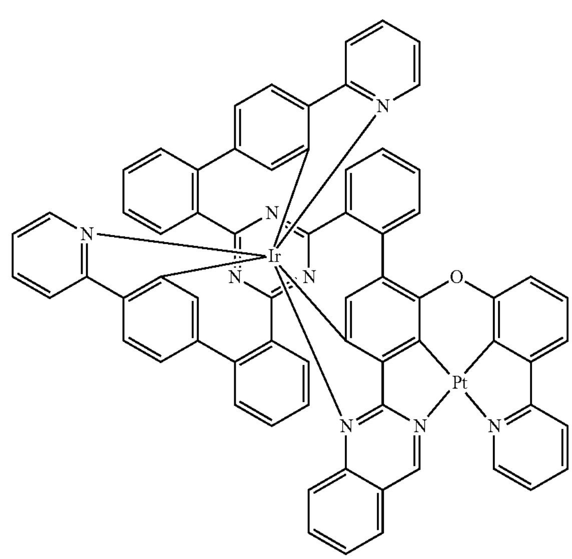

-continued
25
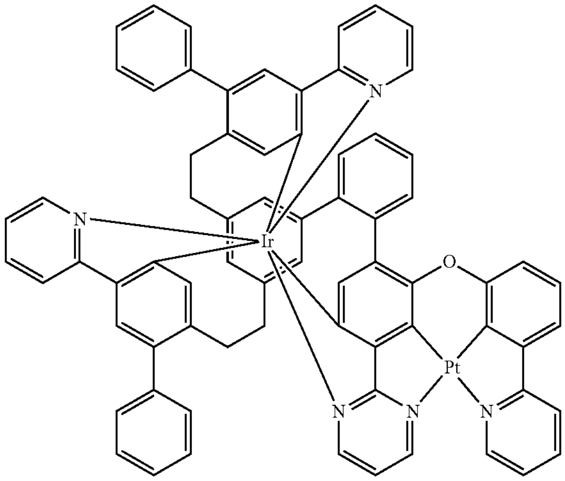
26
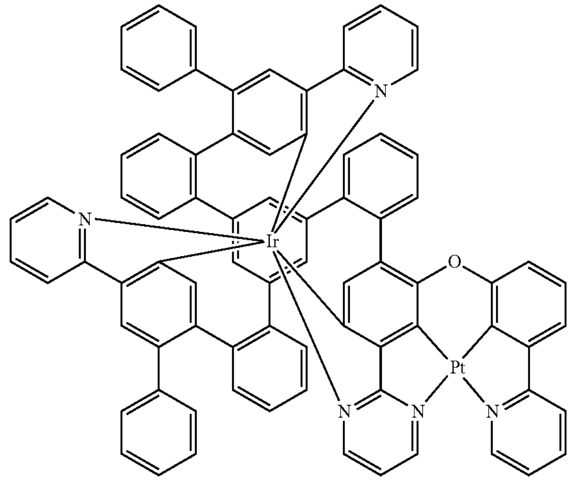
27
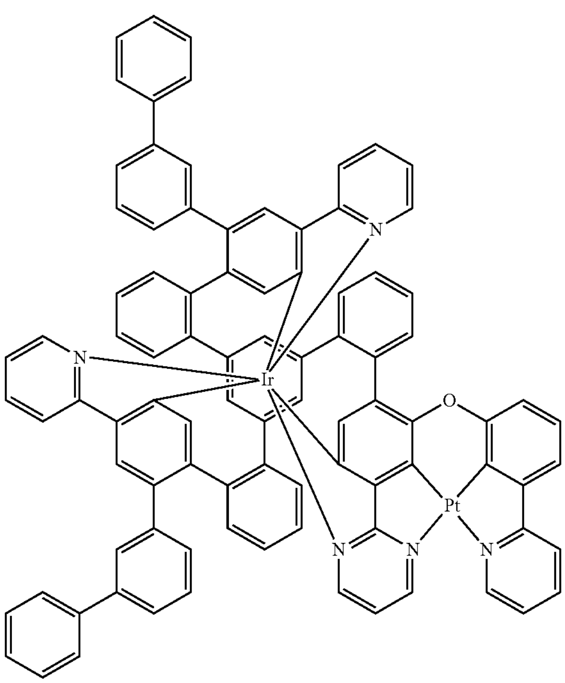
28
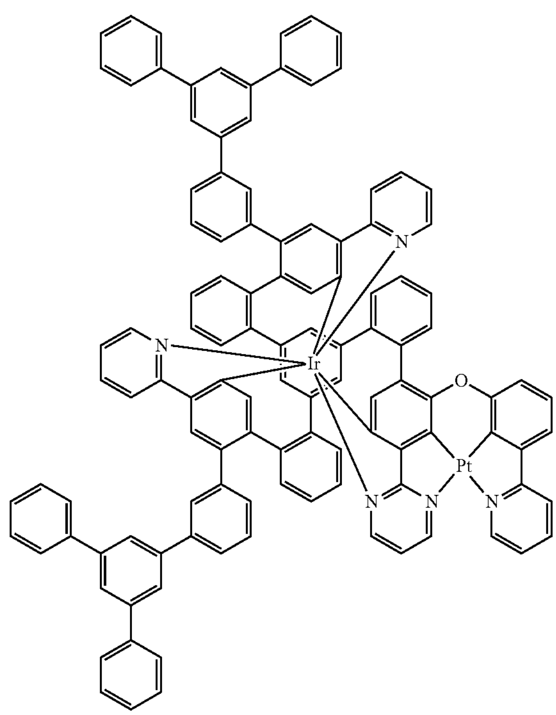

-continued
29
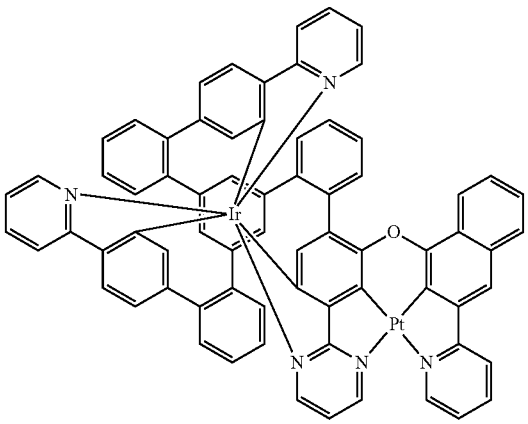
30
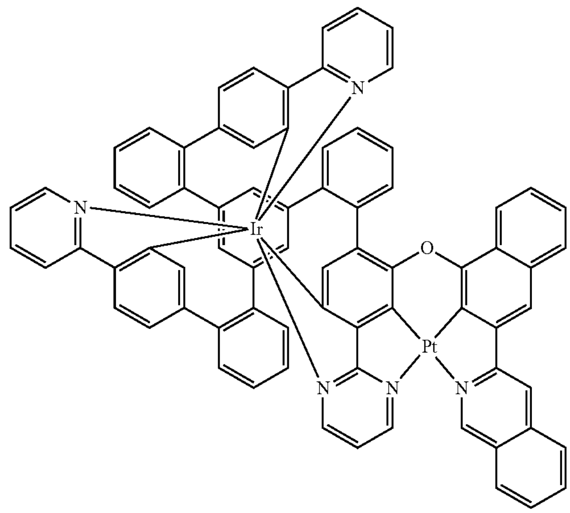
31
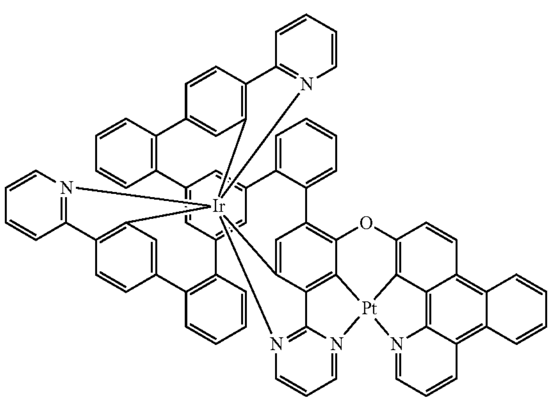
32
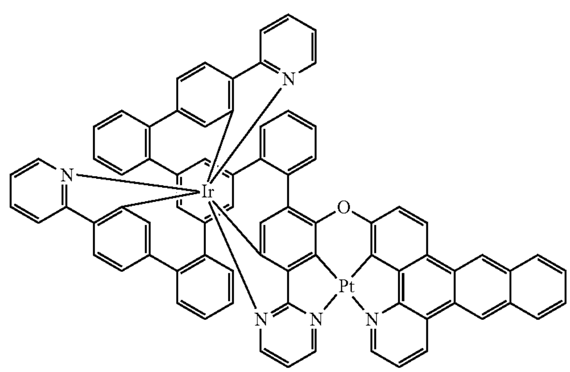
33
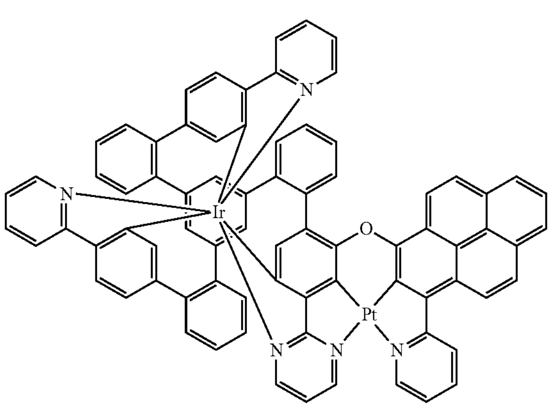
34
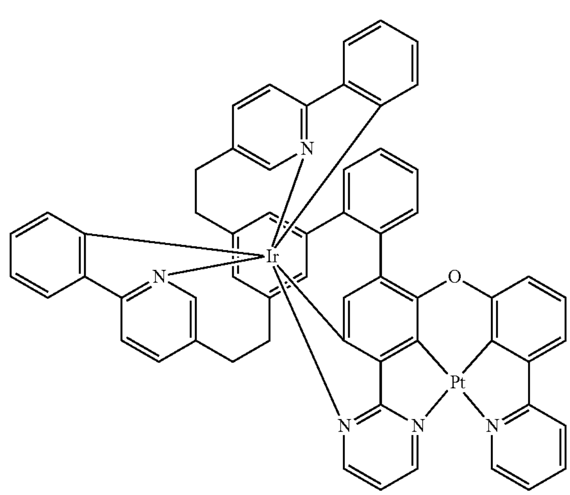

-continued
35
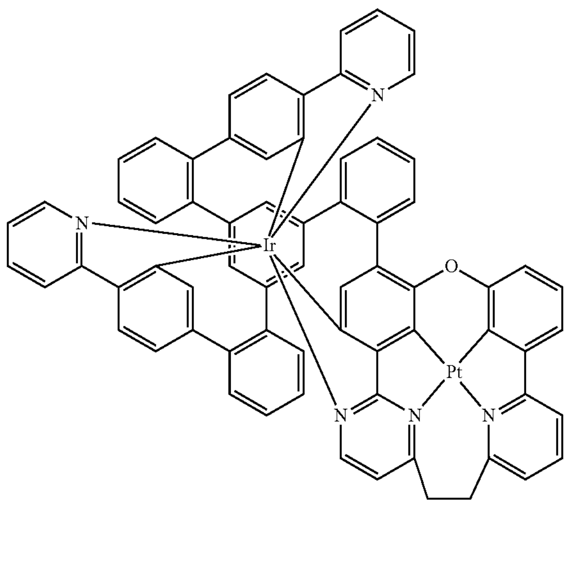
36
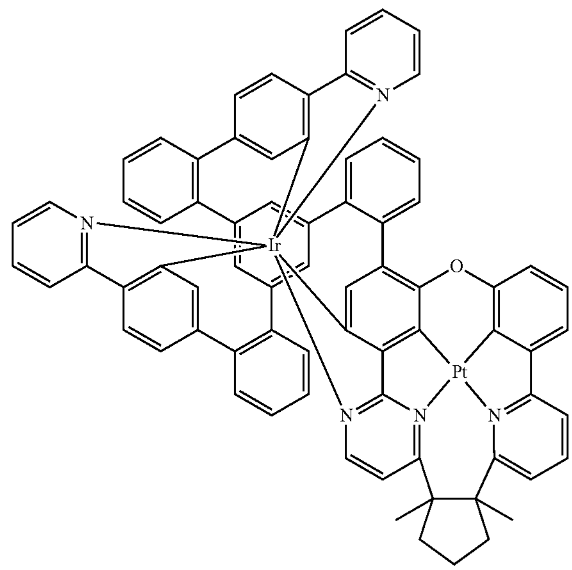
37
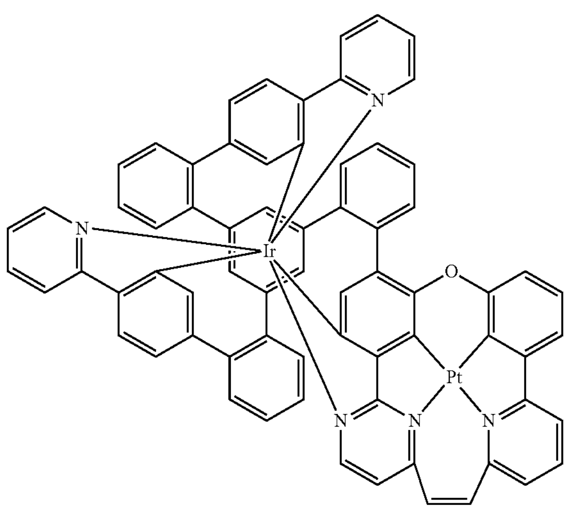
38
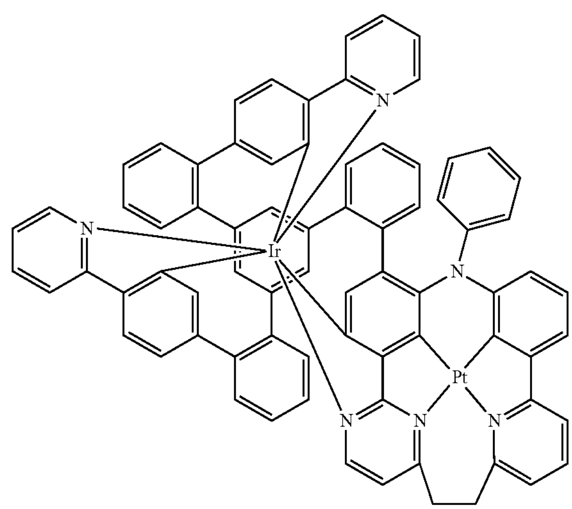
39
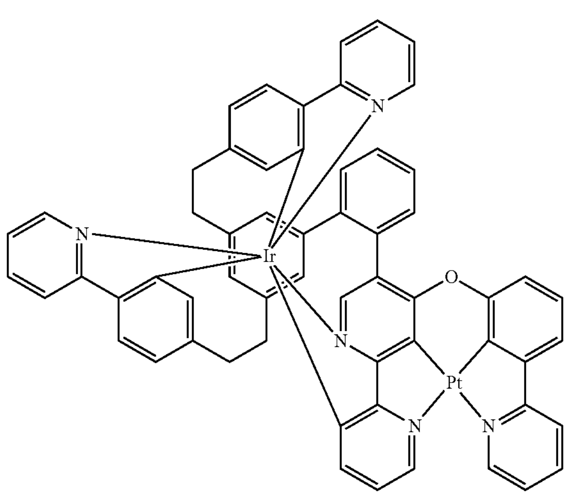
40
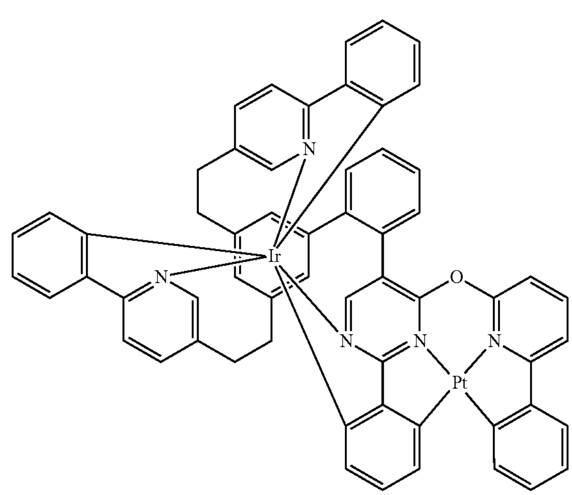

-continued
41
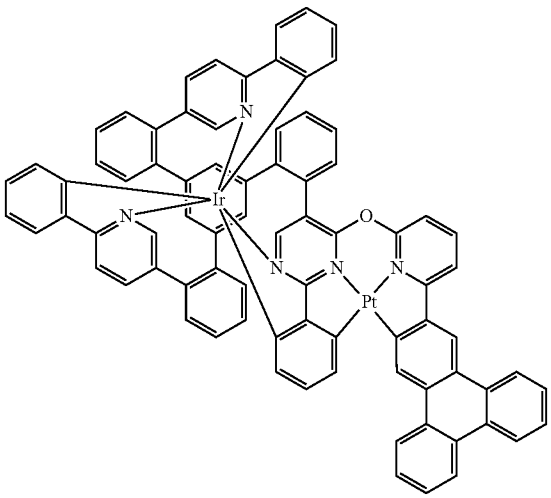
42
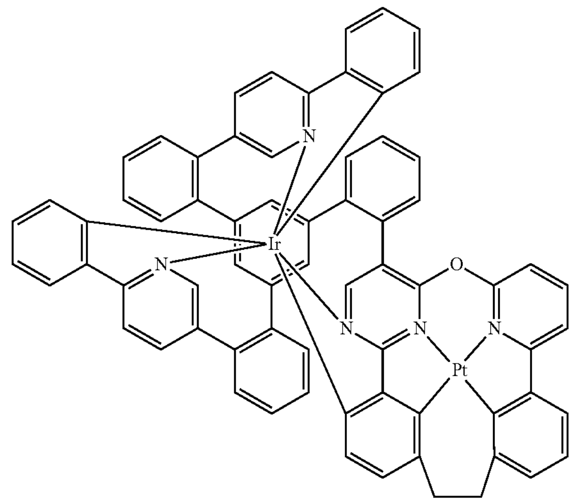
43
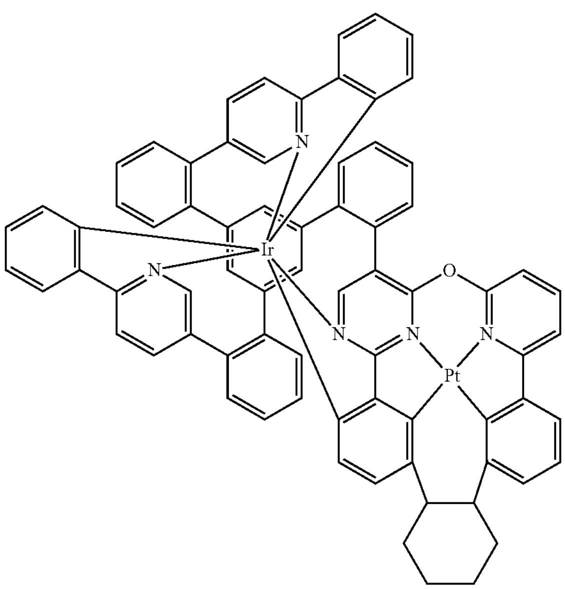
44
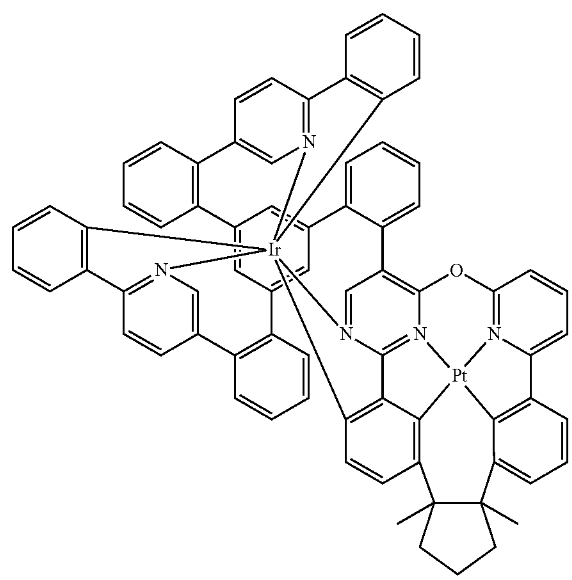
45
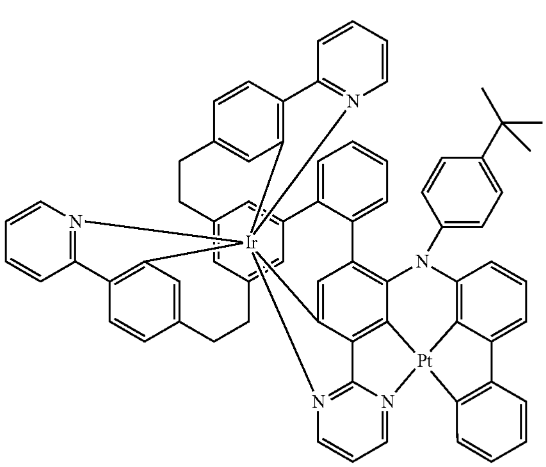
46
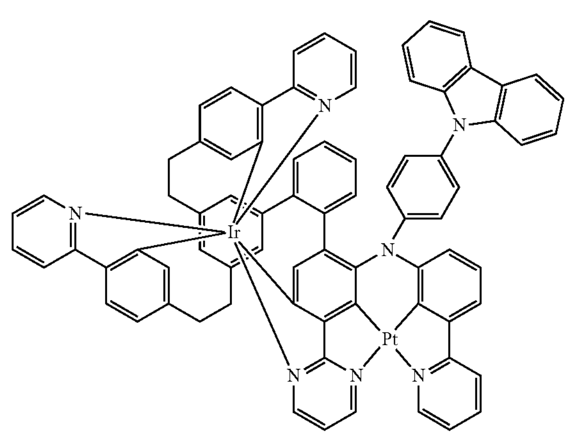

-continued
47
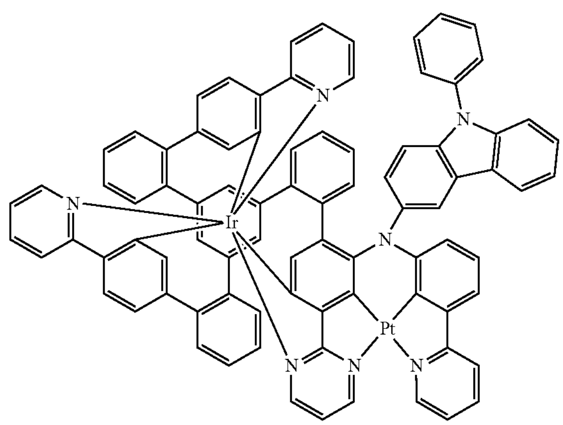
48
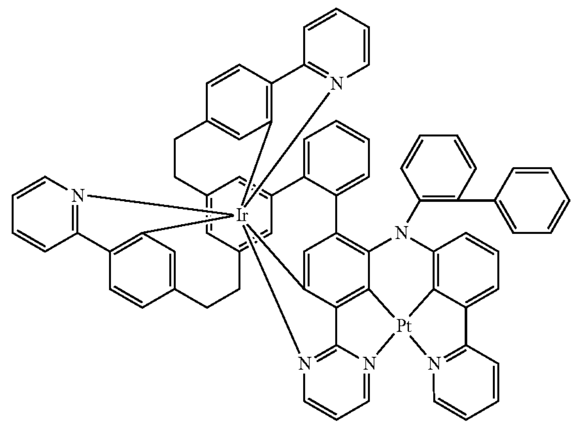
50
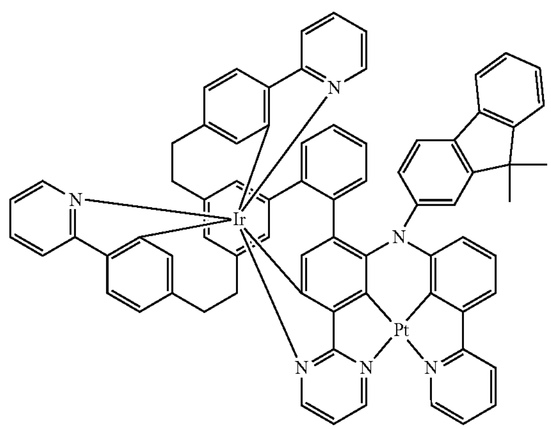
51
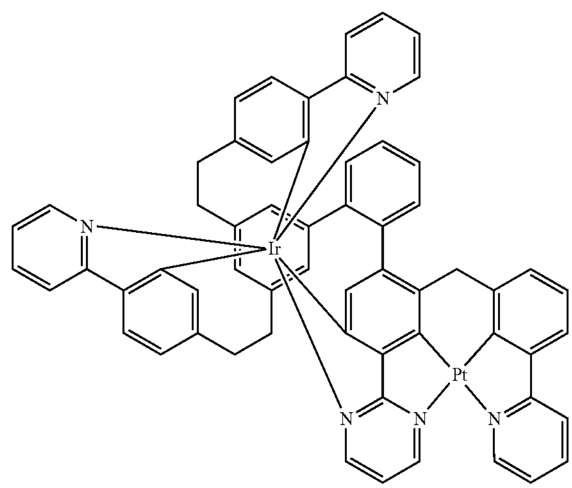
52
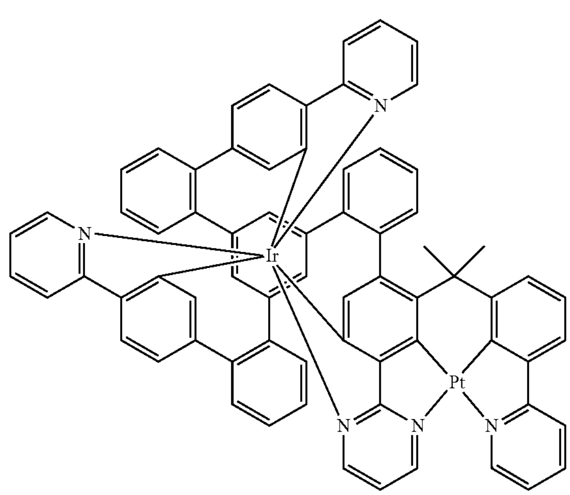
53
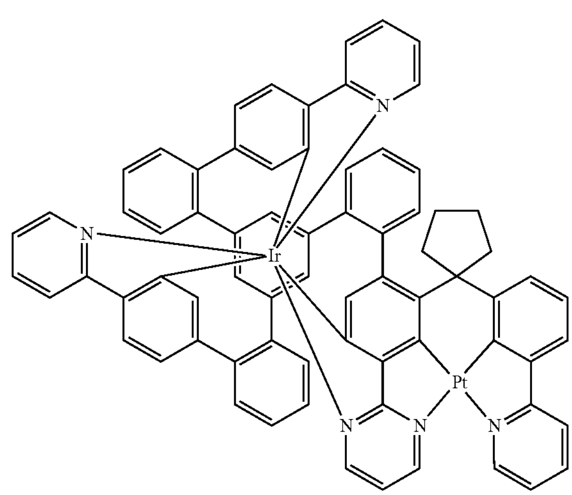

-continued
54
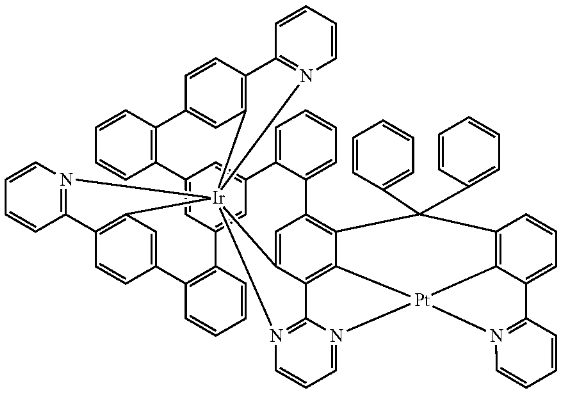
55
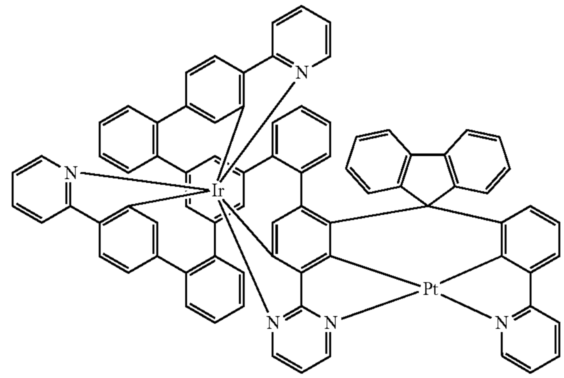
56
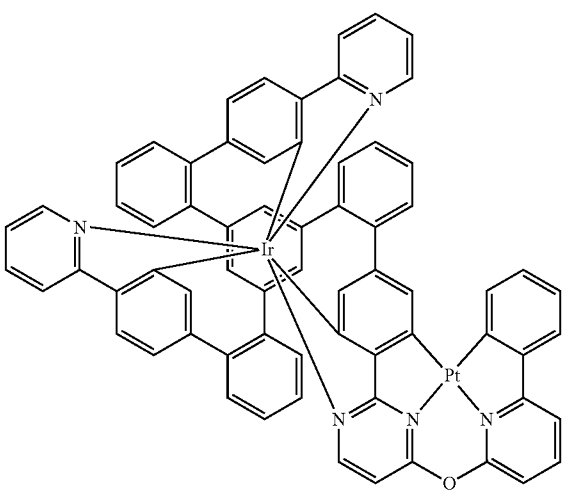
57
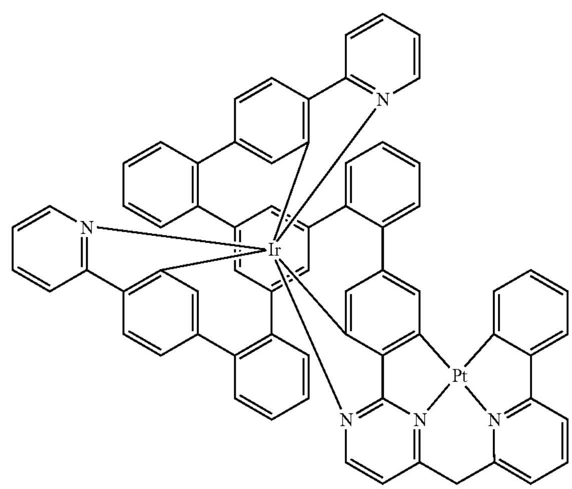
58
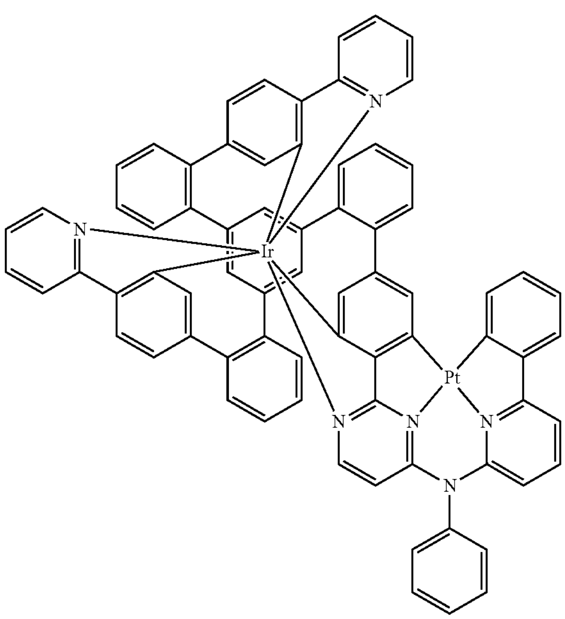
59
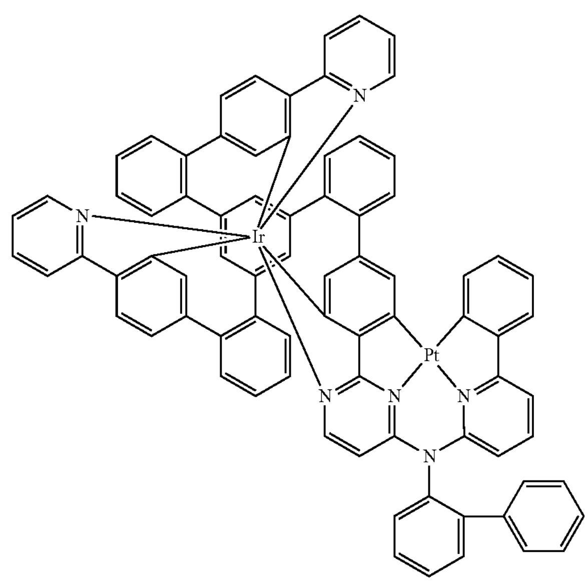

-continued
60
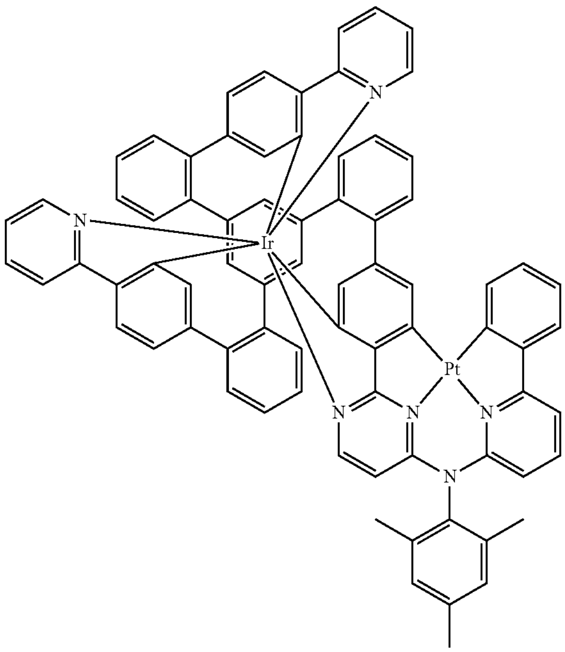
61
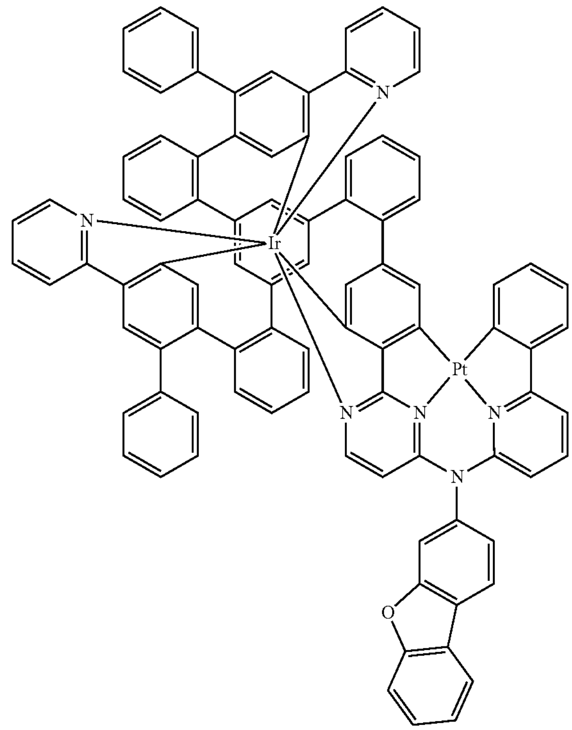
62
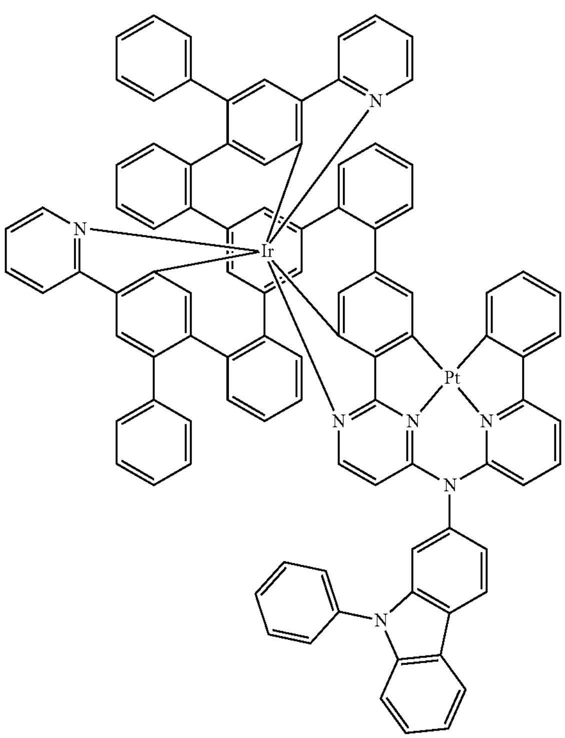
63
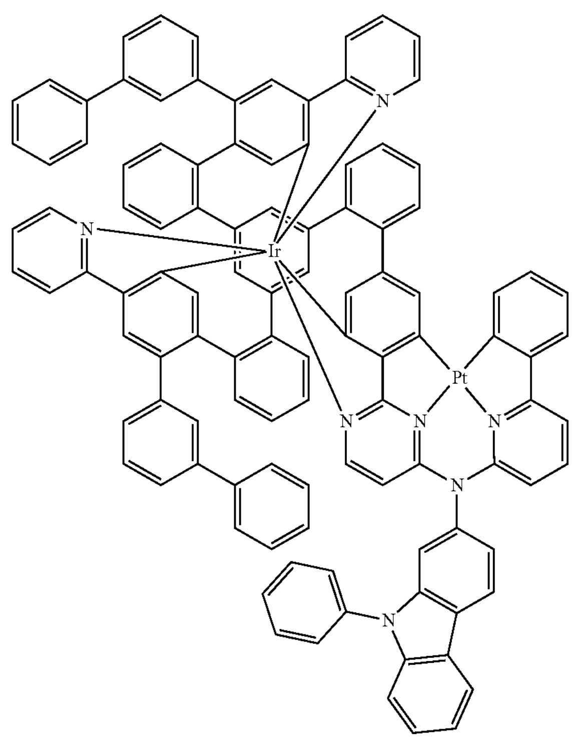

-continued
64
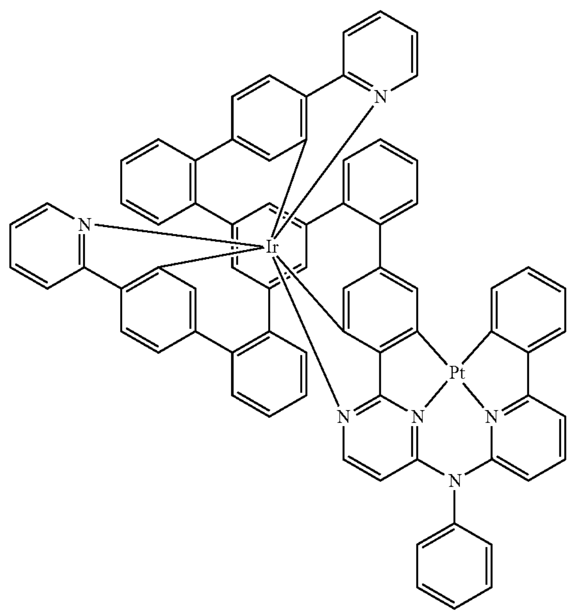
65
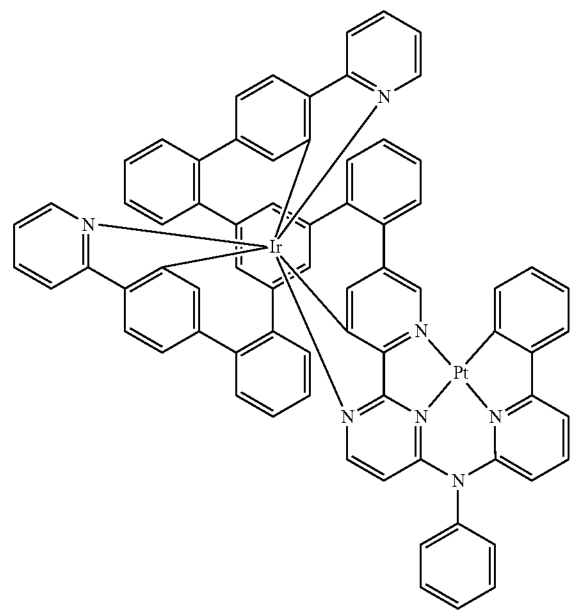
66
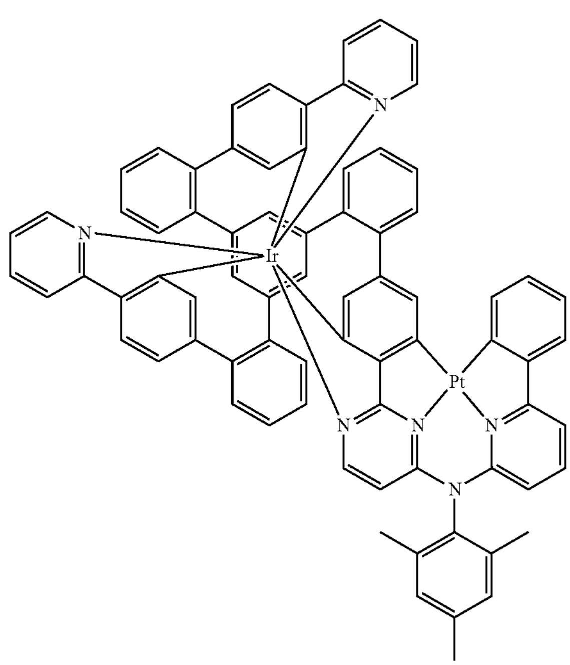
67
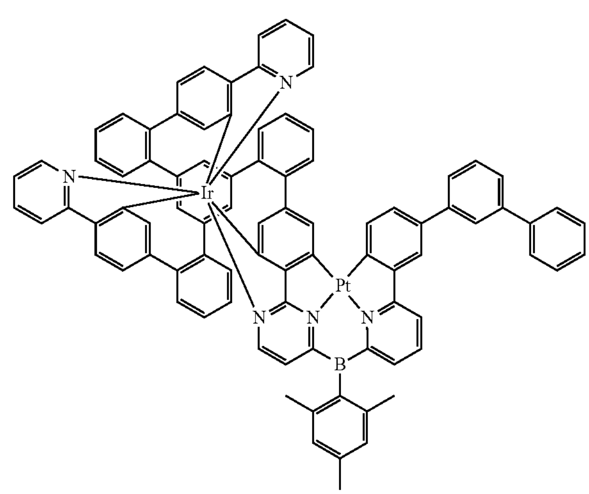

-continued
68
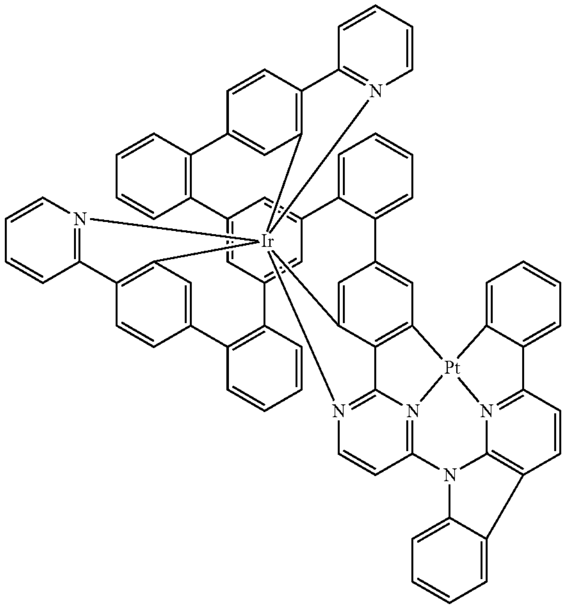
69
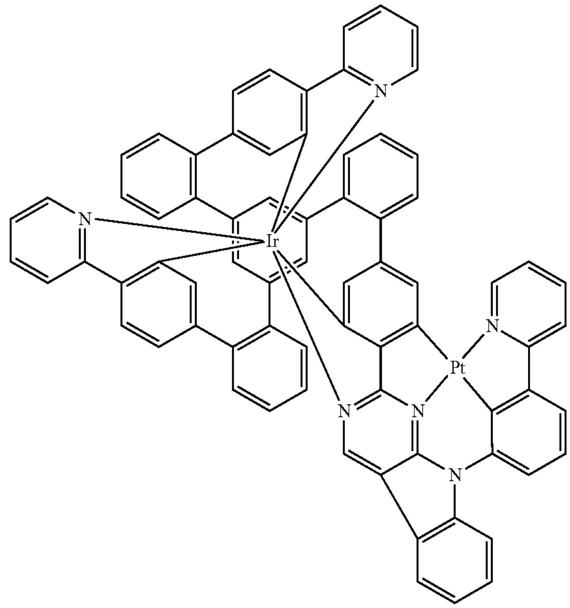
70
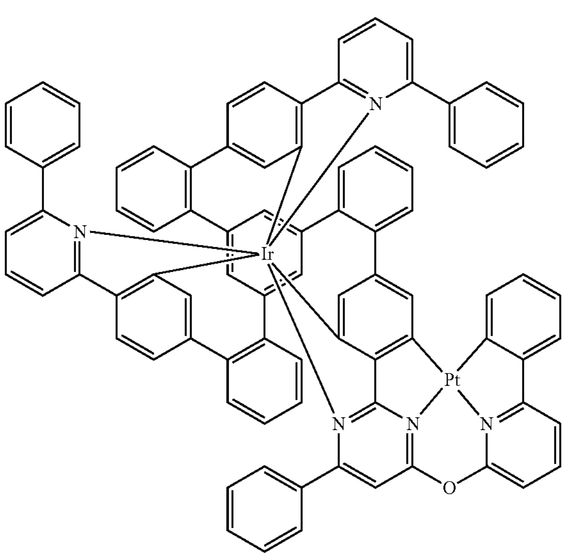
71
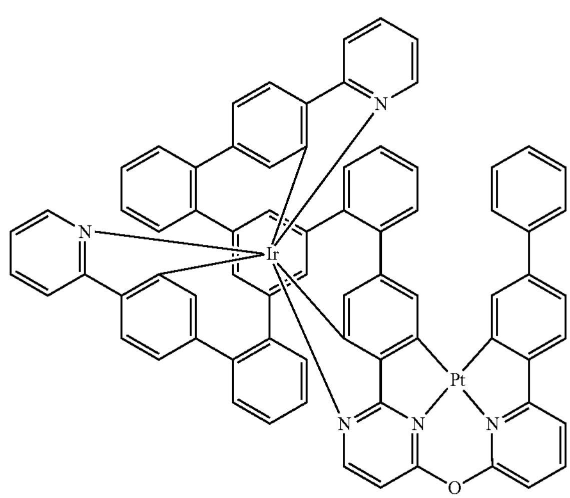

-continued
72
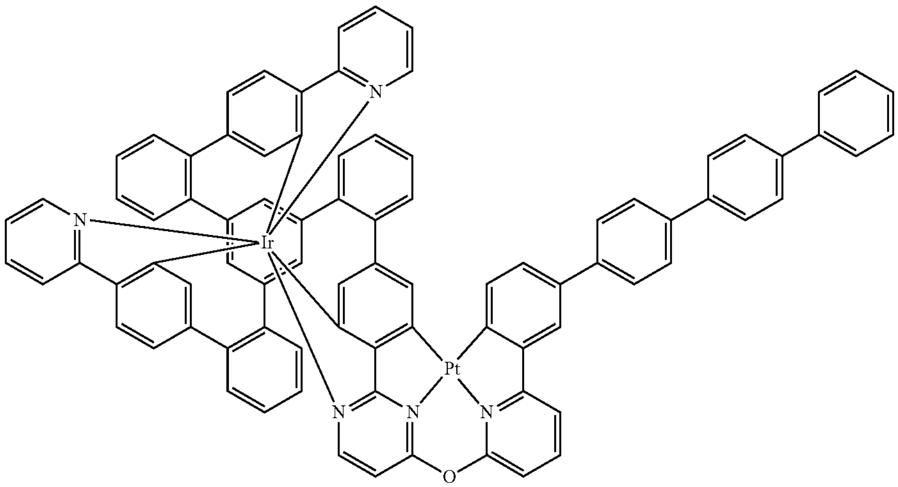
73
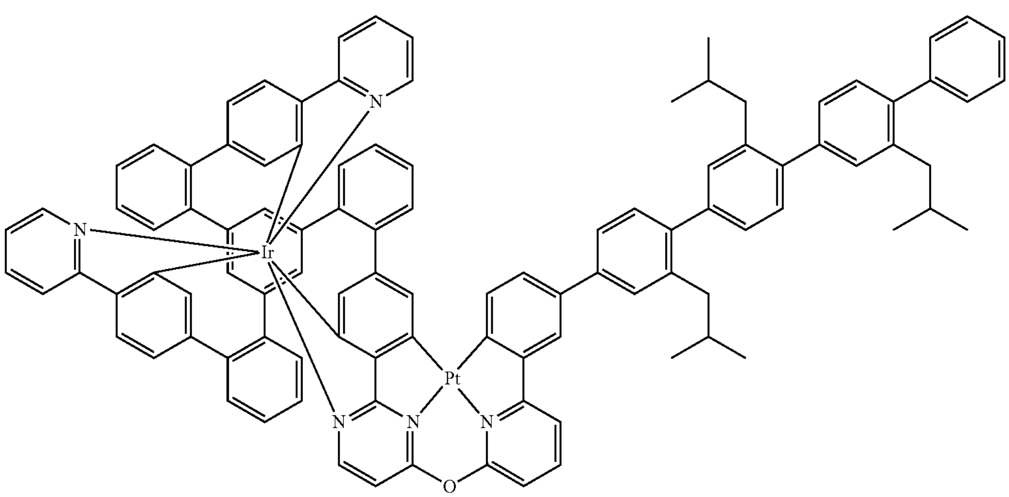

-continued
74
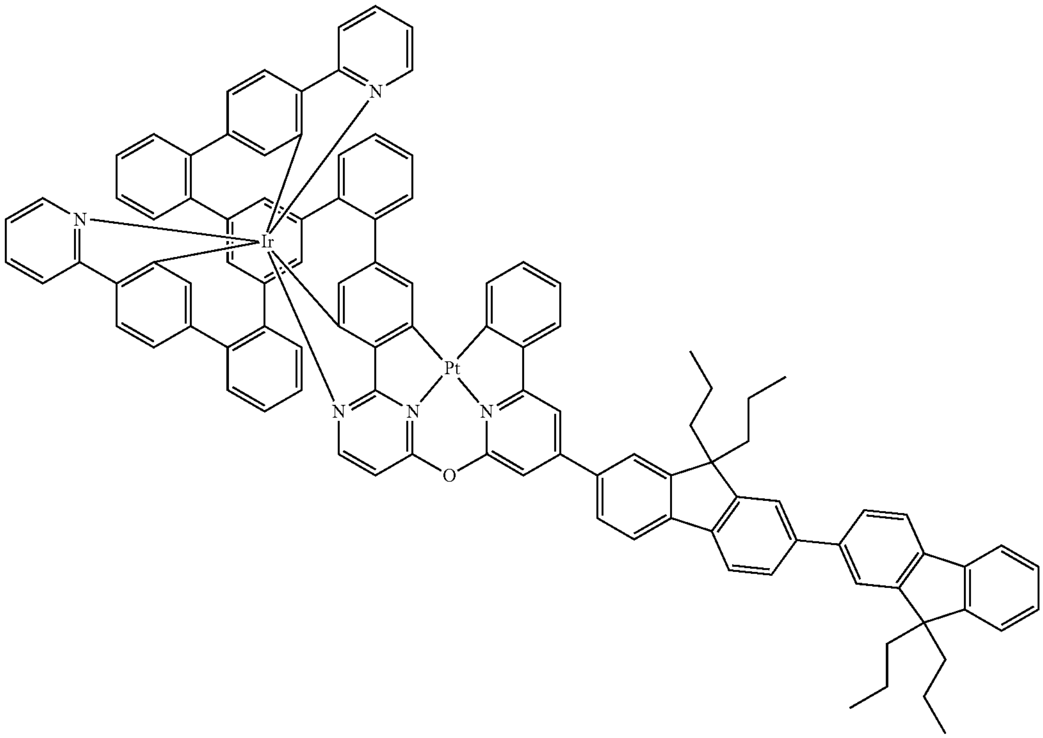
75
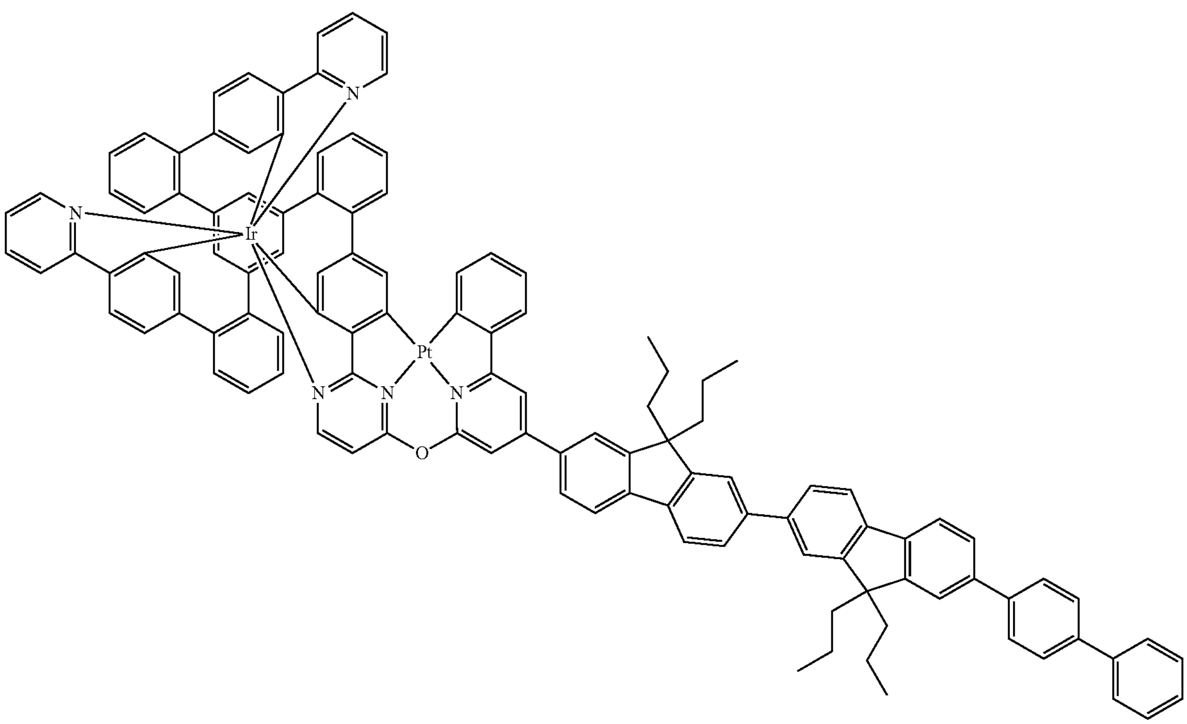

-continued
76
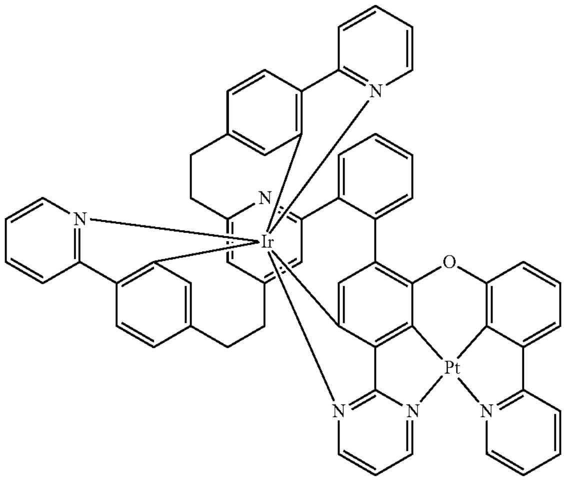
77
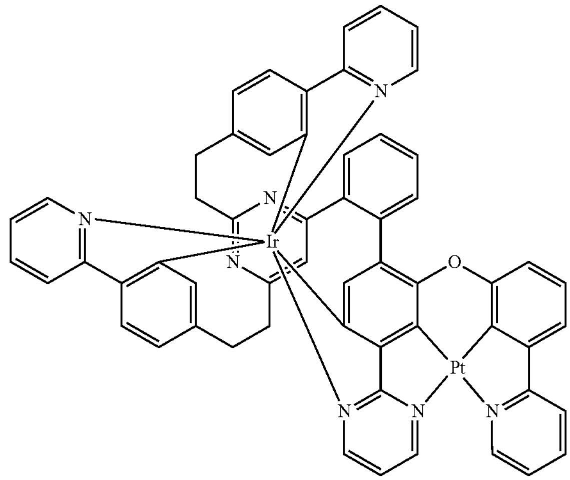
78
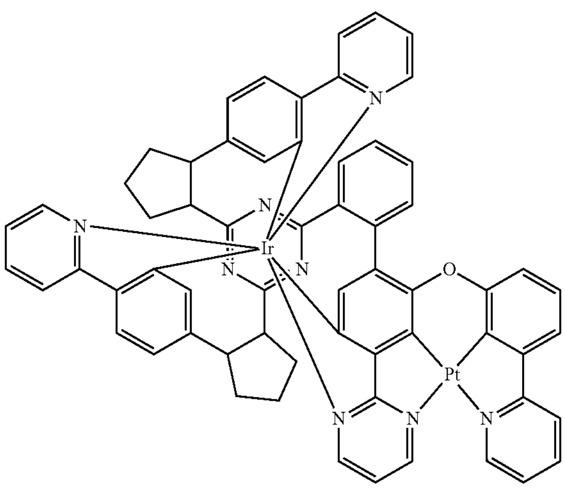
79
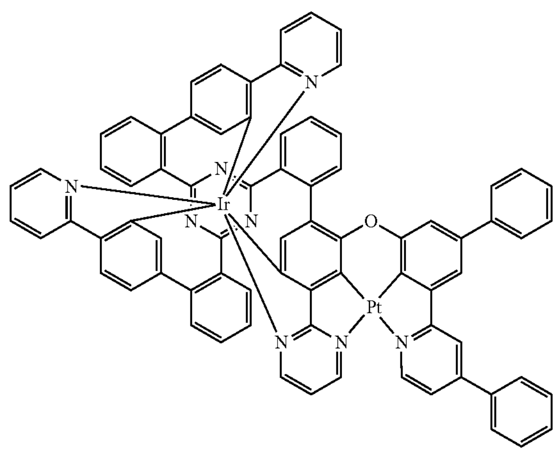
80
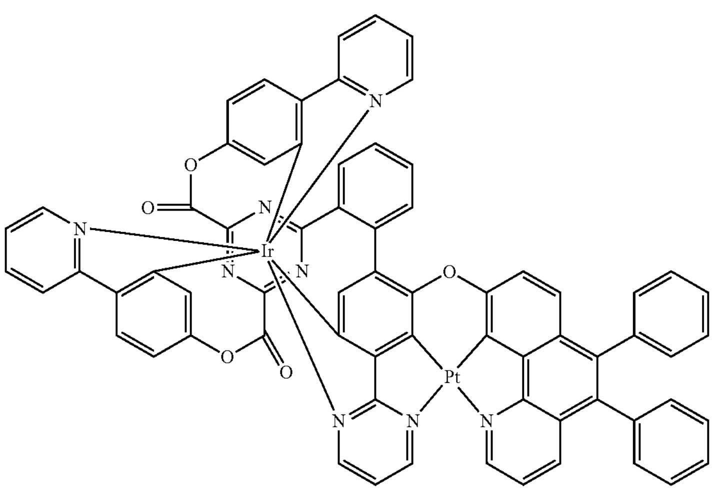

-continued
81
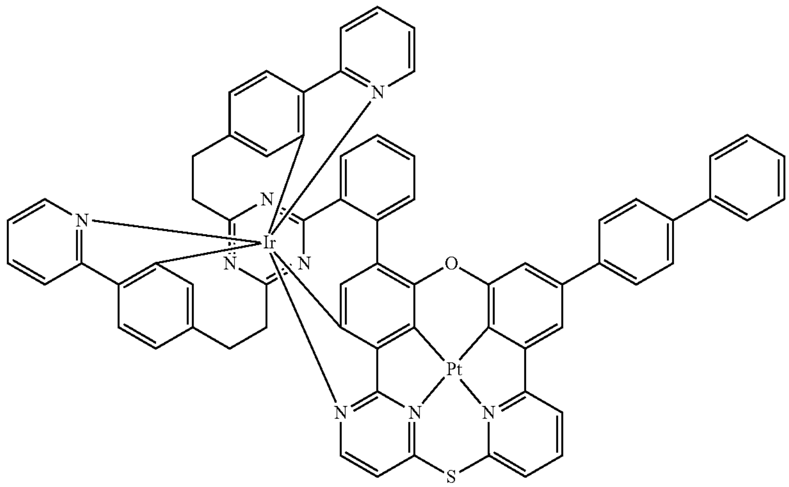
82
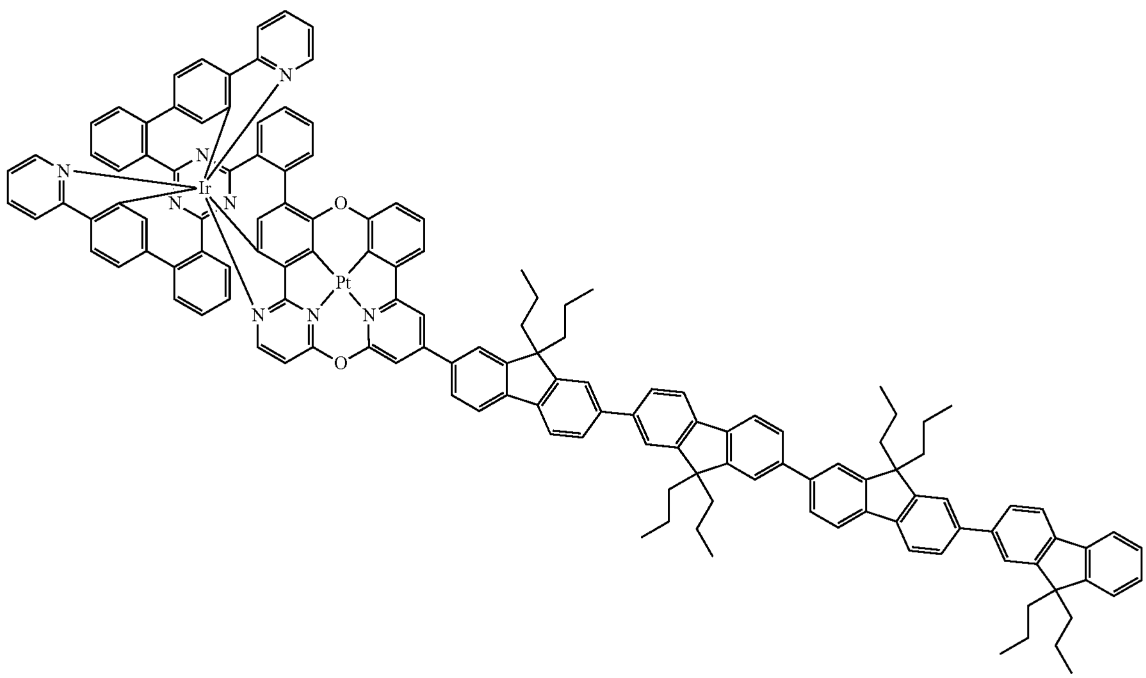

-continued

83

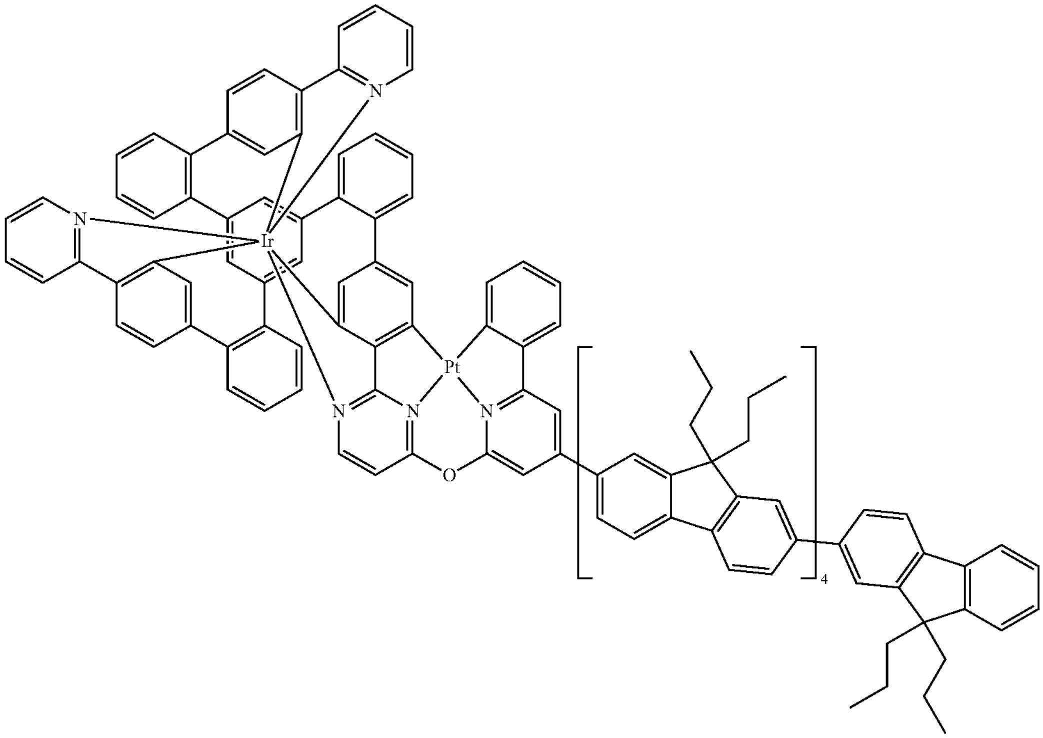

84

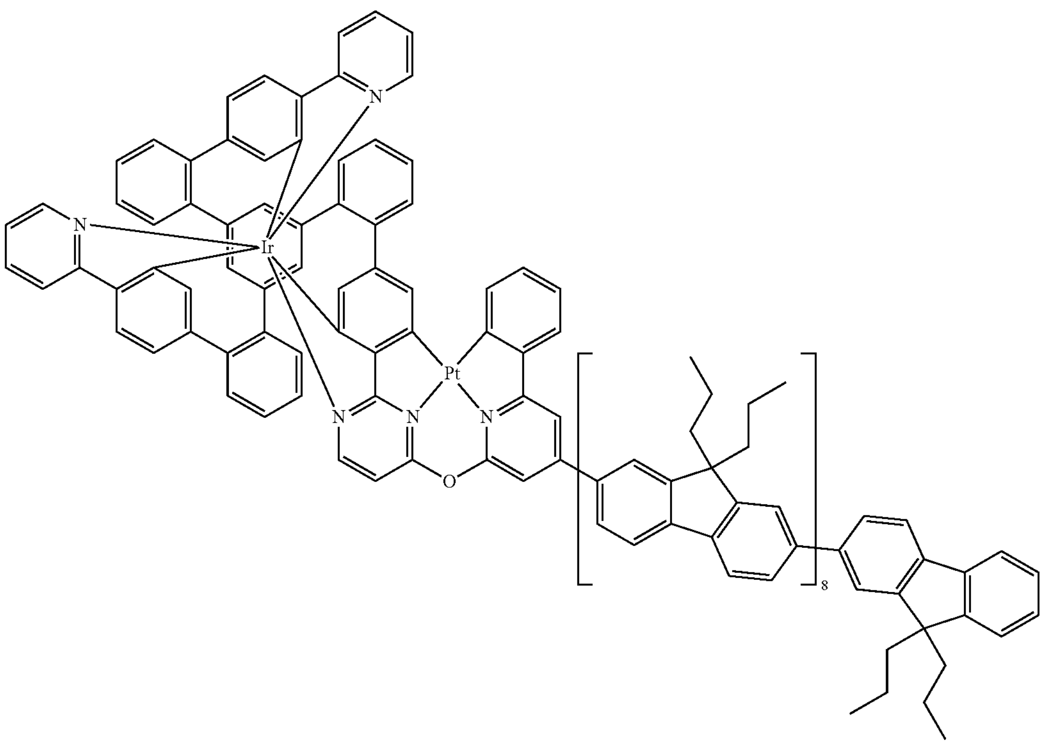

The Ir—Pt complexes of the invention are chiral structures. If the tripodal ligand of the complexes is additionally also chiral, the formation of diastereomers and multiple enantiomer pairs is possible. In that case, the complexes of the invention include both the mixtures of the different diastereomers or the corresponding racemates and the individual isolated diastereomers or enantiomers.

If ligands having two identical sub-ligands $L^1$ are used in the ortho-metallation to give the Ir complex, what is obtained is typically a racemic mixture of the $C_1$-symmetric complexes, i.e. of the Δ and Λ enantiomers. These may be separated by standard methods (chromatography on chiral materials/columns or optical resolution by crystallization).

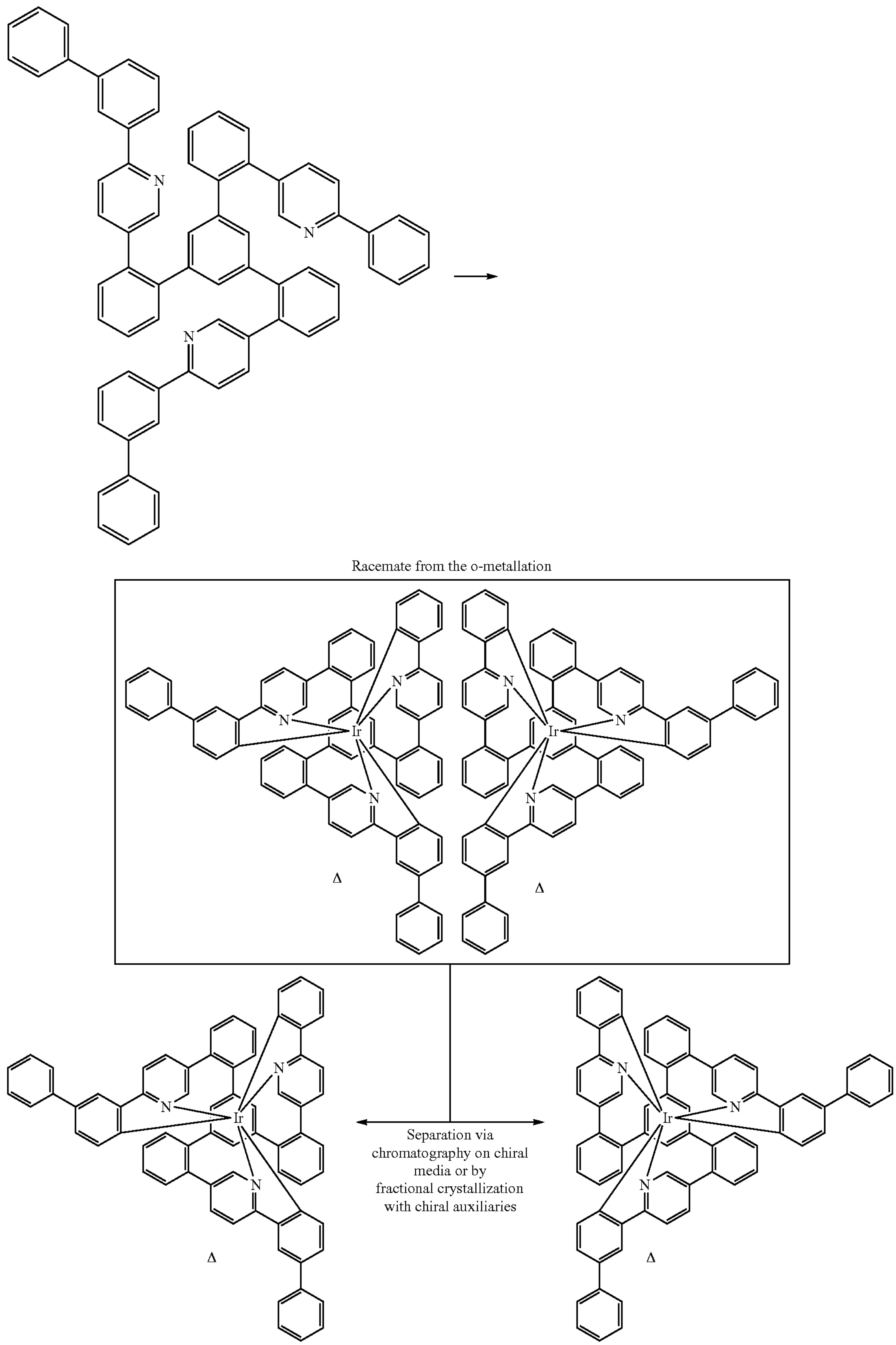
Racemate from the o-metallation
Δ
Δ
Separation via chromatography on chiral media or by fractional crystallization with chiral auxiliaries
Δ
Δ

Optical resolution via fractional crystallization of diastereomeric salt pairs can be effected by customary methods. One option for this purpose is to oxidize the uncharged Ir(III) complexes (for example with peroxides or $H_2O_2$ or by electrochemical means), add the salt of an enantiomerically pure monoanionic base (chiral base) to the cationic Ir(IV) complexes thus produced, separate the diastereomeric salts thus produced by fractional crystallization, and then reduce them with the aid of a reducing agent (e.g. zinc, hydrazine hydrate, ascorbic acid, etc.) to give the enantiomerically pure uncharged complex, as shown schematically below:

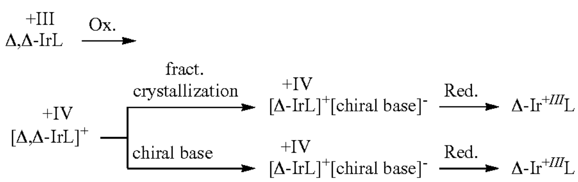

In addition, an enantiomerically pure or enantiomerically enriching synthesis is possible by complexation in a chiral medium (e.g. R- or S-1,1-binaphthol).

If ligands having three different sub-ligands are used in the complexation, what is typically obtained is a diastereomer mixture of the complexes which can be separated by standard methods (chromatography, crystallization, etc.).

Enantiomerically pure $C_1$-symmetric complexes can also be synthesized selectively, as shown in the scheme which follows. For this purpose, an enantiomerically pure $C_1$-symmetric ligand is prepared and complexed, the diastereomer mixture obtained is separated and then the chiral group is detached.

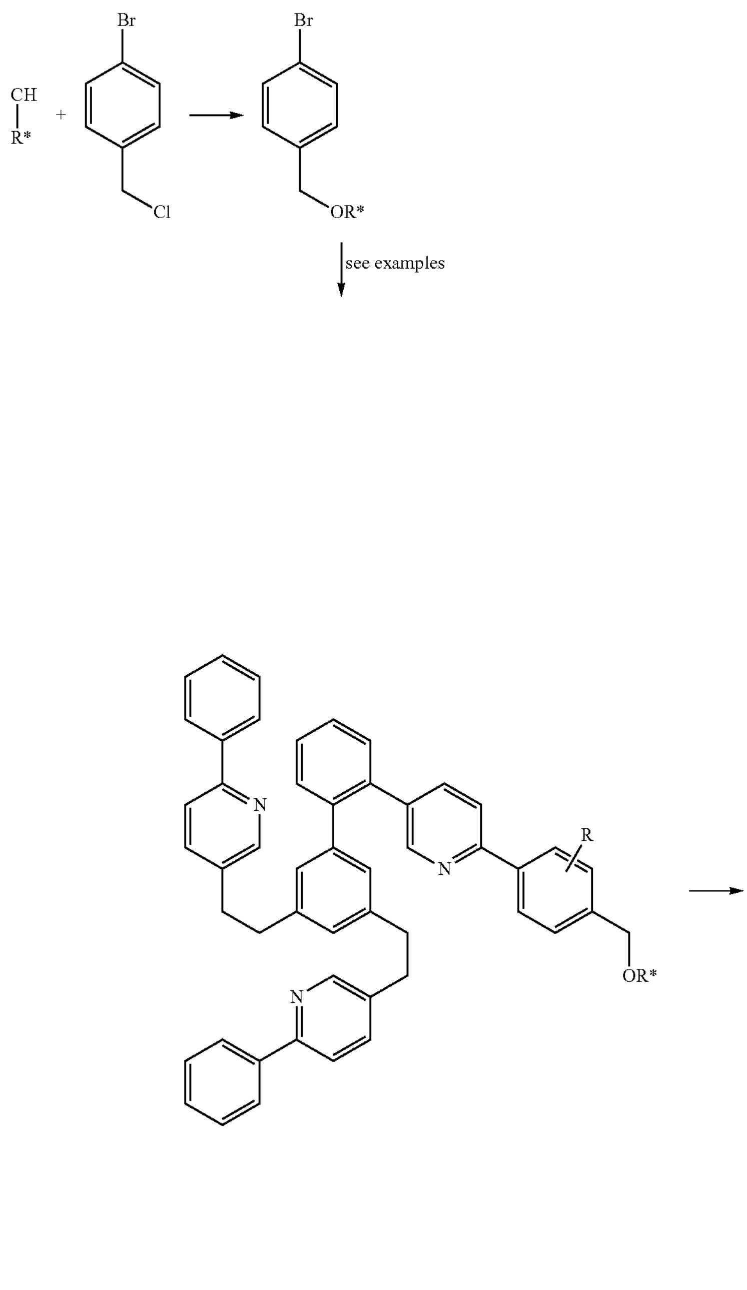

-continued

Diastereomer mixture from the o-metallation

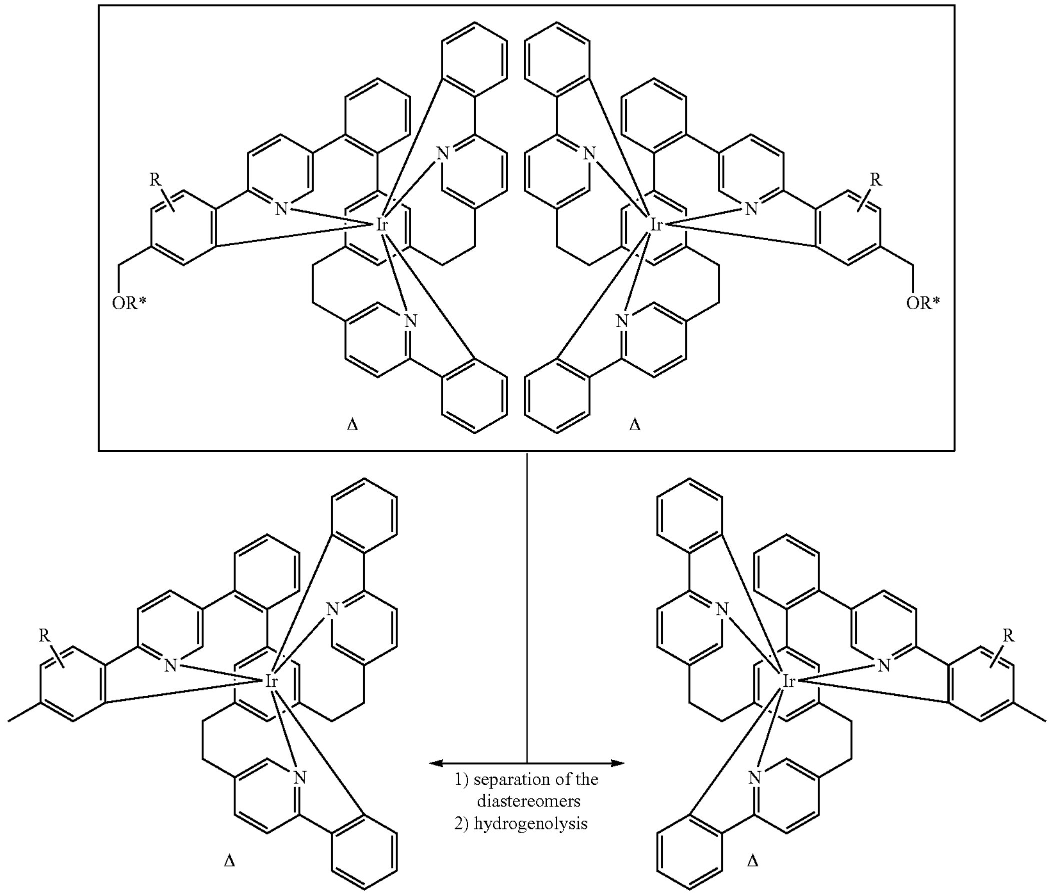

R*: enantiomerically pure radical

The further functionalization to give the Ir—Pt complexes can be effected on the enantiomer mixture or on the individual enantiomers. This does not change the stereochemistry on the iridium. If further stereocentres are introduced in the functionalization to give the Ir—Pt complexes, this results in diastereomers that can be separated by standard methods (chromatography, fractional crystallization, etc.).

The complexes of the invention can especially be prepared by the route described hereinafter. For this purpose, first of all, a hexadentate ligand is prepared, containing the central sub-ligand(s), the $V^1$ group and, when n=1 or 2, the sub-ligand(s) $L^1$. This ligand is then used to prepare an iridium complex which is then functionalized on the central sub-ligand in the para position to the carbon atom that coordinates to Ir, especially halogenated and preferably brominated. In a coupling reaction, in a next step, the $L^2$-$V^2$ group is introduced, and, in a last step, the tetradentate ligand thus formed is coordinated to the Pt.

Therefore, the present invention further provides a process for preparing the compound of the invention, characterized by the following process steps:

a) synthesis of a hexadentate ligand that does not yet contain the $L^2$-$V^2$ group;
b) synthesis of an Ir complex from the hexadentate ligand;
c) functionalization of the Ir complex, especially bromination;
d) introduction of the $L^2$-$V^2$ group by a coupling reaction; and
e) synthesis of the Pt complex.

Suitable iridium reactants for the preparation of the iridium complex are especially iridium alkoxides of the formula (57), iridium ketoketonates of the formula (58), iridium halides of the formula (59) or iridium carboxylates of the formula (60).

$Ir(OR)_3$ formula (57)

formula (58)

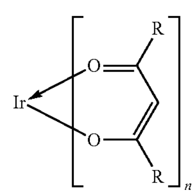

$IrHal_3$ formula (59)

$Ir(OOCR)_3$ formula (60)

where R has the definitions given above, Hal=F, Cl, Br or I and the iridium reactants may also take the form of the corresponding hydrates. R here is preferably an alkyl group having 1 to 4 carbon atoms.

It is likewise possible to use iridium compounds bearing both alkoxide and/or halide and/or hydroxyl and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato)iridium, and $IrCl_3 \cdot xH_2O$ where x is typically a number from 2 to 4.

The synthesis of the iridium complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metallated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO), sulfones (dimethyl sulfone, sulfolane, etc.), carboxylic acids (such as glacial acetic acid, propionic acid, fatty acids, benzoic acid) and water, and mixtures of these solvents. Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, R-, S- or RS-1,1'-bisnaphthol, catechol, resorcinol, hydroquinone, etc. Particular preference is given here to the use of hydroquinone.

Suitable platinum reactants for the preparation of the platinum complex in the last synthesis step are, for example, $PtCl_2$, $Pt(ac)_2$, $K_2PtCl_4$, $(DMSO)_2PtCl_2$, $(DMSO)_2PtMe_2$ or $(COD)PtCl_2$.

The synthesis of the platinum complex is preferably conducted in solution, in suspension or in the melt. It is possible to use the same solvents/melting aids as in the preparation of the iridium complexes. The solvent used is preferably acetic acid or glacial acetic acid, and the melting aid hydroquinone.

If necessary, the solubility of Pt complexes in salt form can be improved by adding salts such as lithium chloride, ammonium chloride or tetraalkylammonium halides or sulfates in a catalytic, stoichiometric or superstoichiometric amount.

It is possible by these processes, if necessary followed by purification, for example recrystallization or sublimation, to obtain the inventive compounds of formula (1) in high purity, preferably more than 99% (determined by means of $^1H$ NMR and/or HPLC).

The compounds of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (50) to (56) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

For the processing of the metal complexes of the invention from the liquid phase, for example by spin-coating or by printing methods, formulations of the metal complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropyinaphthalene, pentylbenzene, hexylbenzene, heptylbenzene, octylbenzene, 1,1-bis(3,4-dimethylphenyl)ethane, hexamethylindane, methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one compound of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The compound of the invention can be used in an electronic device as active component or as oxygen sensitizers or as photocatalysts. The present invention thus further provides for the use of a compound of the invention in an electronic device or as oxygen sensitizer or as photocatalyst. The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one metal complex of the invention. Preferred electronic devices are selected from the group consisting of organic electroluminescent devices (OLEDs, PLEDs), organic infrared electroluminescence sensors, organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells (Grätzel cells), organic optical detectors, organic photoreceptors, organic field-quench devices (O-FQDs), light-emitting electrochemical cells (LECs), oxygen sensors and organic laser diodes (O-lasers), comprising at least one metal complex of the invention in at least one layer. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Three-layer systems are especially preferred, where the three layers exhibit blue, green and orange or red emission, or systems having more than three emitting layers. Preference is further given to tandem OLEDs. The system may also be a hybrid system wherein one or more layers fluoresce and one or more other layers phosphoresce. White-emitting organic electroluminescent devices may be used for lighting applications or else with colour filters for full-colour displays.

Infrared iris sensors are also based on the above-described principle of the organic electroluminescent devices, where the organic electroluminescent device for this application emits light in the infrared region of the spectrum. The characteristic light reflected by the eye is then detected by a camera.

In a preferred embodiment of the invention, the organic electroluminescent device comprises the metal complex of the invention as emitting compound in one or more emitting layers, especially in a red- or infrared-emitting layer.

When the metal complex of the invention is used as emitting compound in an emitting layer, it is preferably used in combination with one or more matrix materials. The mixture of the metal complex of the invention and the matrix material contains between 0.1% and 99% by weight, preferably between 1% and 90% by weight, more preferably between 3% and 40% by weight and especially between 5% and 25% by weight of the metal complex of the invention, based on the overall mixture of emitter and matrix material. Correspondingly, the mixture contains between 99.9% and 1% by weight, preferably between 99% and 10% by weight, more preferably between 97% and 60% by weight and especially between 95% and 75% by weight of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, biscarbazole derivatives, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015 or WO 2015/169412, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative, especially a biscarbazole derivative, as mixed matrix for the compound of the invention. Preference is likewise given to the use of a mixture of a charge-transporting matrix material and an electrically inert matrix material having no significant involvement, if any, in the charge transport, as described, for example, in WO 2010/108579. Preference is likewise given to the use of two electron-transporting matrix materials, for example triazine derivatives and lactam derivatives, as described, for example, in WO 2014/094964.

Depicted below are examples of compounds that are suitable as matrix materials for the compounds of the invention.

Examples of triazines and pyrimidines which can be used as electron-transporting matrix materials are the following compounds:

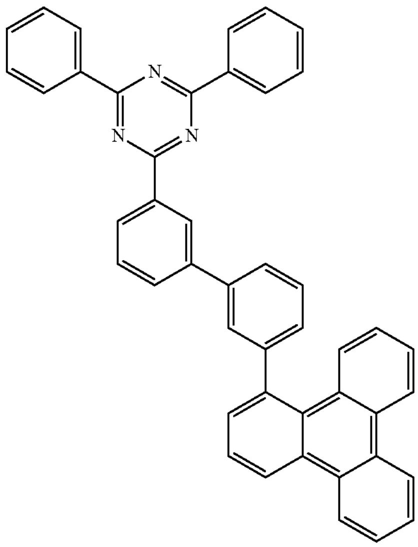
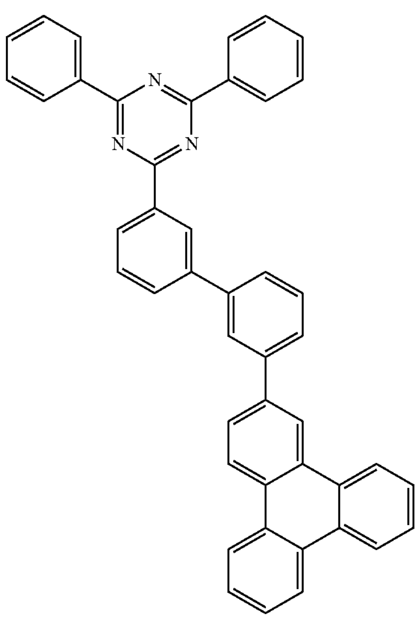
-continued
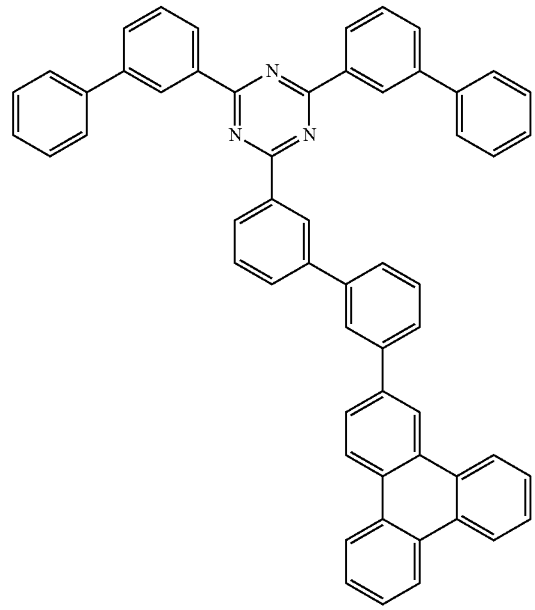
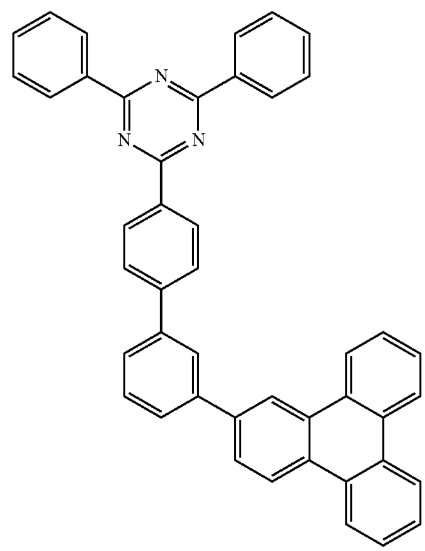
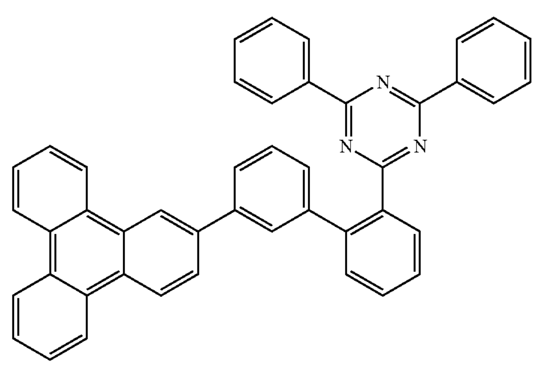

-continued
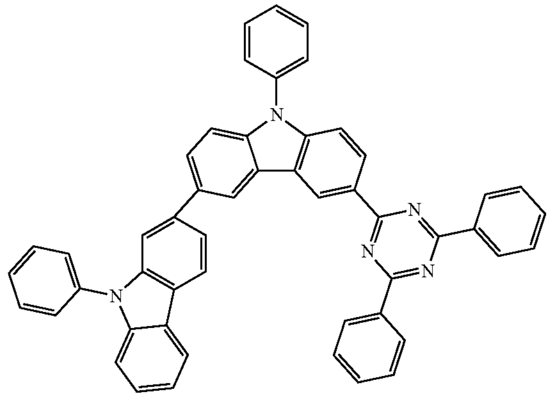
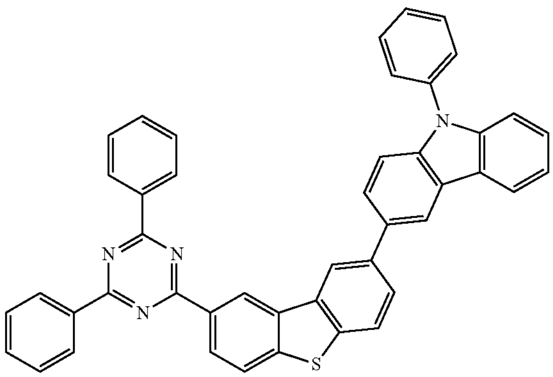
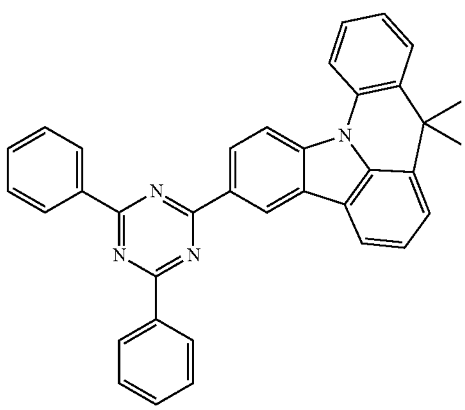
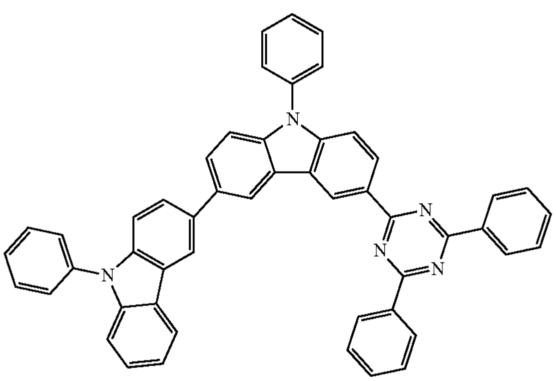
-continued
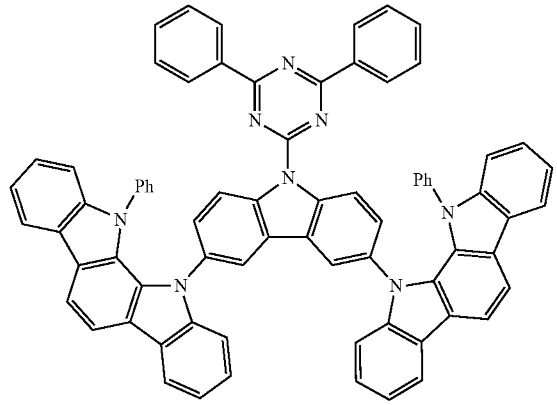
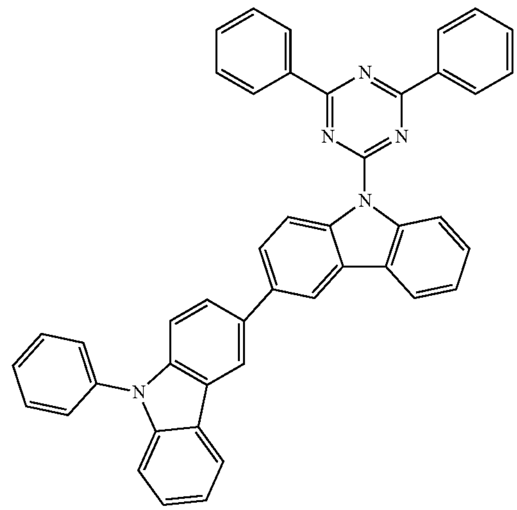
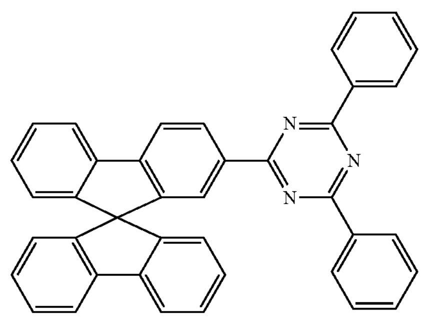
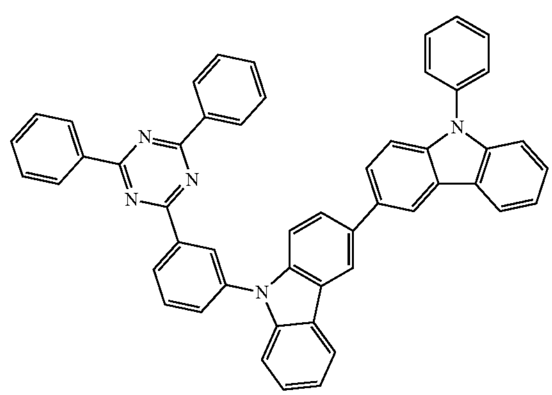

-continued
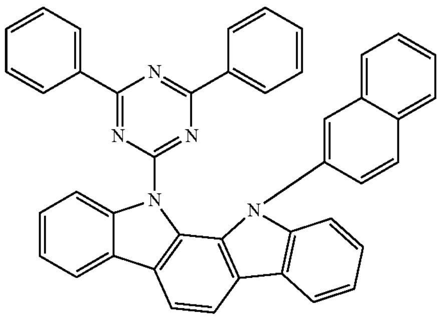
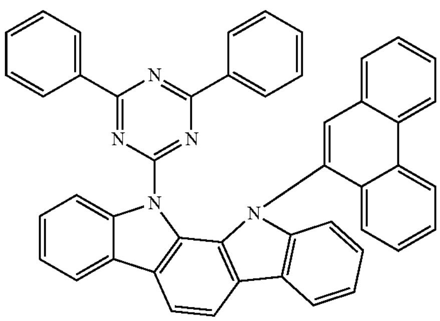
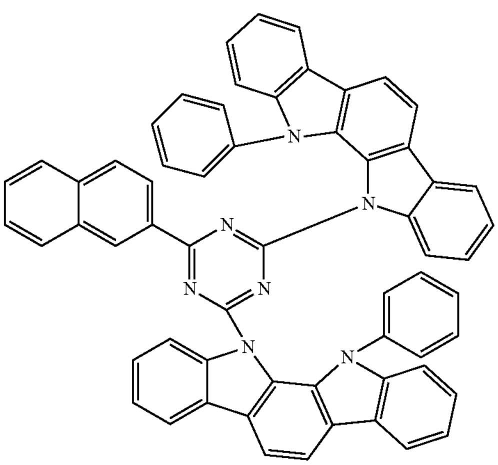
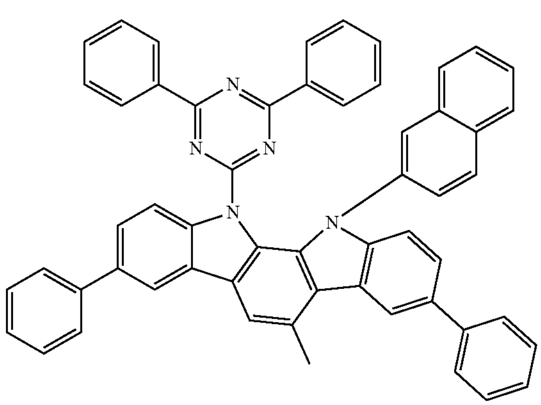
-continued
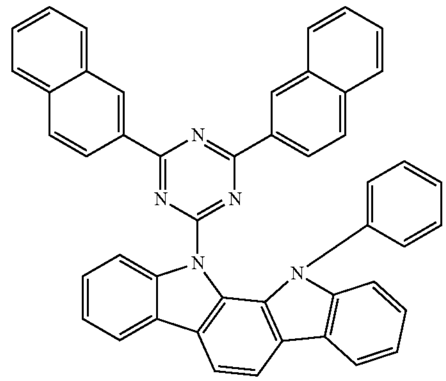
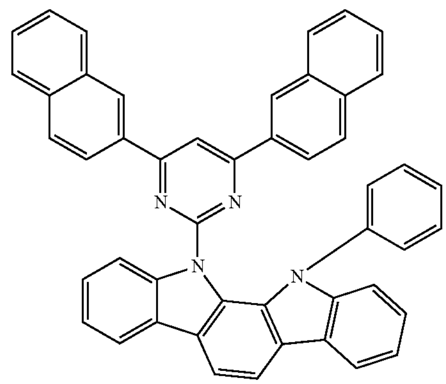
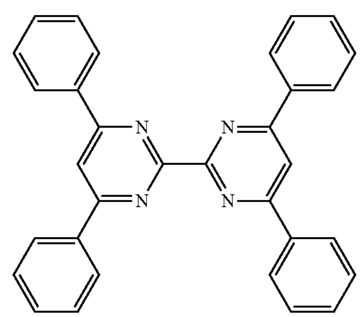
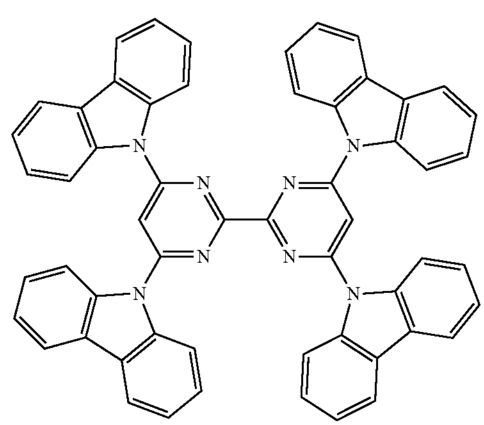

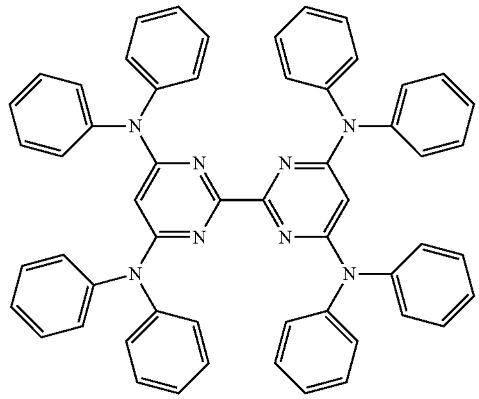
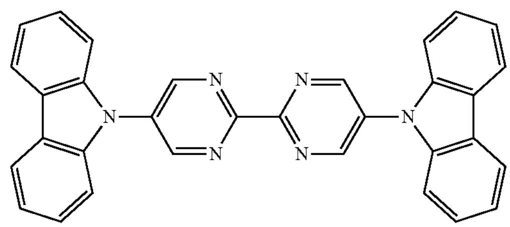
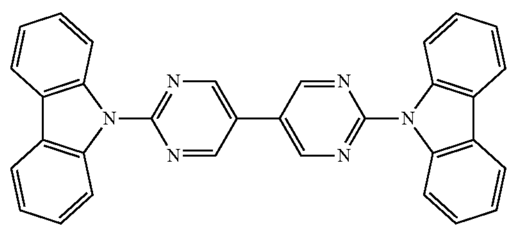
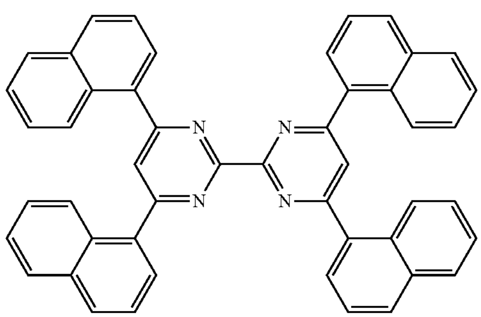
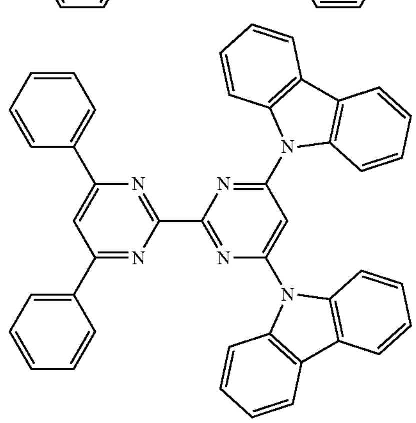
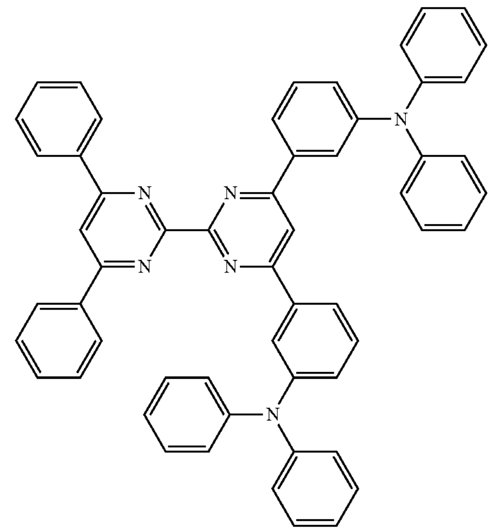
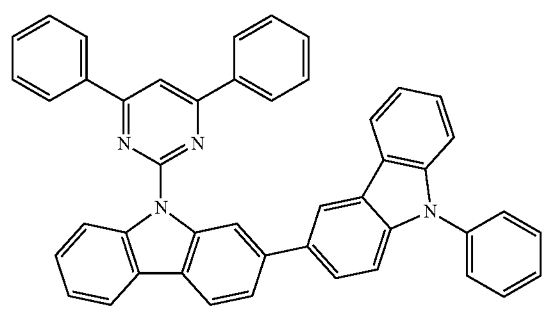
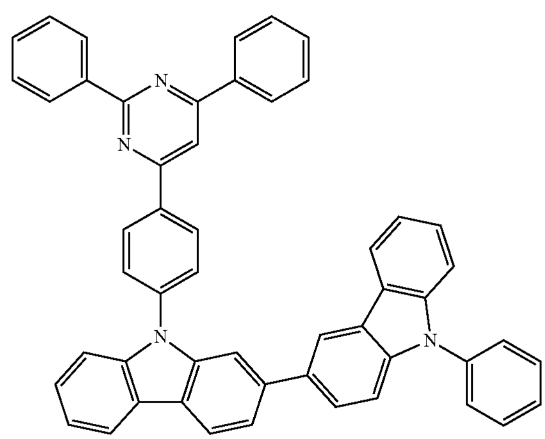
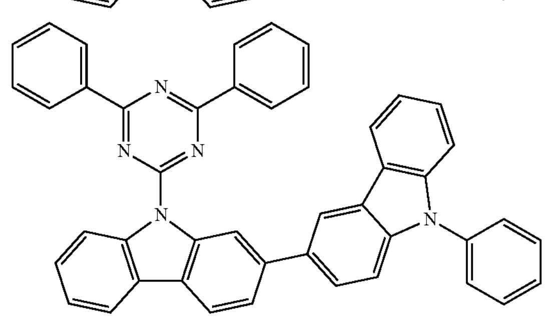

-continued
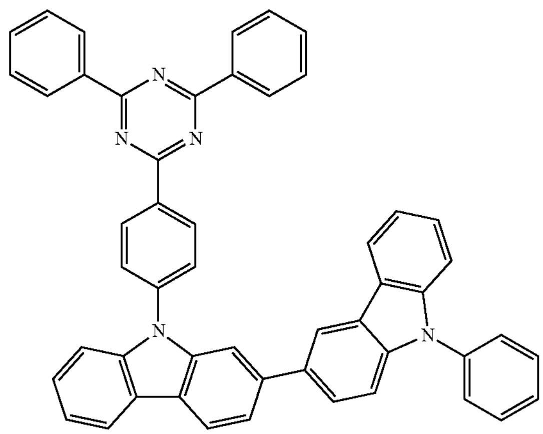
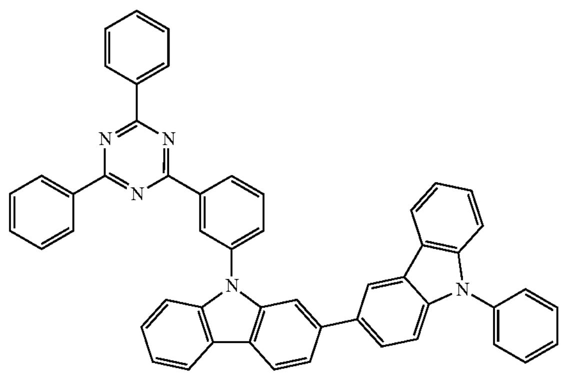
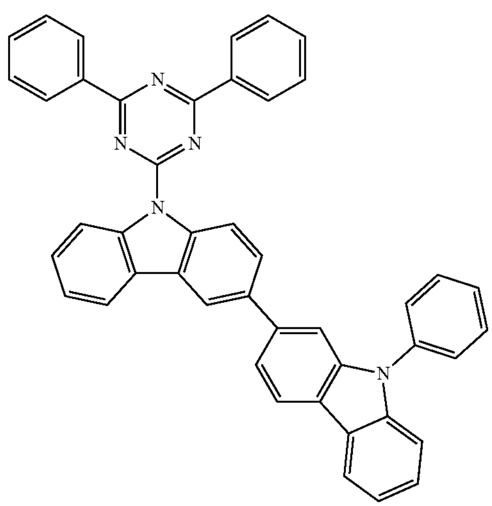
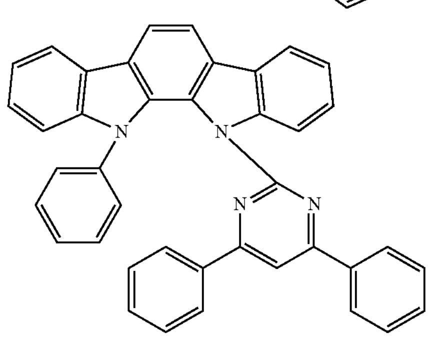
-continued
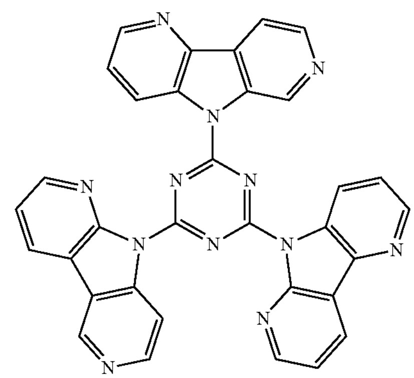
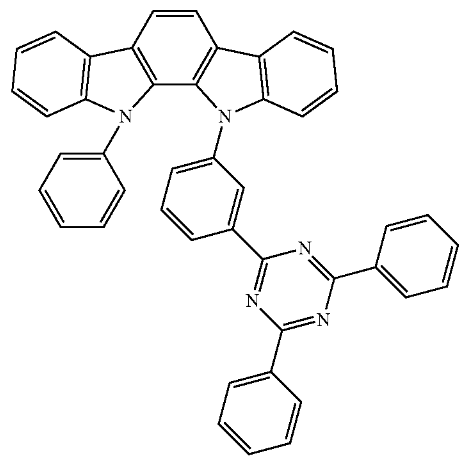
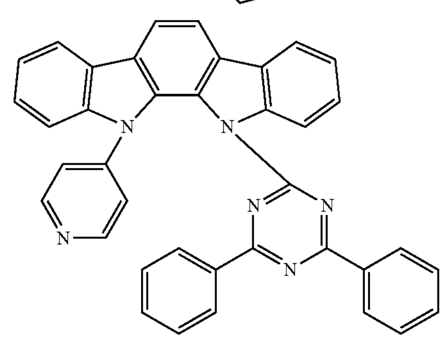
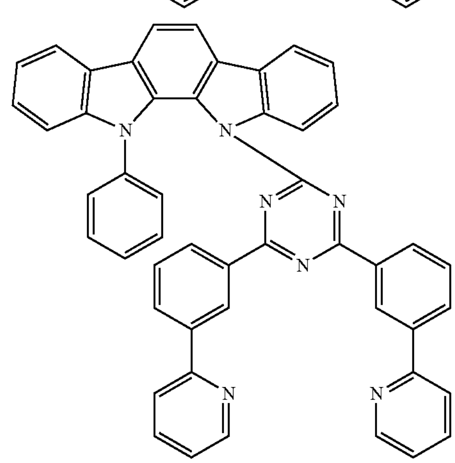

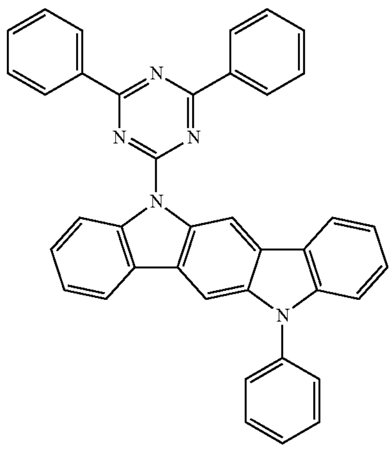
N
N
N
N
N
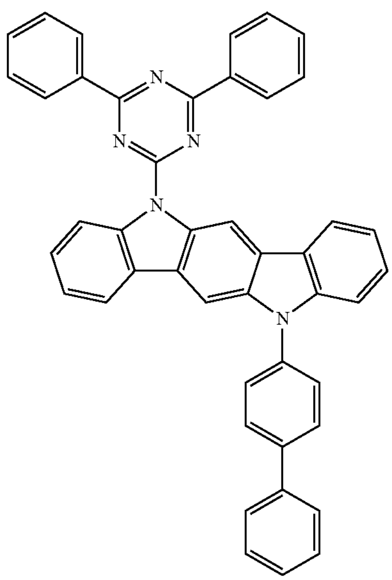
N
N
N
N
N
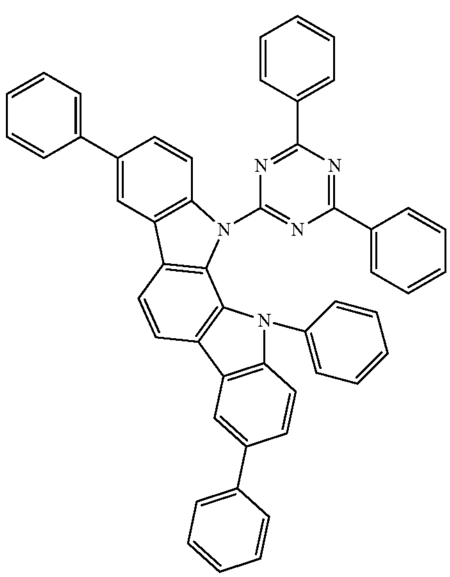
N
N
N
N
N
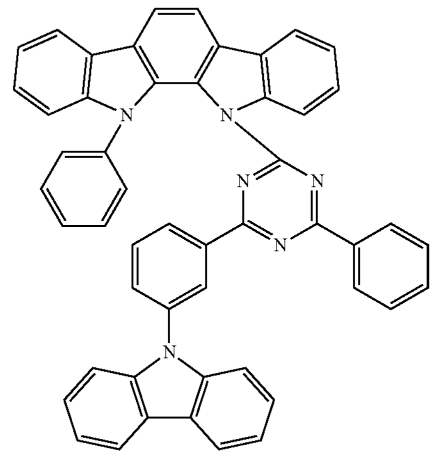
N
N
N
N
N
N
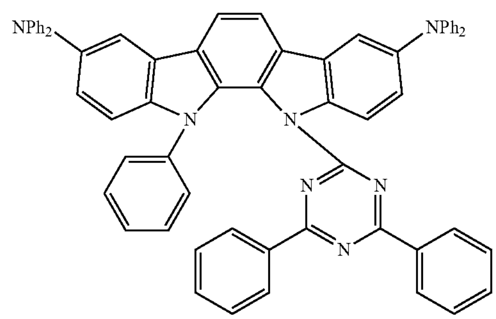
NPh2
NPh2
N
N
N
N
N
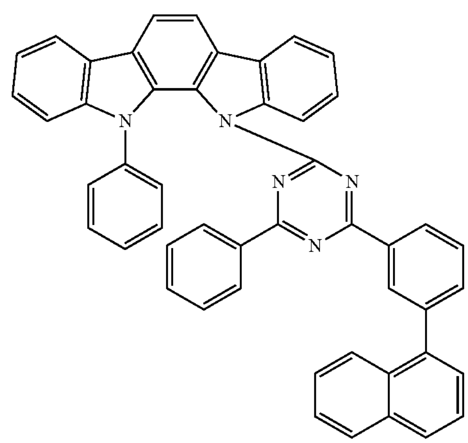
N
N
N
N
N
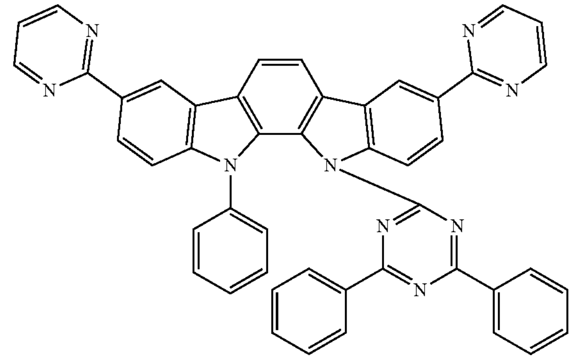
N
N
N
N
N
N
N
N
N -continued
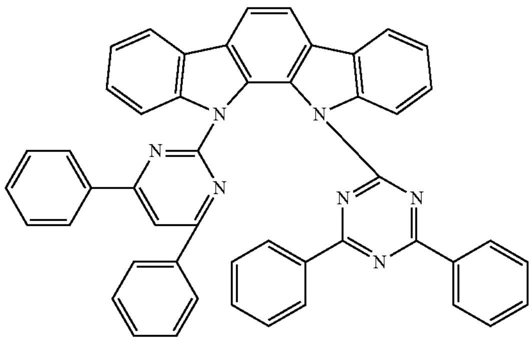
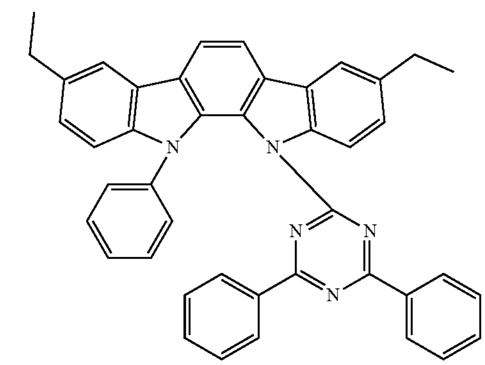
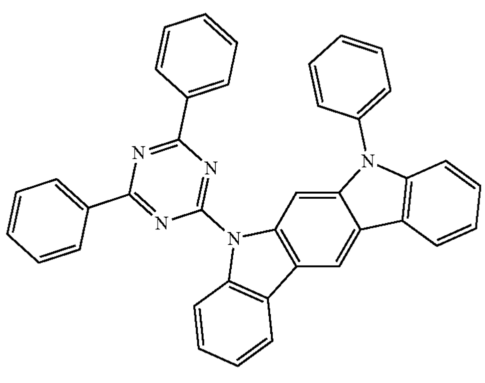
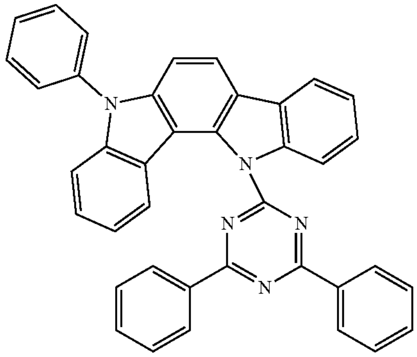
-continued
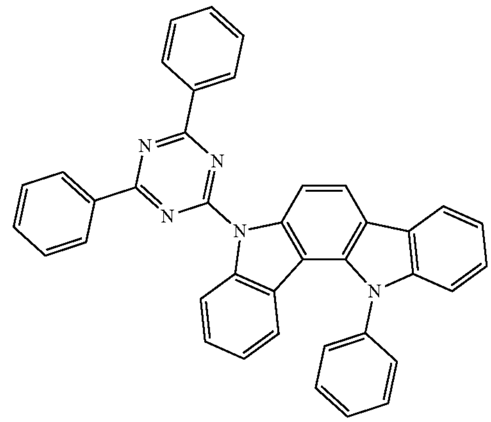
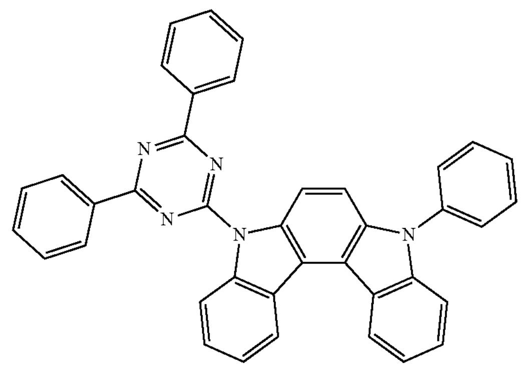
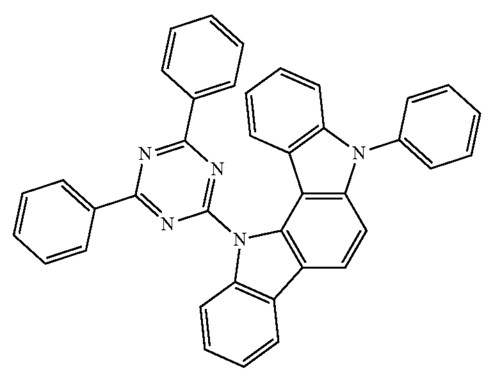
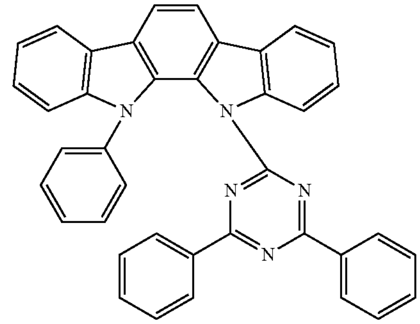

-continued
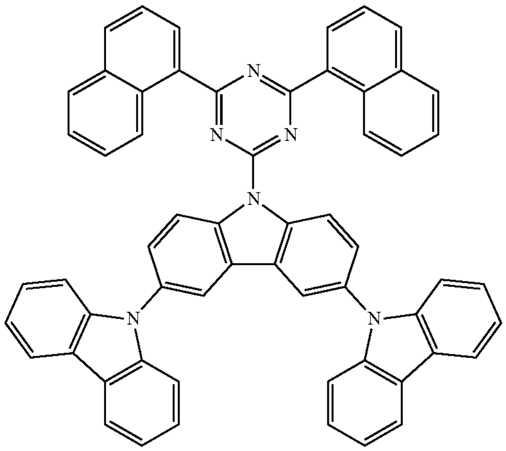
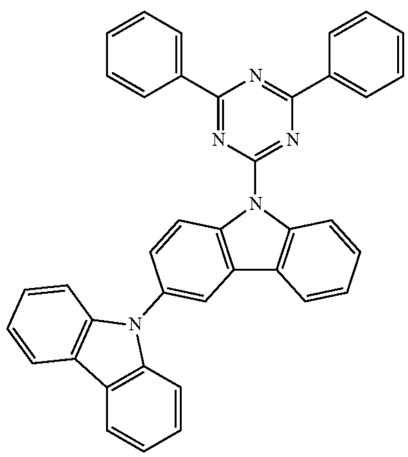
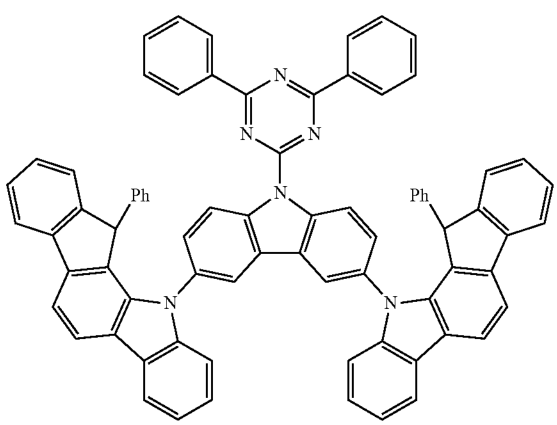
-continued
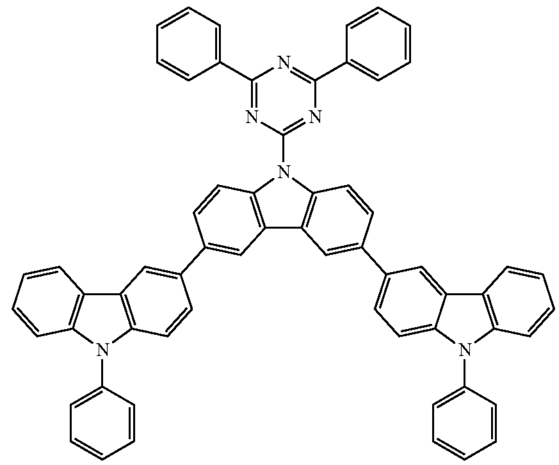
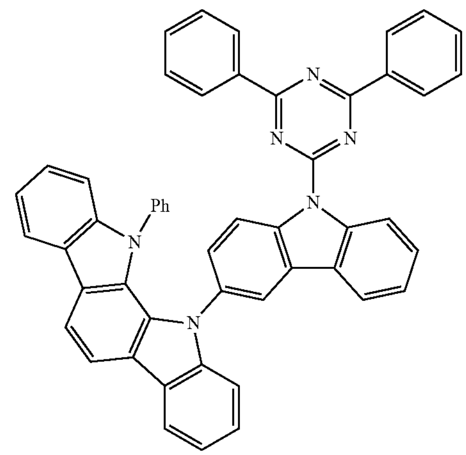
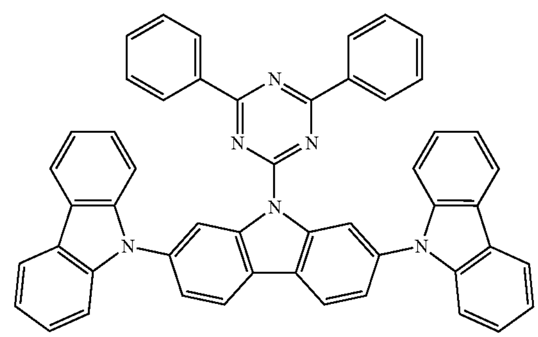
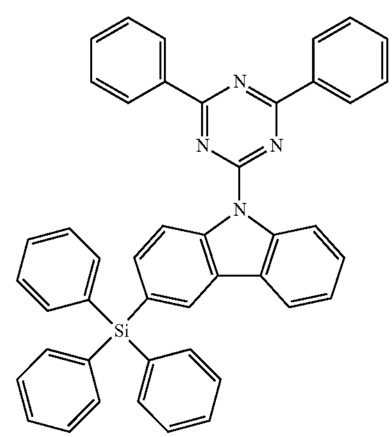

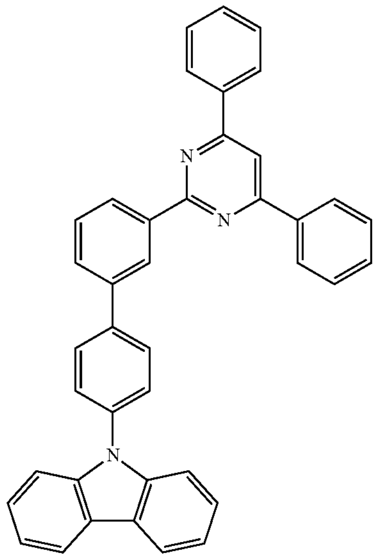
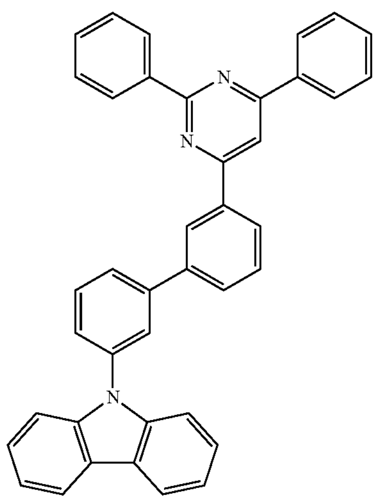
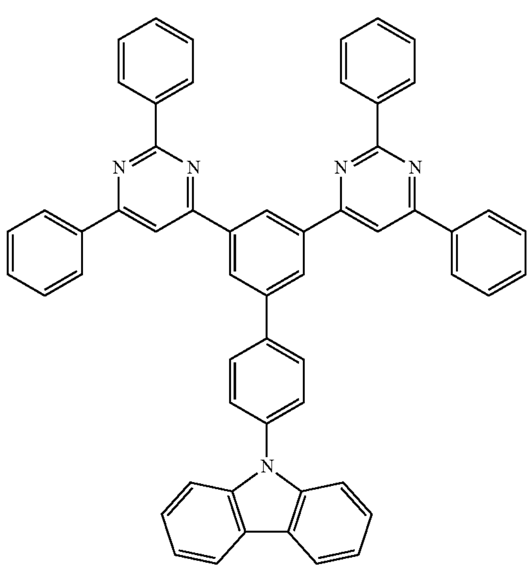
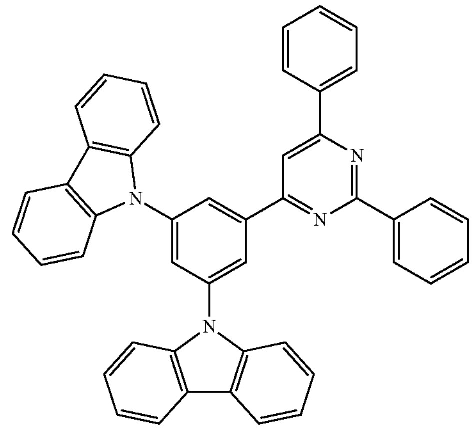
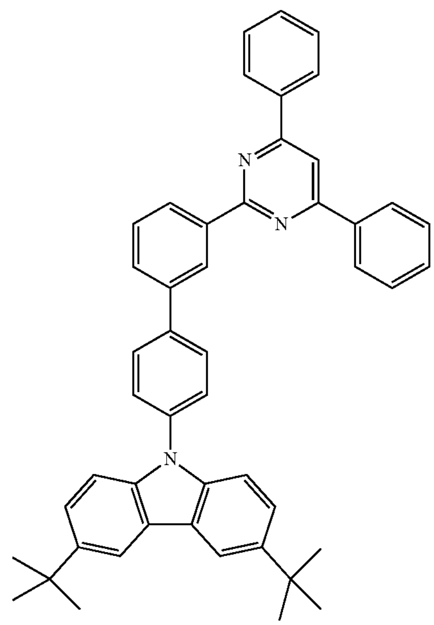
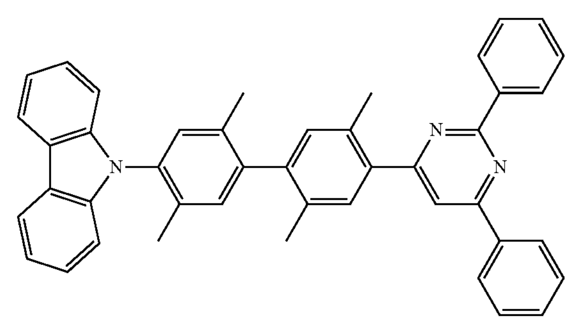

-continued
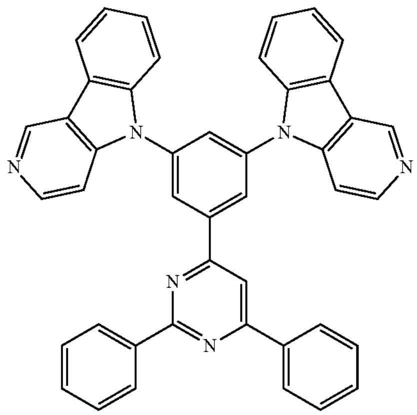
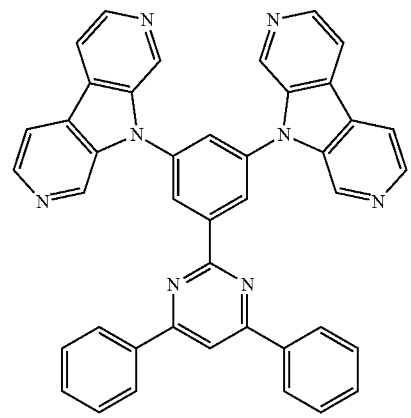
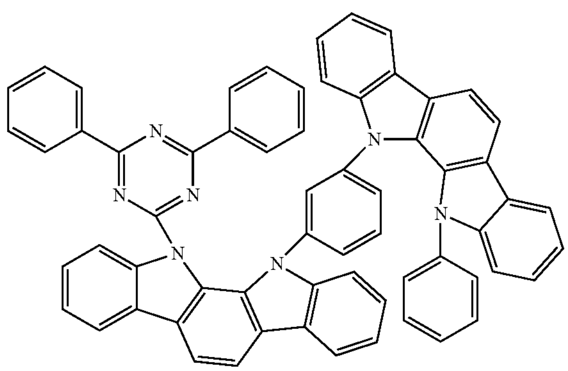
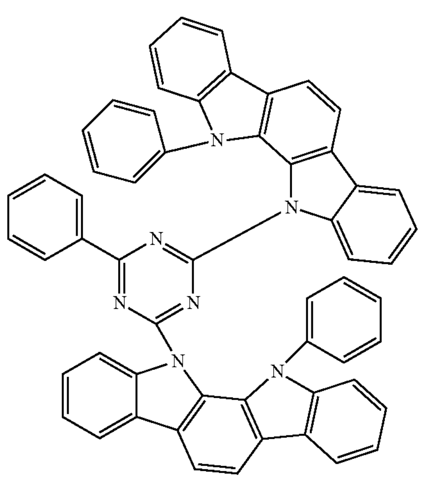
-continued
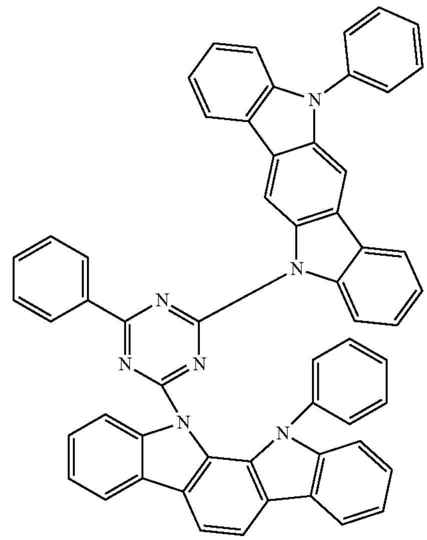
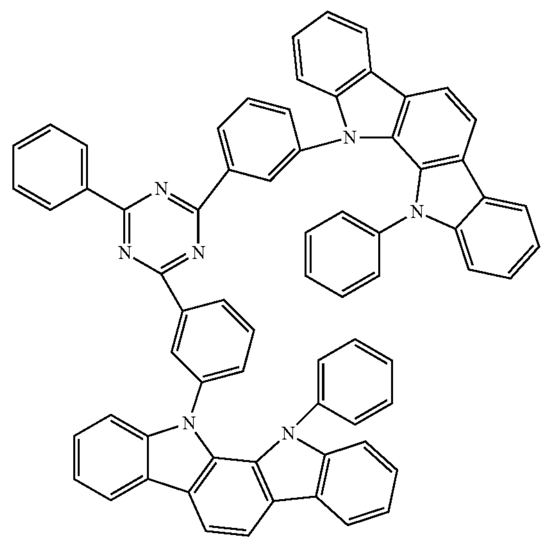
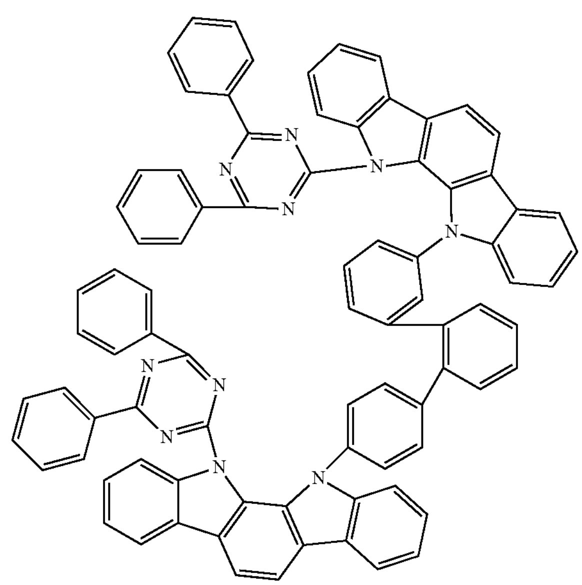

-continued
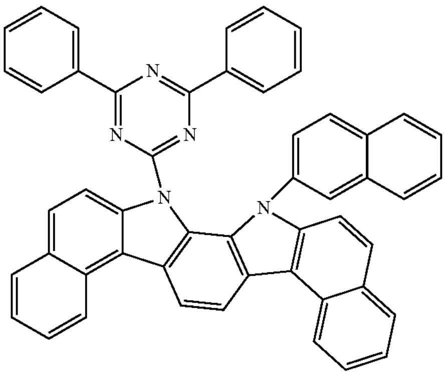
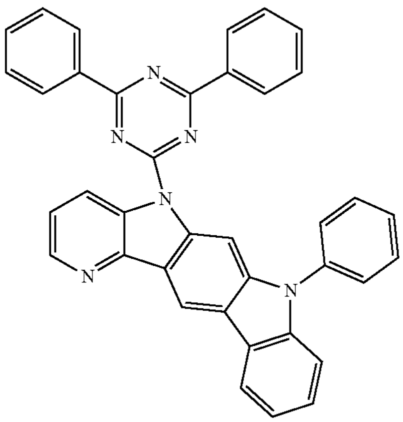
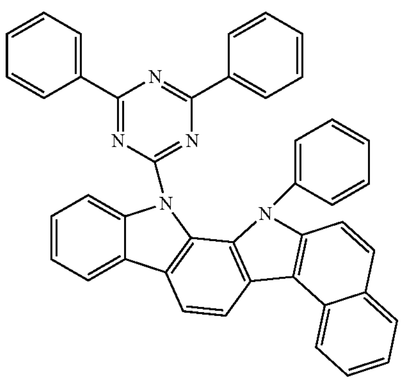
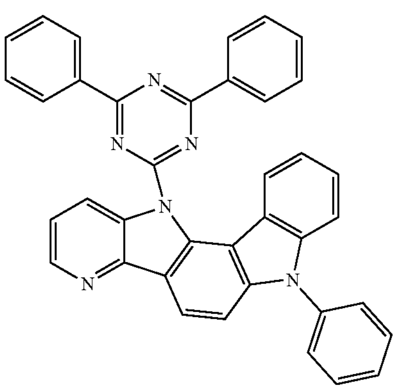
-continued
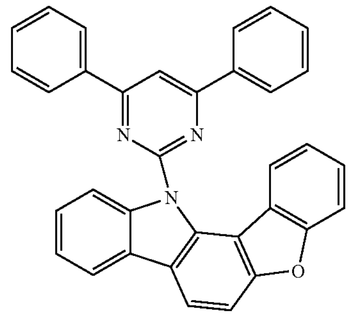
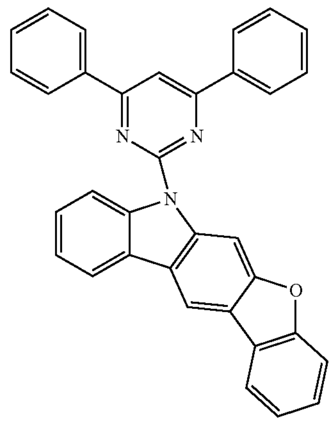
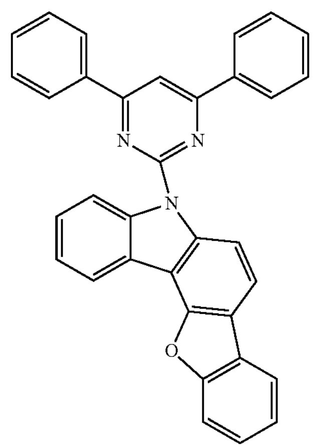
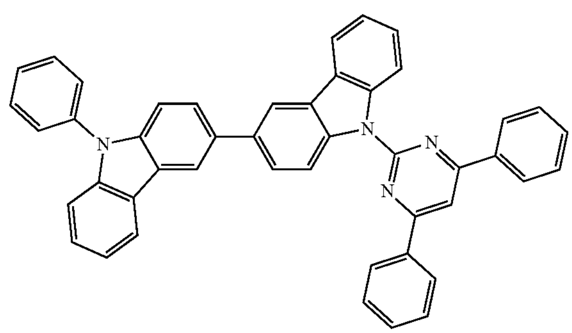

-continued
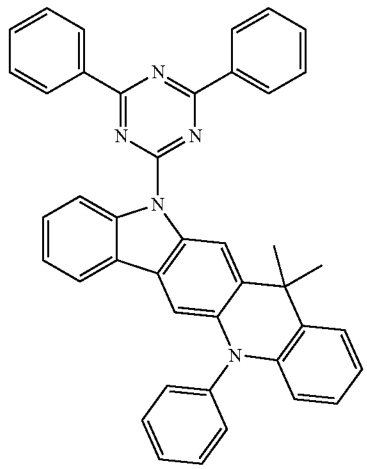
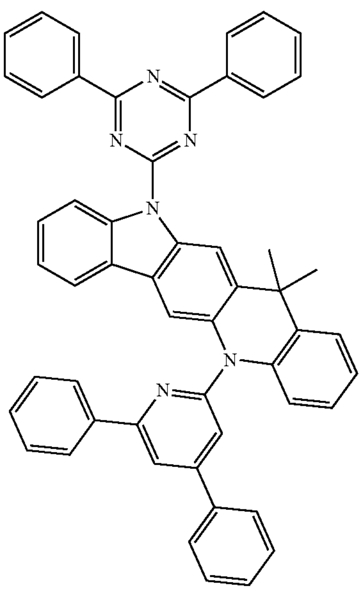
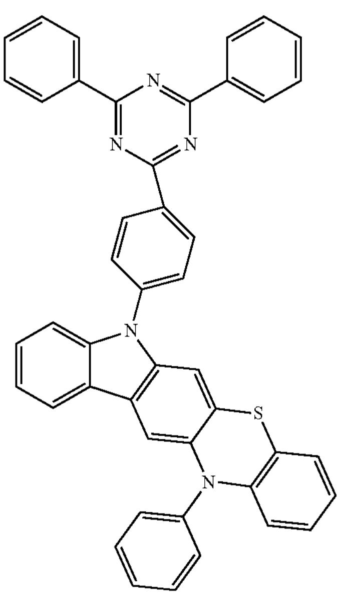
-continued
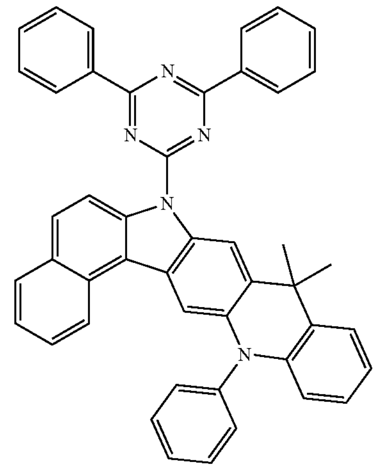
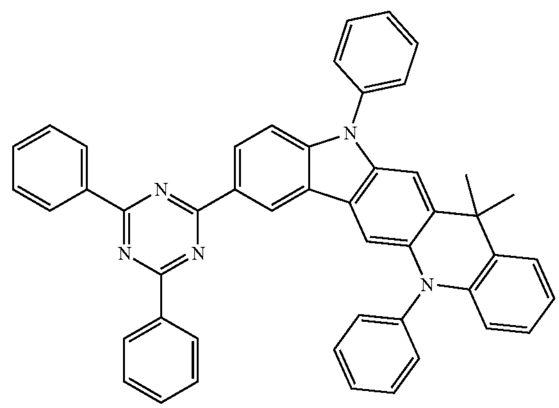
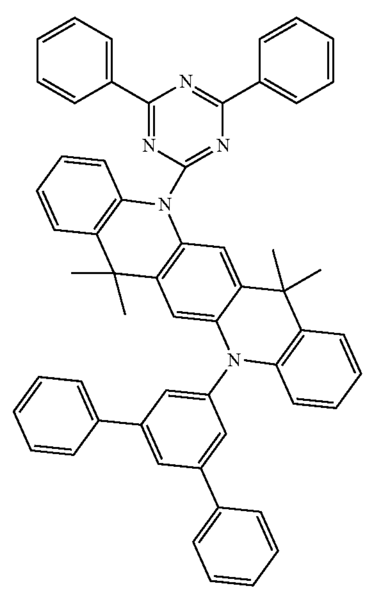

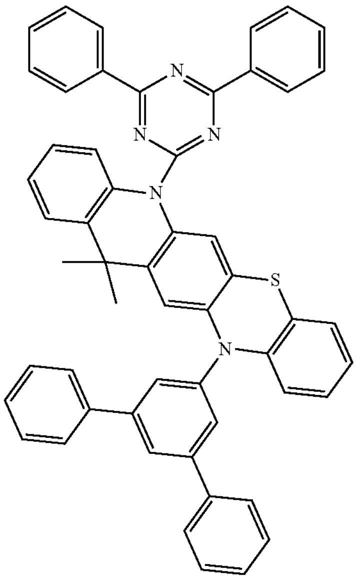
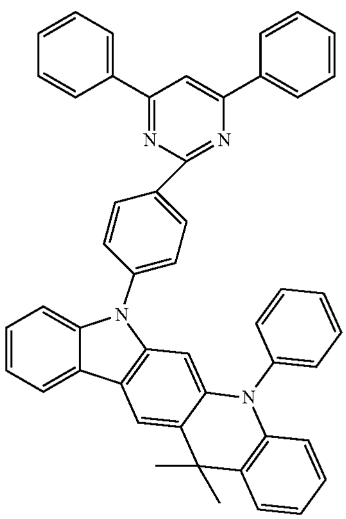
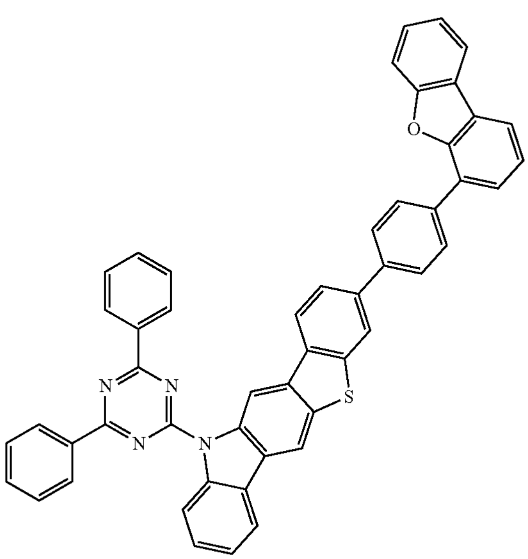
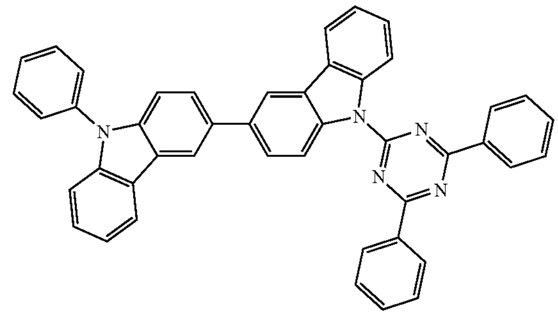
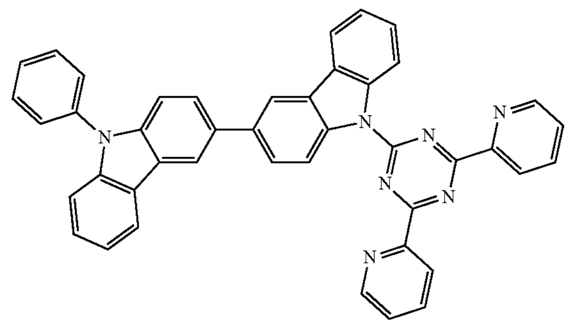
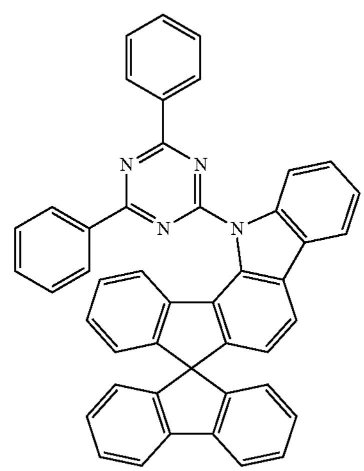
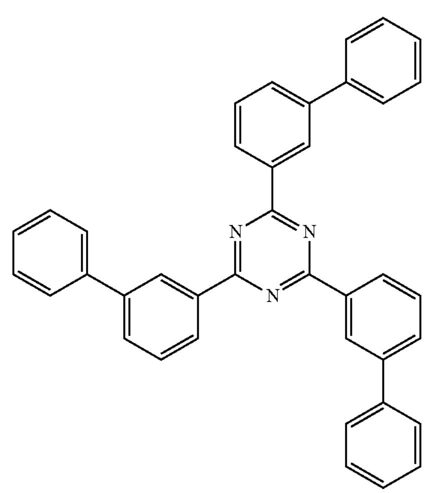

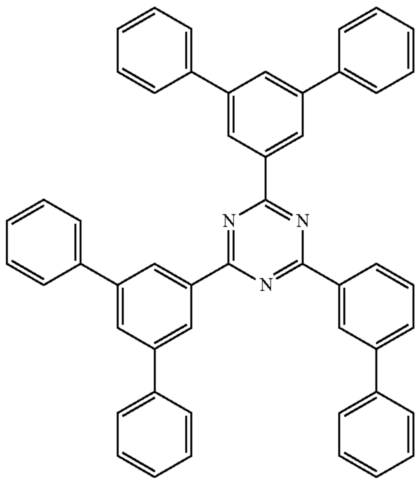
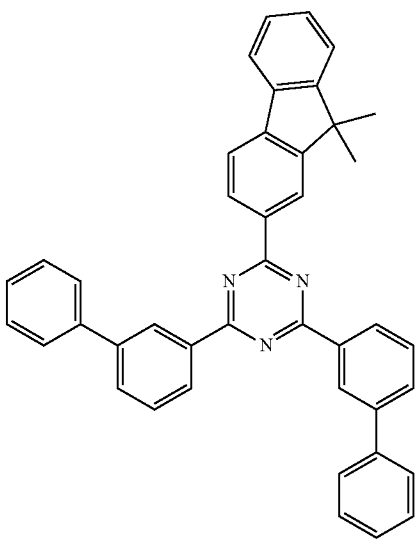
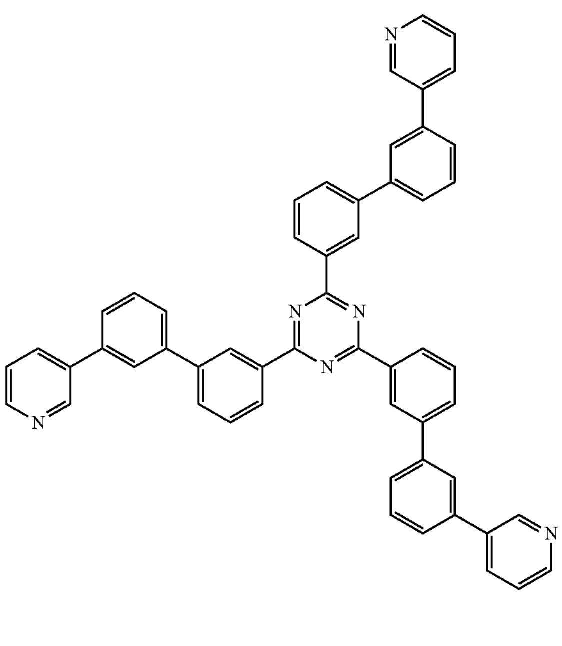
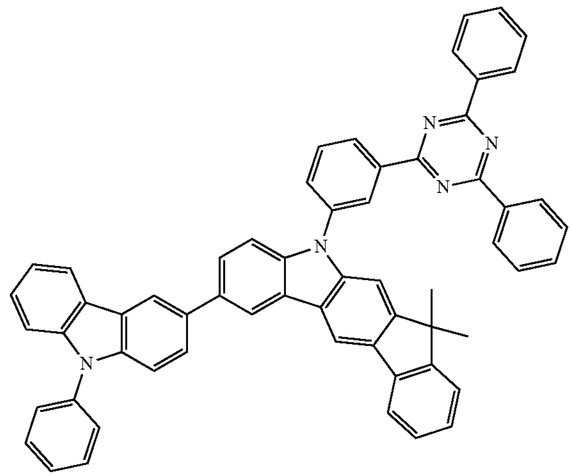
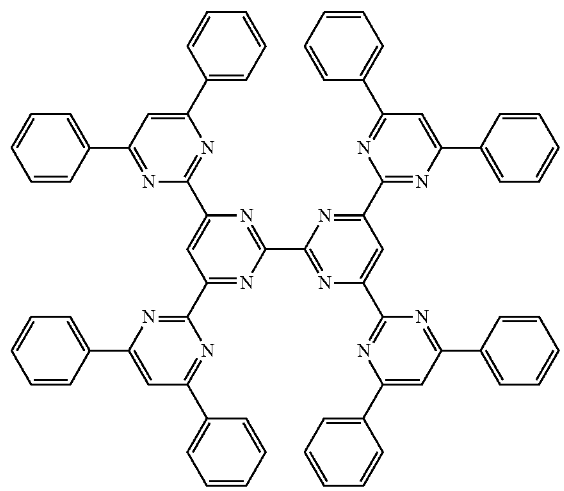
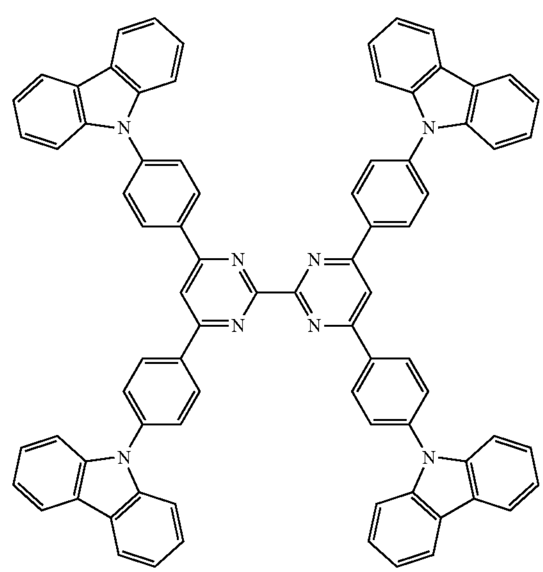

-continued
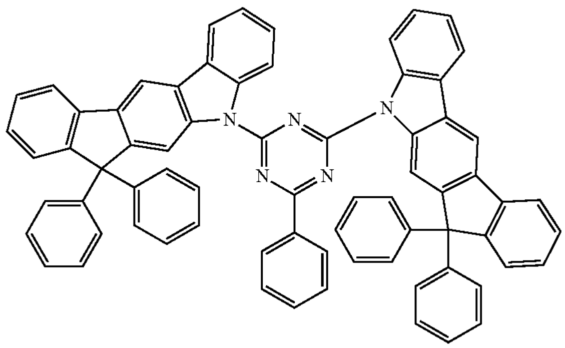
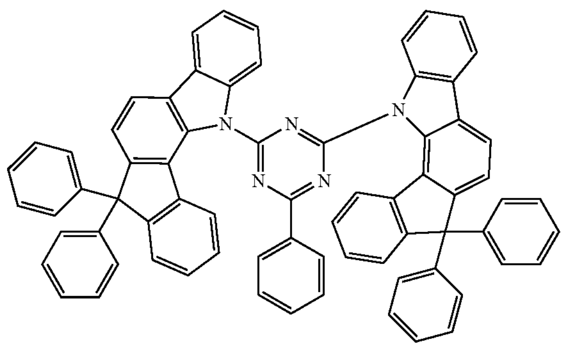
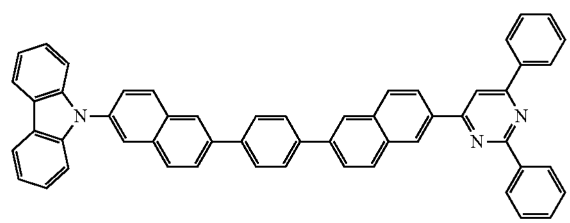
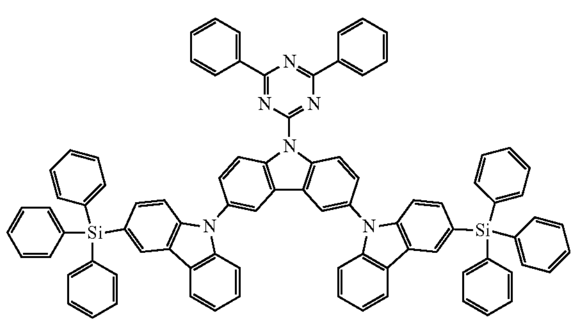
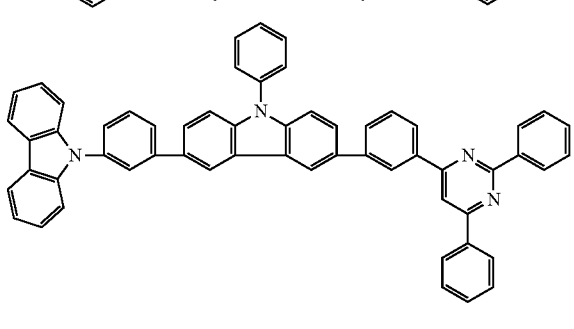
-continued
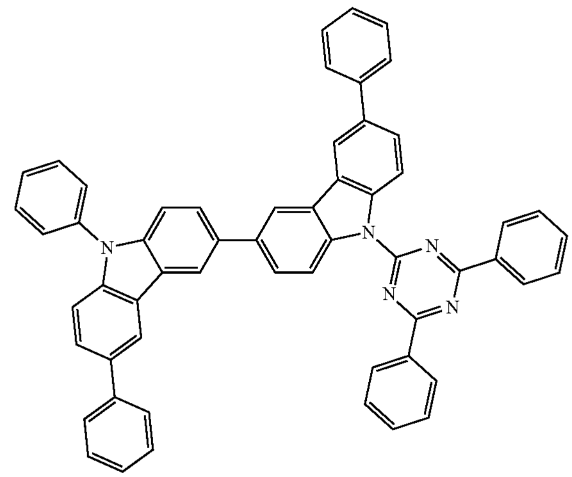
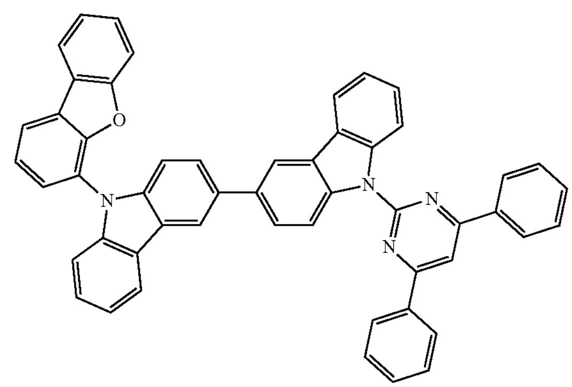
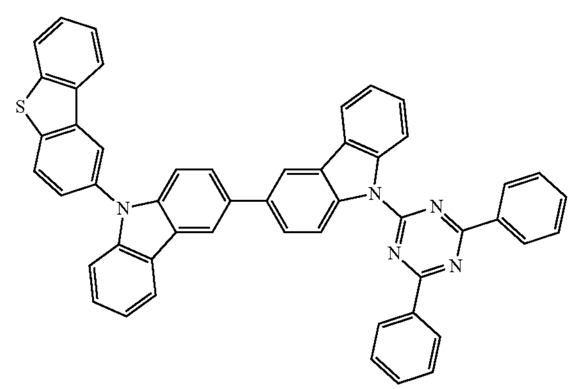
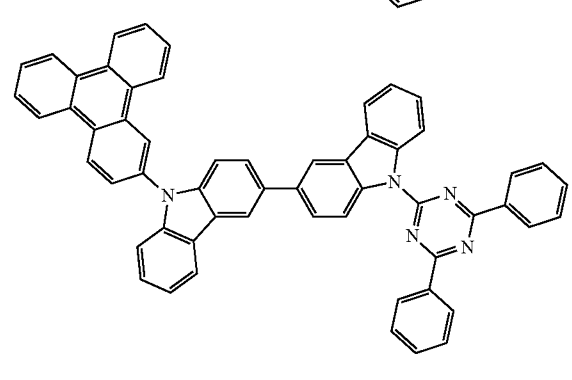

-continued
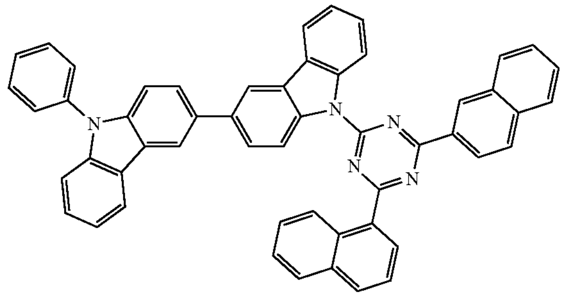
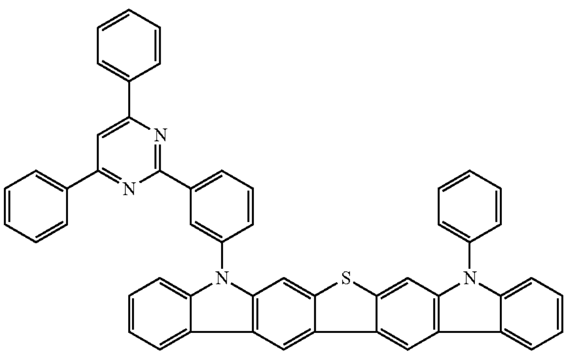
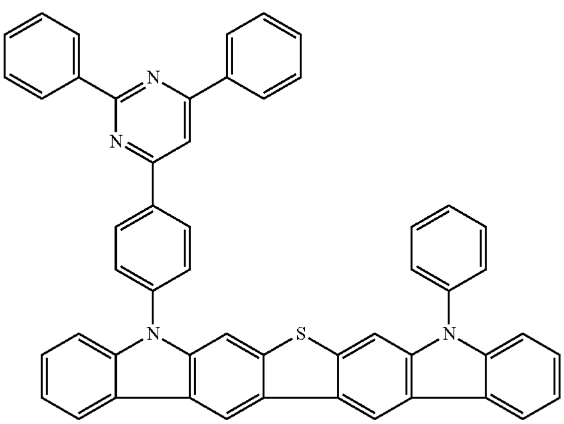
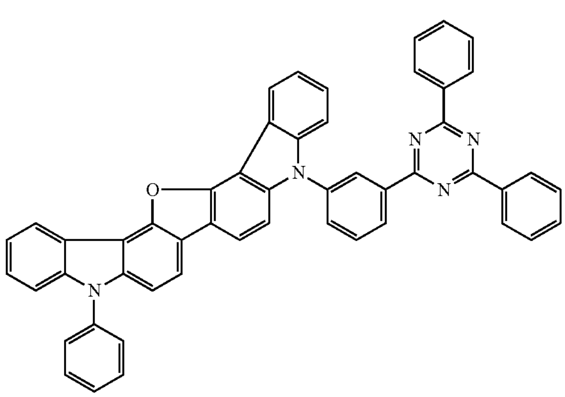
-continued
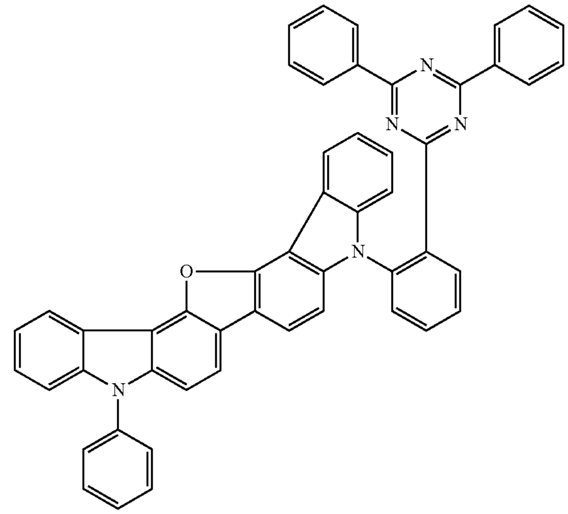
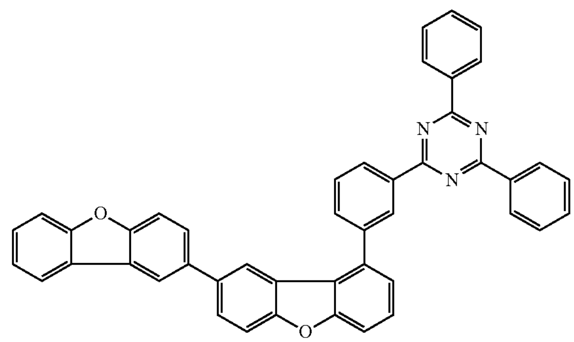
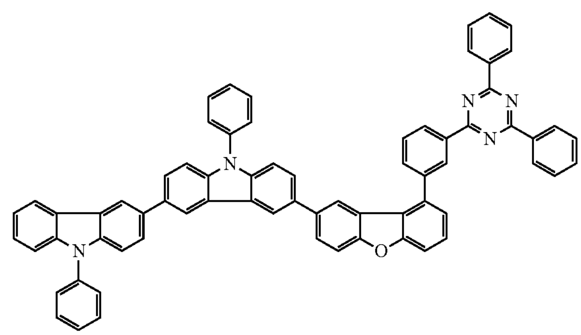
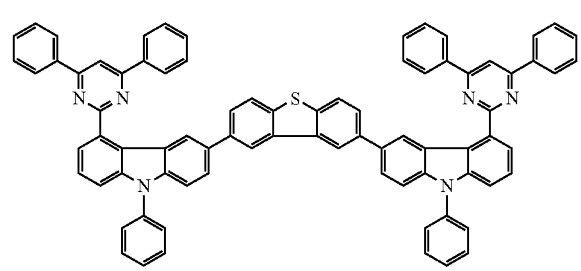

-continued
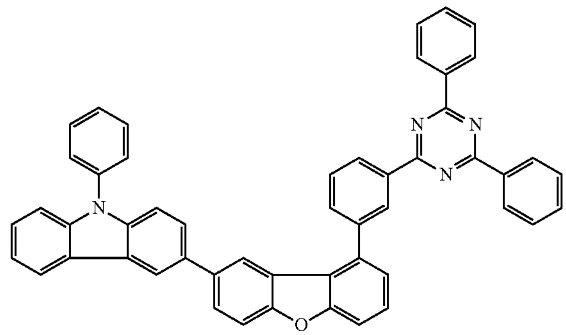
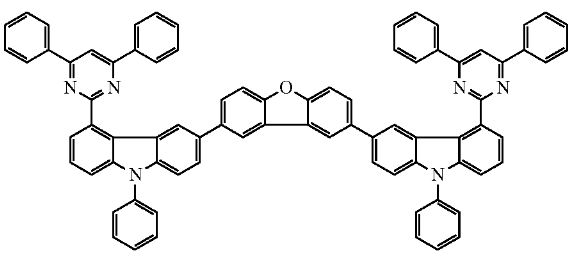
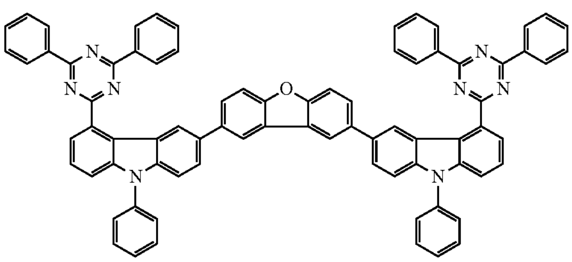
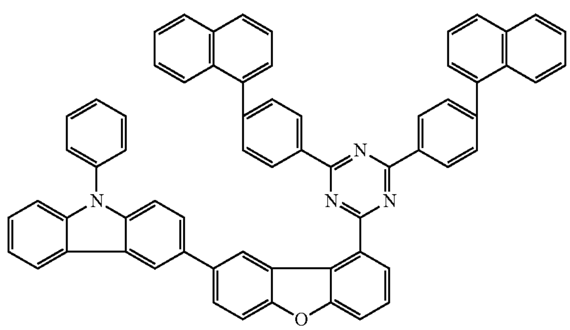
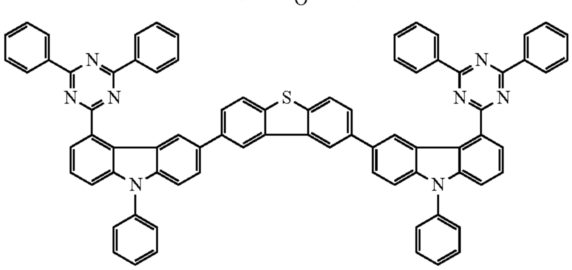
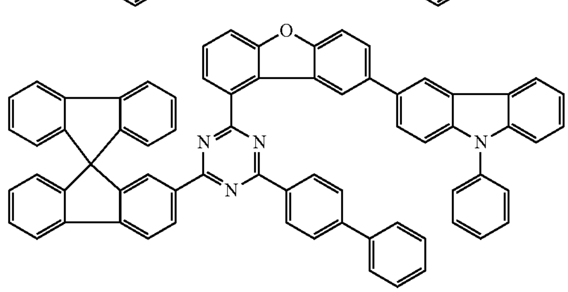
-continued
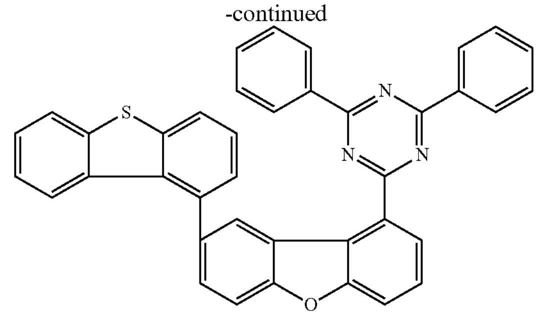
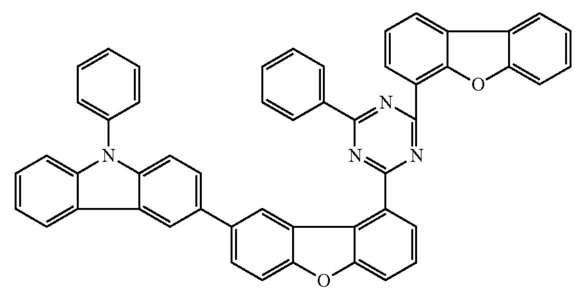
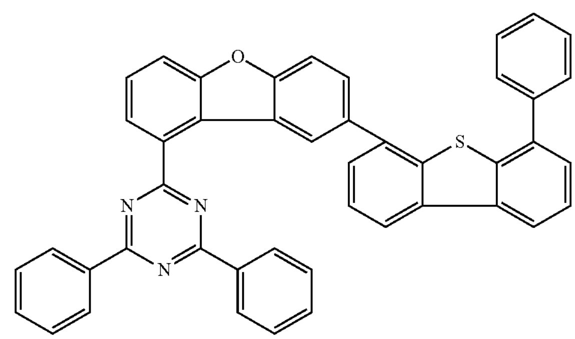
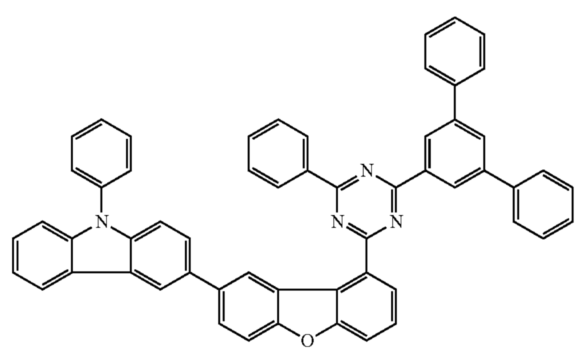
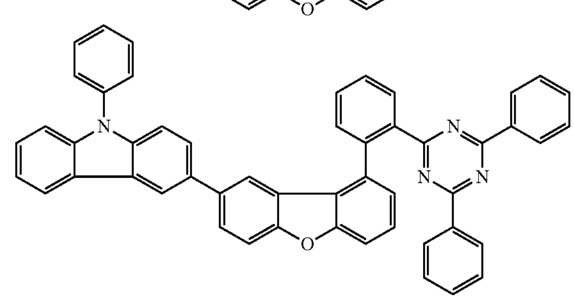

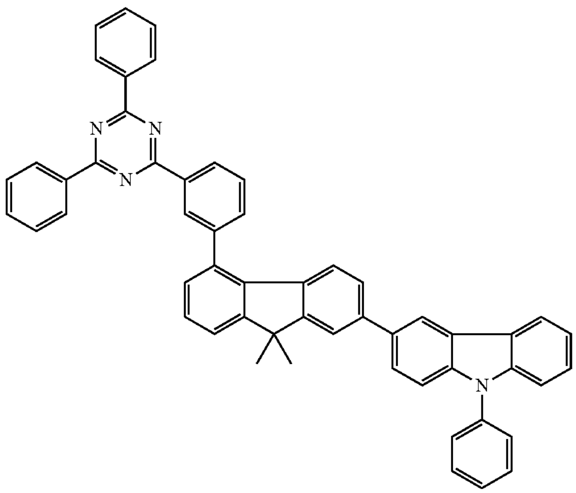
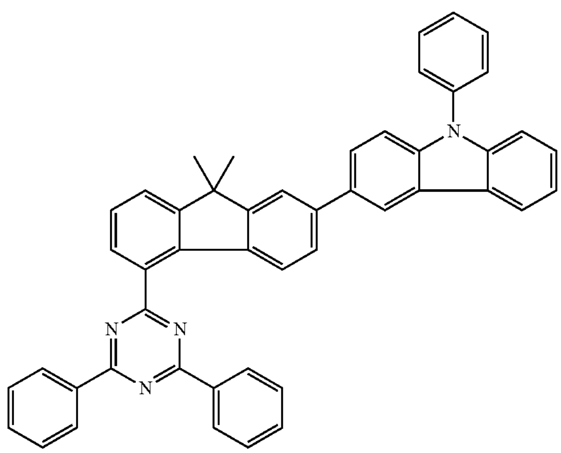
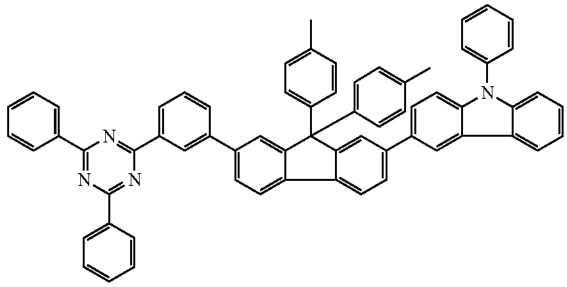
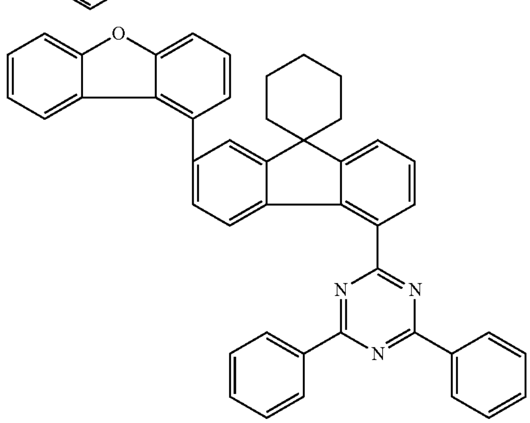
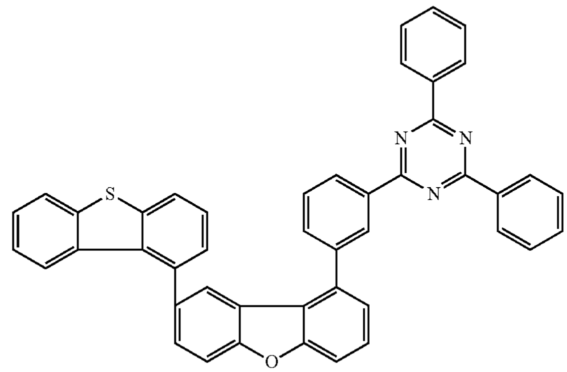
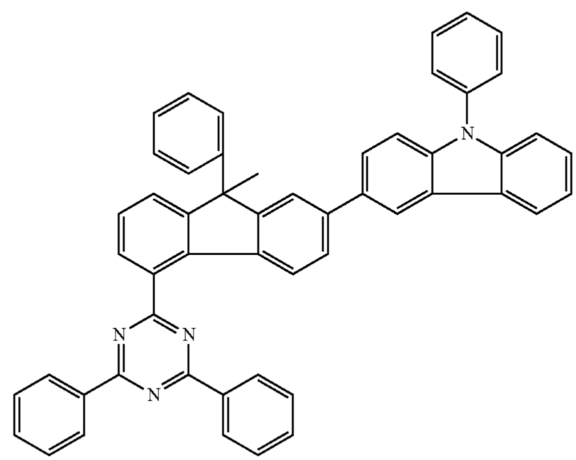
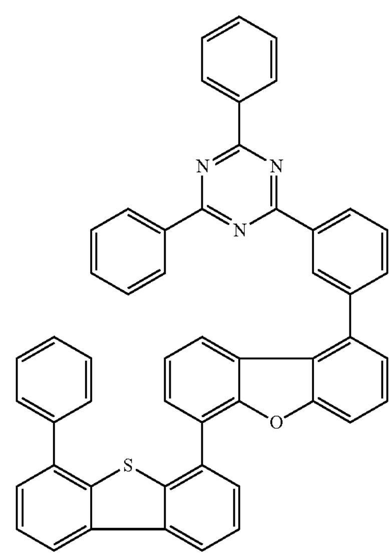

-continued
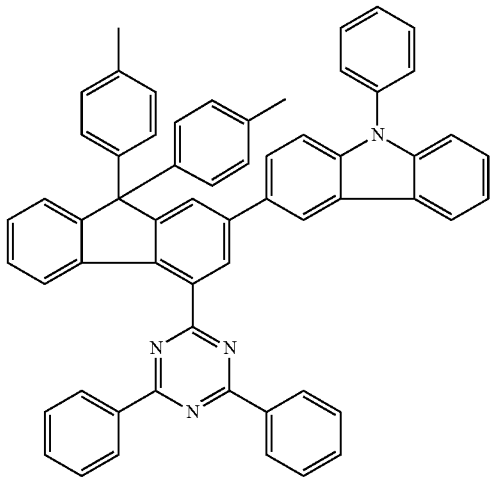
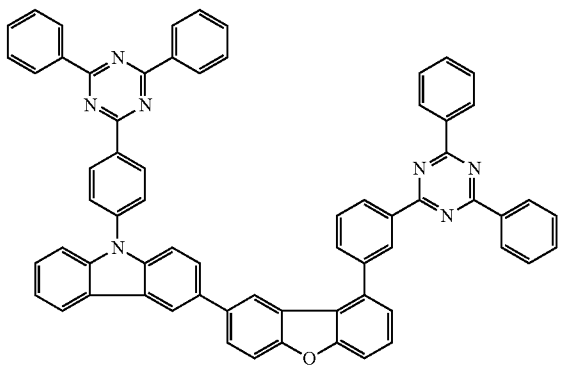
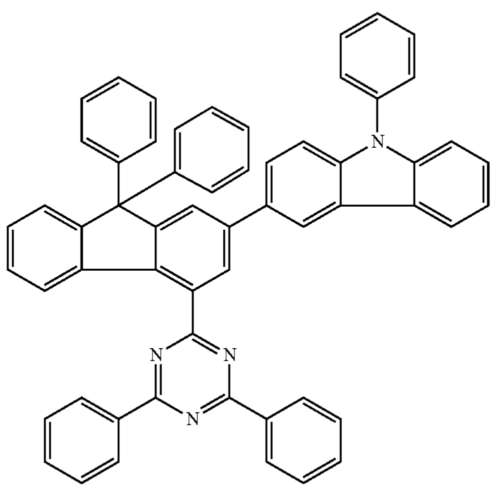
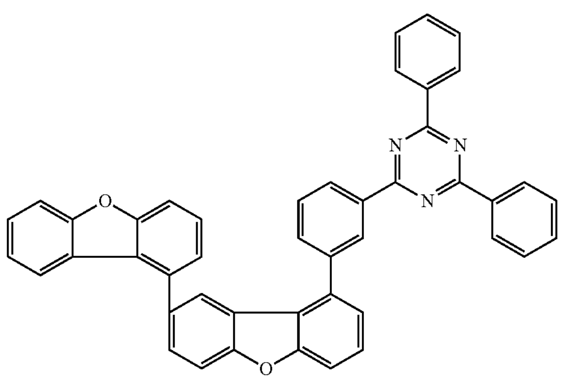
-continued
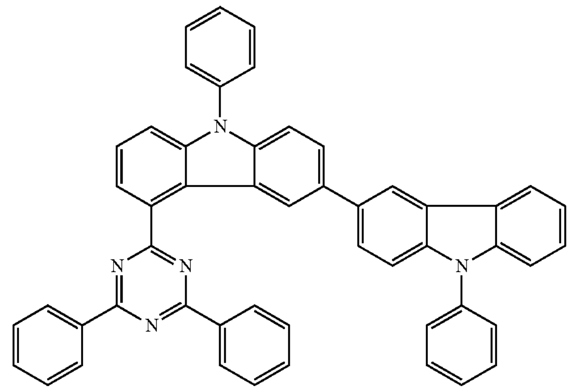
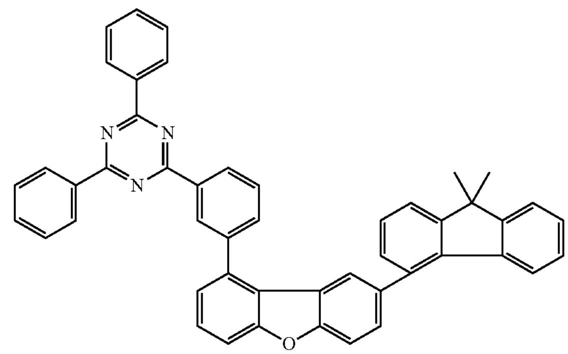
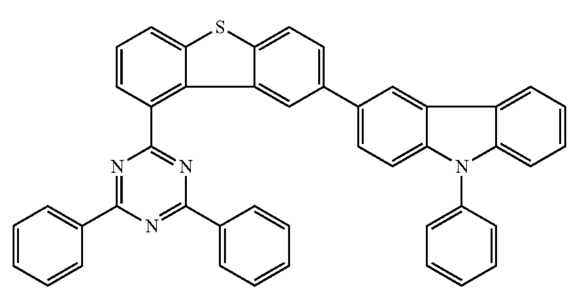
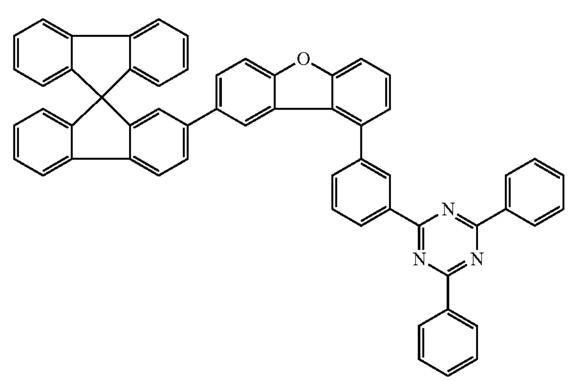

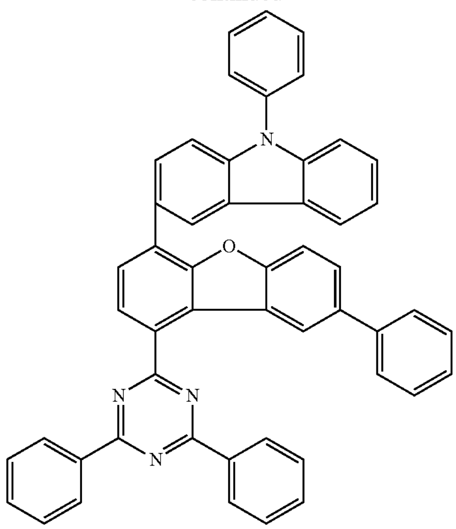
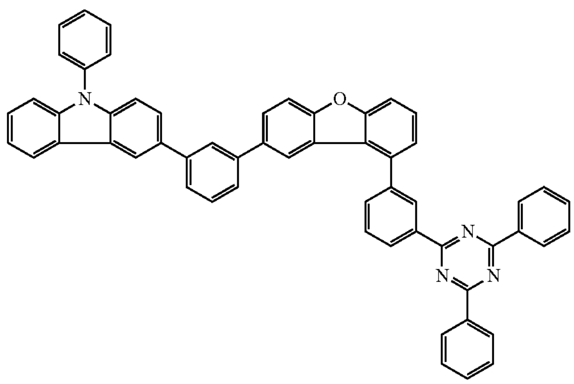
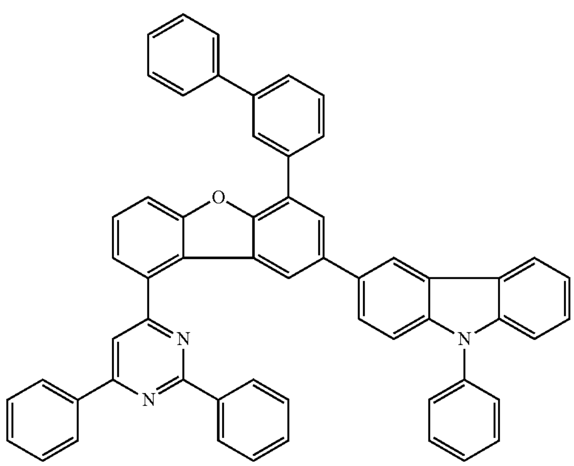
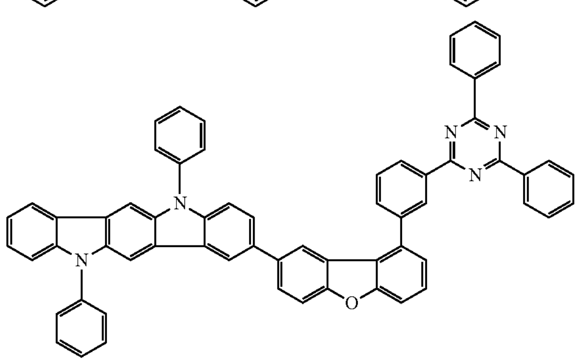
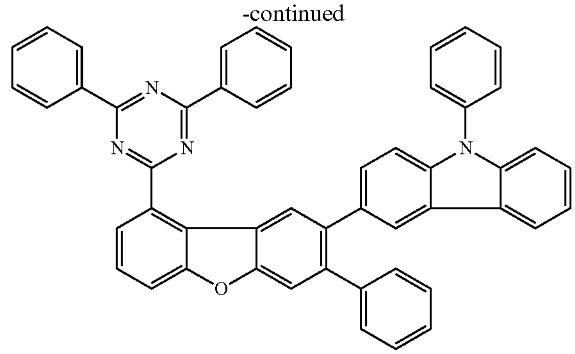
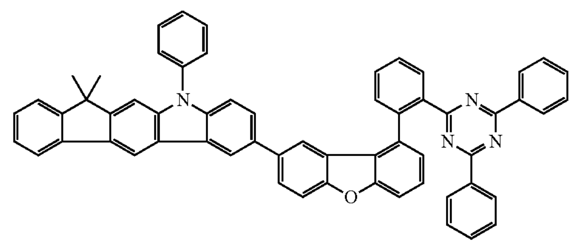
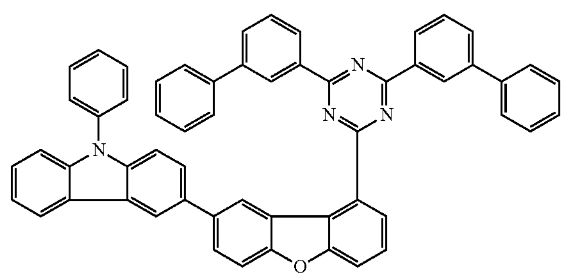
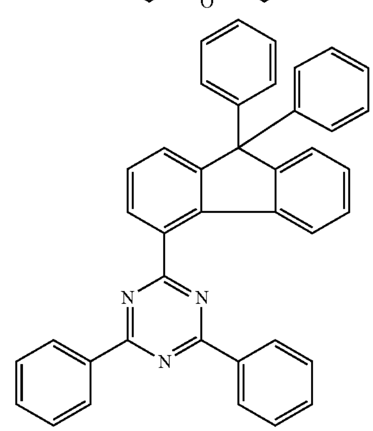
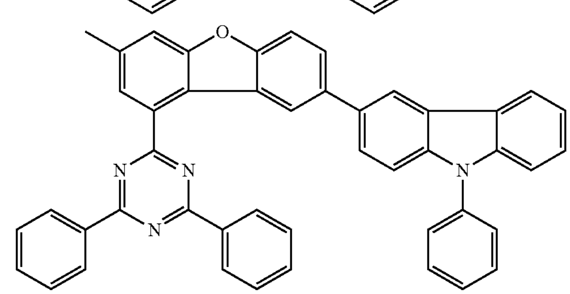

-continued
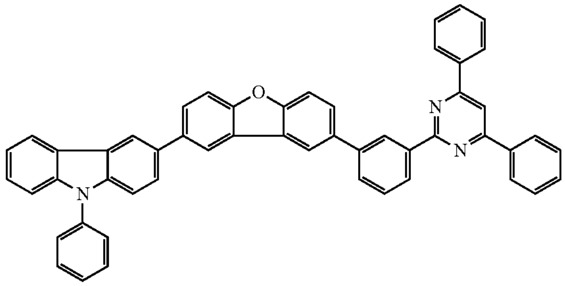
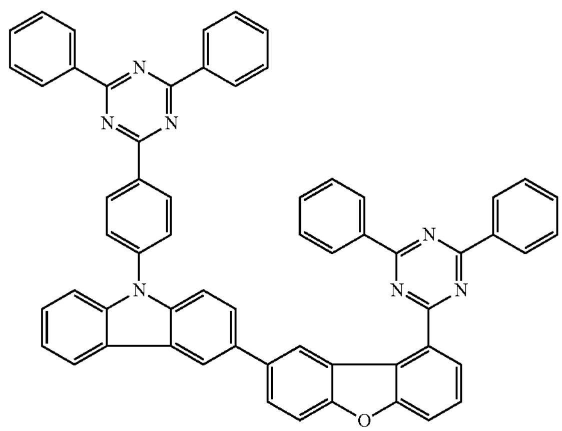
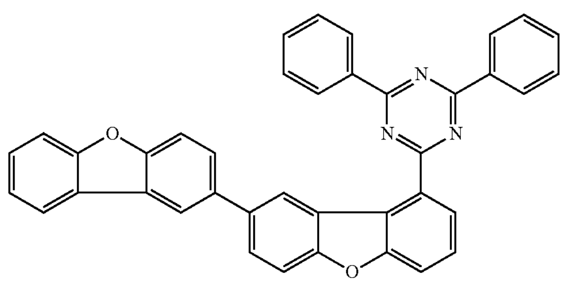
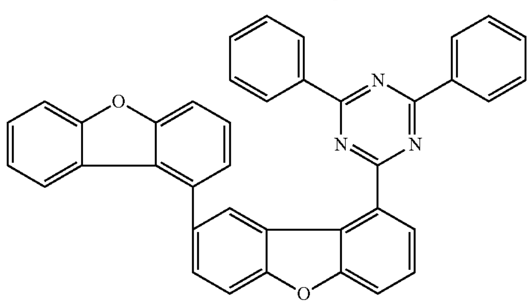
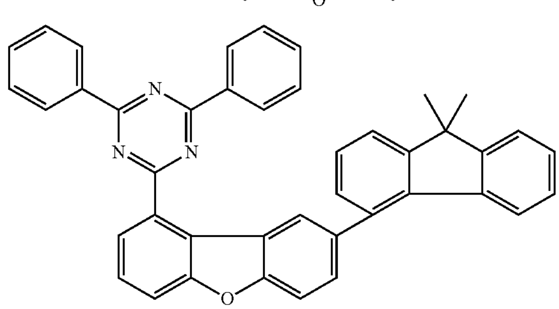
-continued
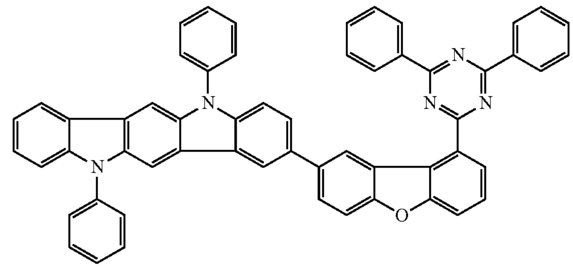
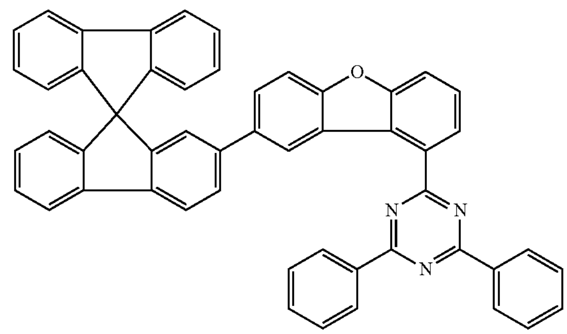
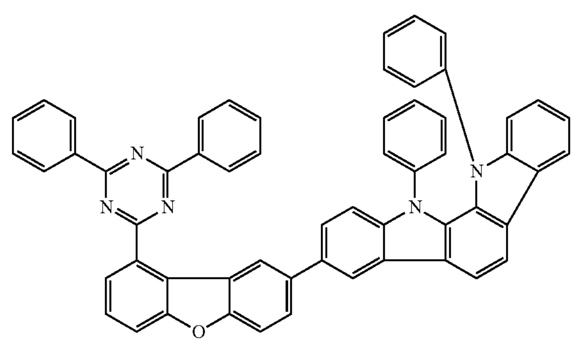
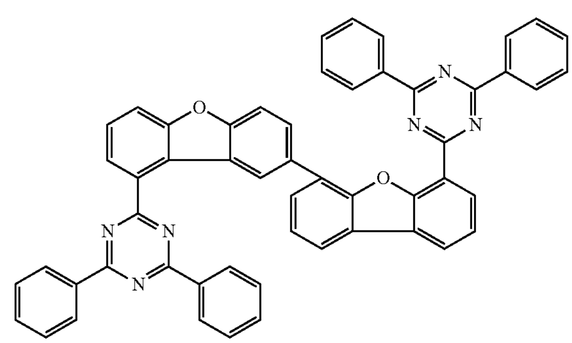
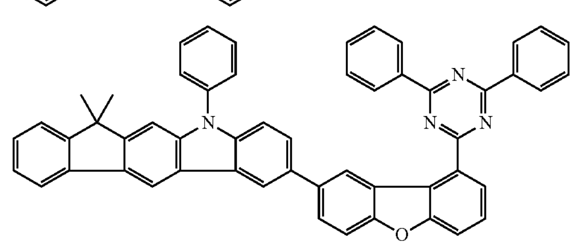

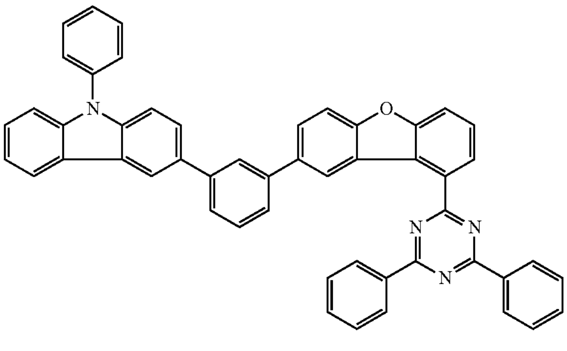
N
O
N
N
N
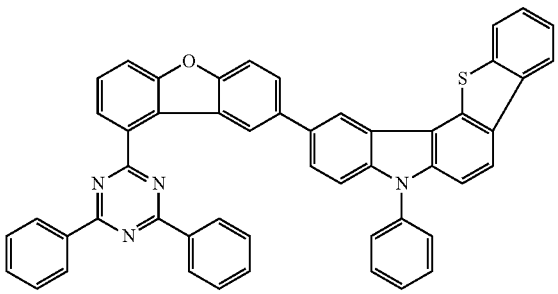
O
S
N
N
N
N
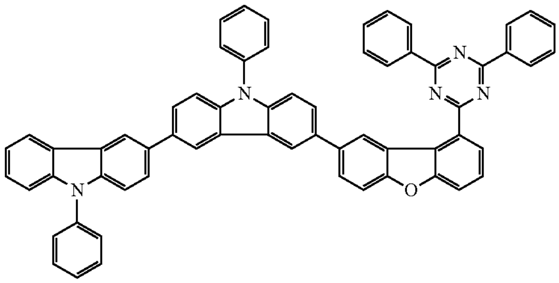
N
N
N
N
N
O
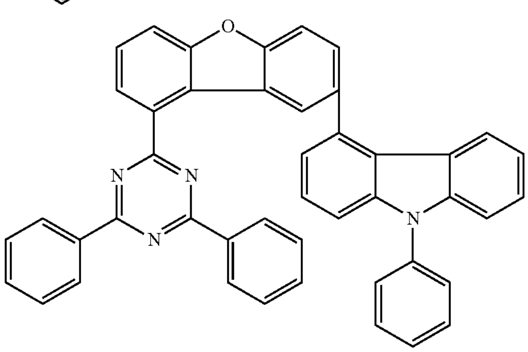
O
N
N
N
N
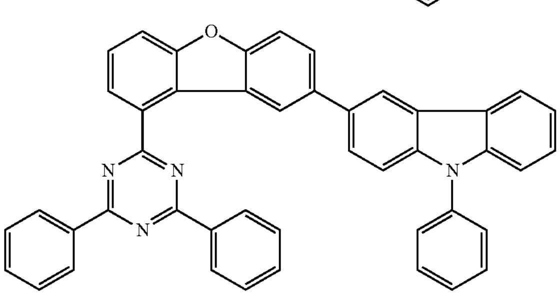
O
N
N
N
N
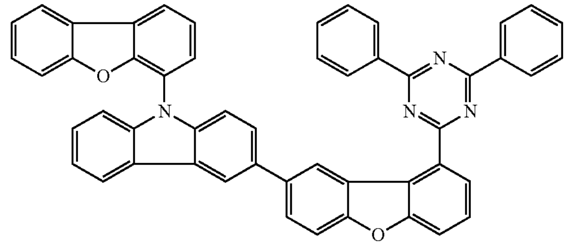
O
N
N
N
N
O
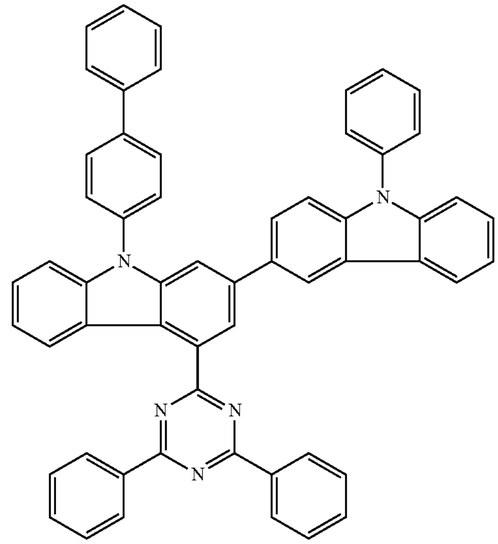
N
N
N
N
N
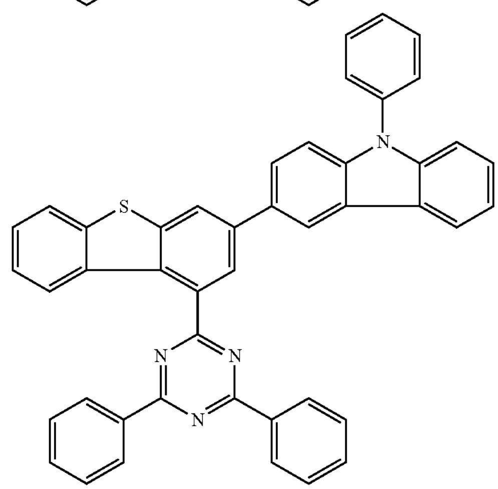
N
S
N
N
N
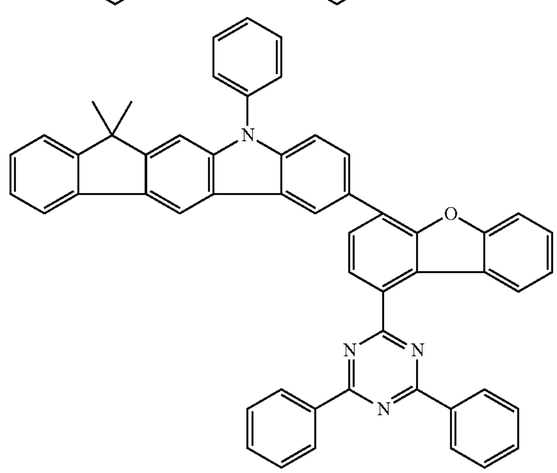
N
O
N
N
N -continued
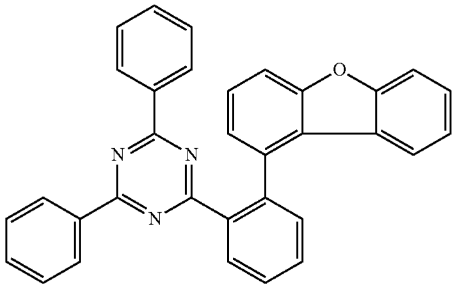
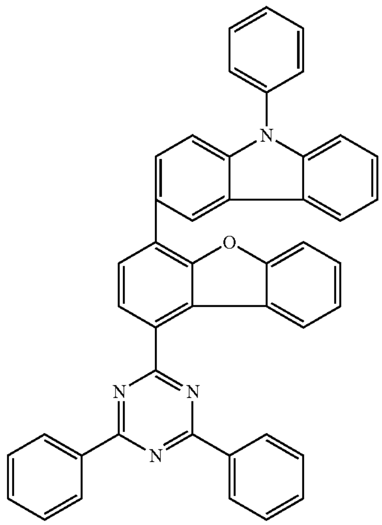
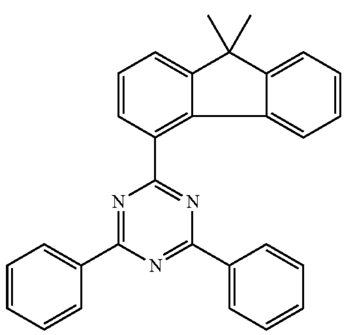
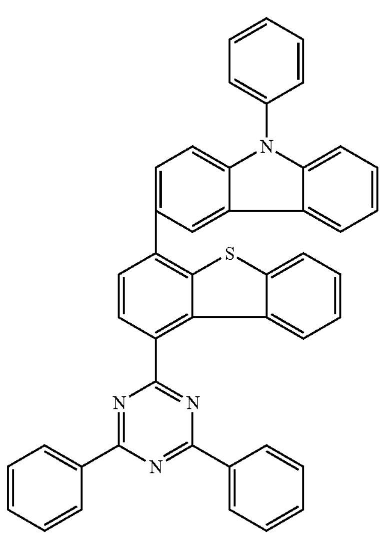
-continued
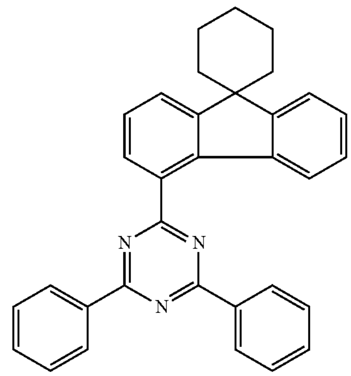
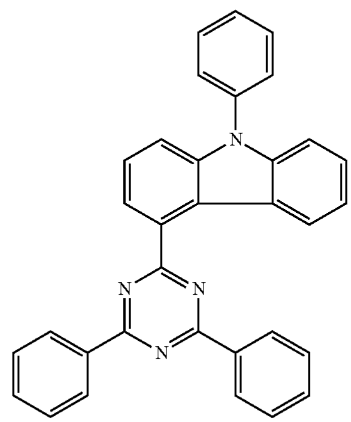
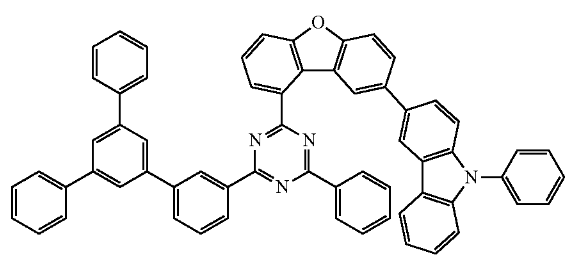
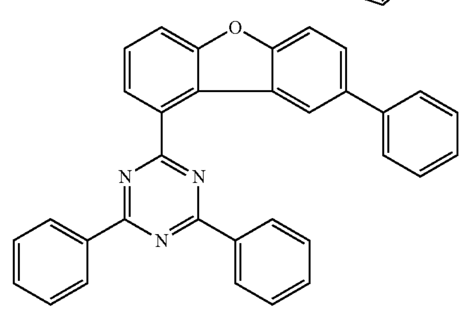
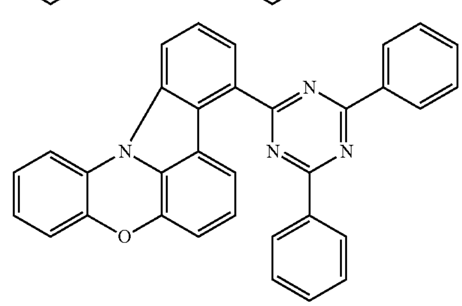

-continued
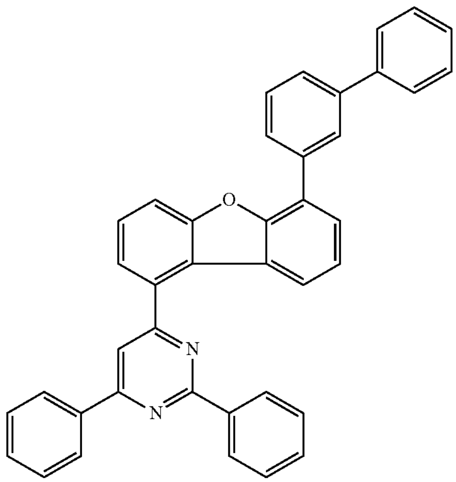
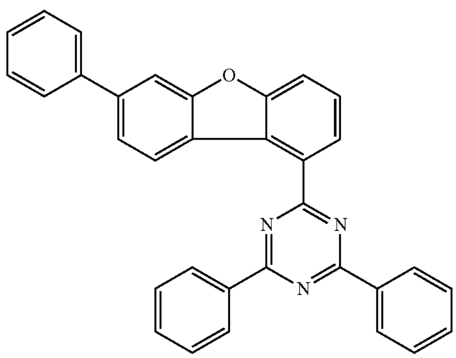
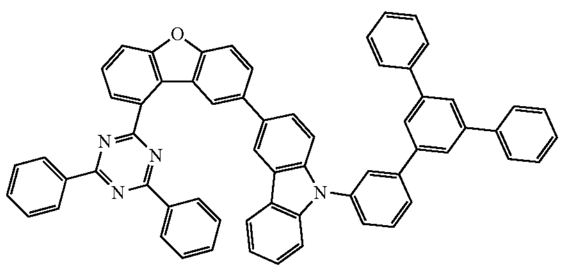
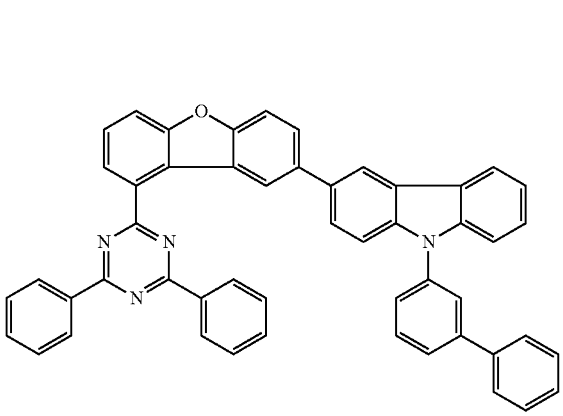
-continued
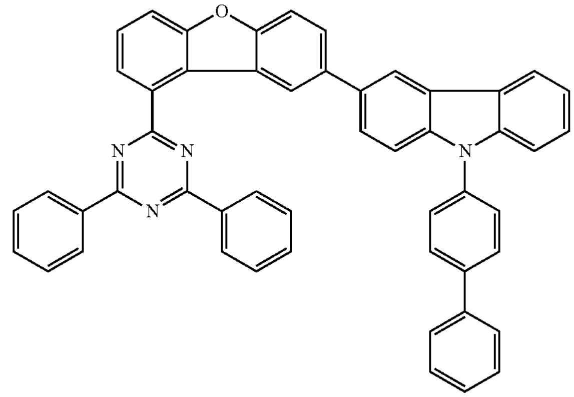
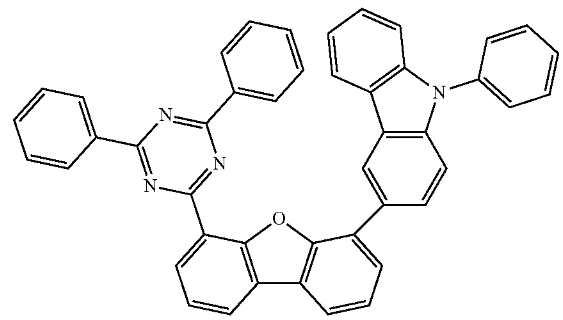
Examples of lactams which can be used as electron-transporting matrix materials are the following compounds:
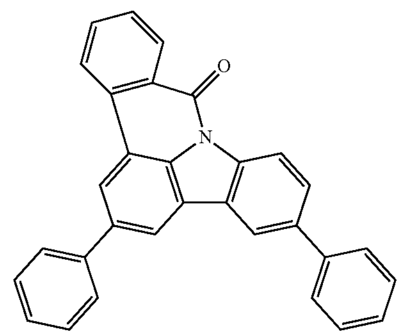
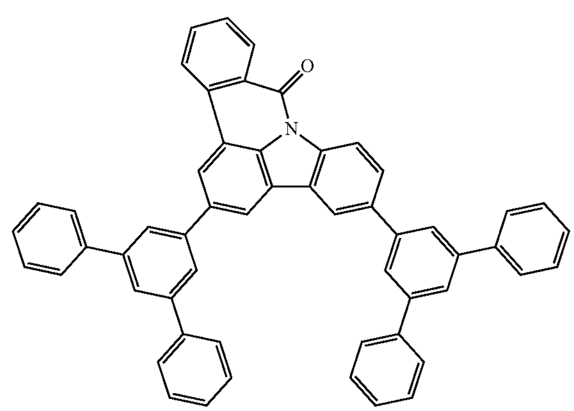

-continued
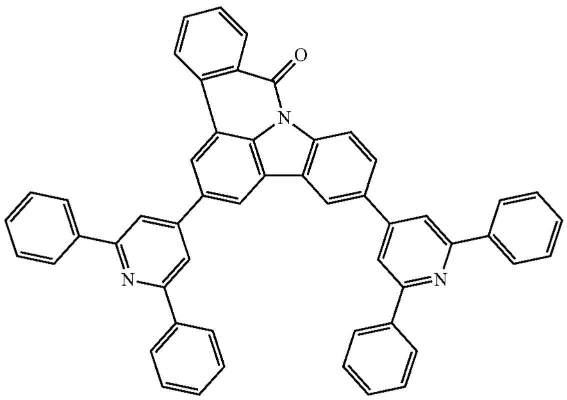
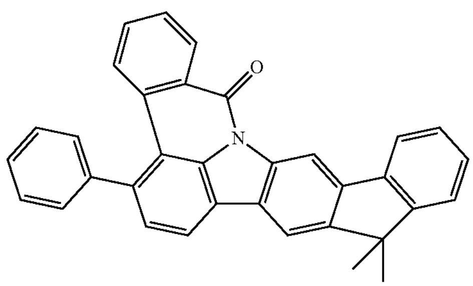
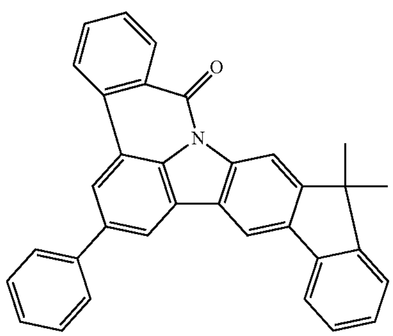
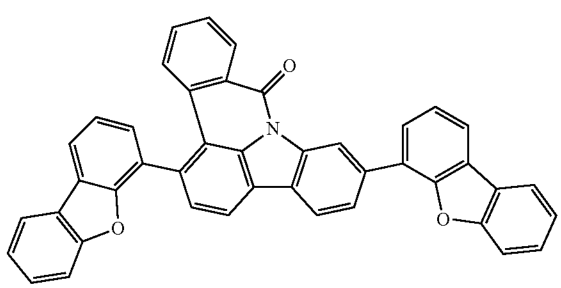
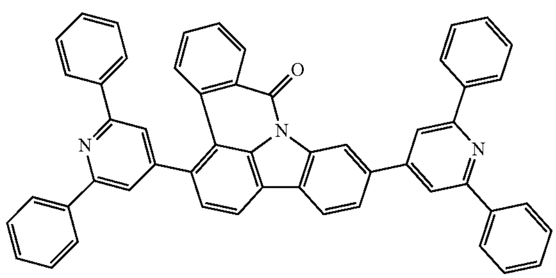
-continued
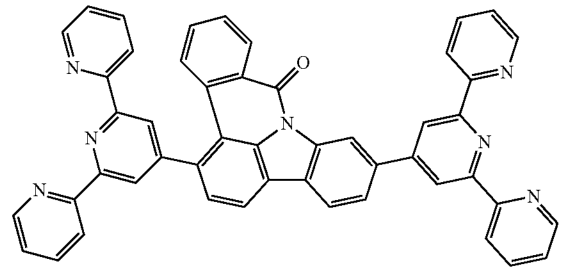
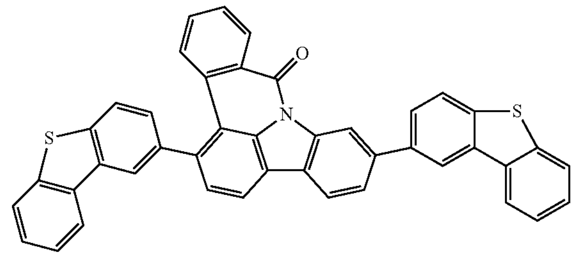
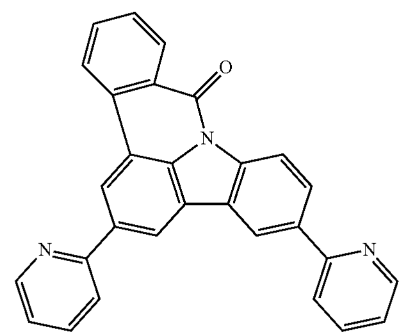
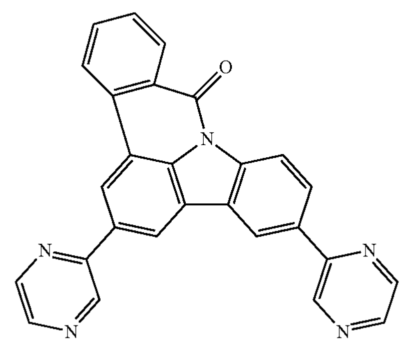
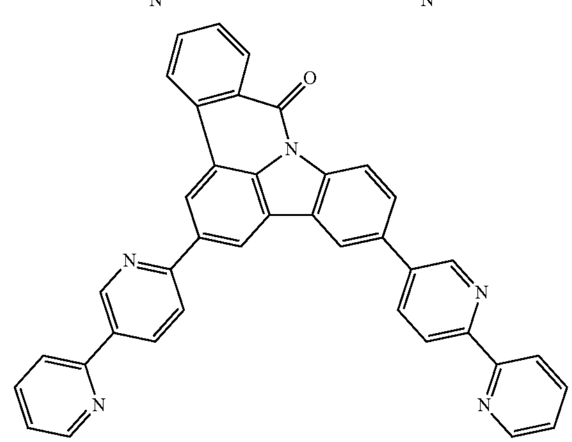

-continued
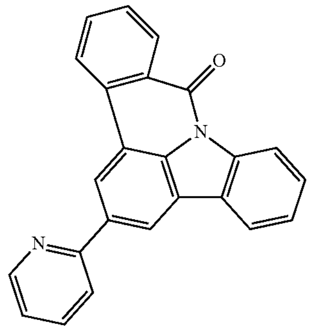
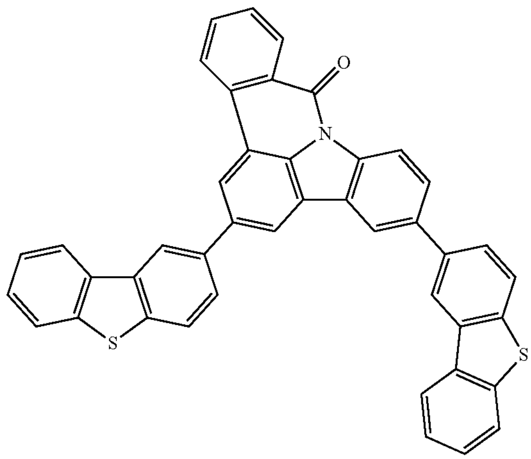
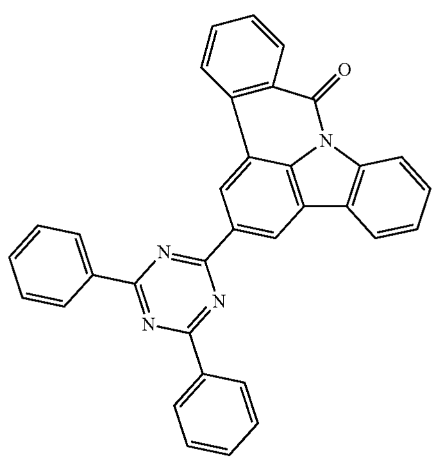
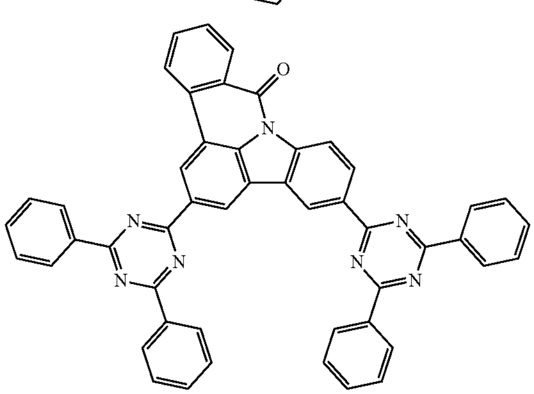
-continued
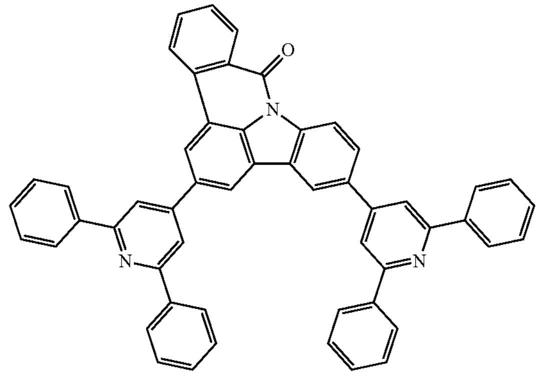
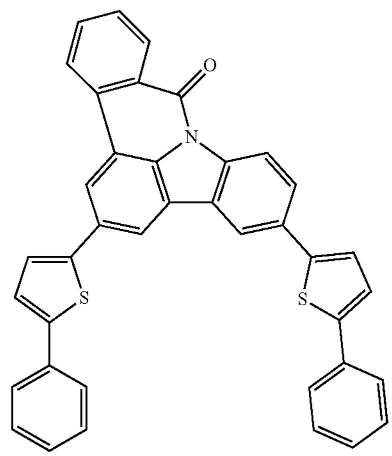
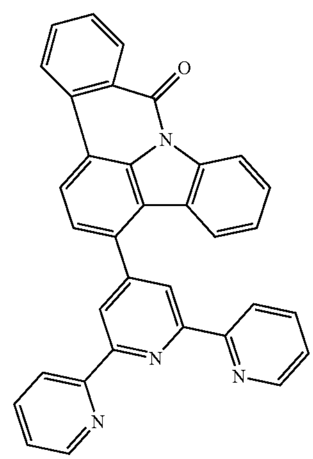

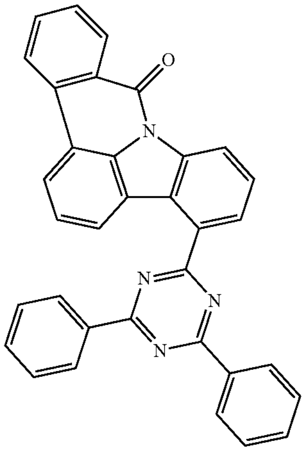
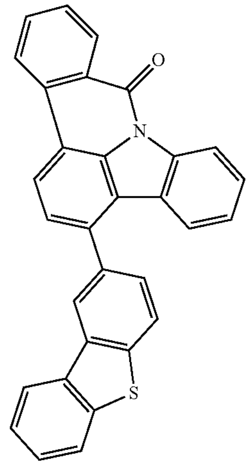
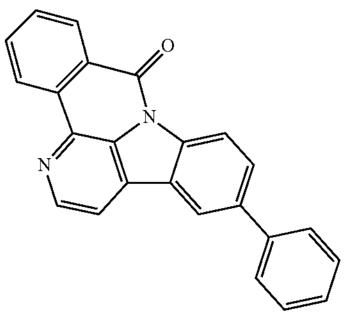
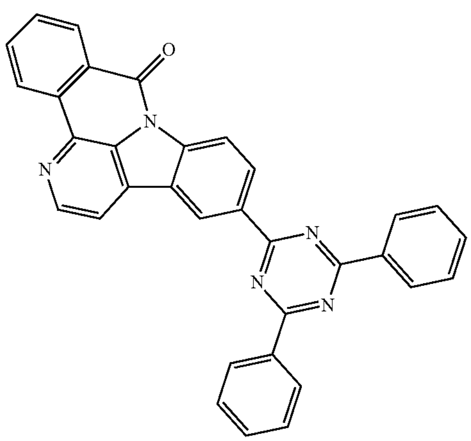
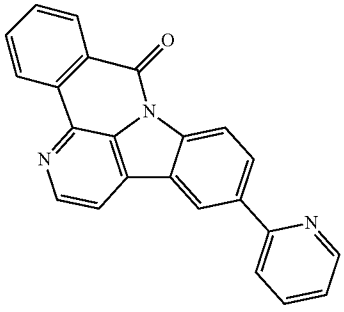
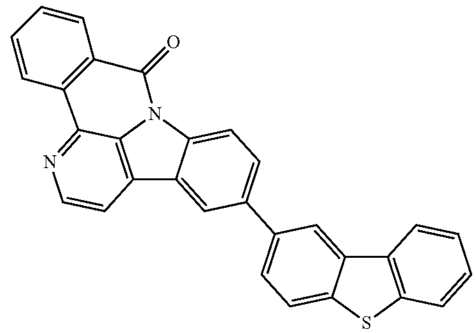
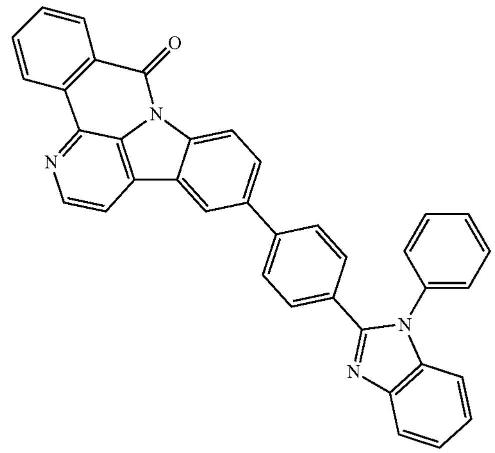
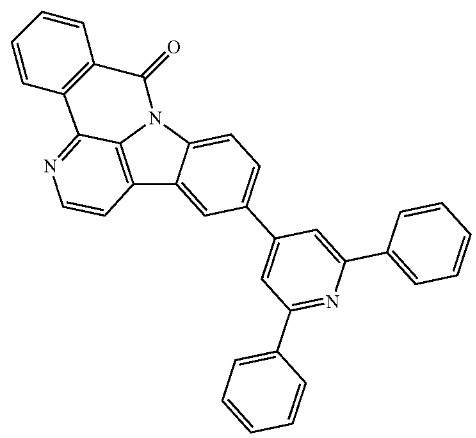
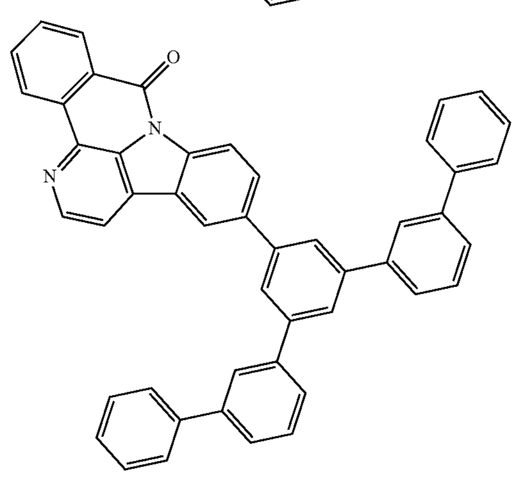

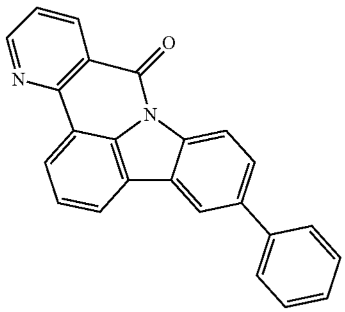
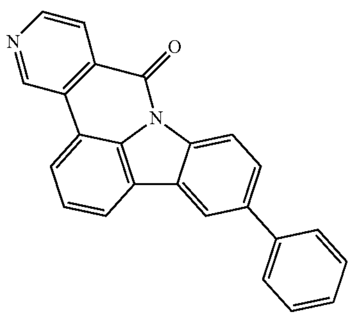
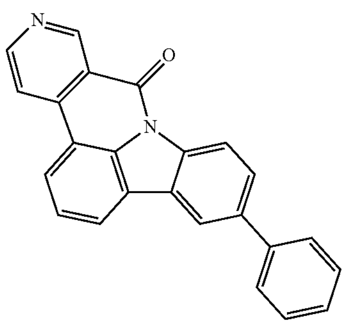
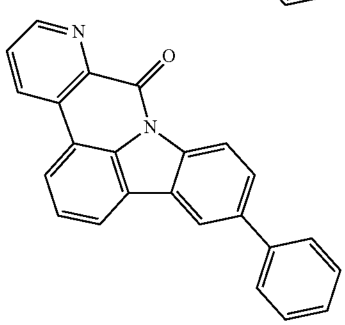
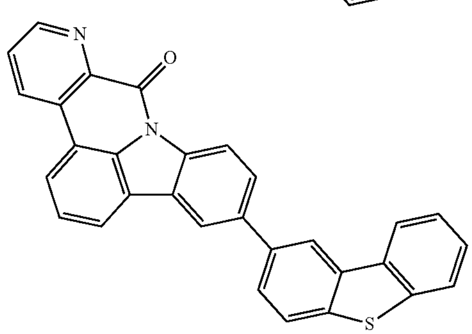
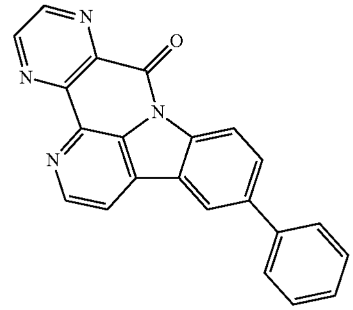
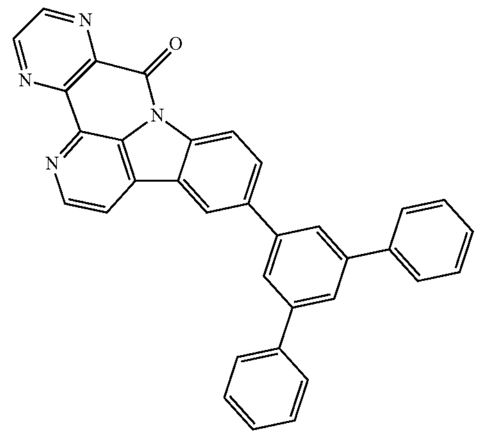
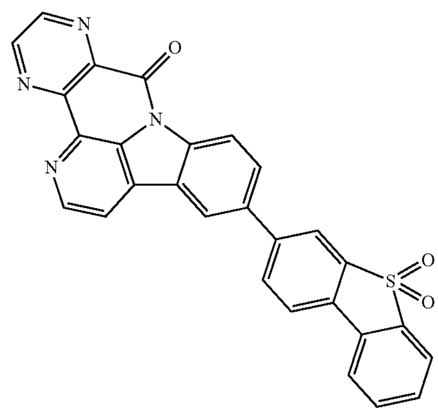
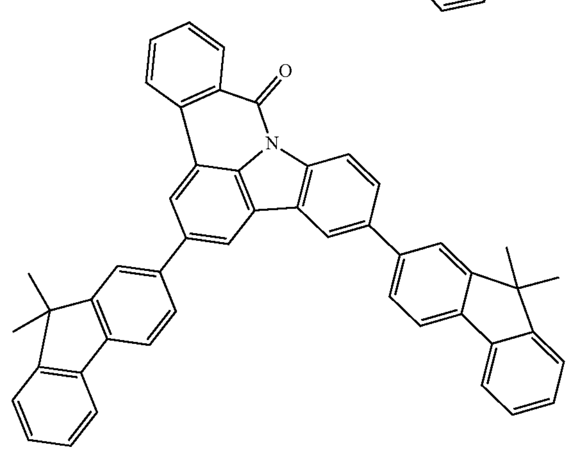

-continued
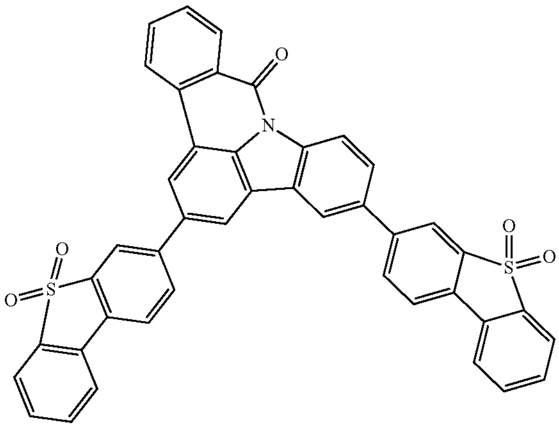
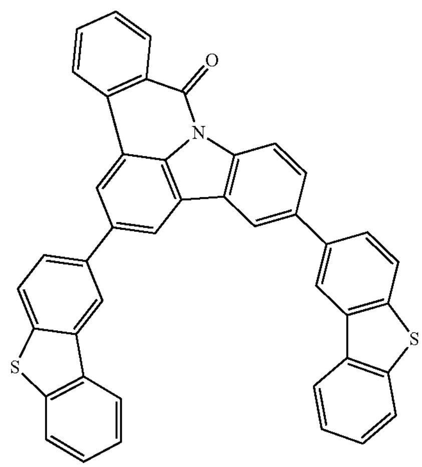
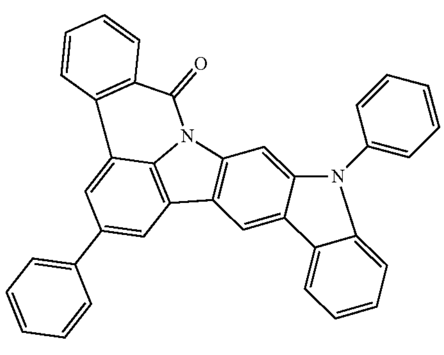
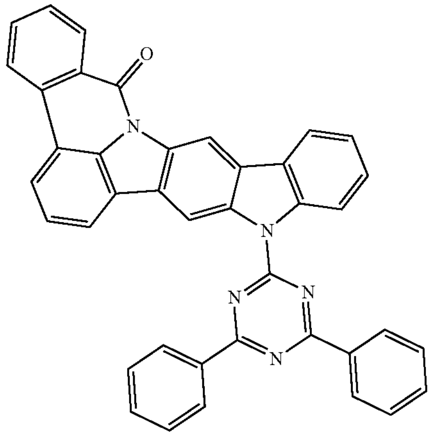
-continued
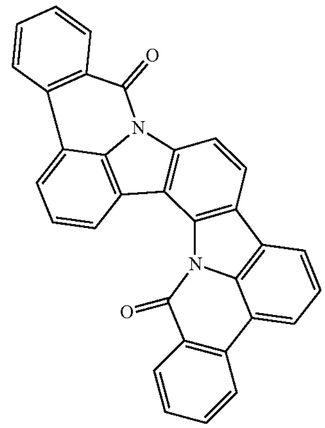
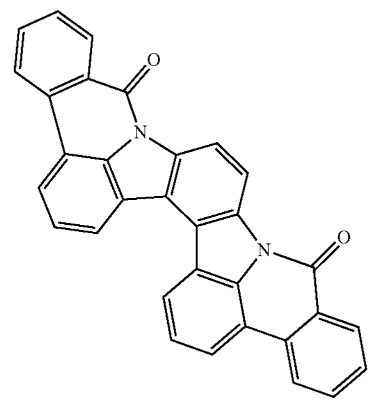
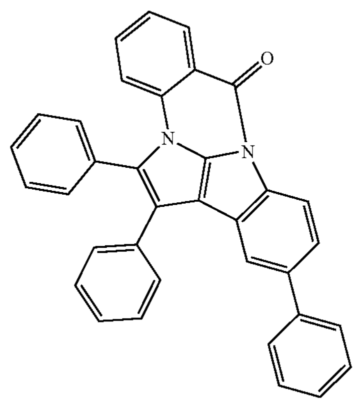
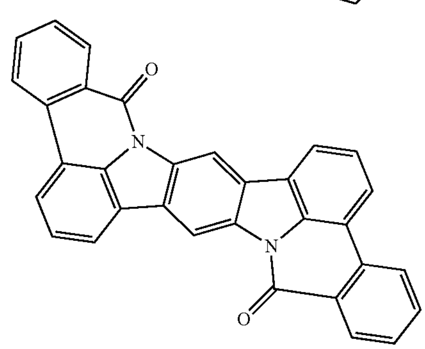

-continued
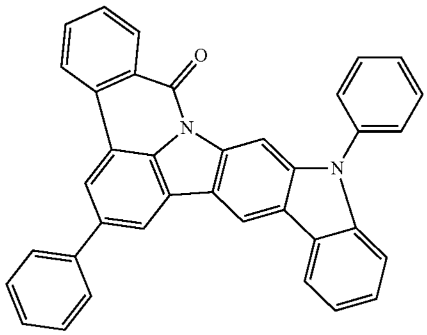
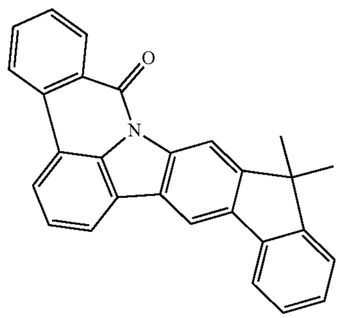
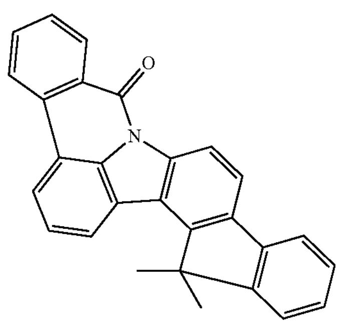
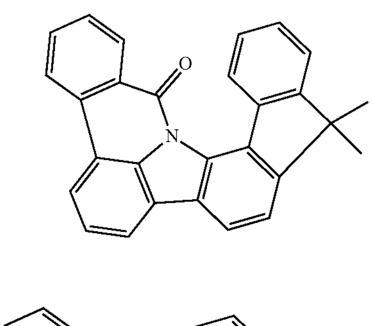
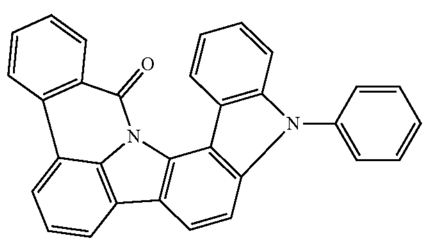
-continued
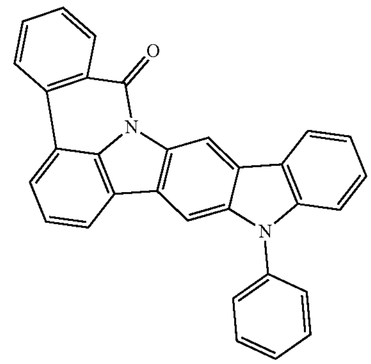
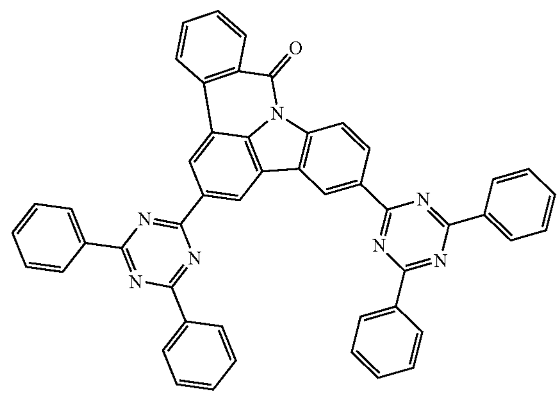
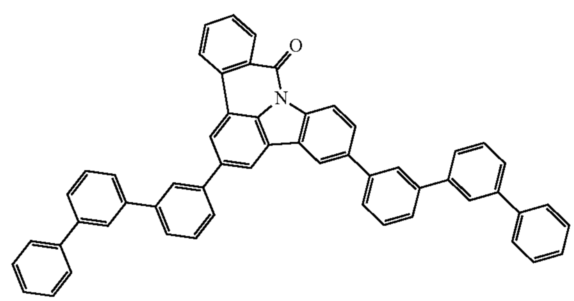
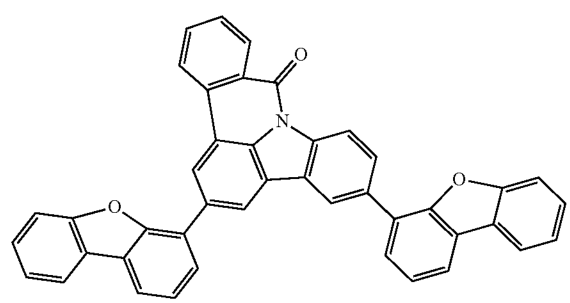

-continued
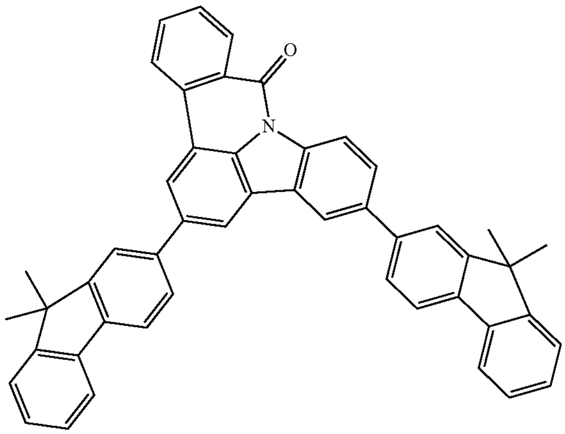
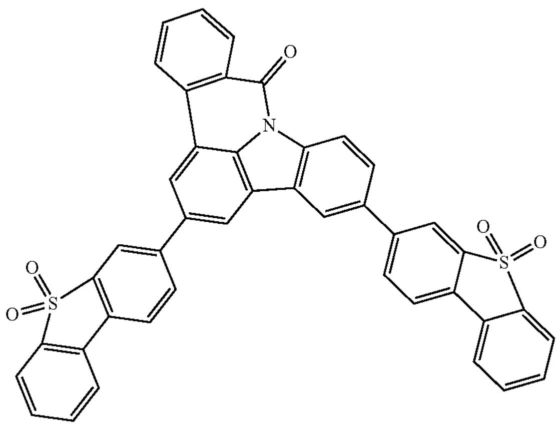
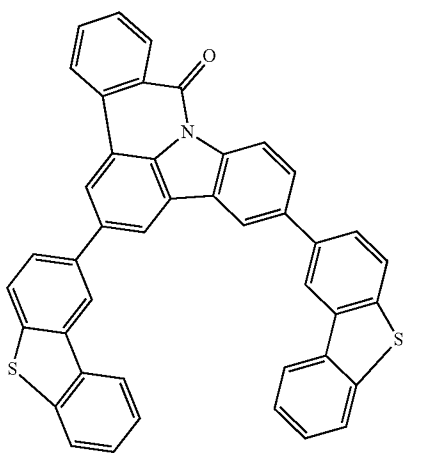
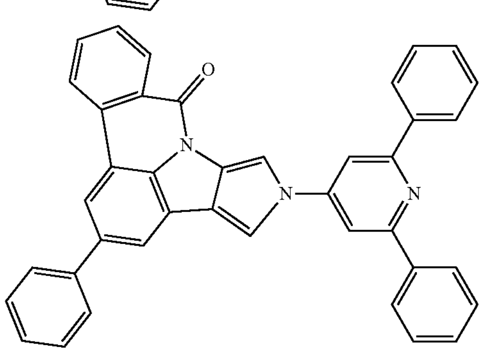
-continued
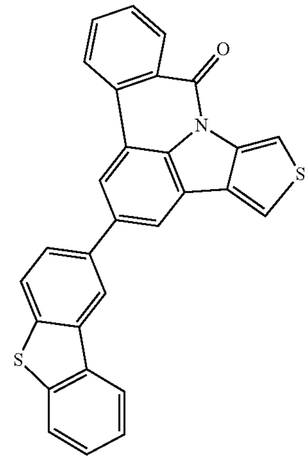
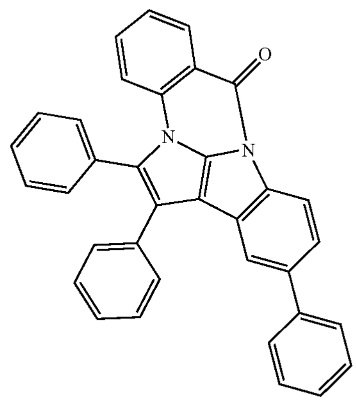
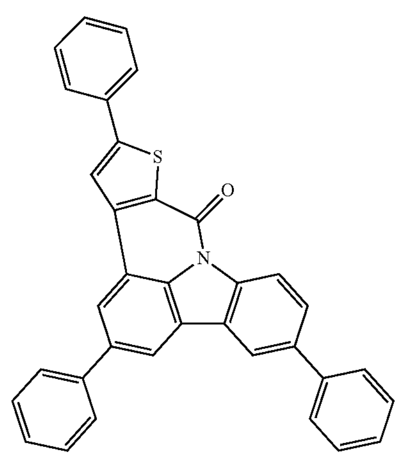

-continued
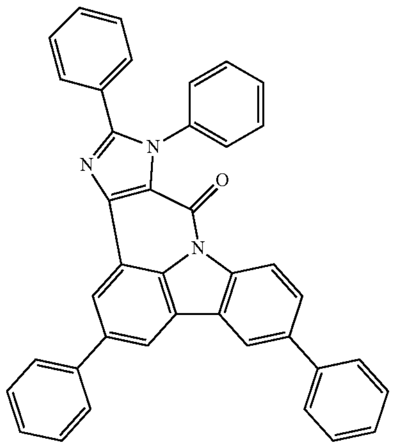
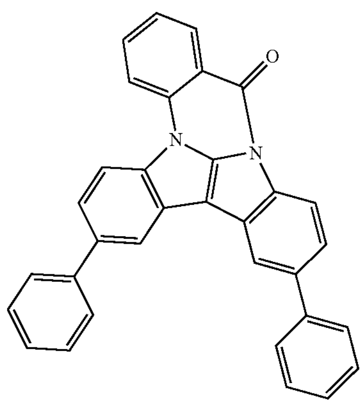
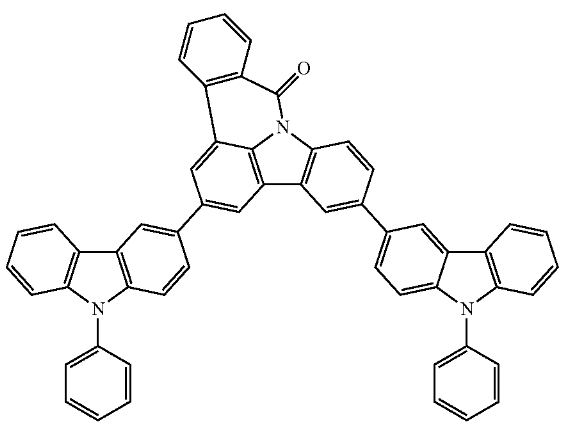
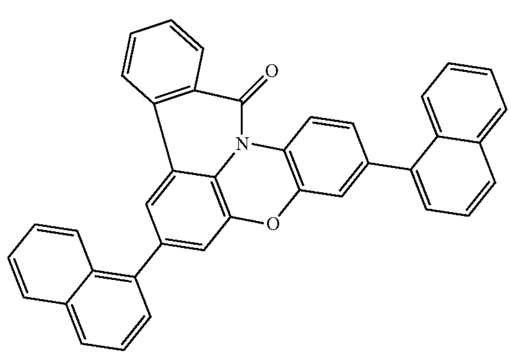
-continued
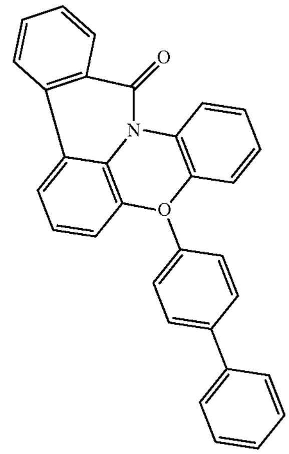
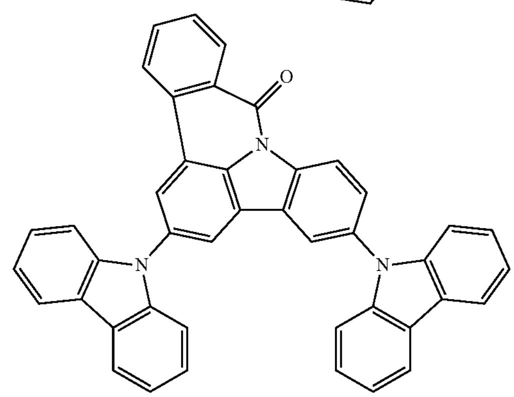
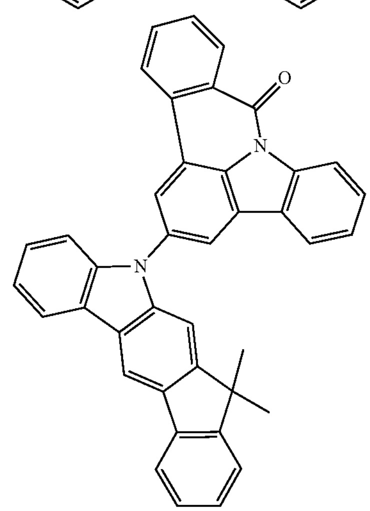
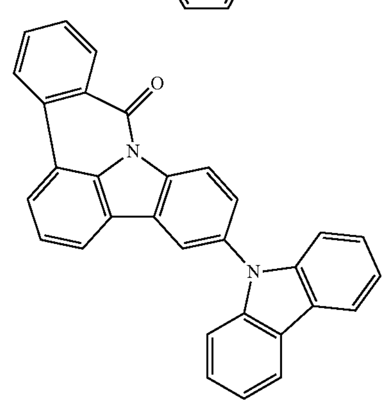

-continued
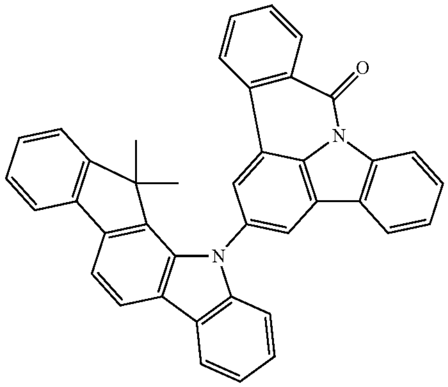
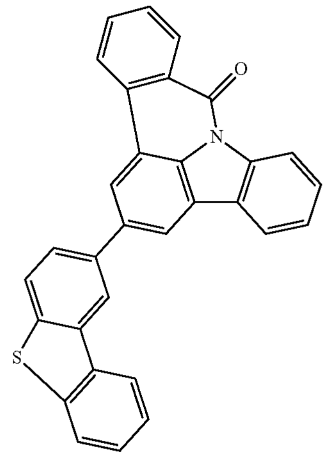
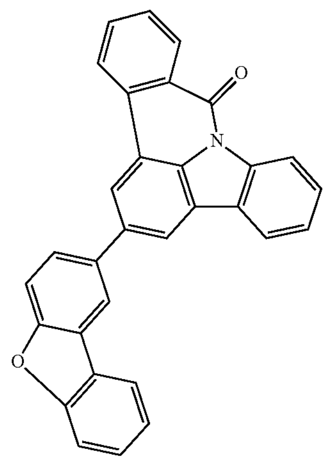
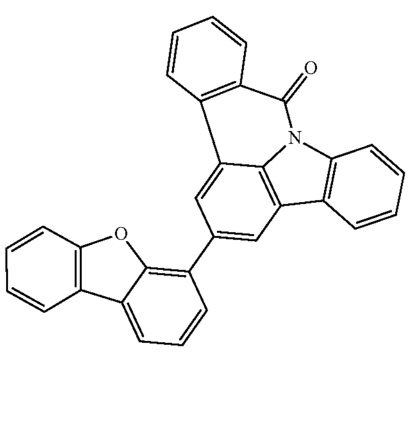
-continued
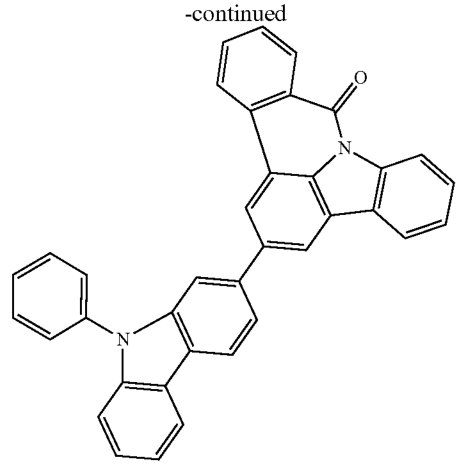
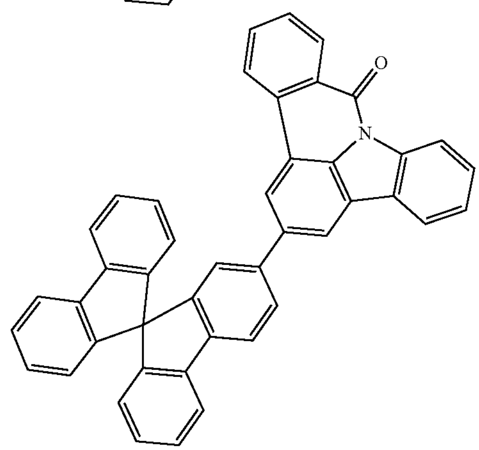
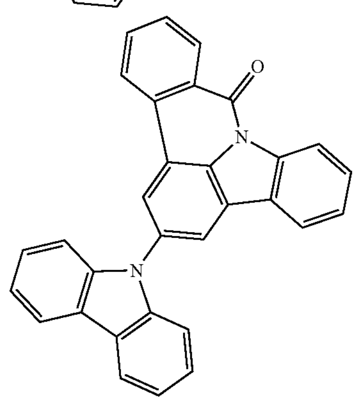
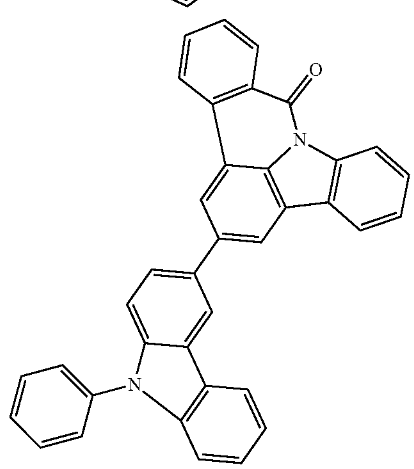

-continued
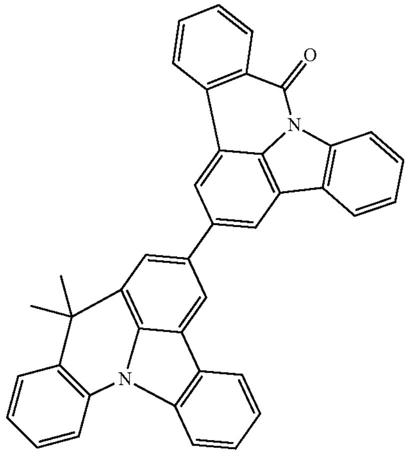
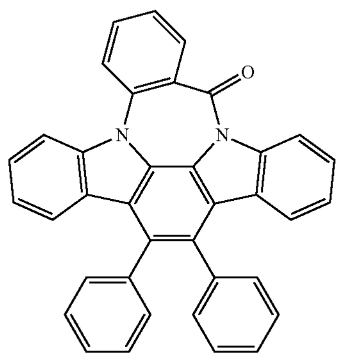
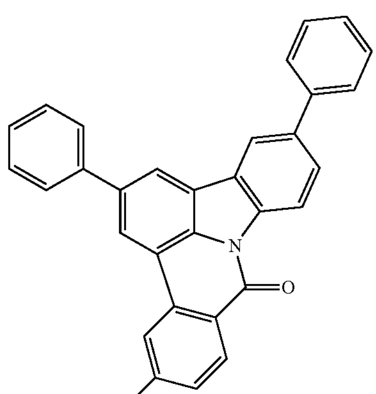
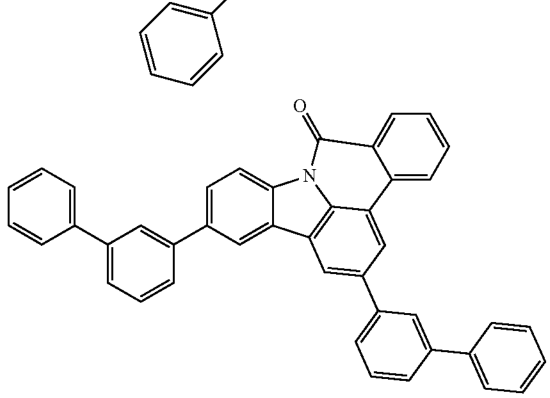
-continued
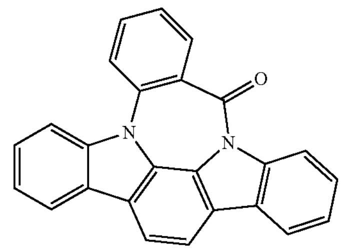
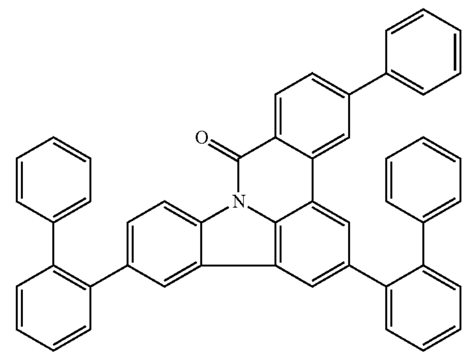
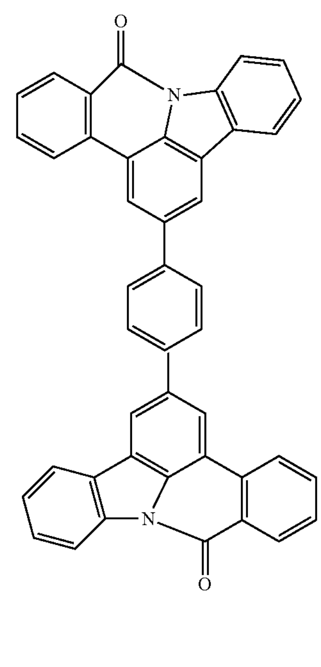
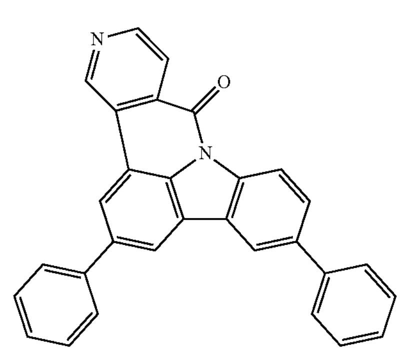

-continued
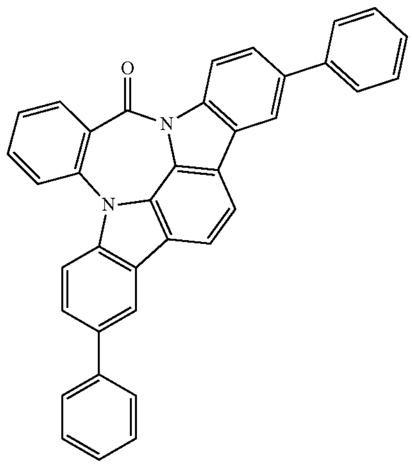
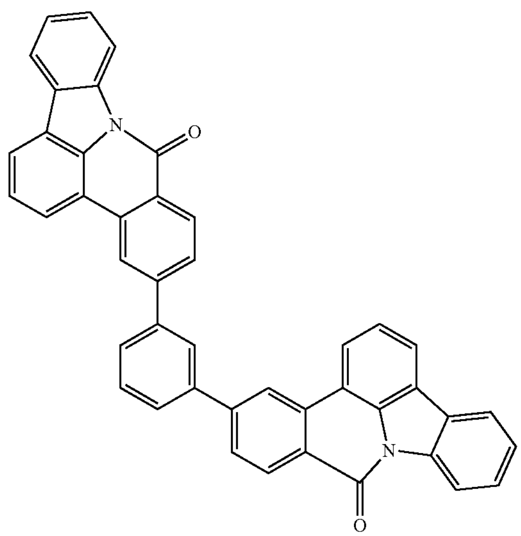
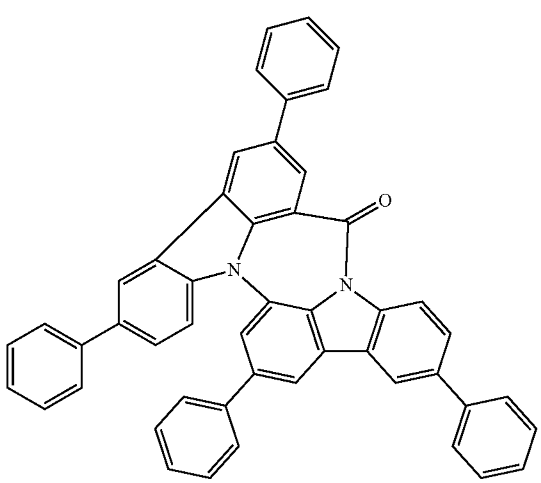
-continued
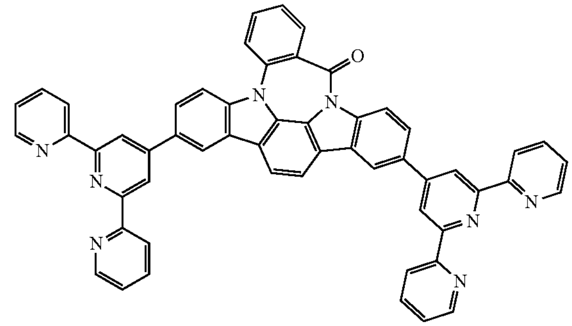
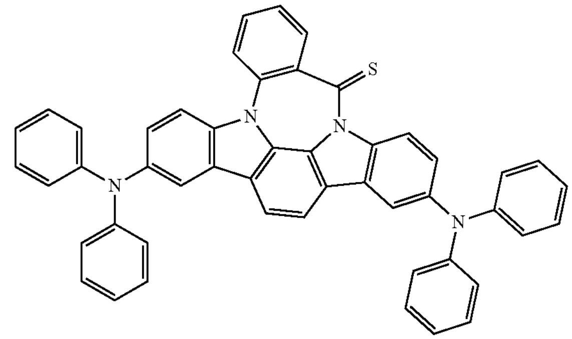
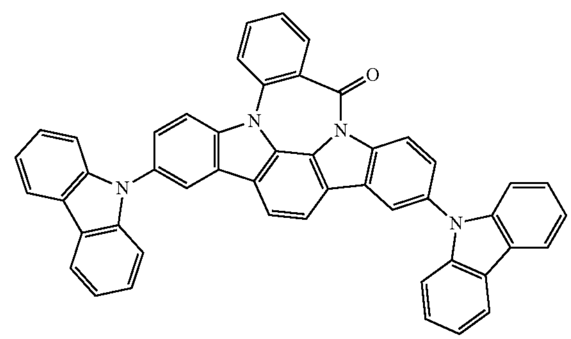
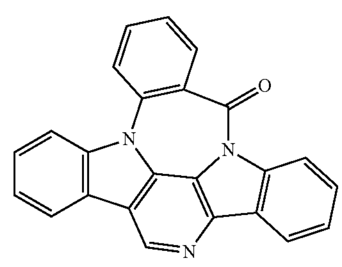
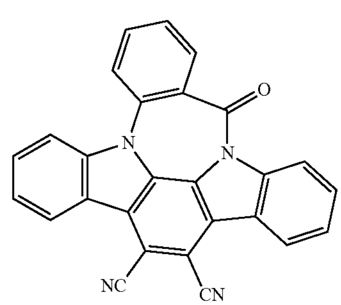
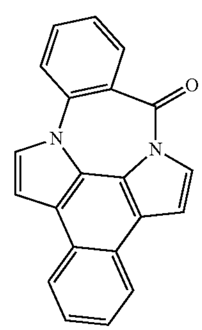

-continued
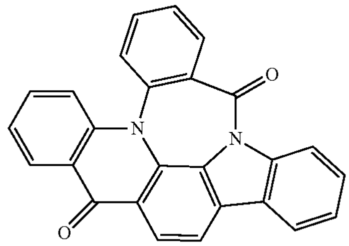
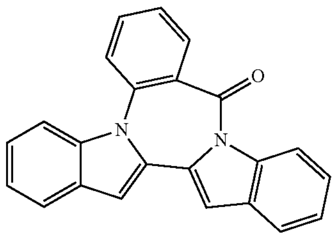
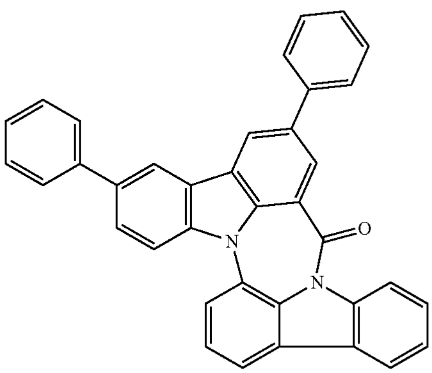
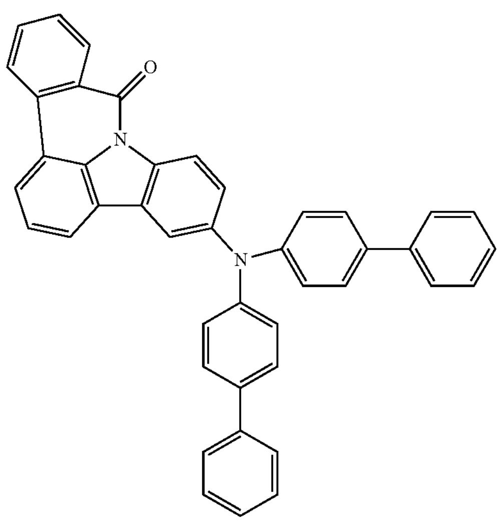
-continued
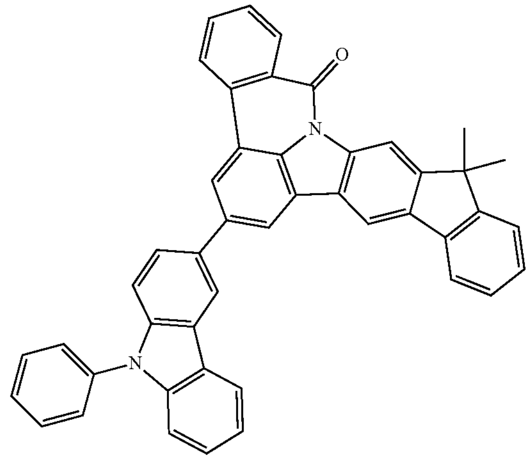
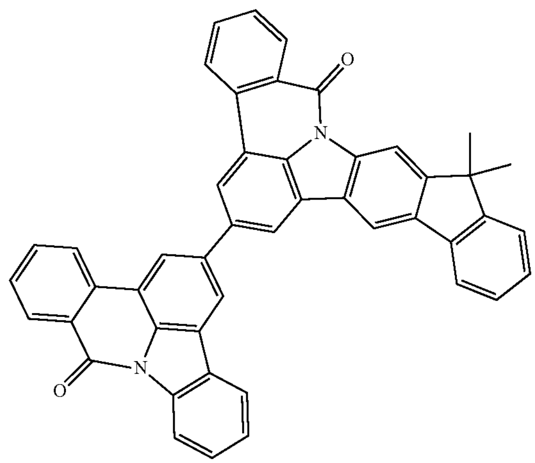
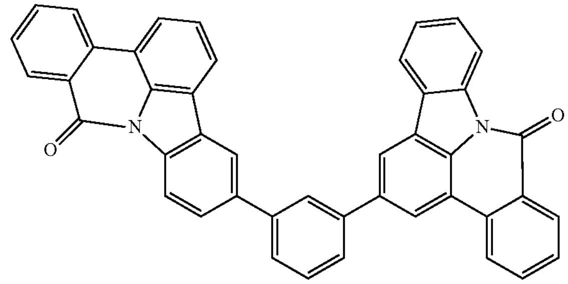
Examples of indolo- and indenocarbazole derivatives in the broadest sense which can be used as hole- or electron-transporting matrix materials according to the substitution pattern are the following compounds:

-continued
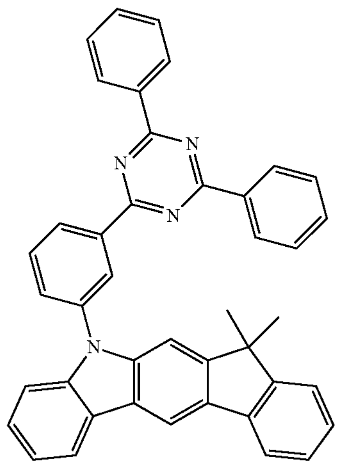
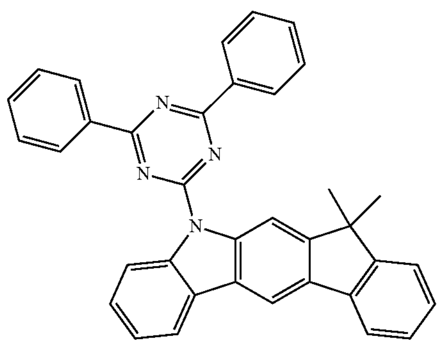
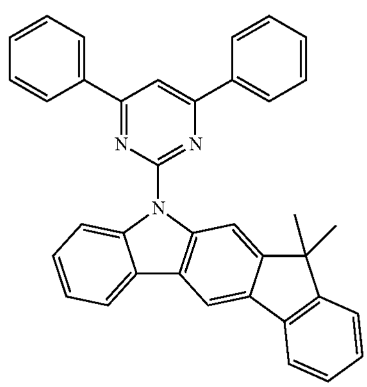
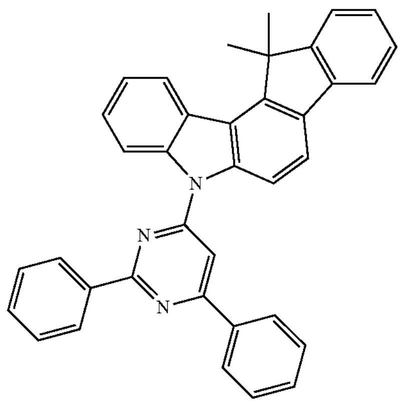
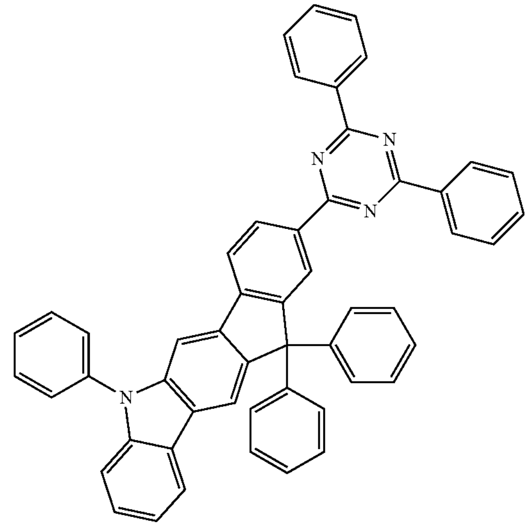
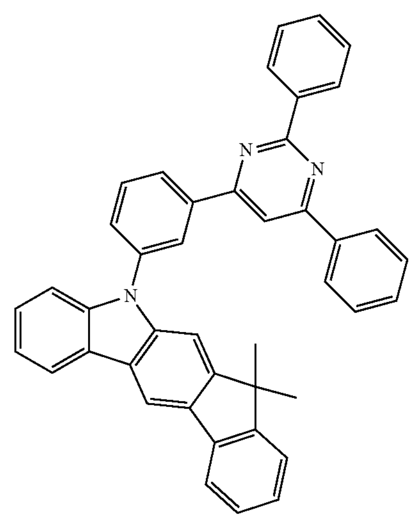
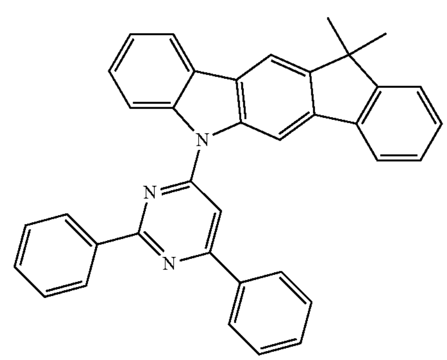

-continued
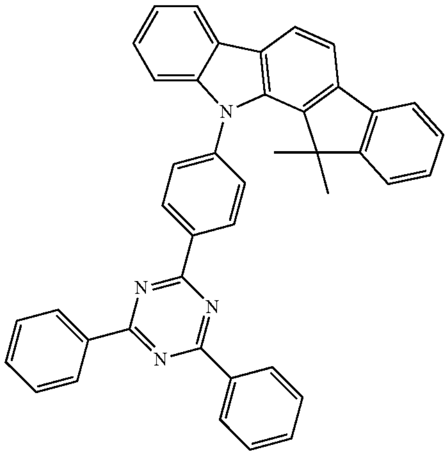
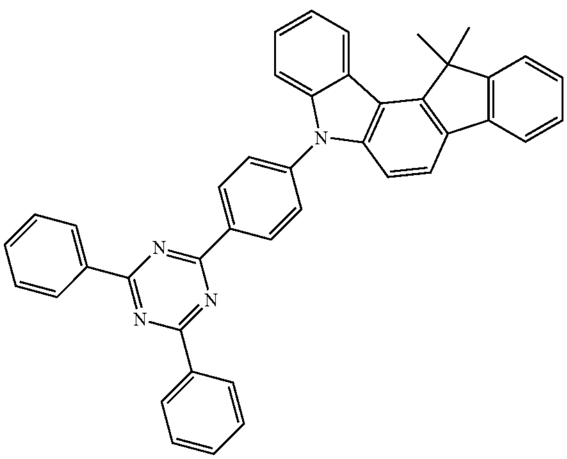
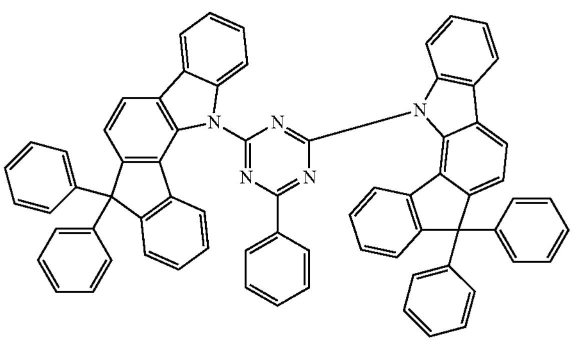
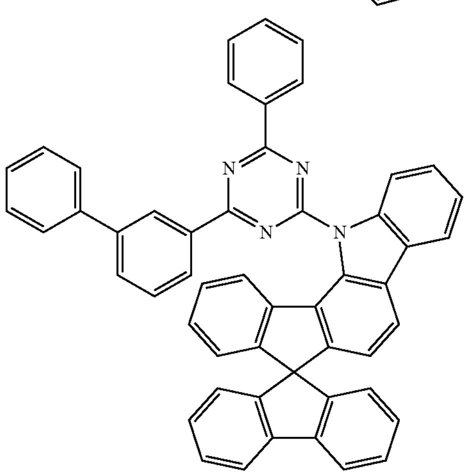
-continued
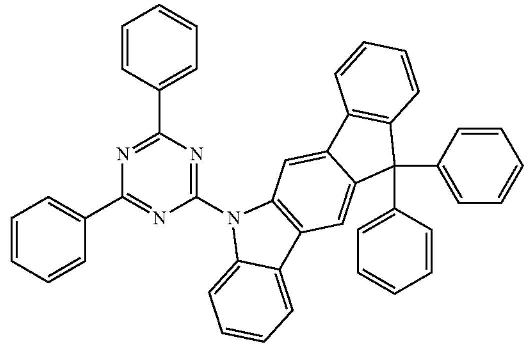
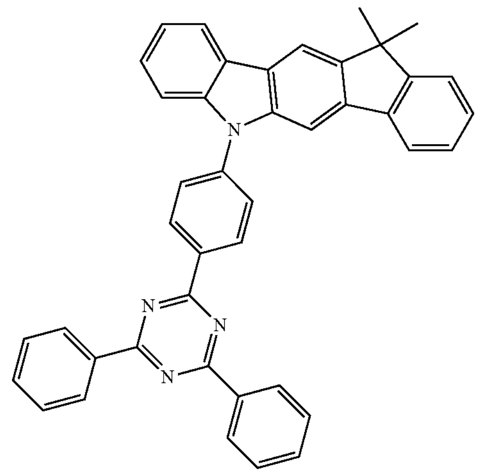
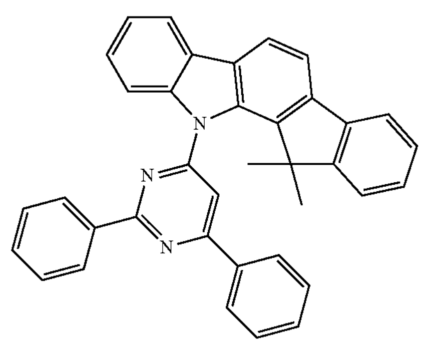
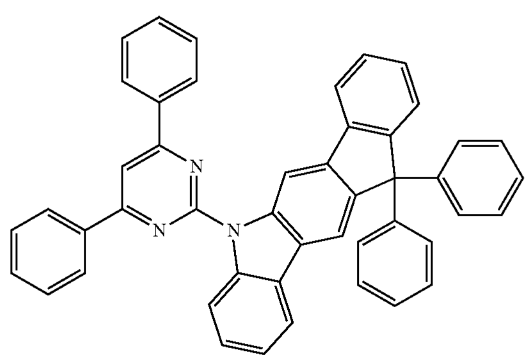

-continued
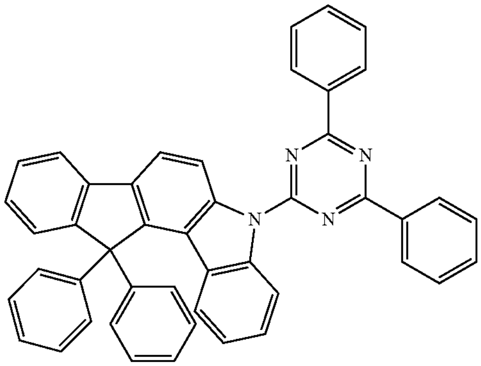
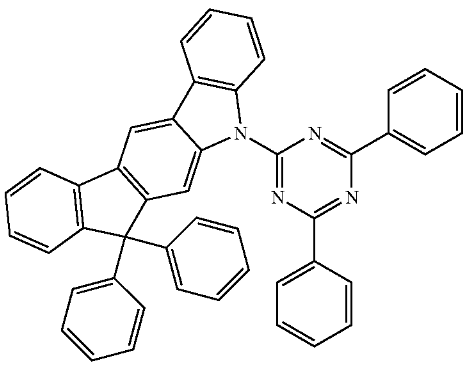
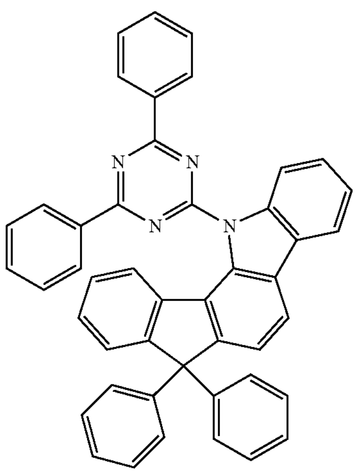
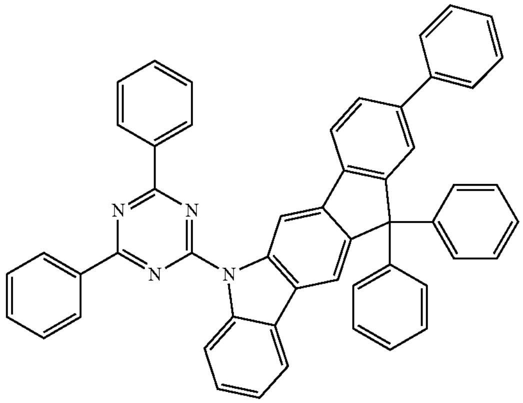
-continued
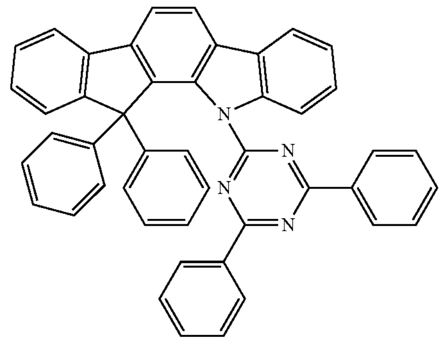
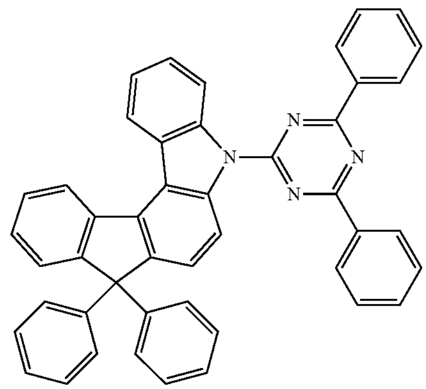
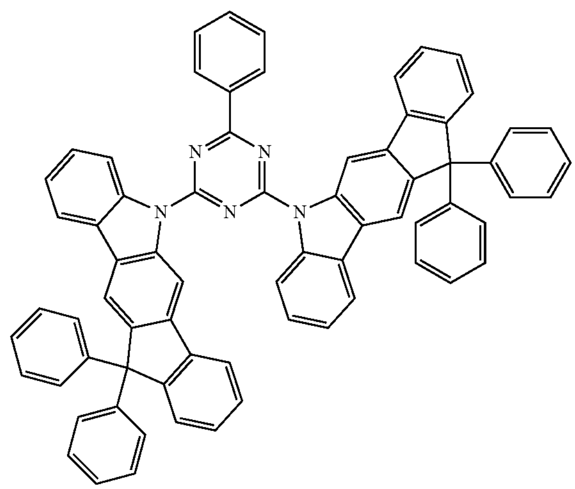
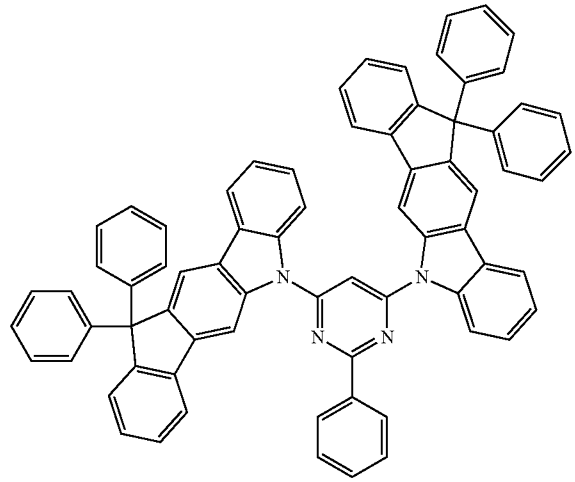

-continued
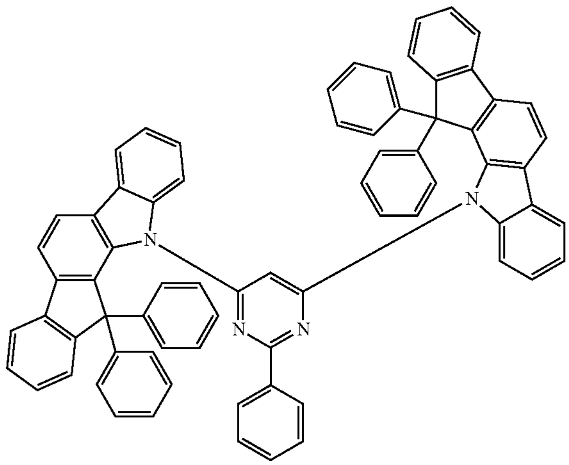
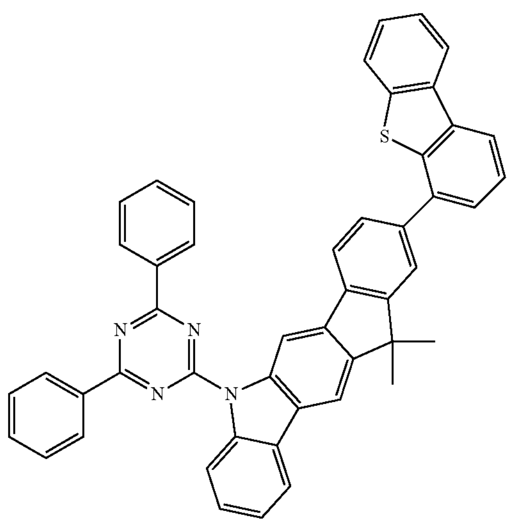
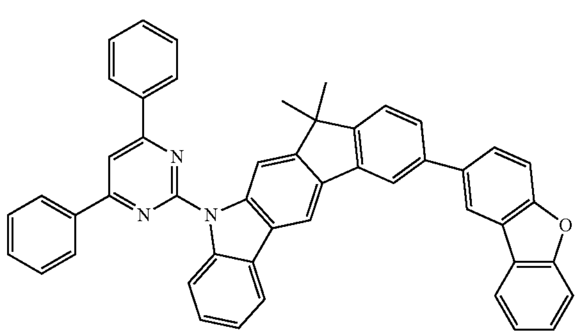
-continued
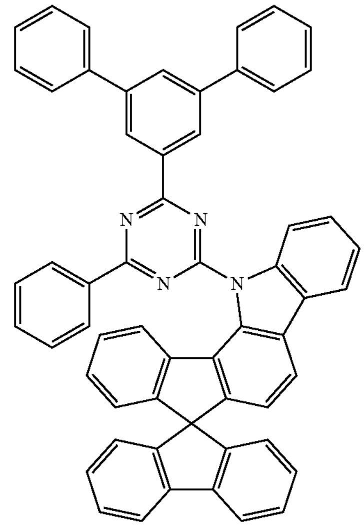
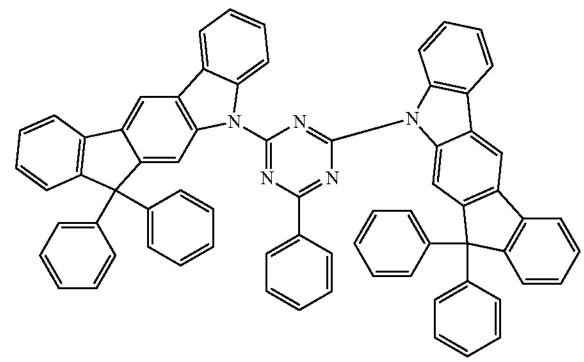
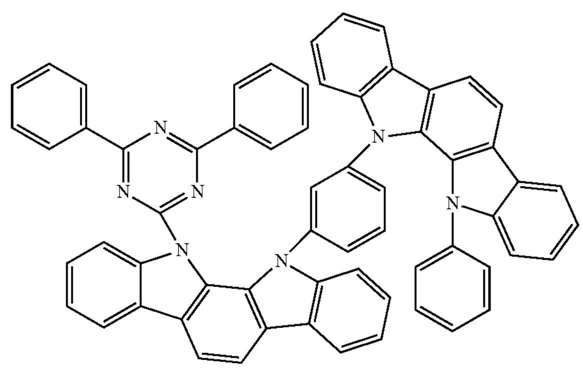
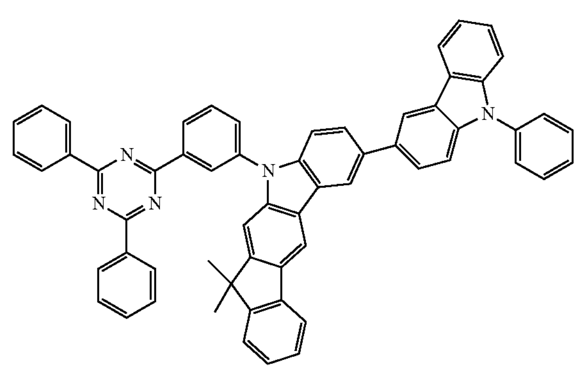

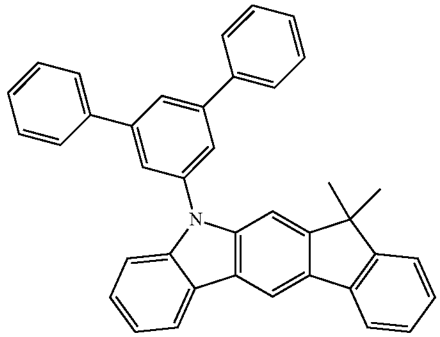
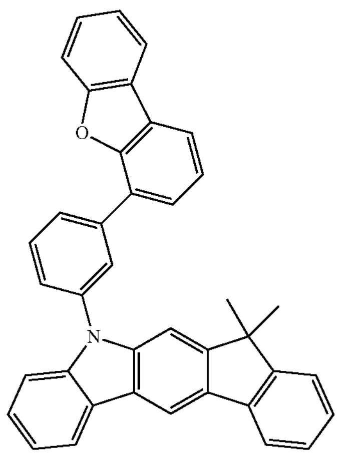
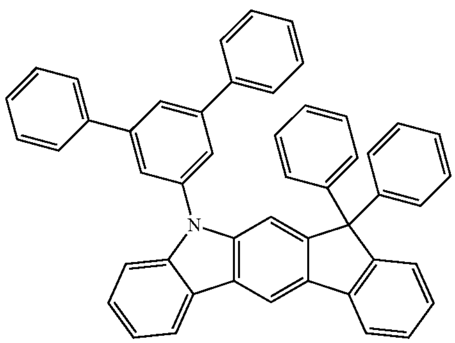
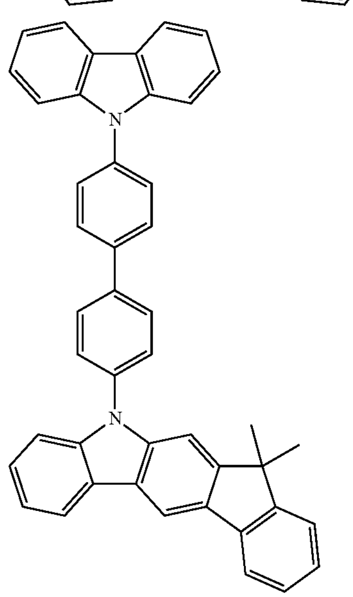
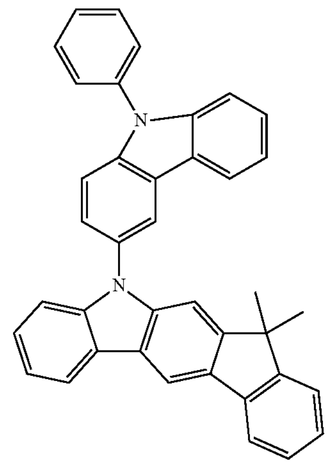
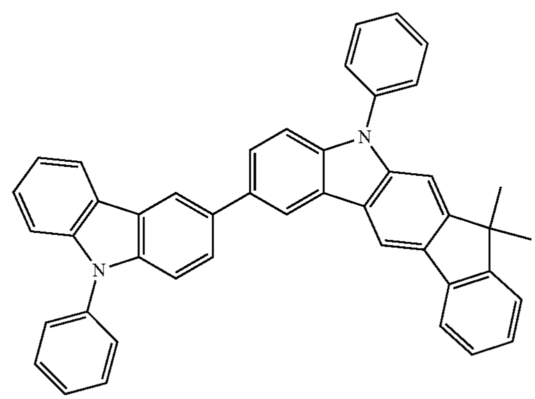
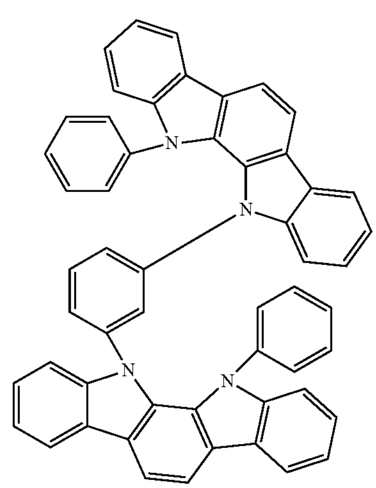

-continued
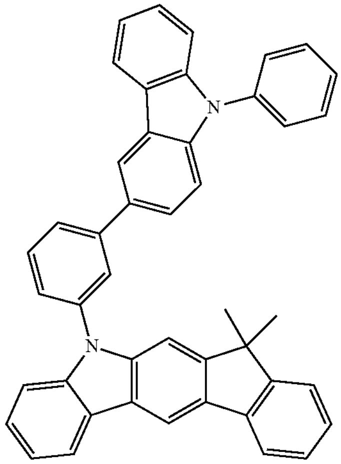
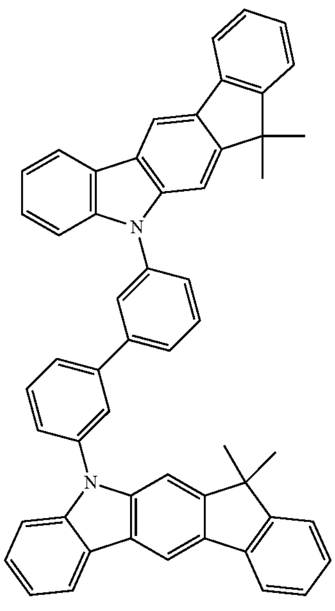
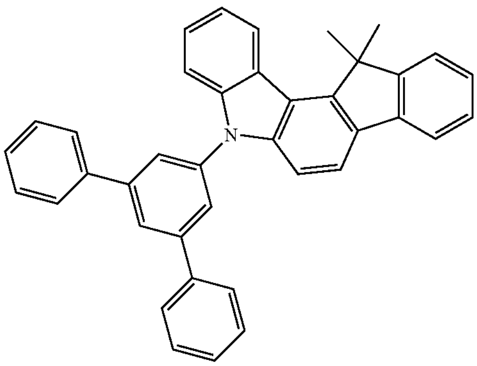
-continued
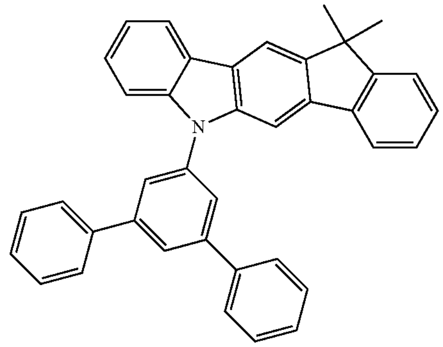
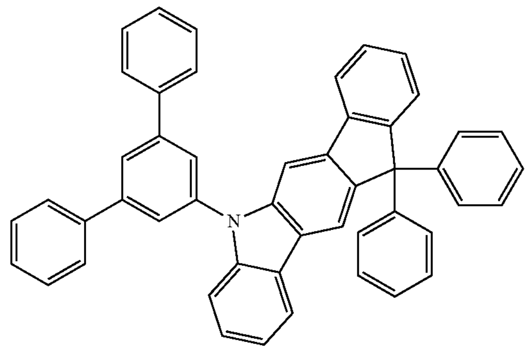
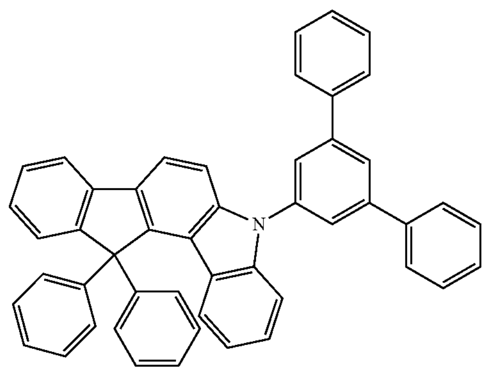
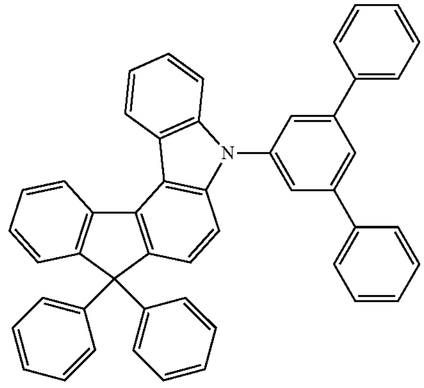

-continued
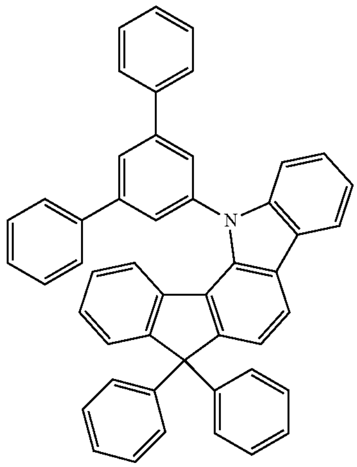
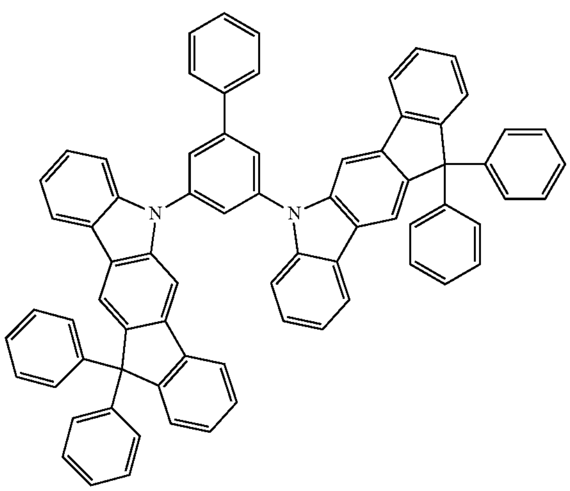
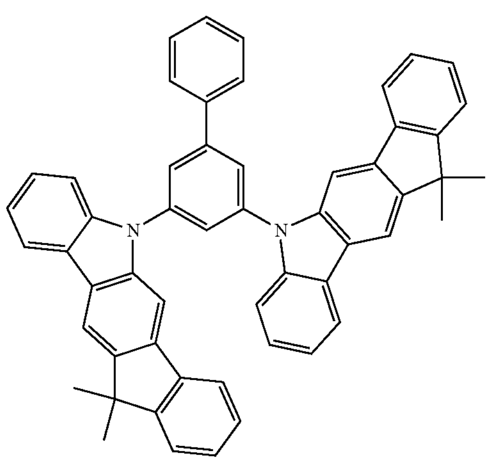
-continued
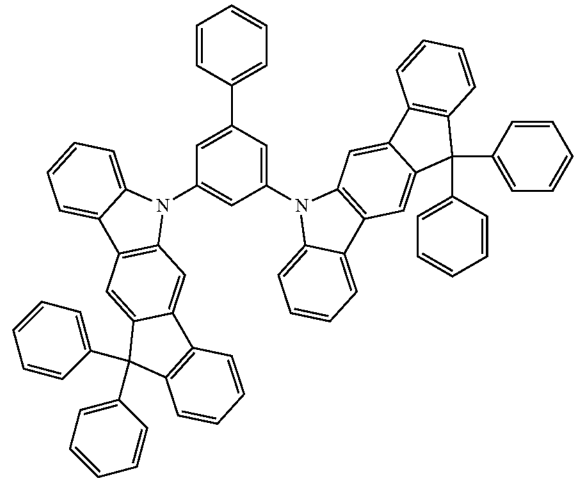
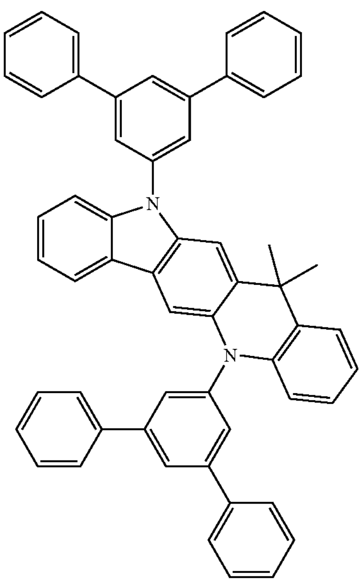
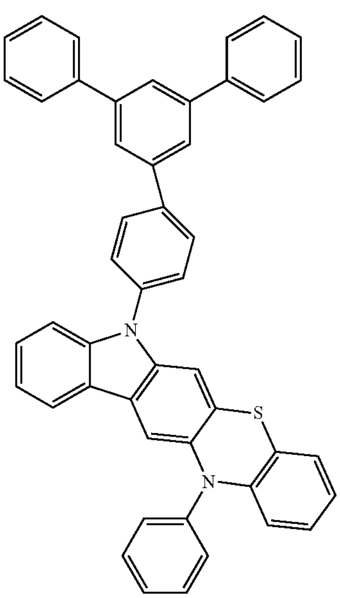

-continued
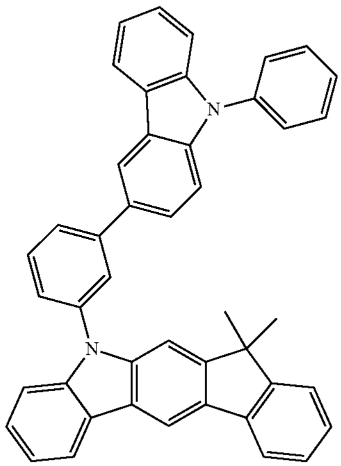
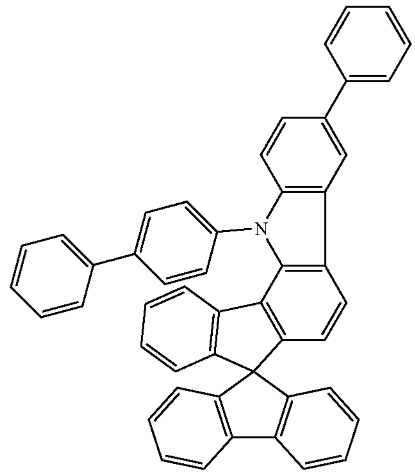
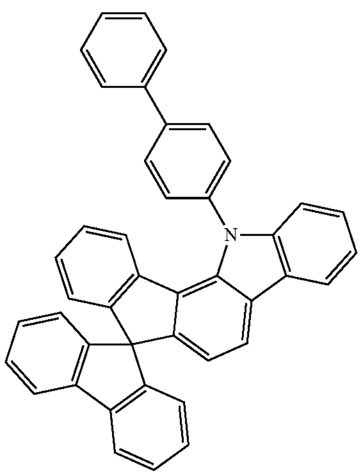
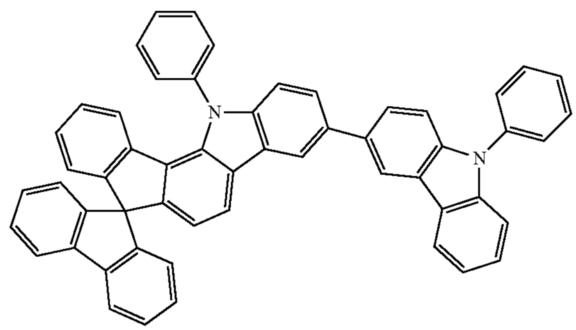
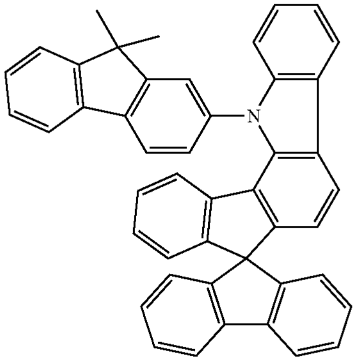
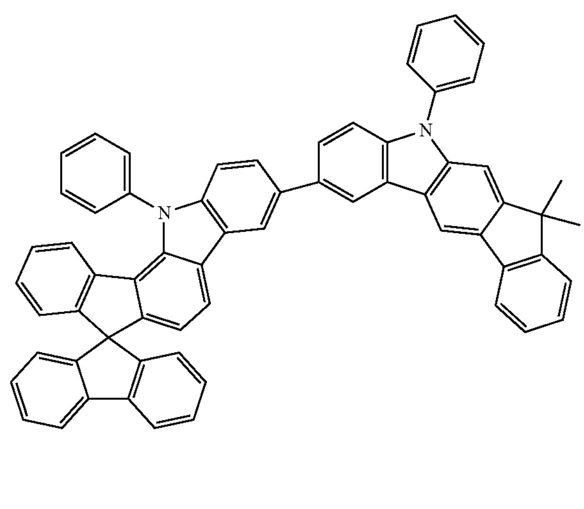
-continued -continued
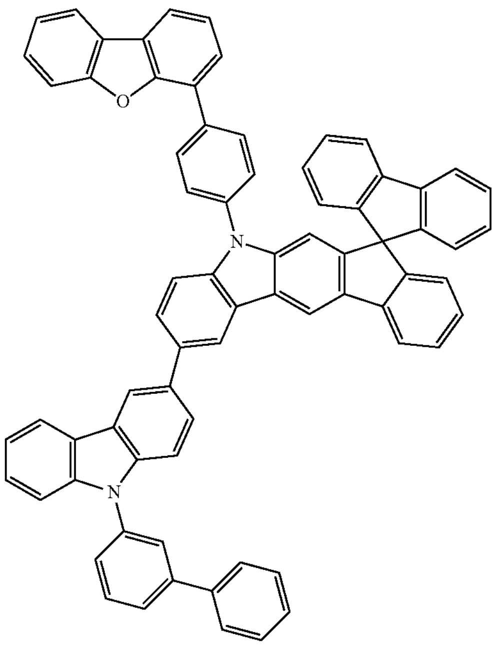
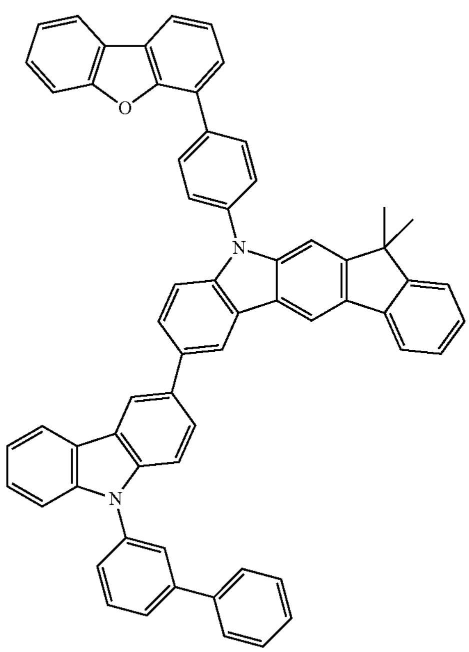
-continued
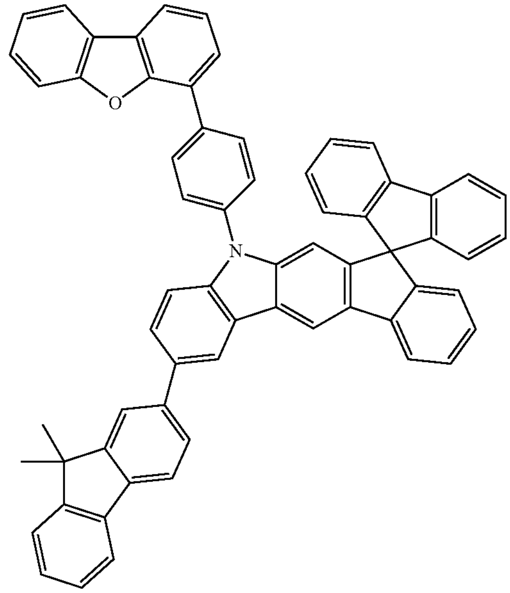
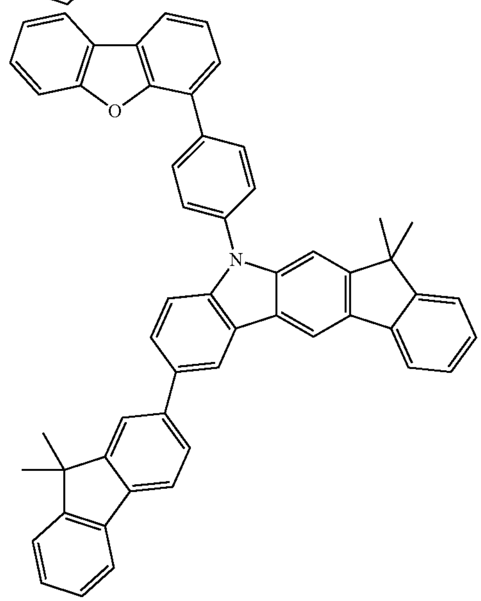
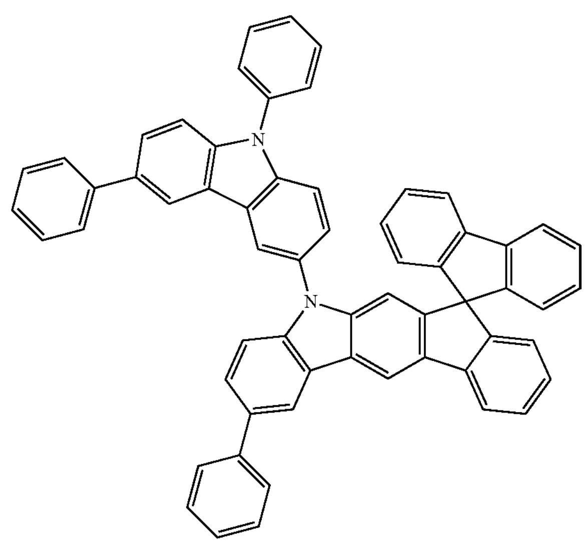

-continued
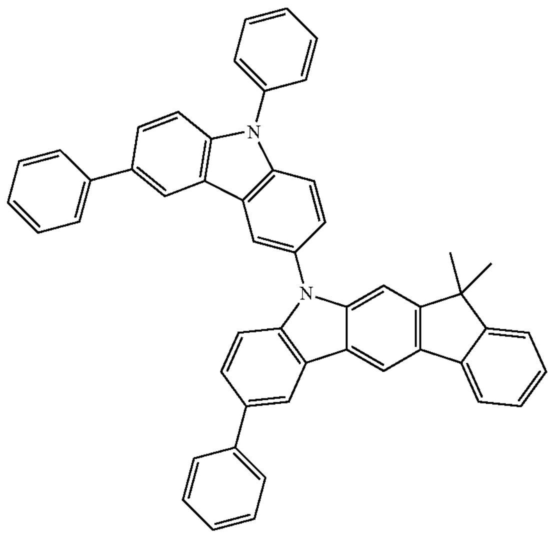
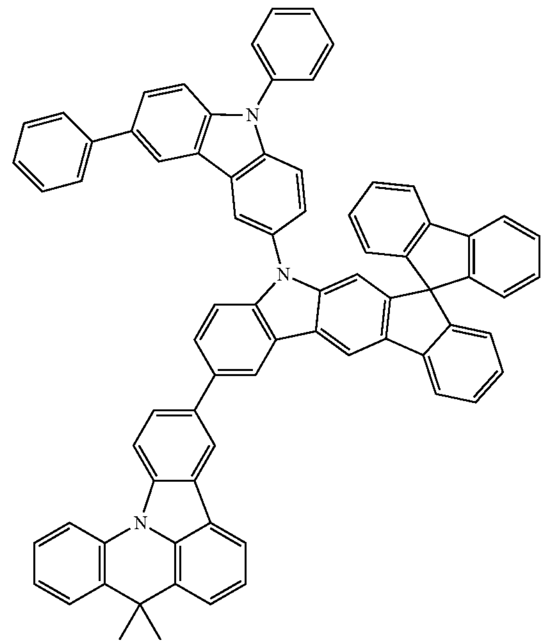
-continued
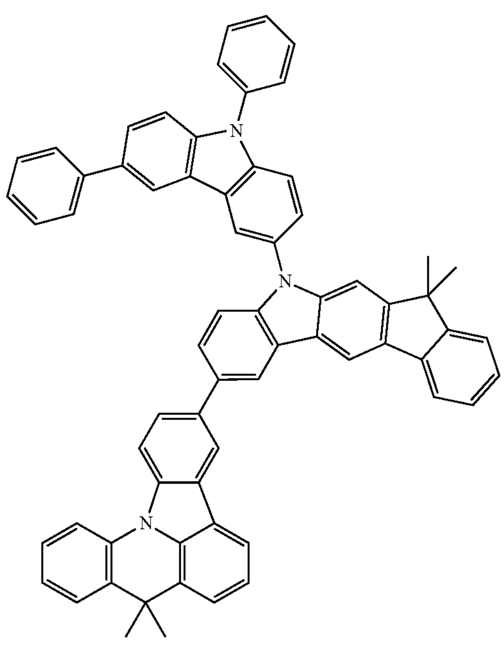
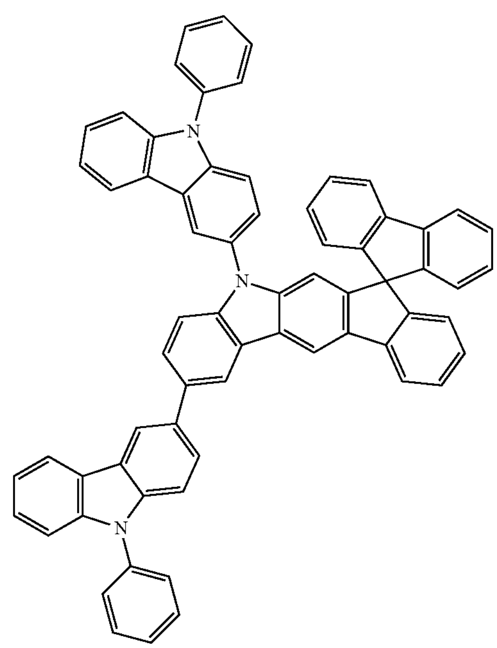

-continued
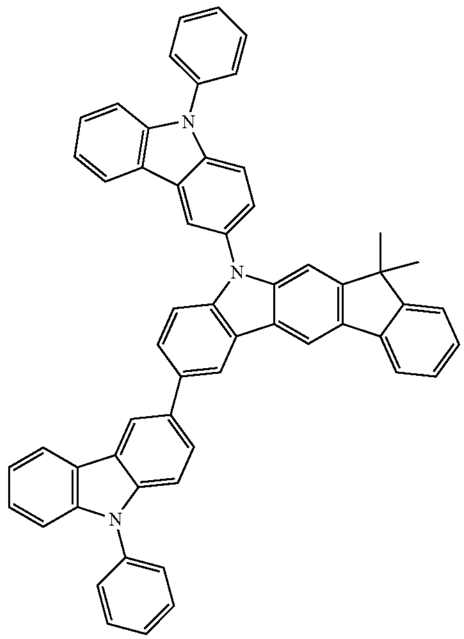
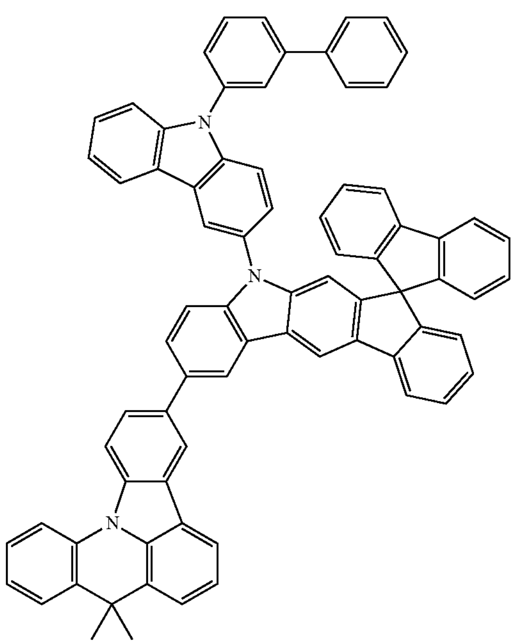
-continued
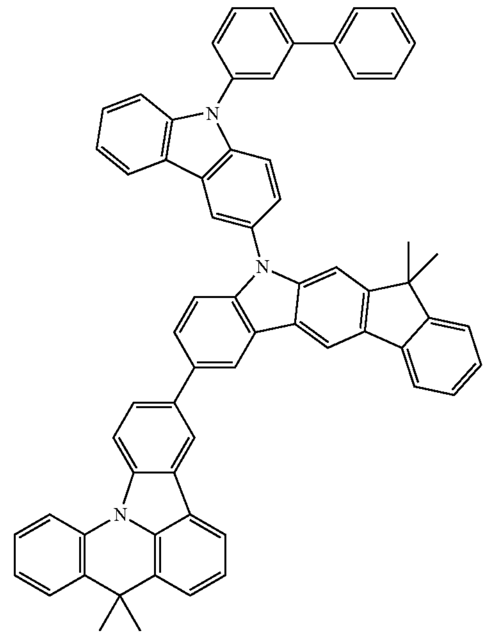
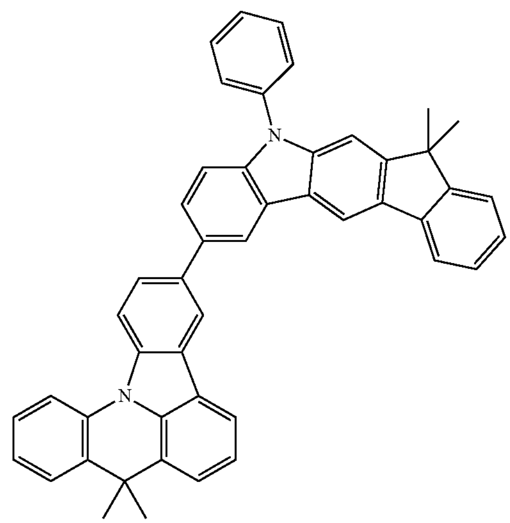
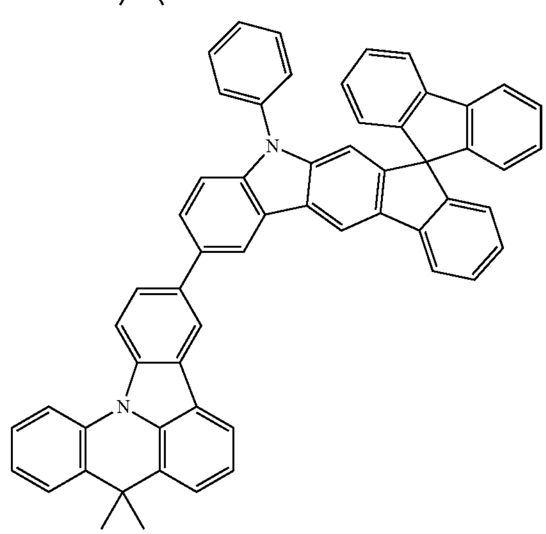

-continued
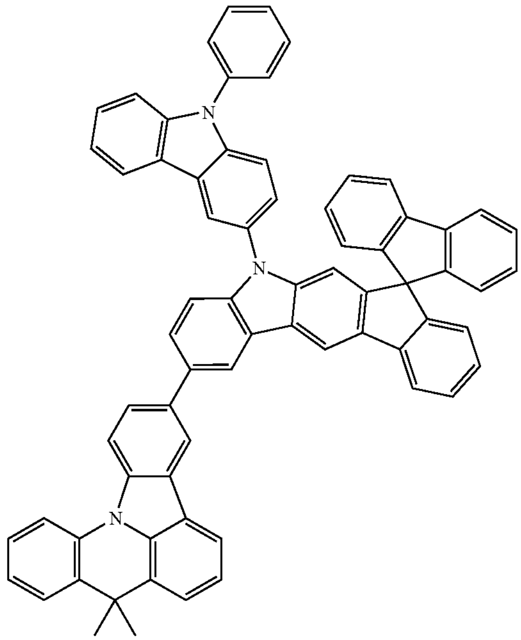
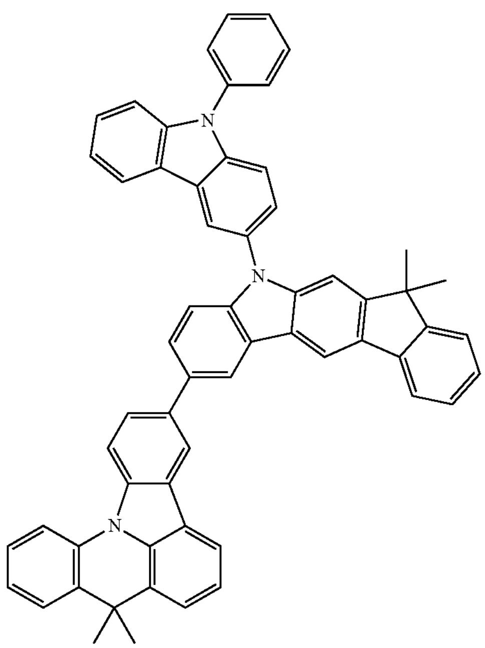
Examples of carbazole derivatives which can be used as hole- or electron-transporting matrix materials according to the substitution pattern are the following compounds:
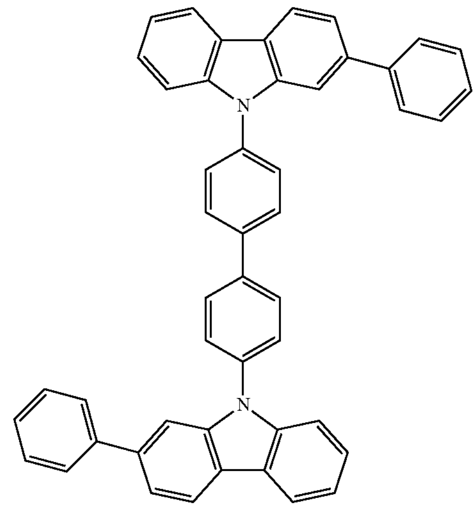
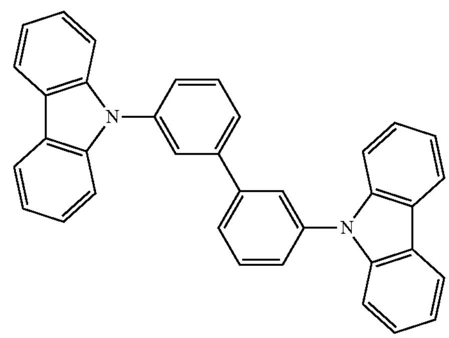
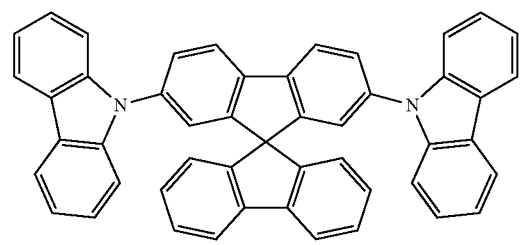
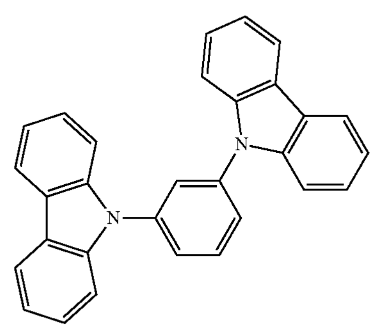
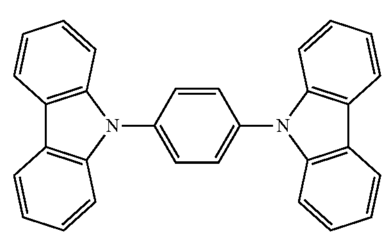

-continued
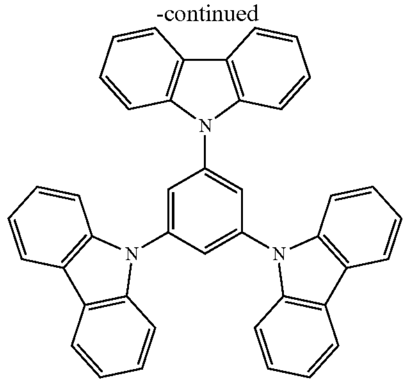
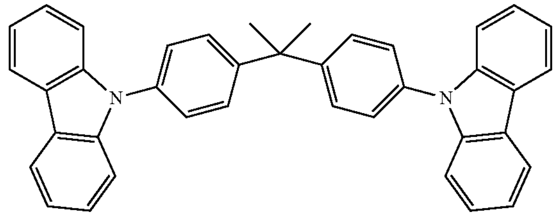
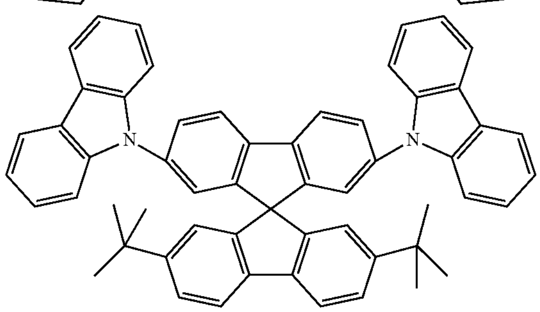
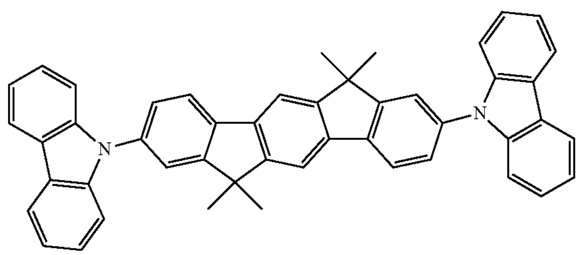
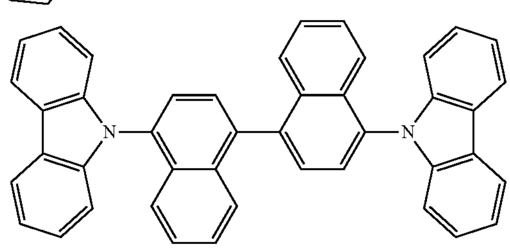
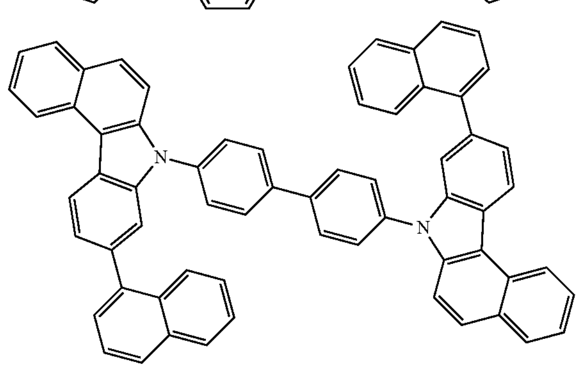
-continued
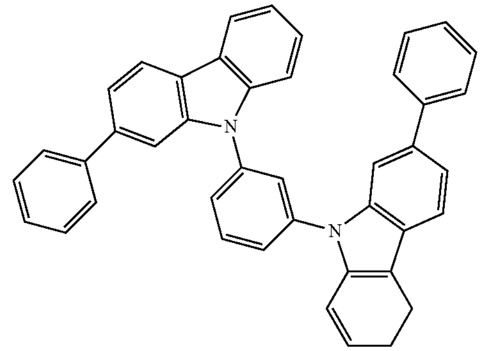
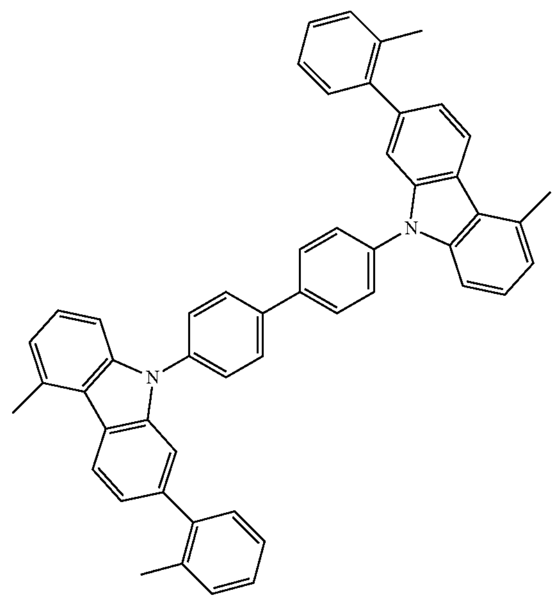
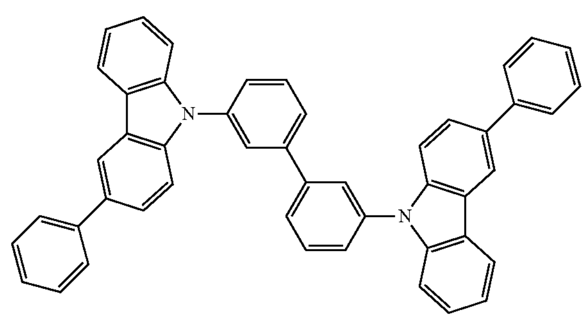
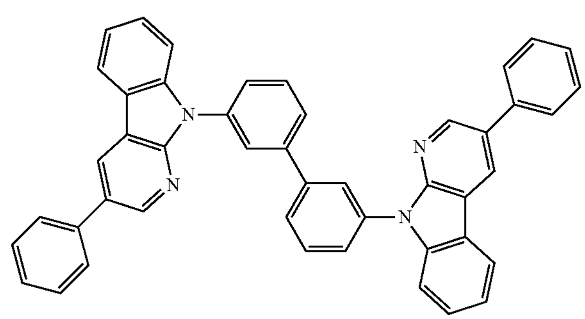

-continued
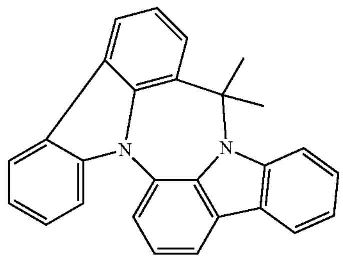
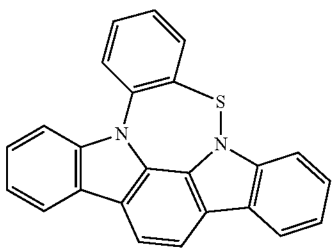
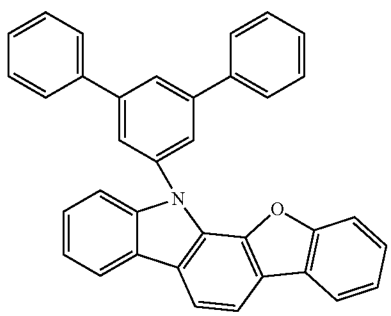
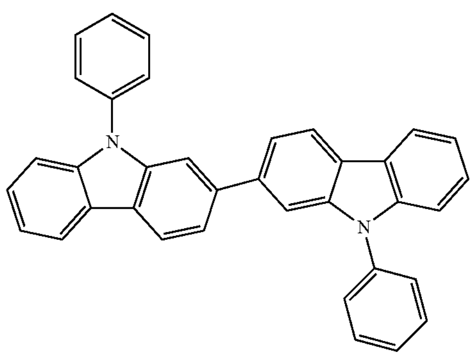
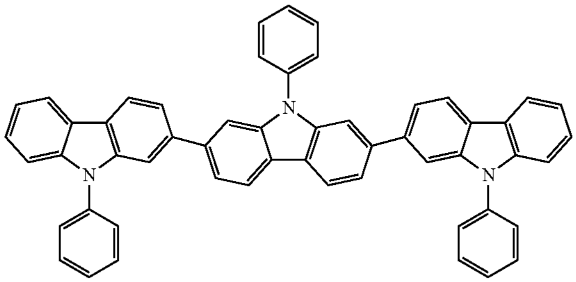
-continued
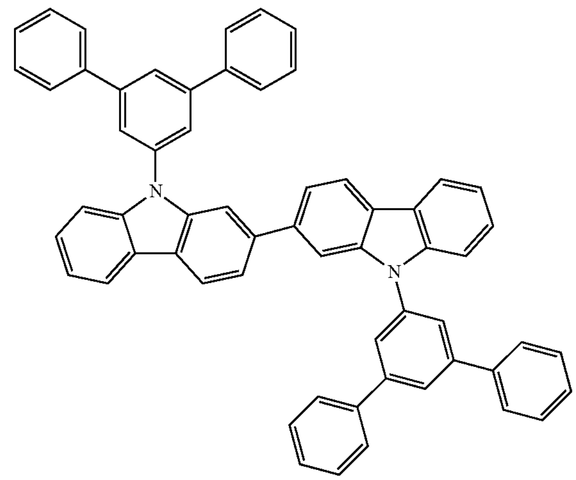
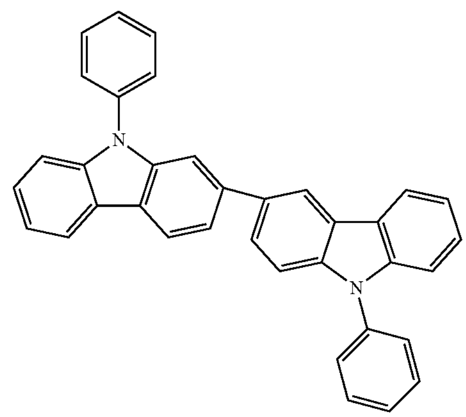
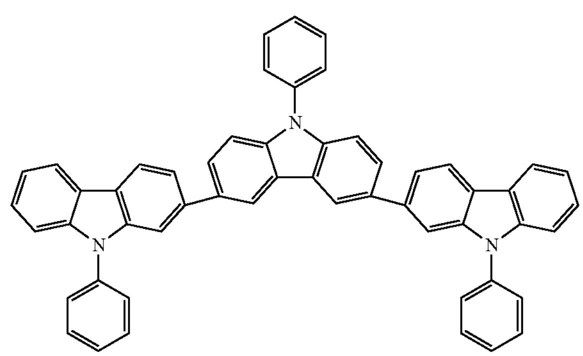

-continued
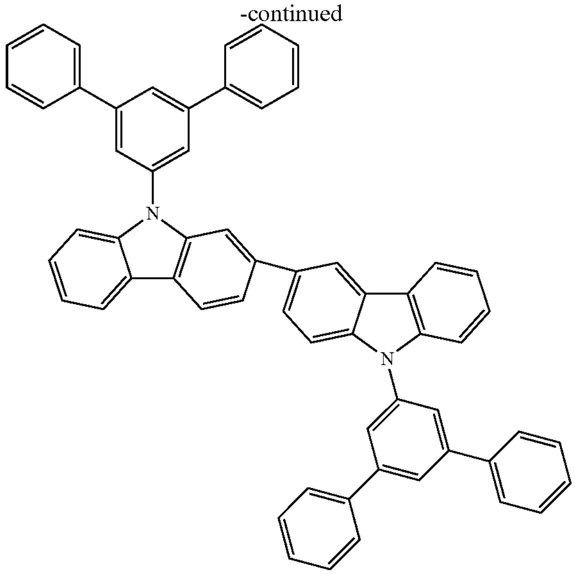
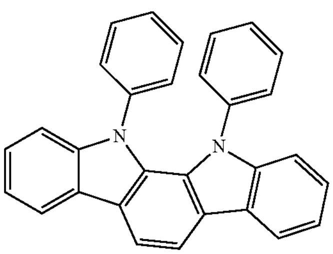
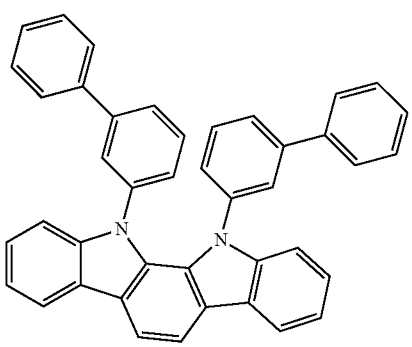
-continued
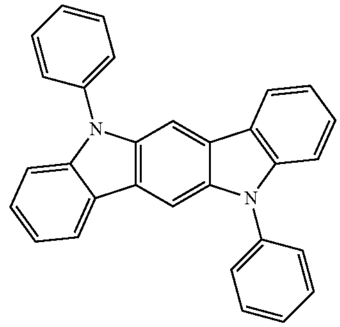
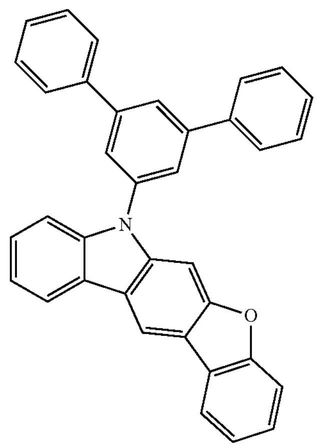
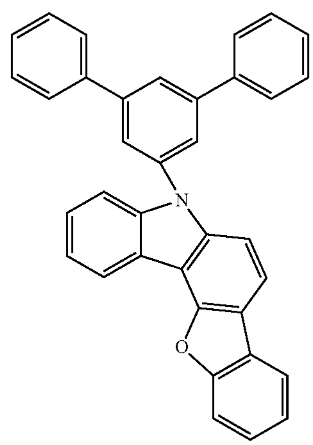
Examples of bridged carbazole derivatives which can be used as hole-transporting matrix materials are the following compounds:

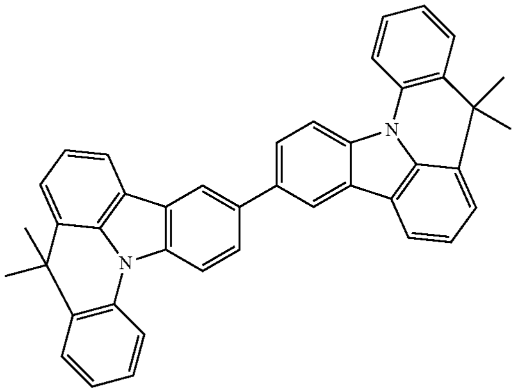
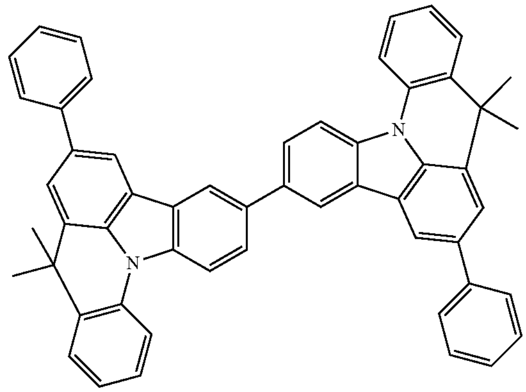
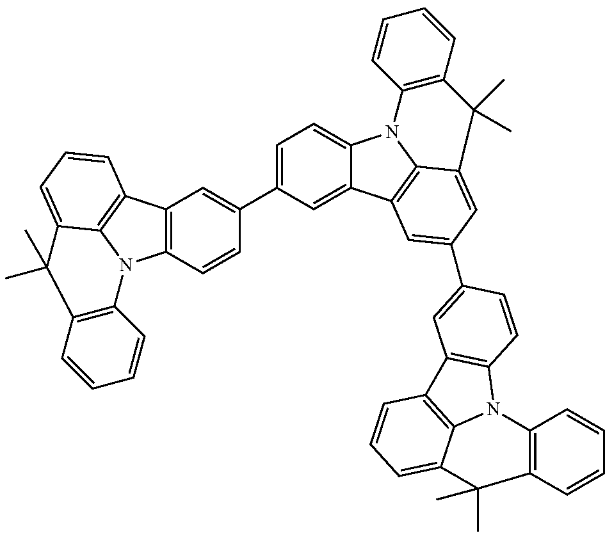
N
N
N
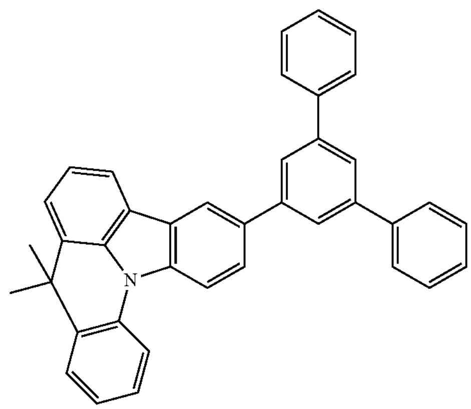
N
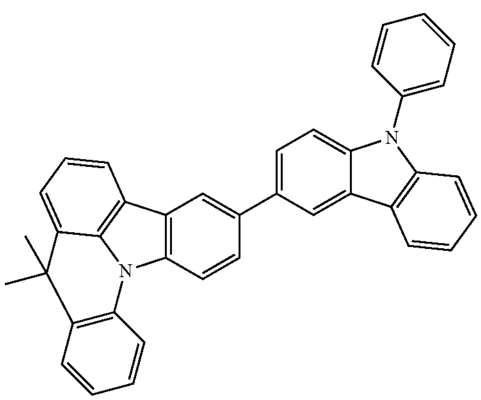
N
N
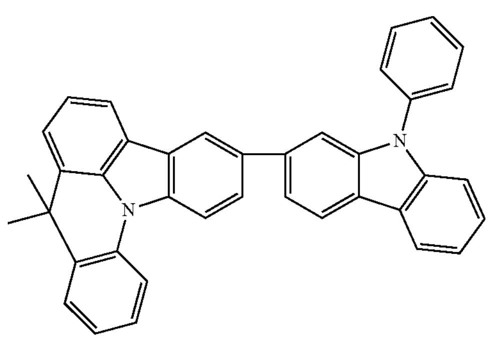
N
N -continued
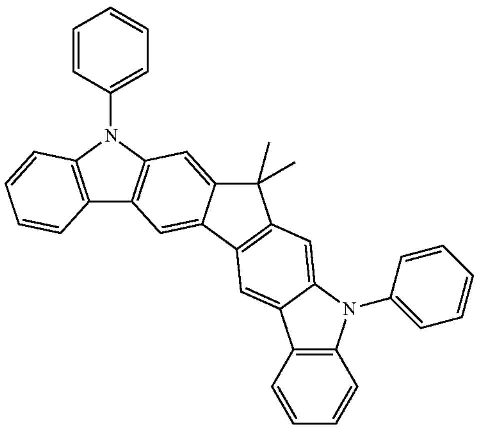
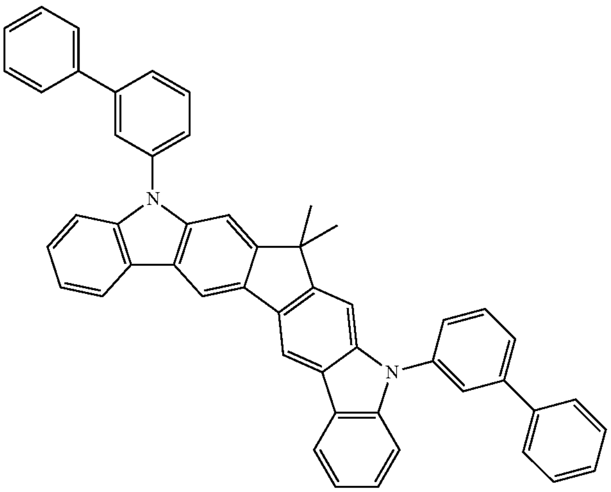
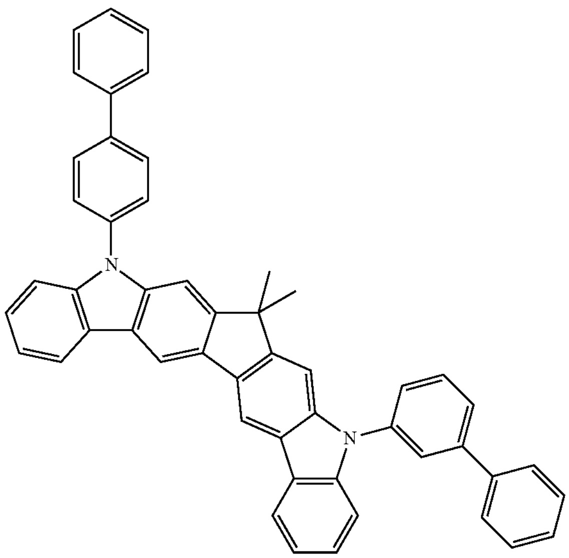
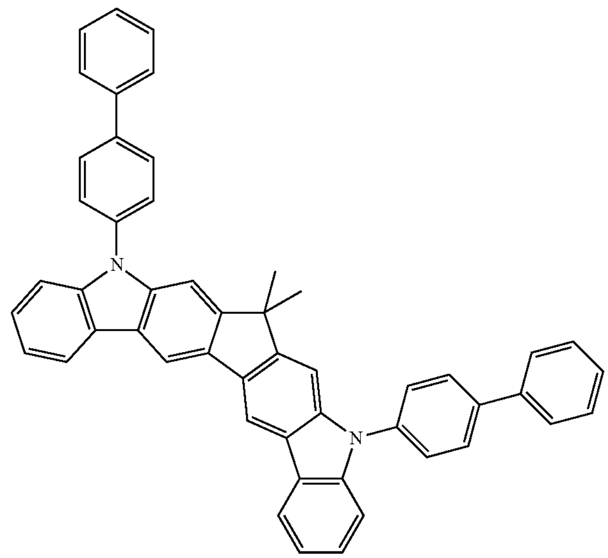
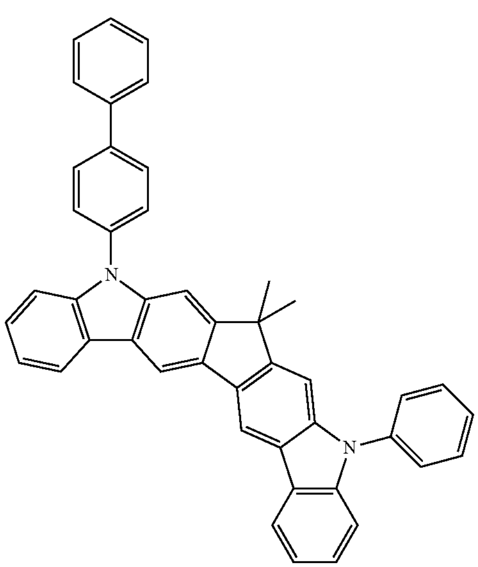
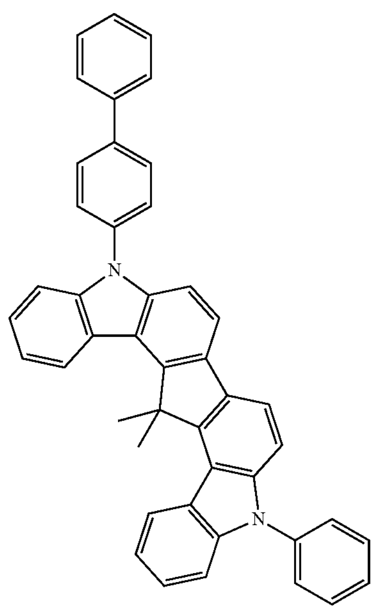

-continued
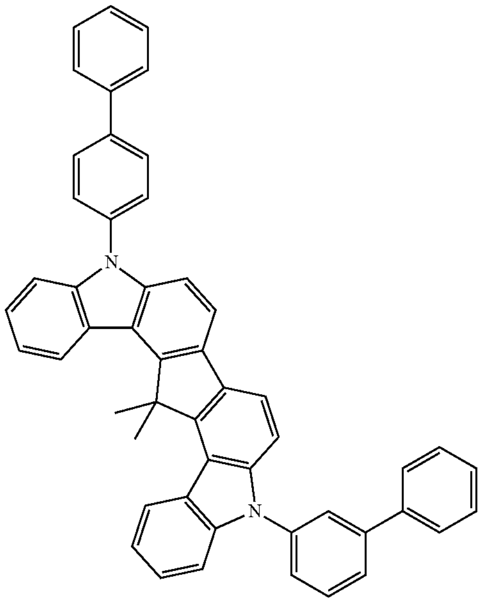
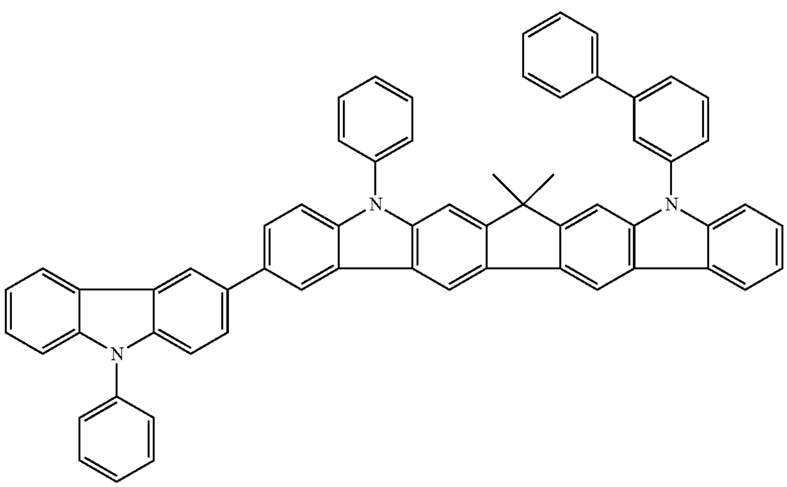
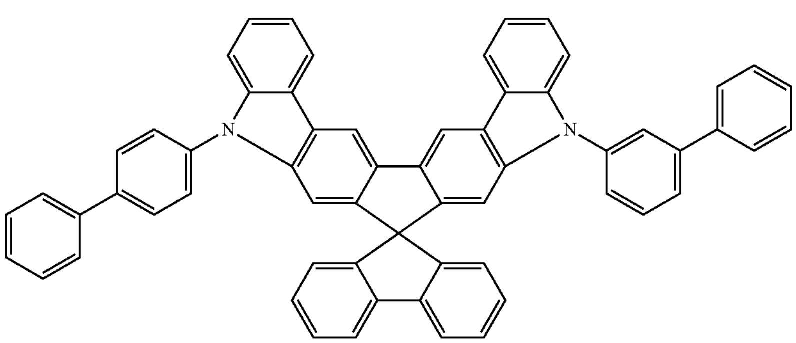

-continued
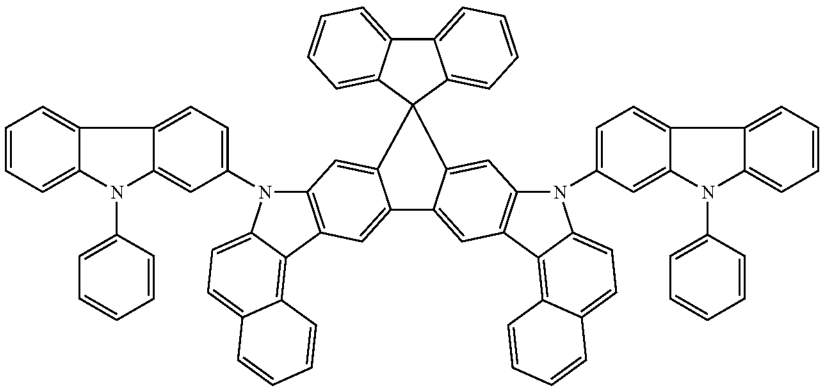
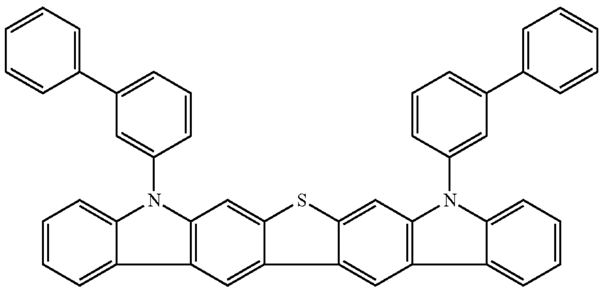
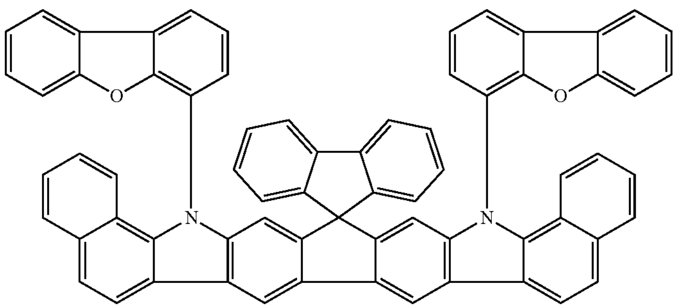
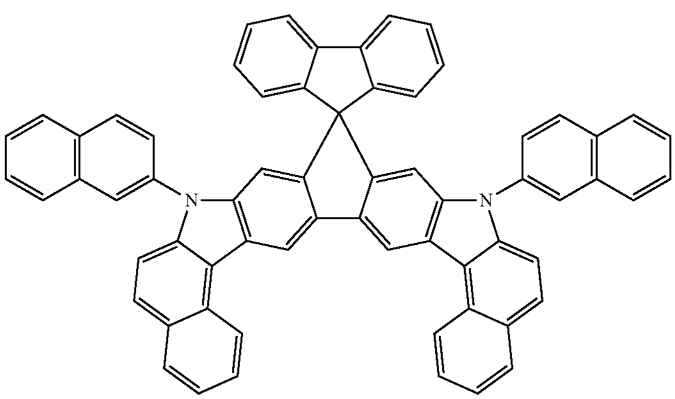
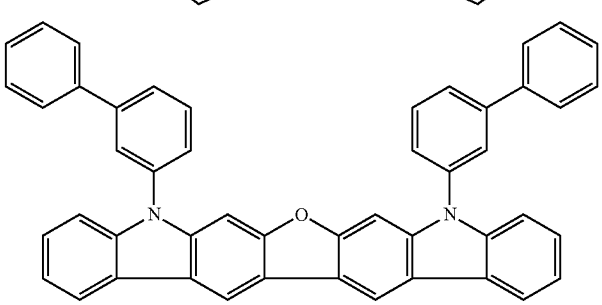

-continued
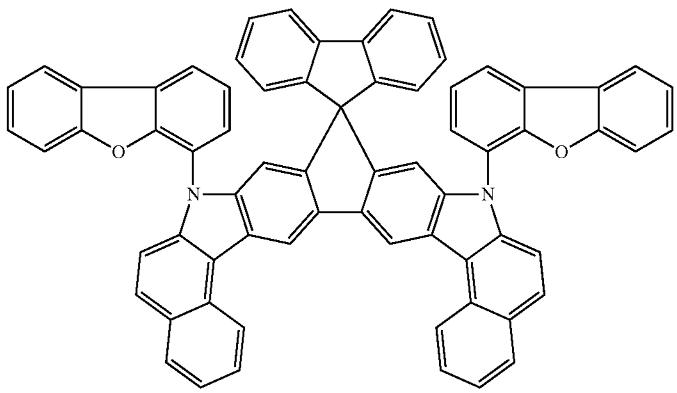
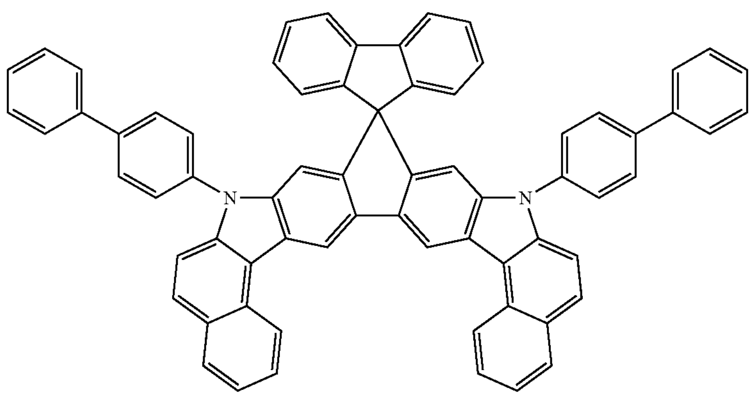
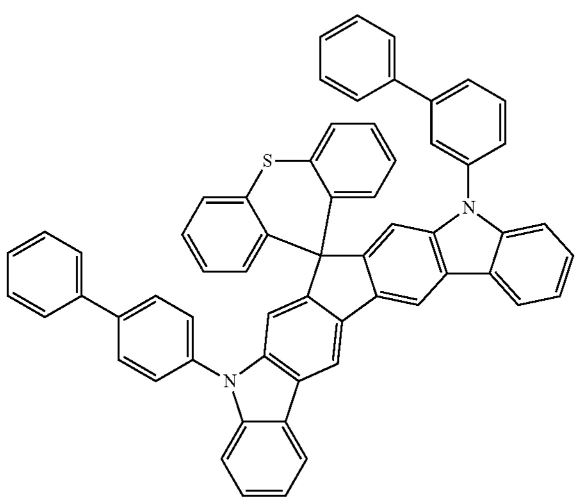
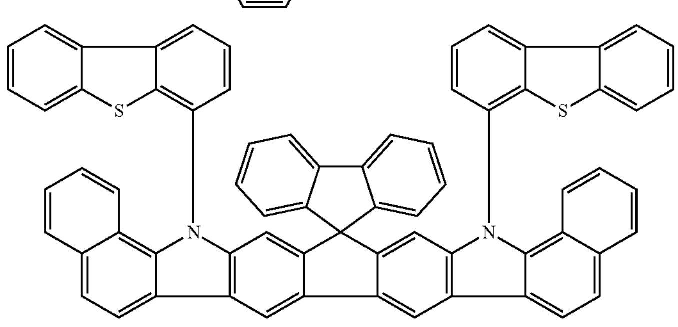

-continued
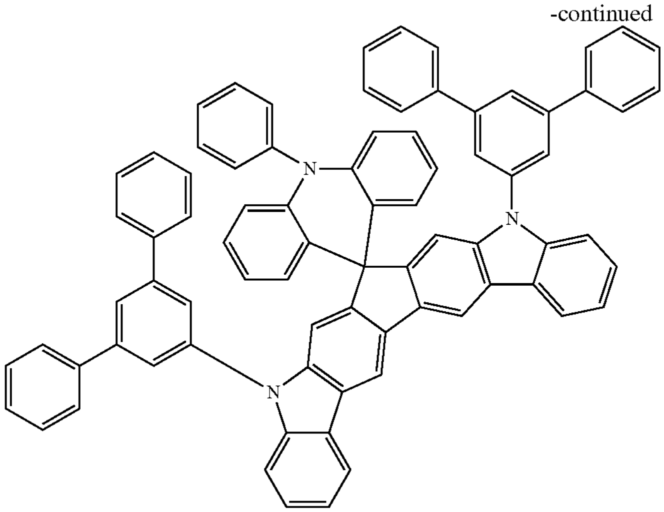
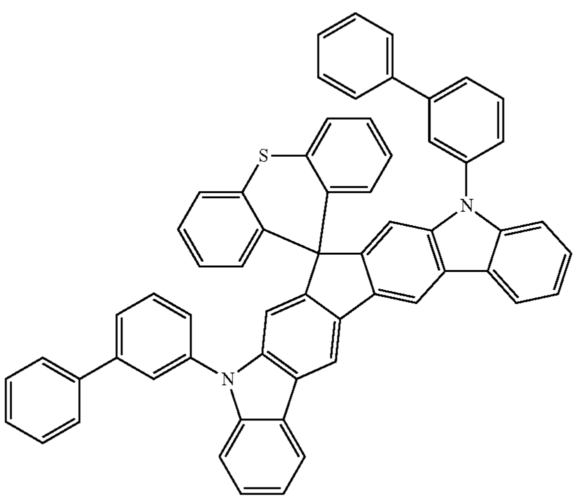
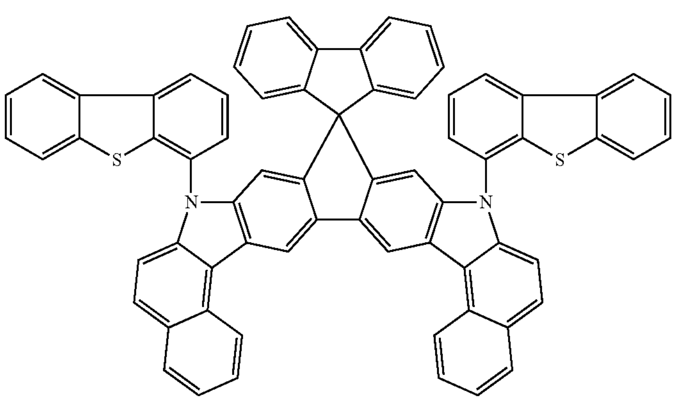

-continued
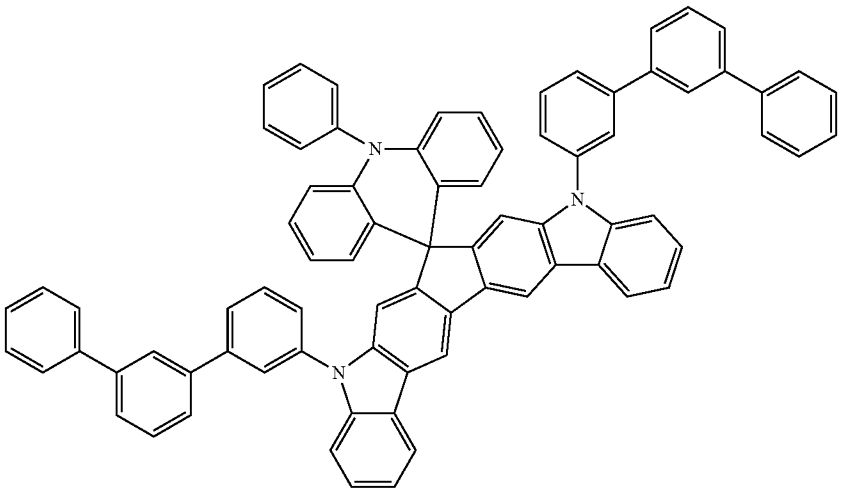
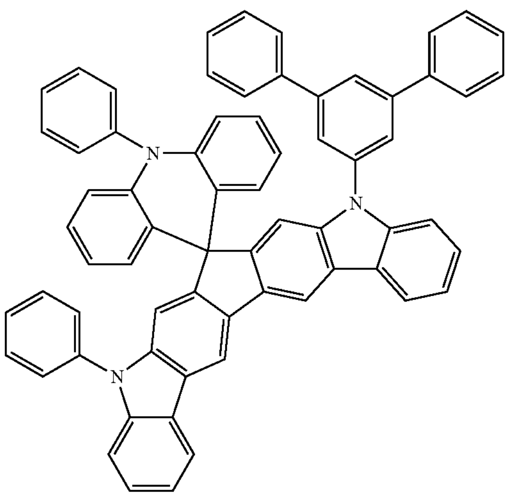
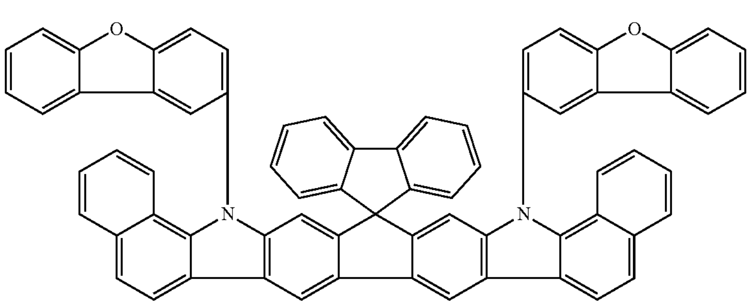

-continued
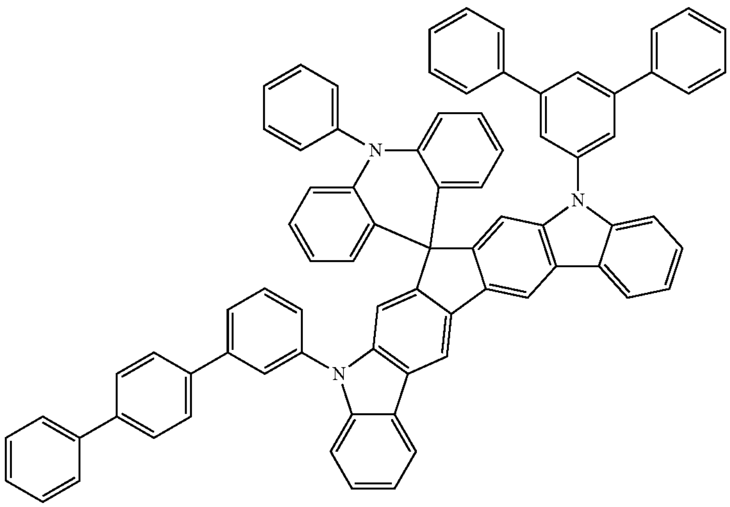
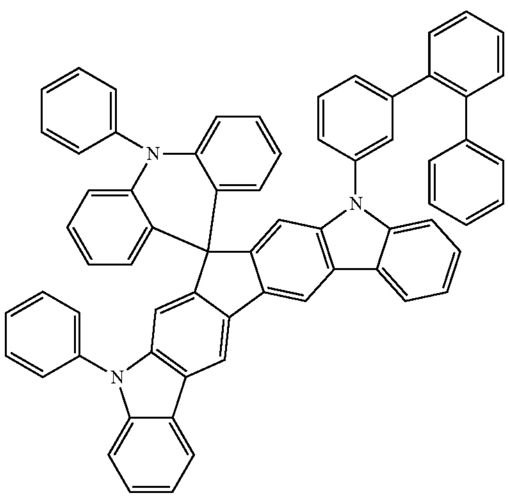
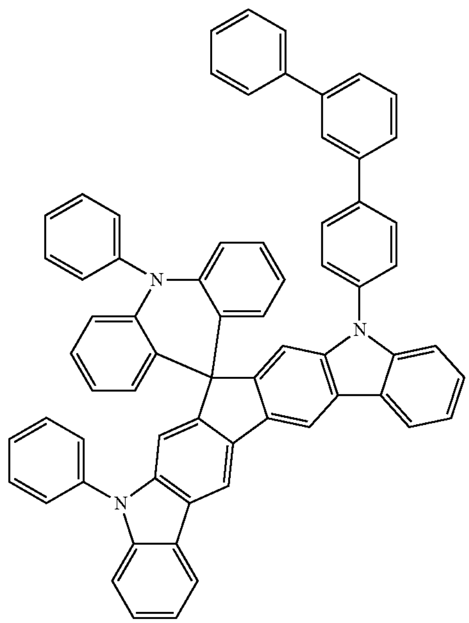
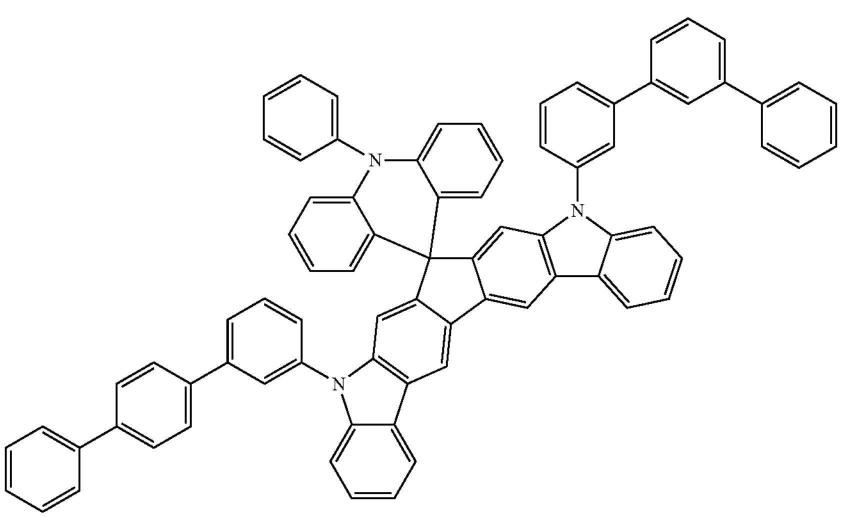

-continued
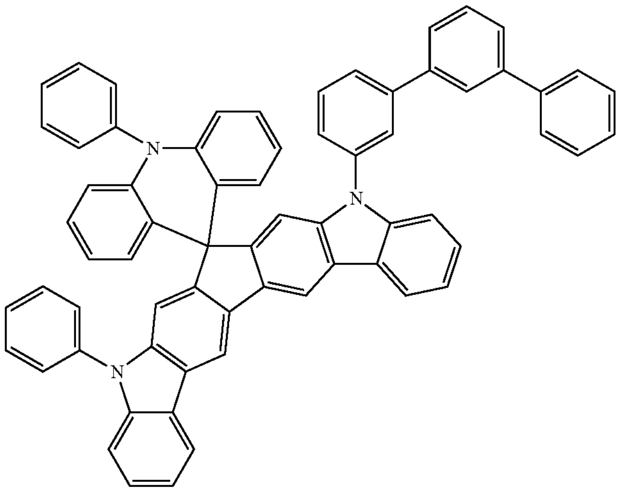
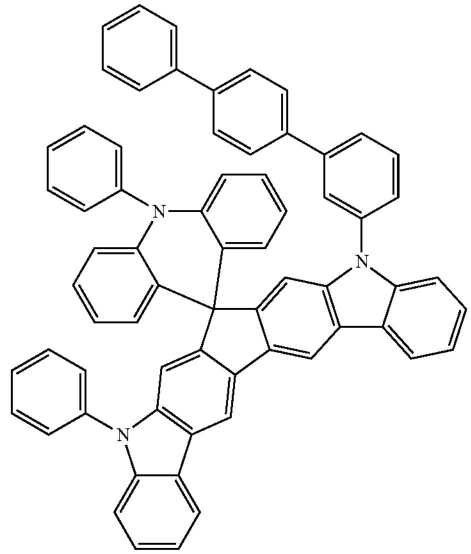
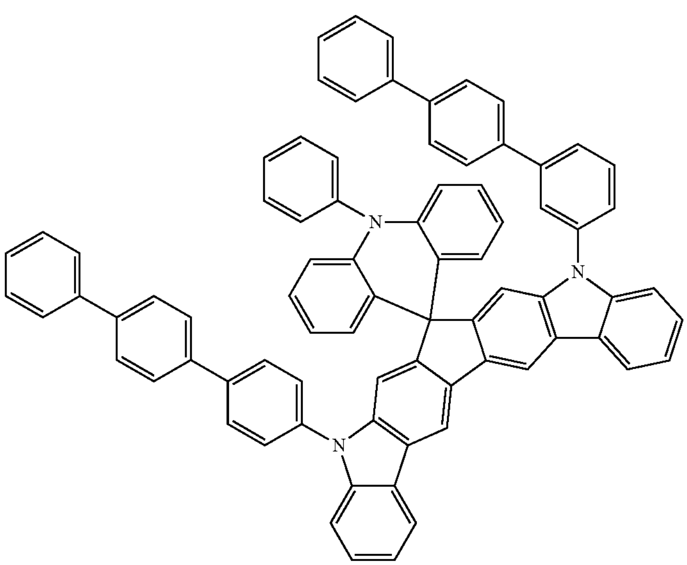
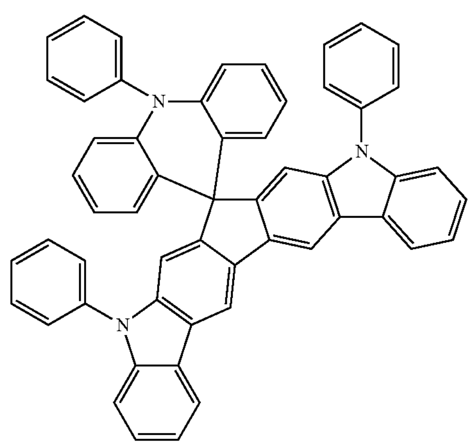

-continued
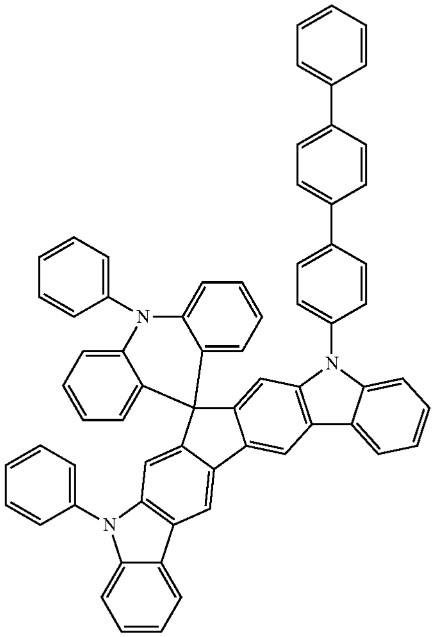
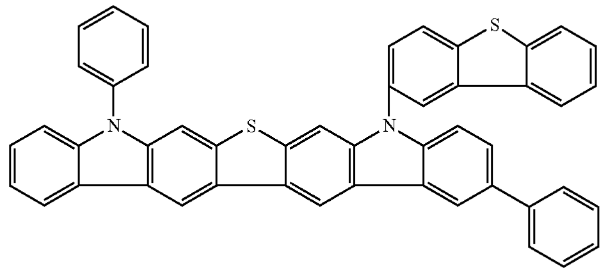
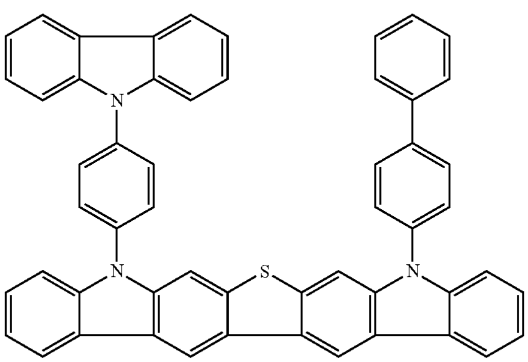
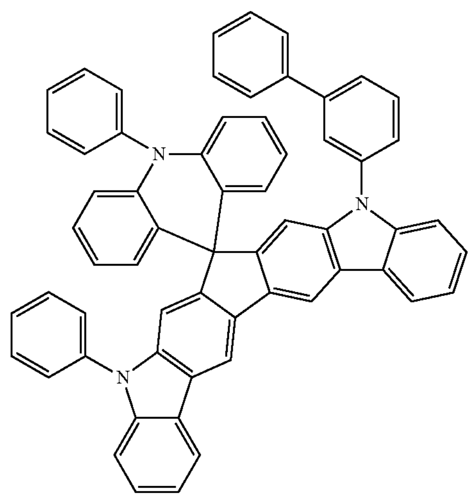
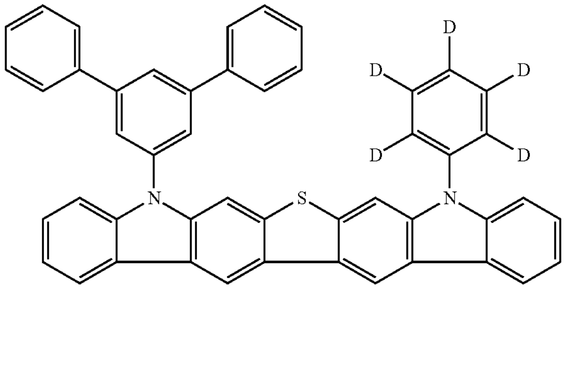
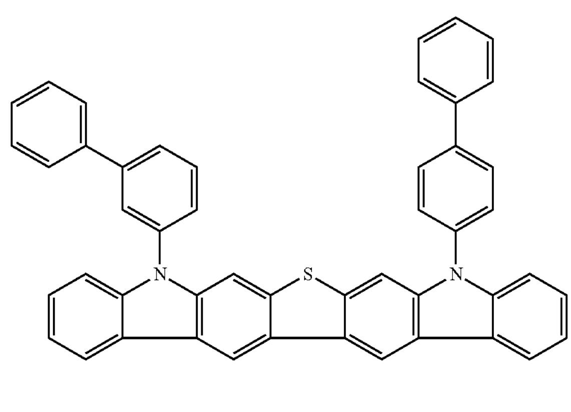

-continued
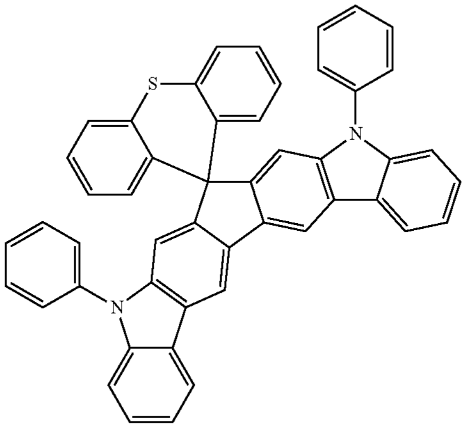
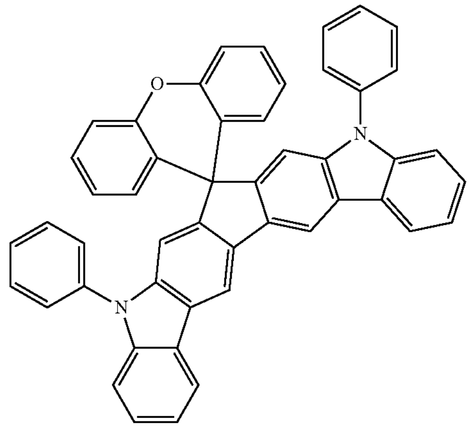
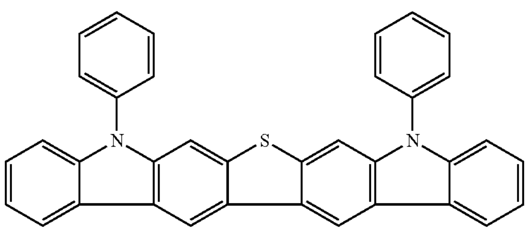
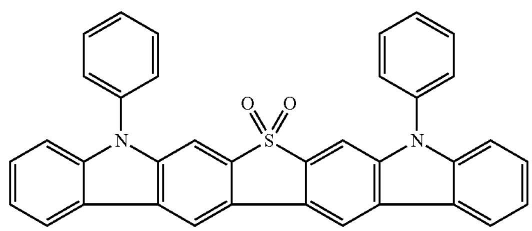
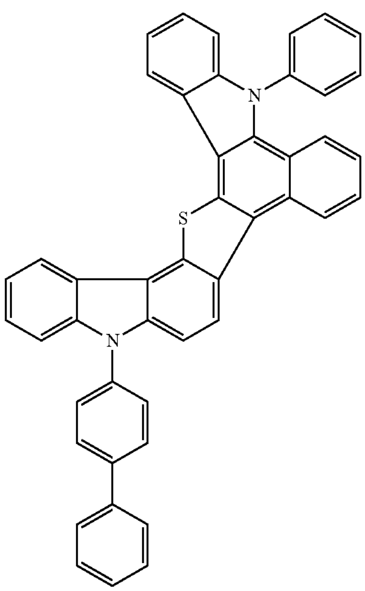
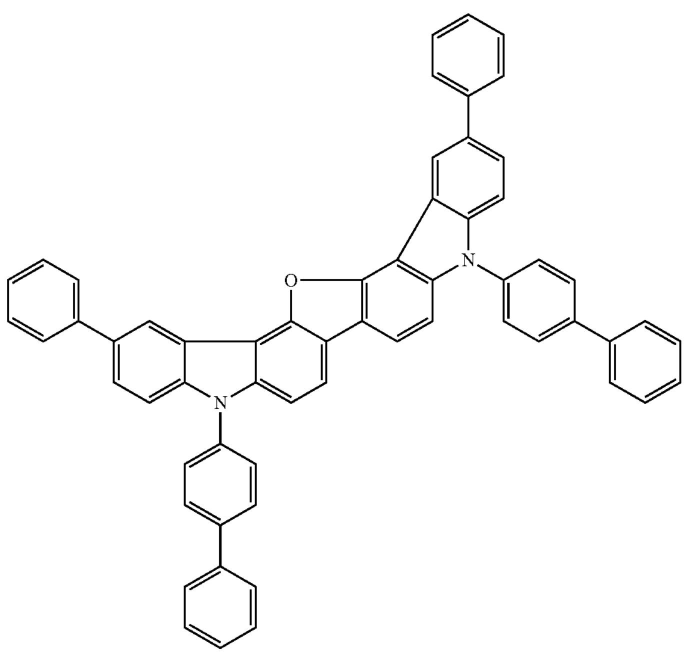

-continued
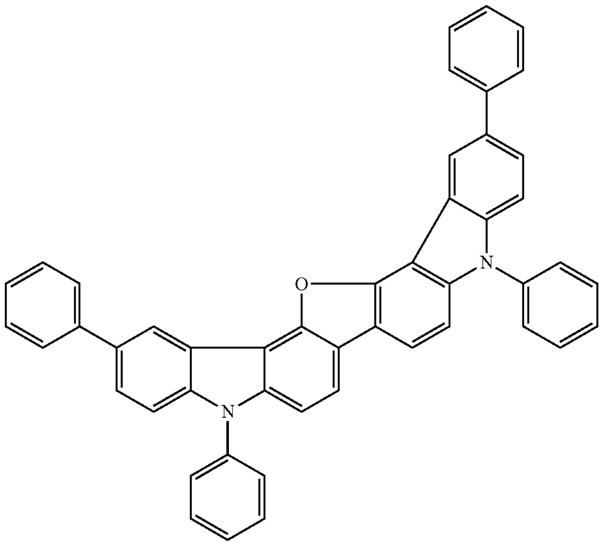
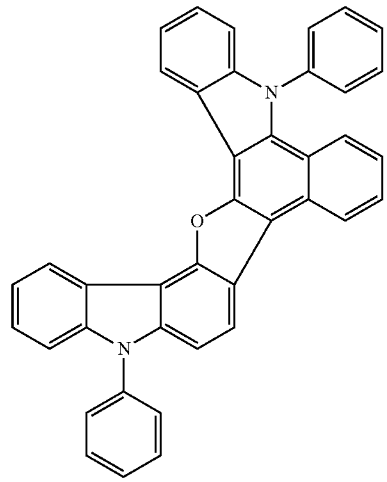
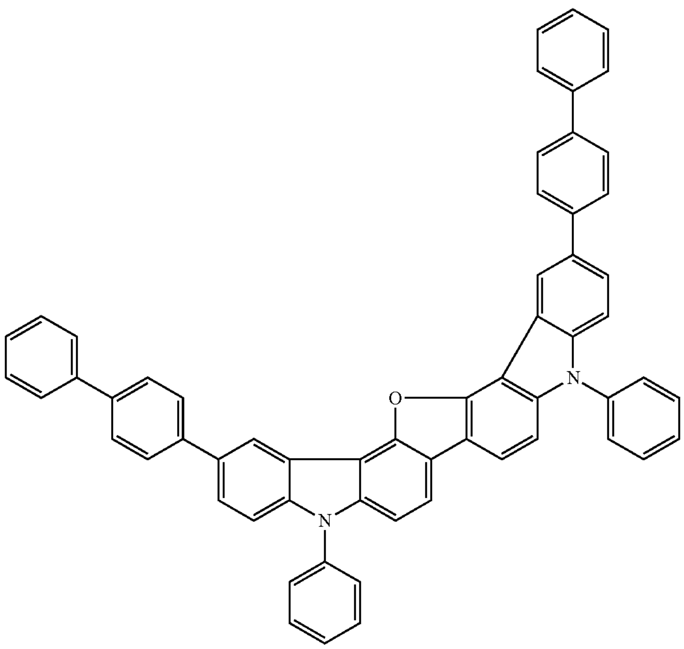
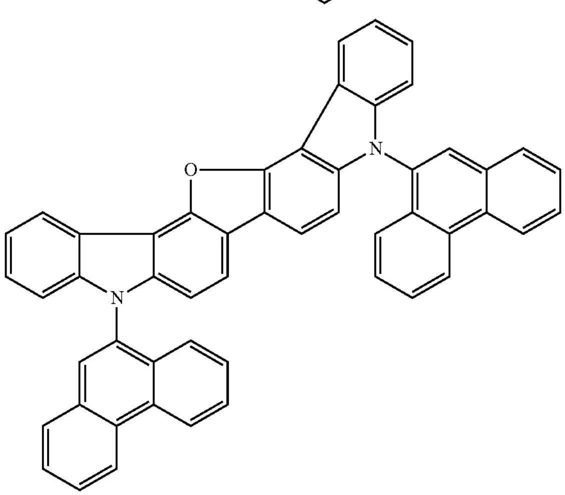
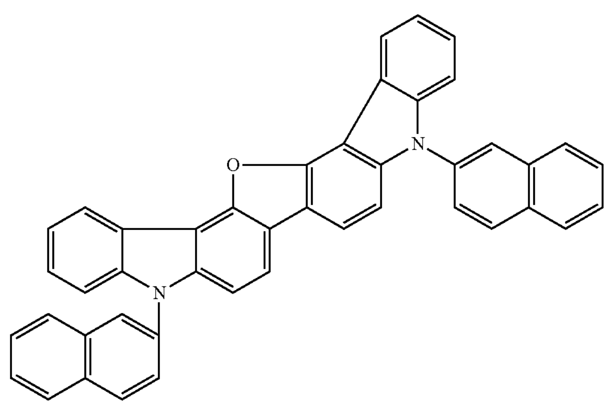

-continued
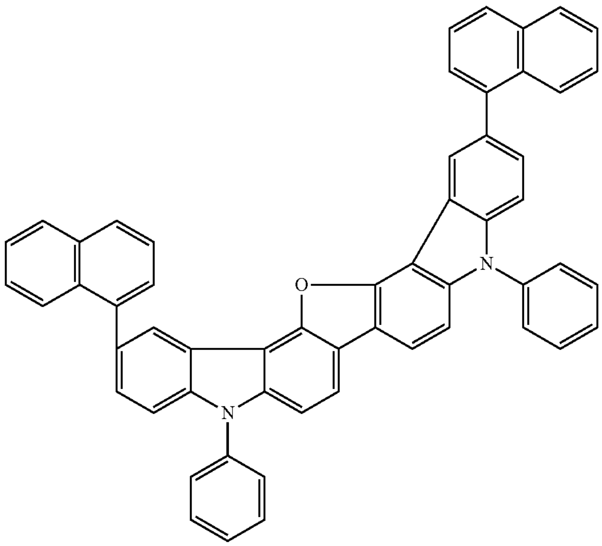
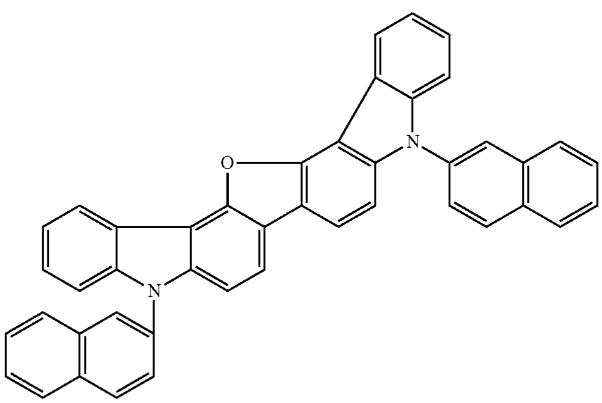
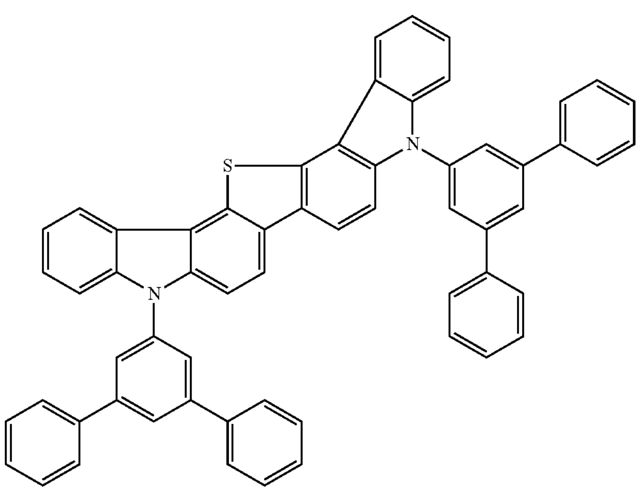

-continued
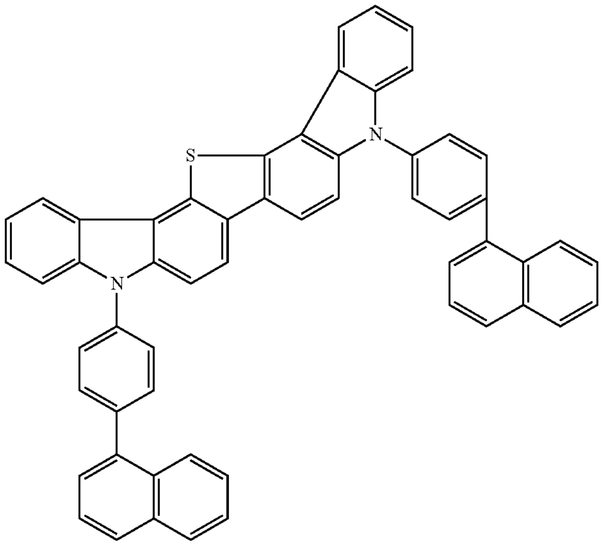
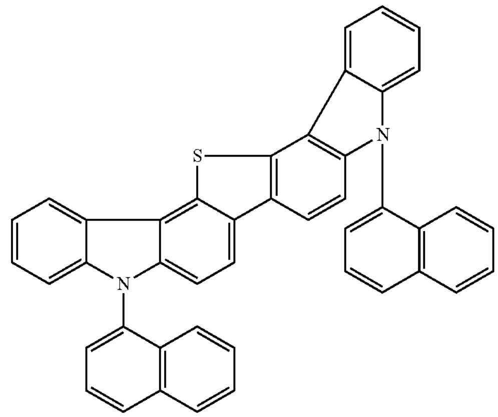
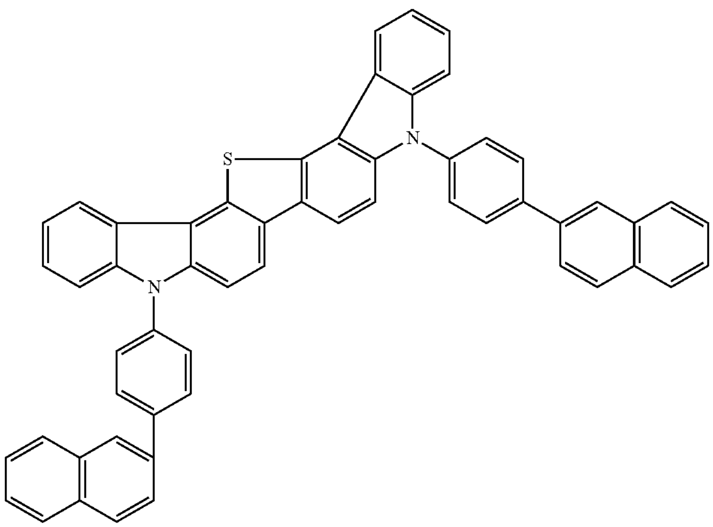
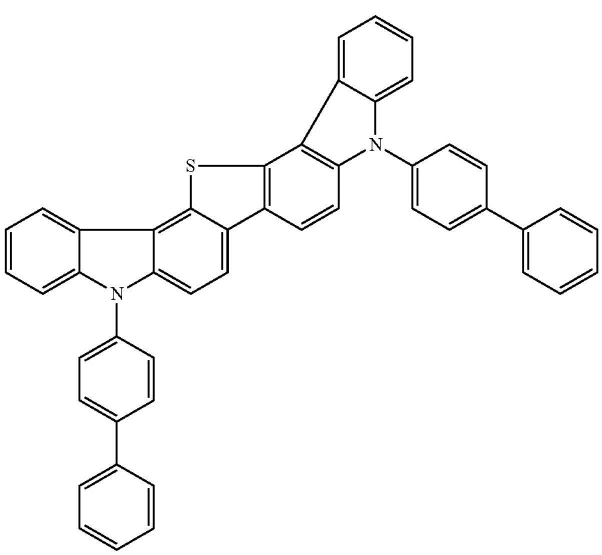

-continued
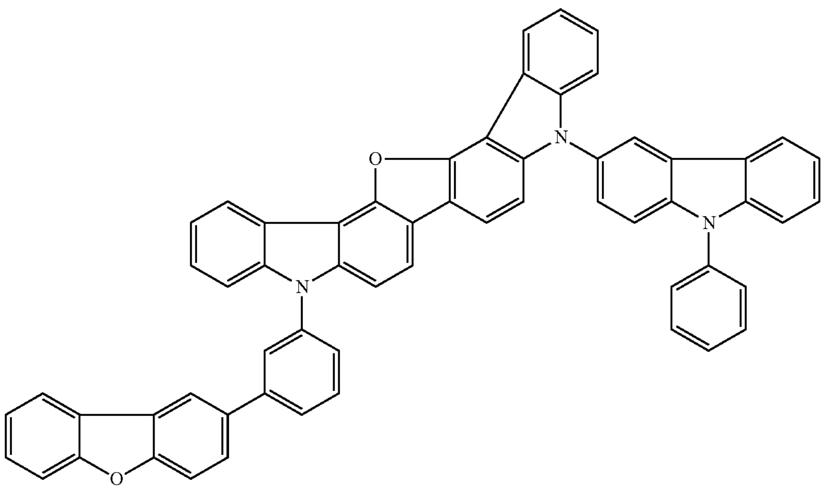
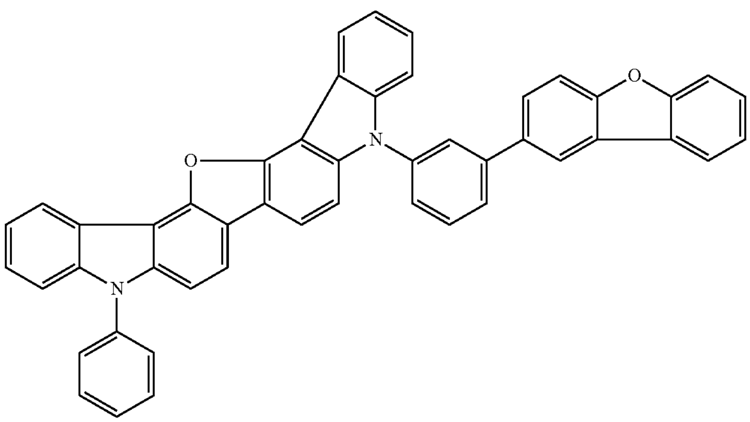
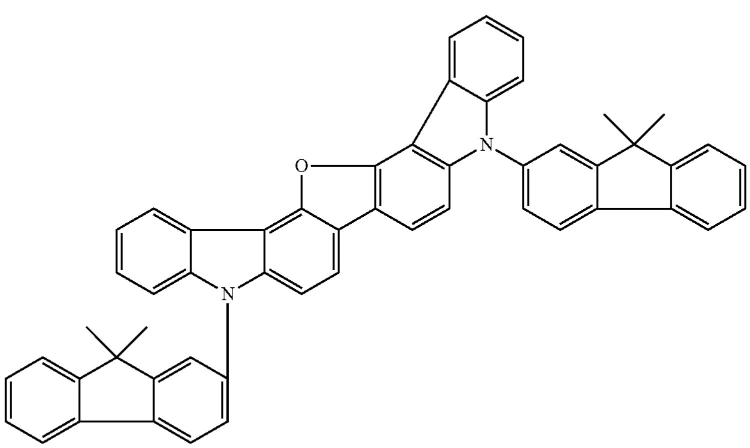

-continued
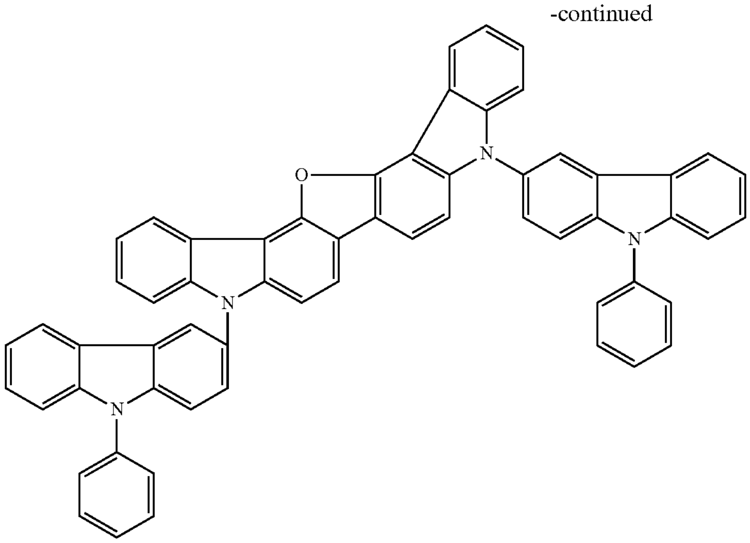
Examples of biscarbazoles which can be used as hole-transporting matrix materials are the following compounds:
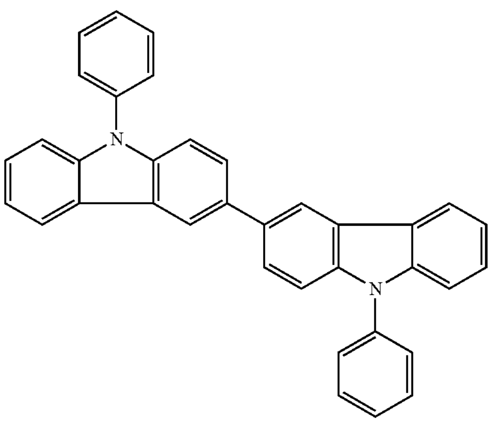
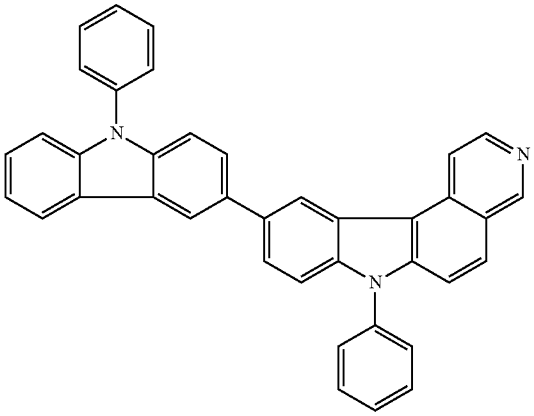
-continued
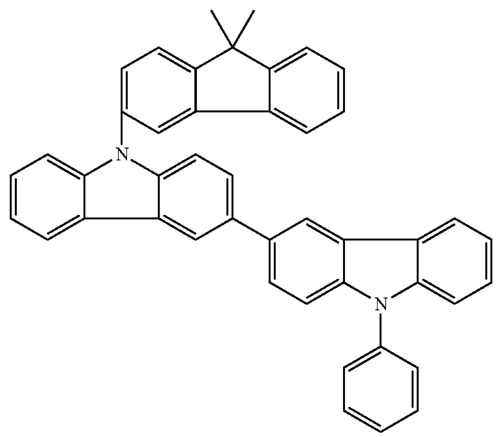
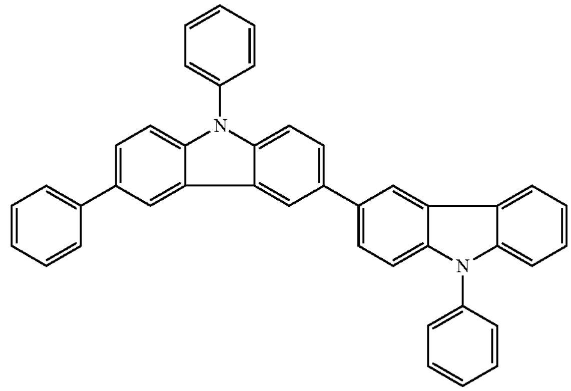

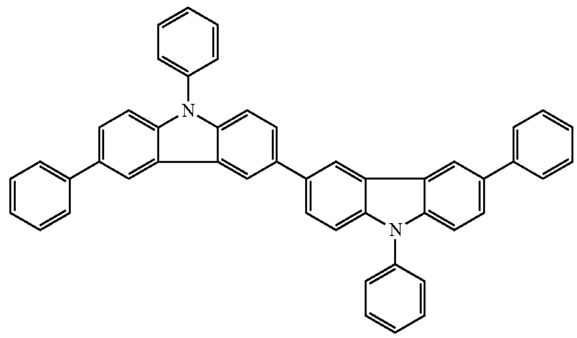
N
N
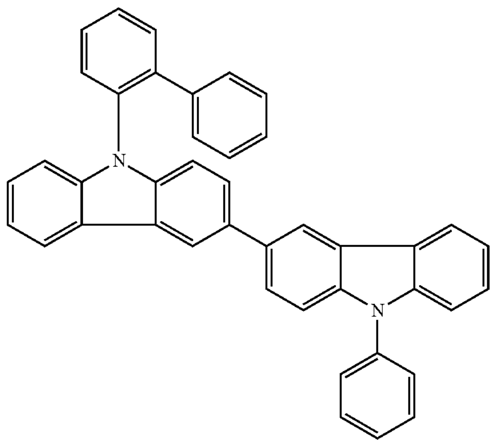
N
N
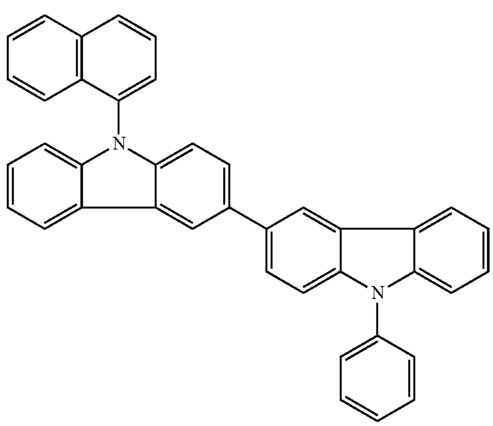
N
N
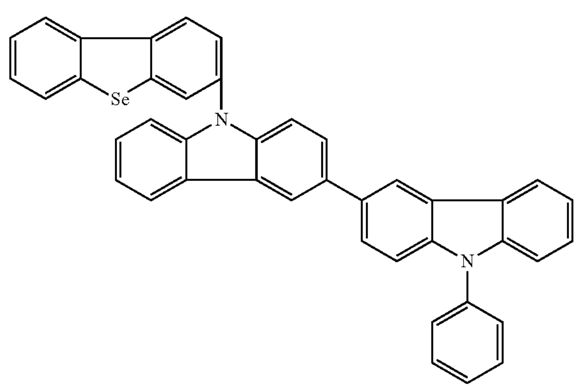
Se
N
N
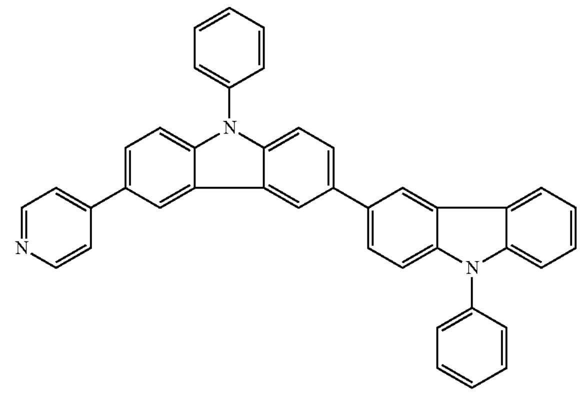
N
N
N
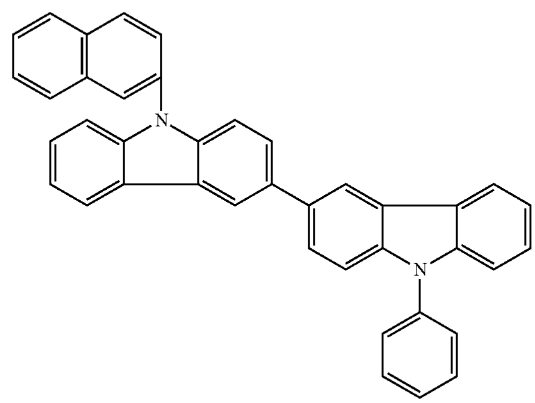
N
N
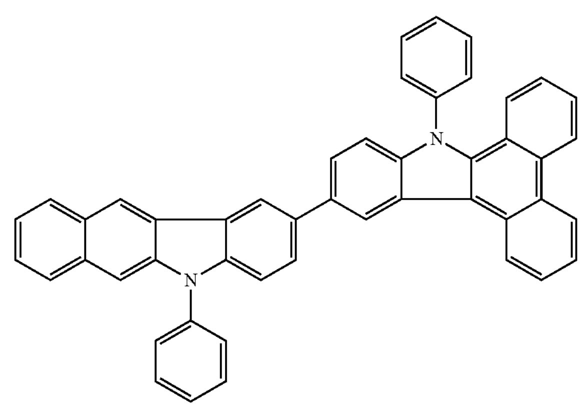
N
N
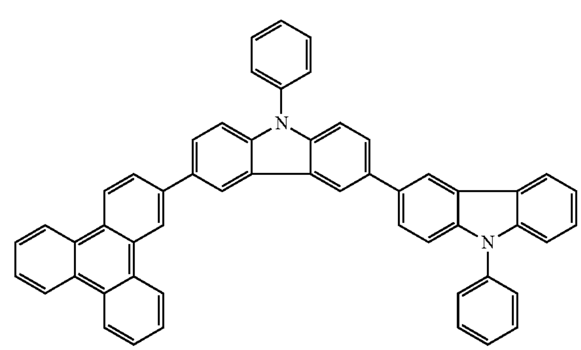
N
N -continued
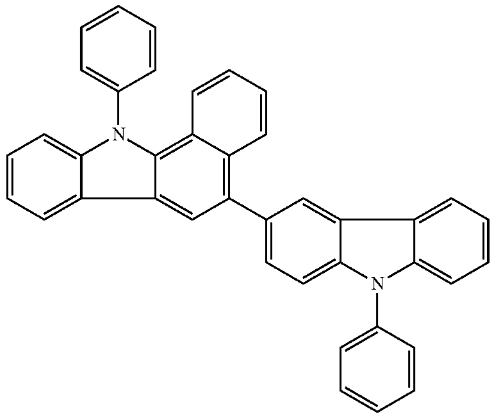
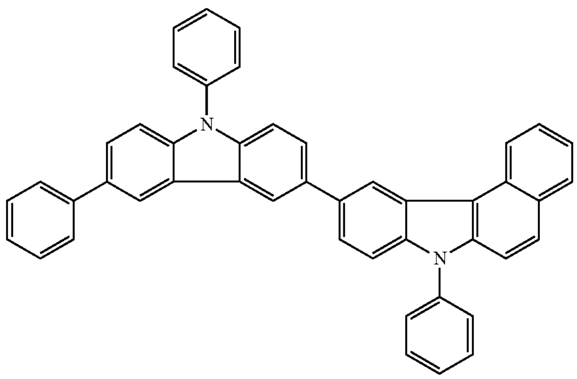
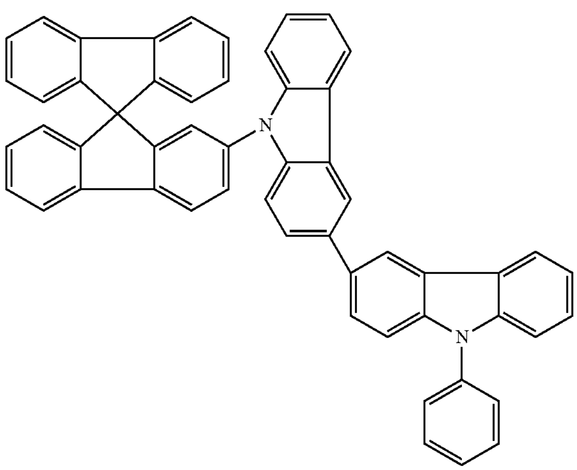
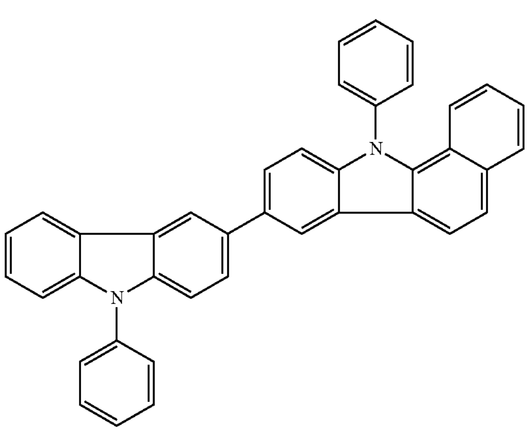
-continued
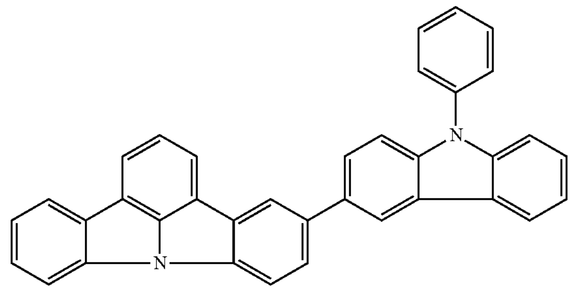
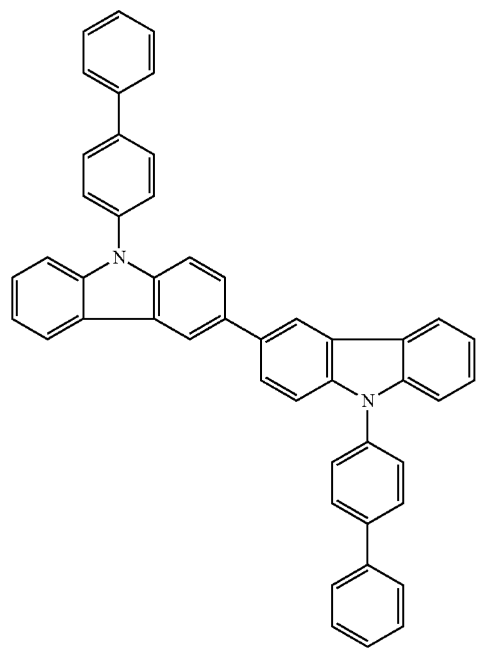
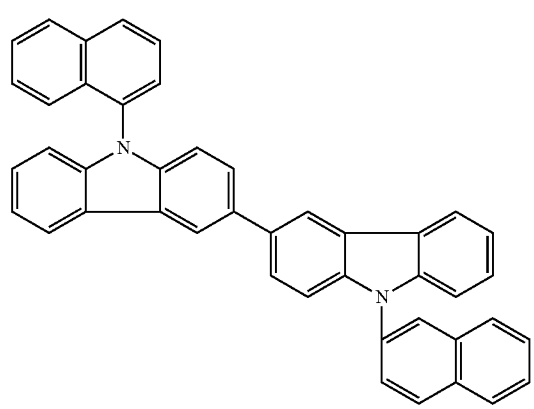

-continued
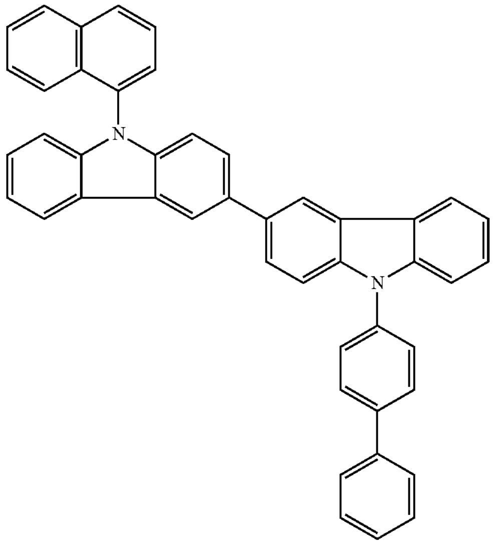
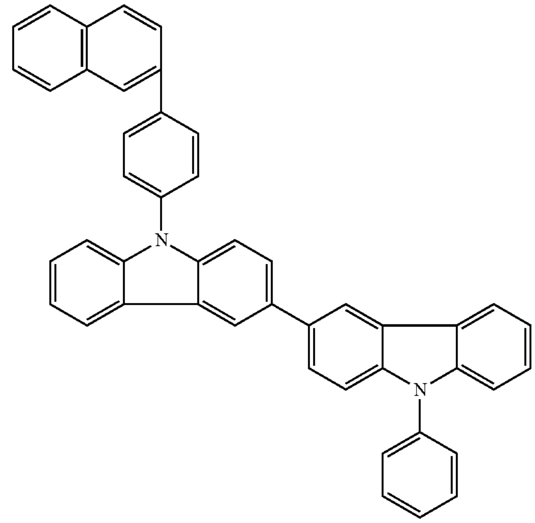
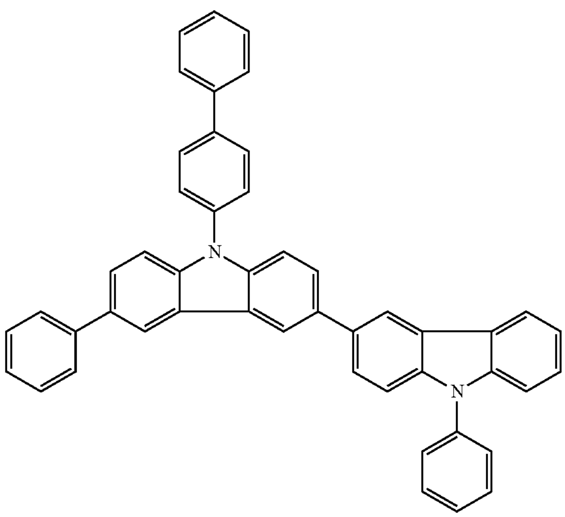
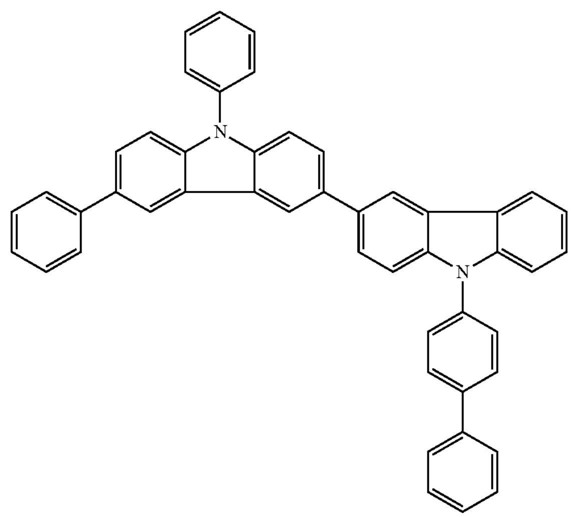
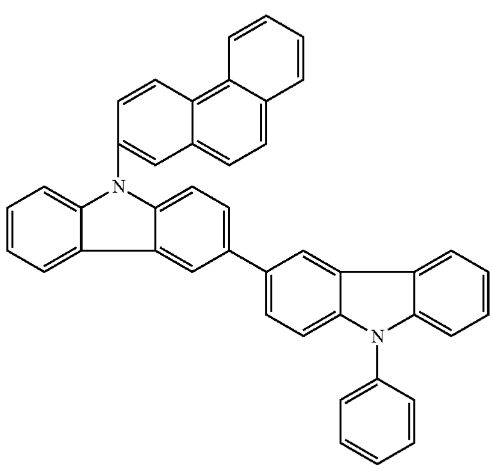
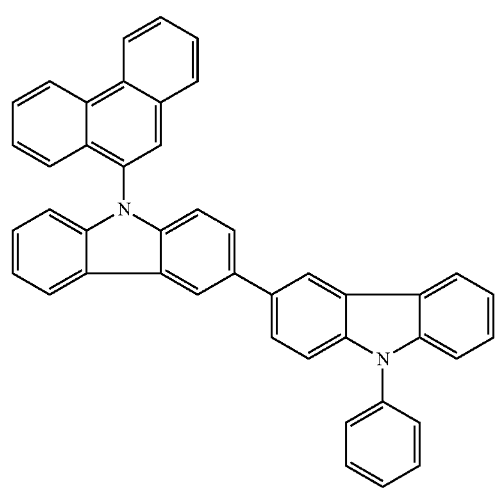

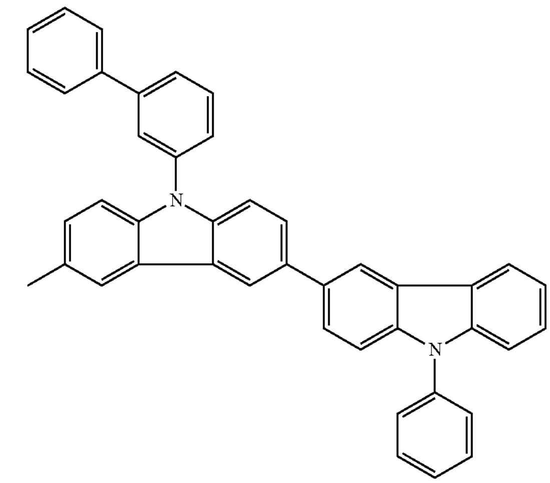
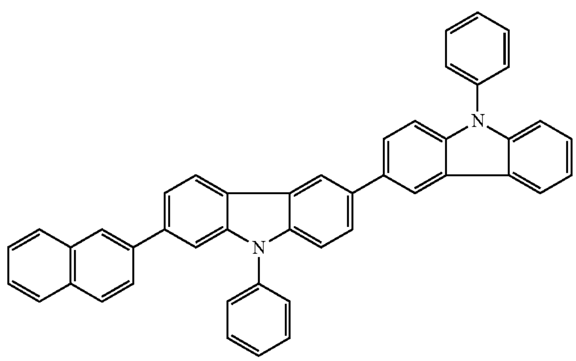
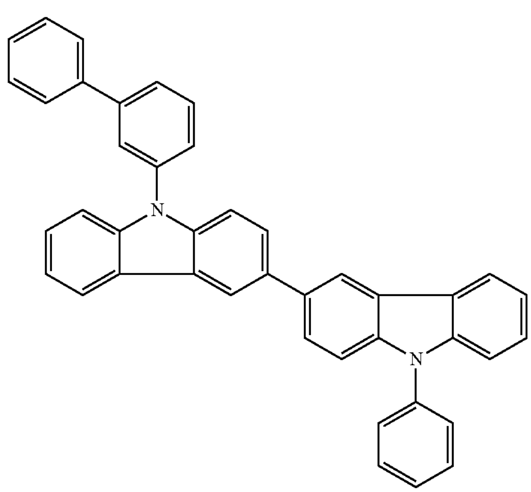
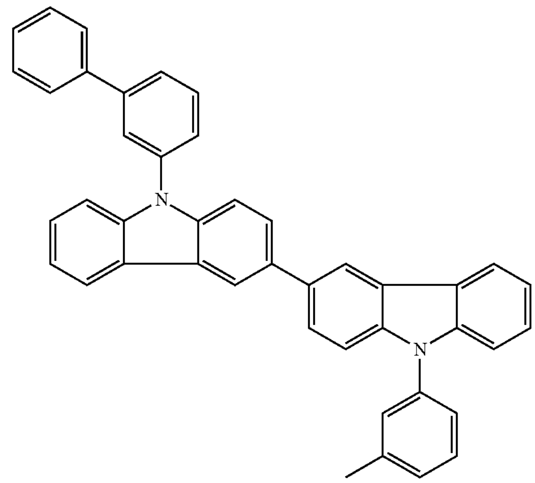
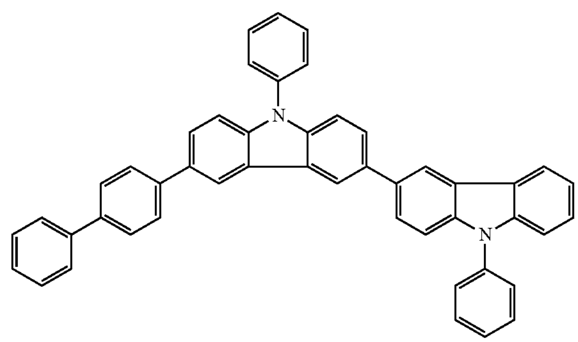
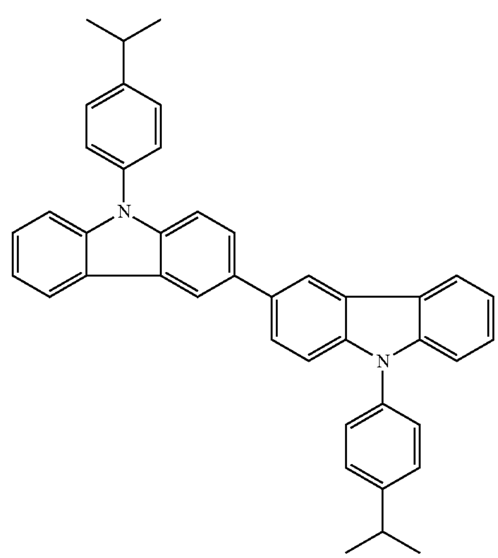

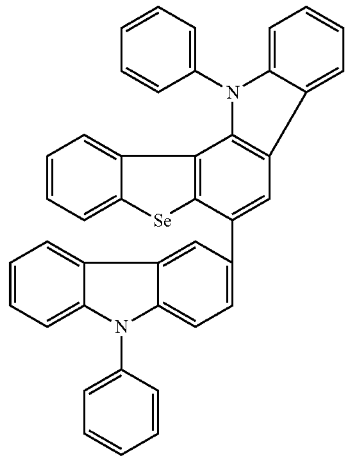
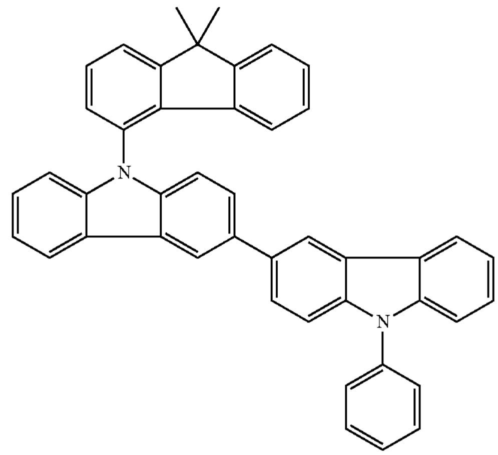
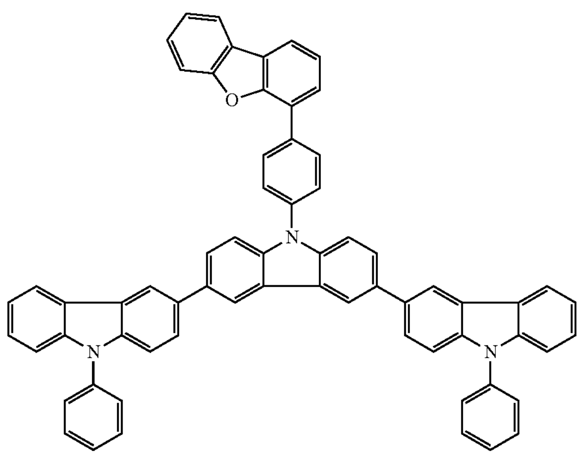
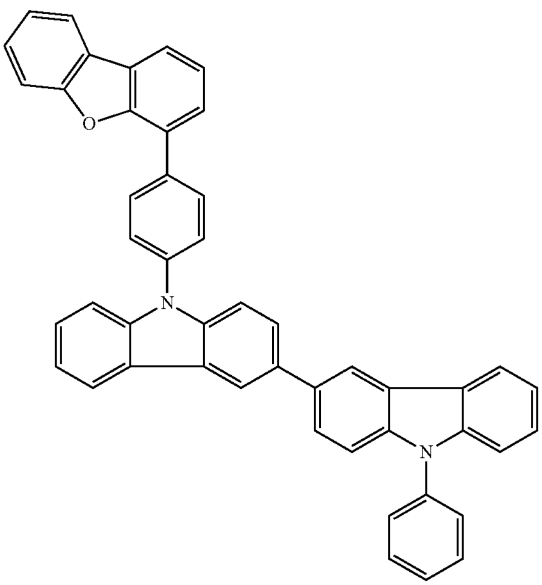
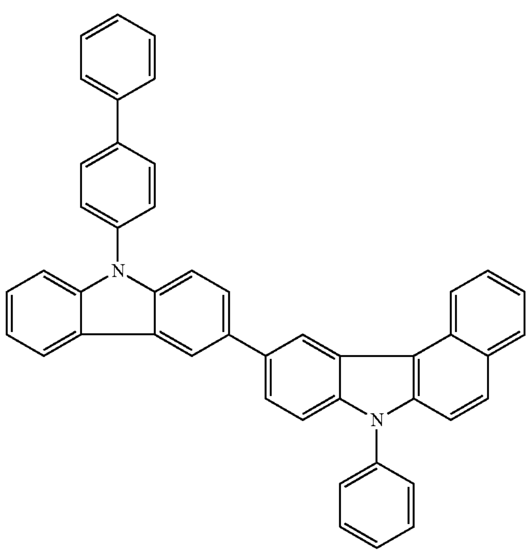
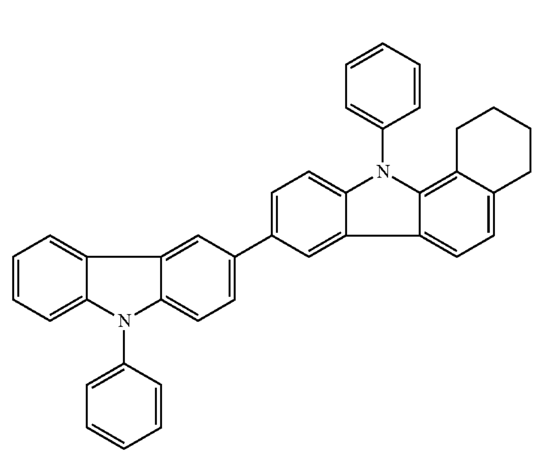
N

-continued
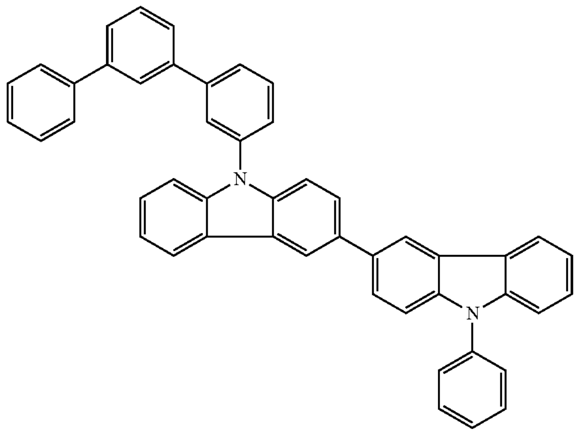
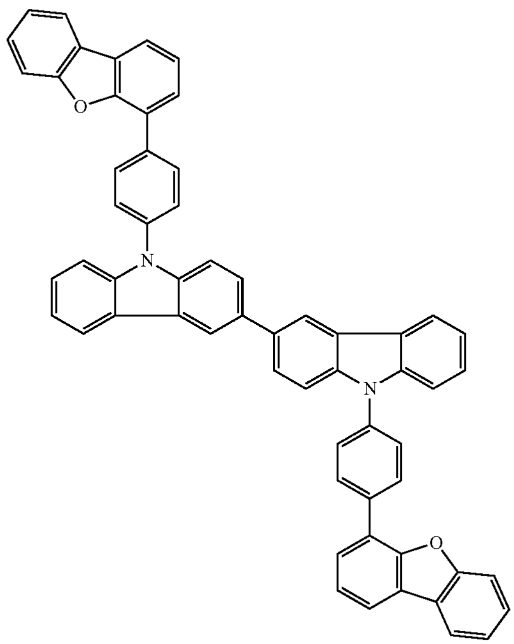
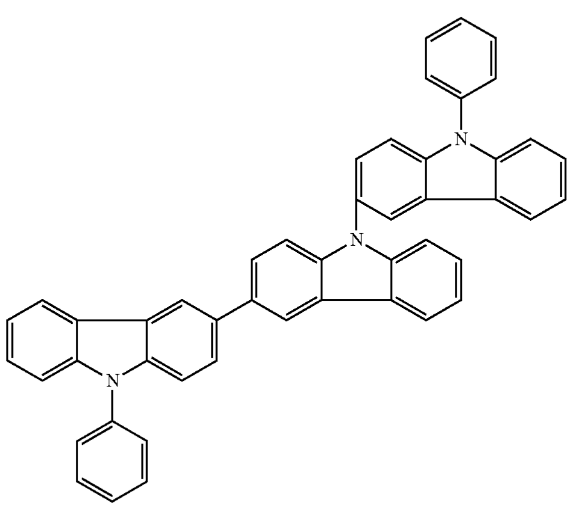
-continued
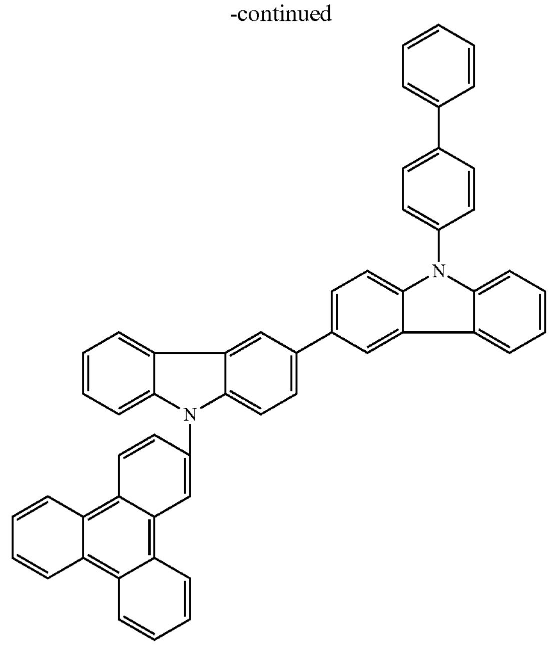
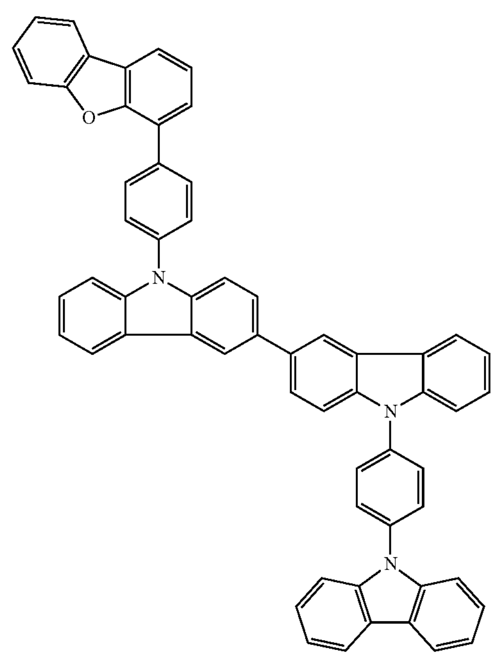

-continued
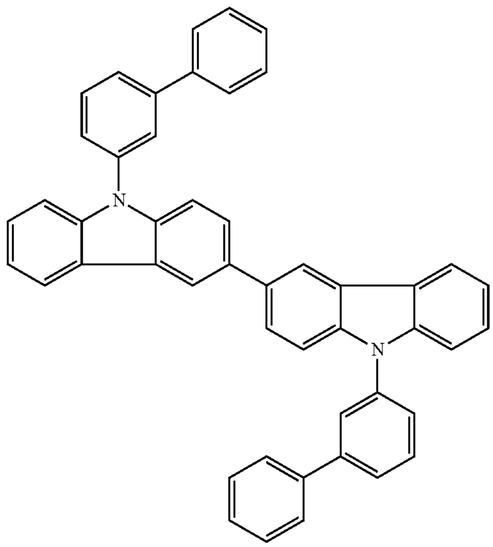
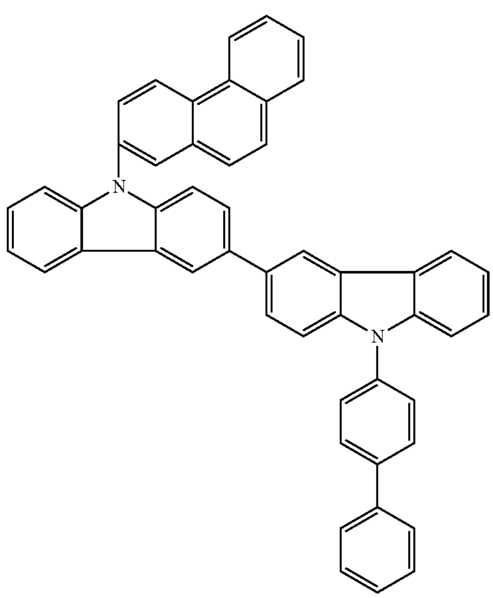
-continued
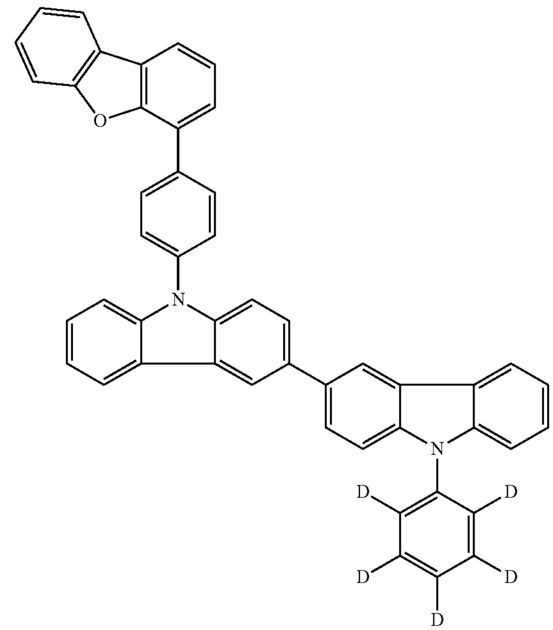
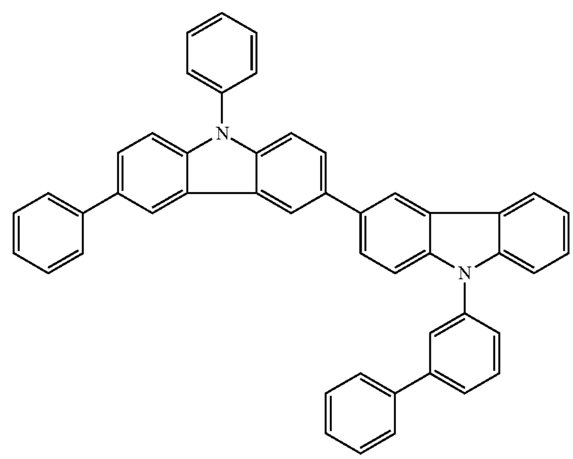
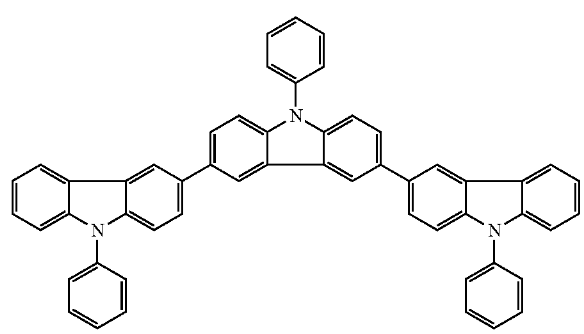

-continued
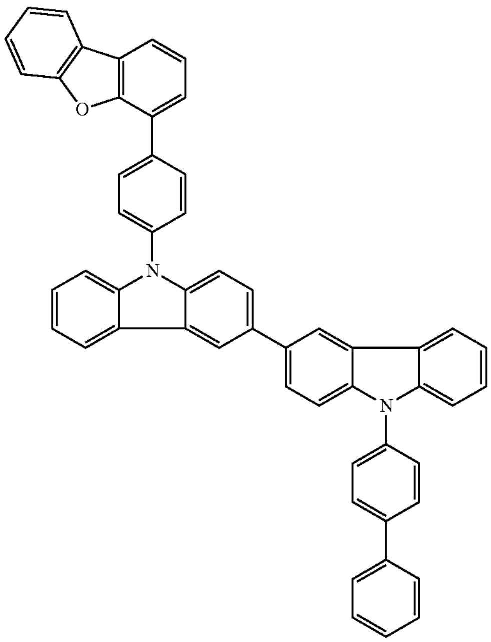
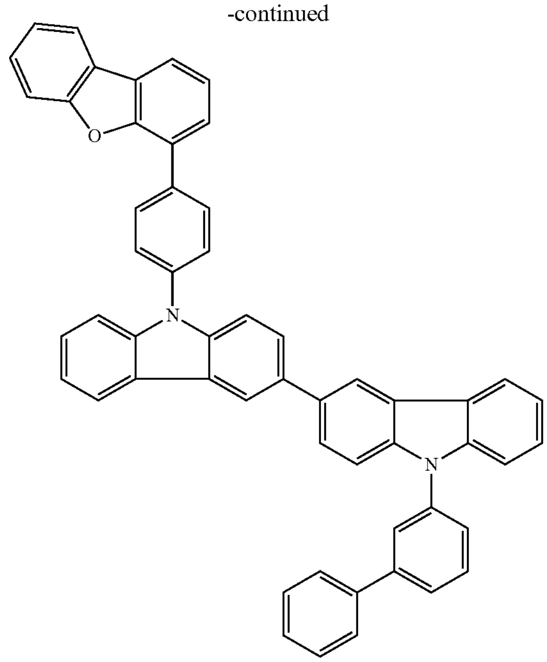
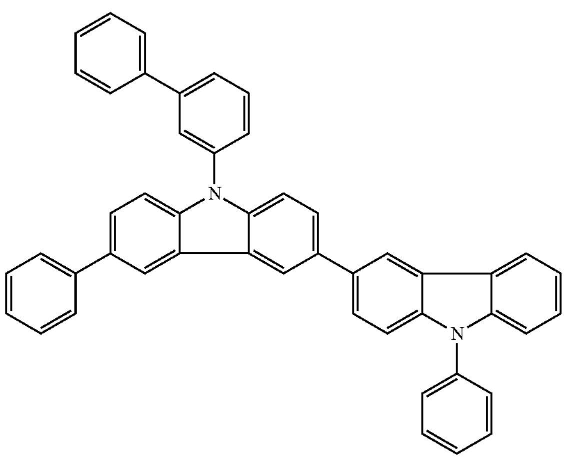
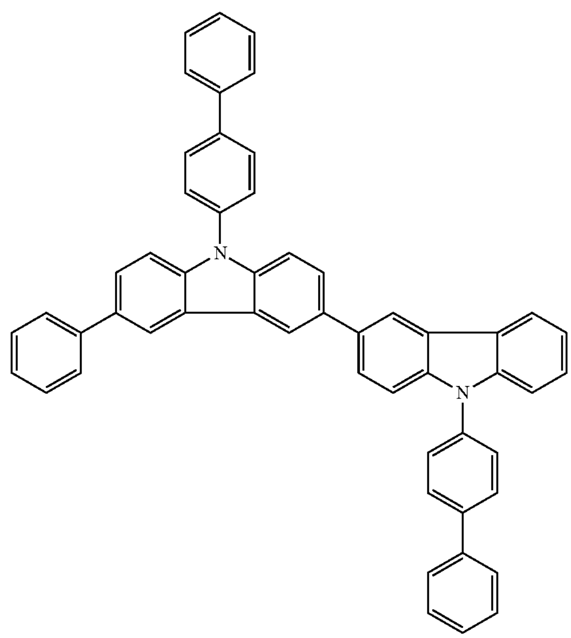
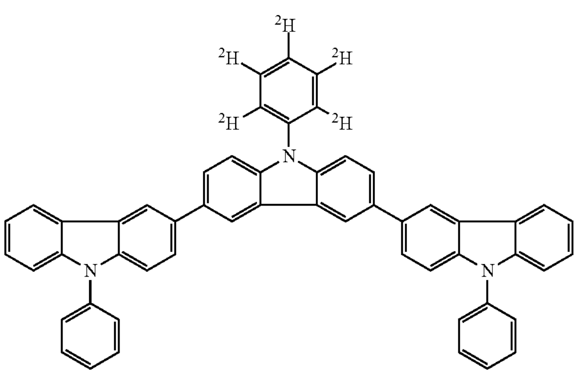

-continued
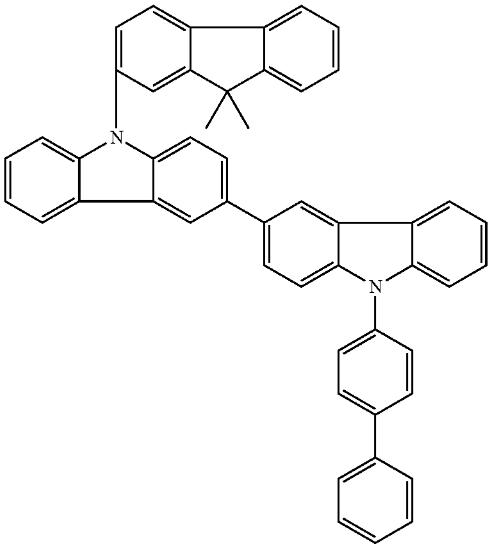
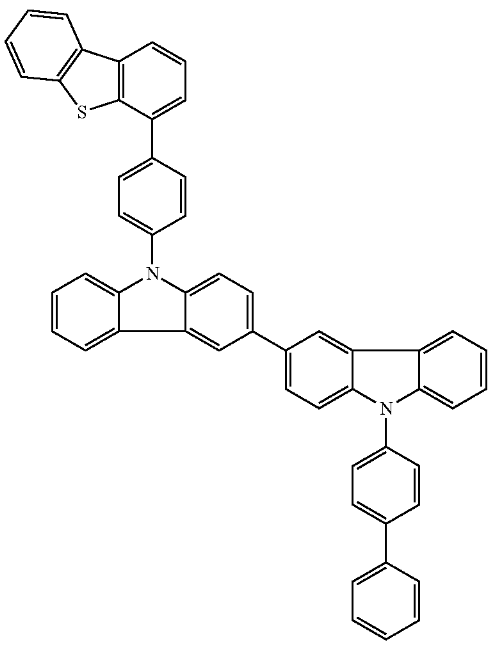
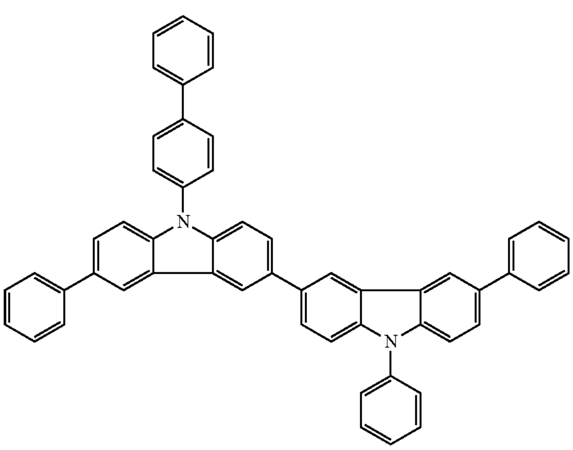
-continued
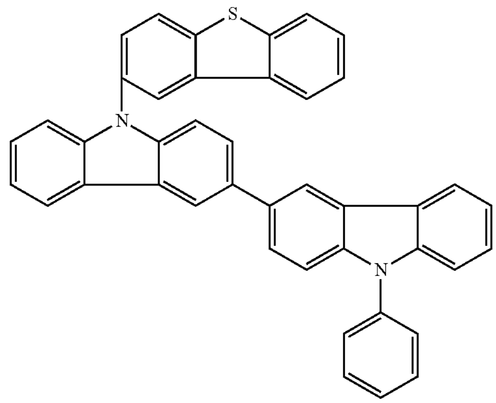
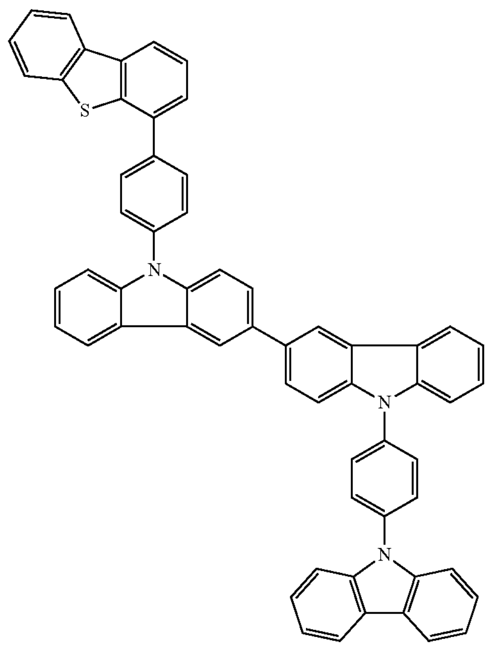
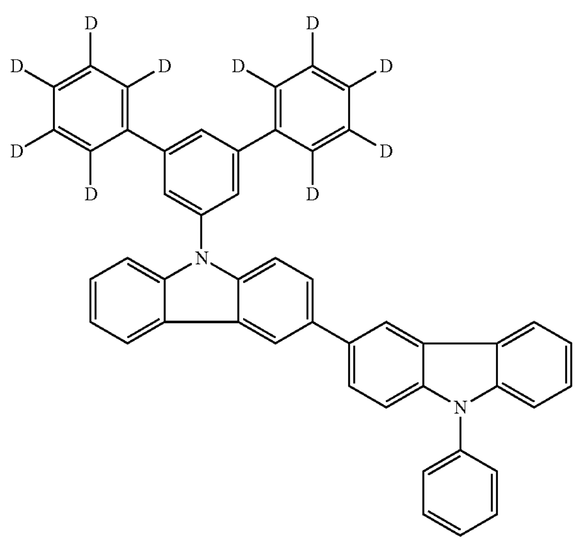

-continued
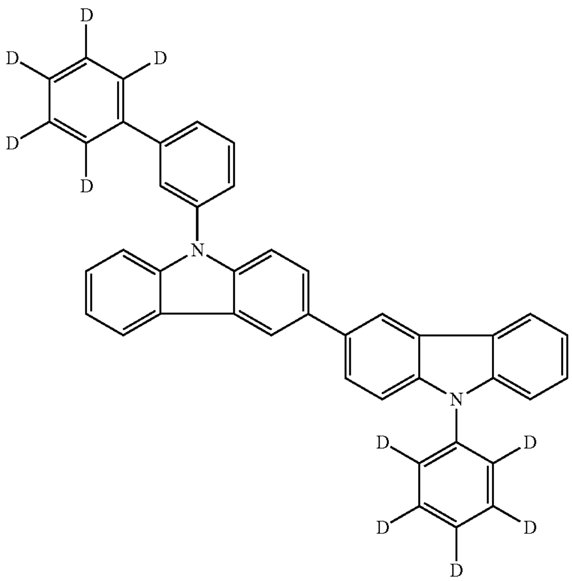
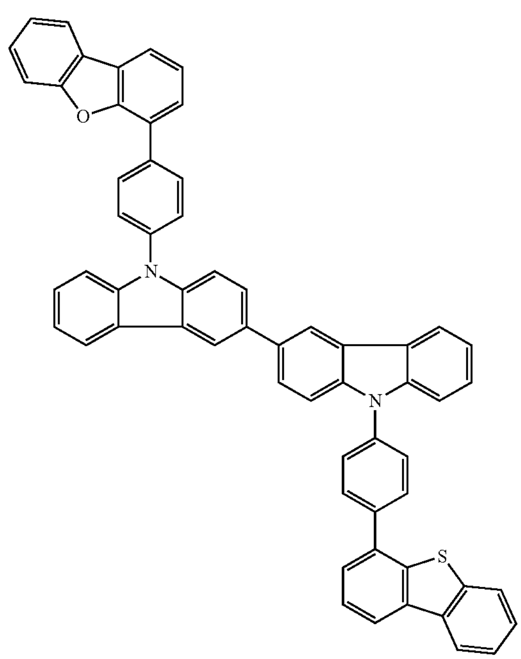
-continued
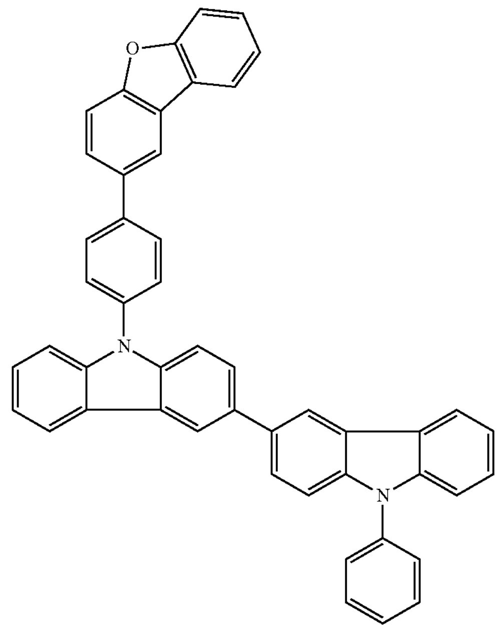
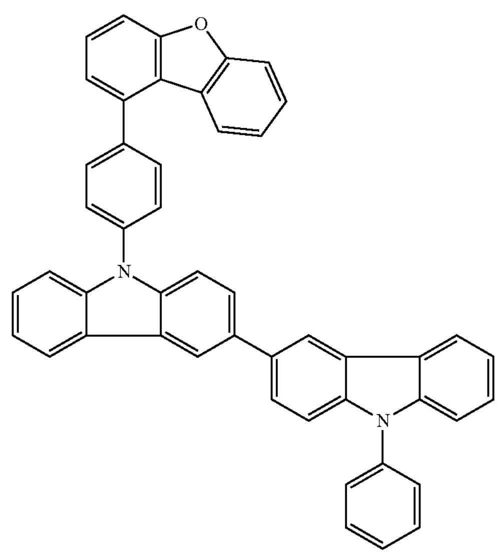

-continued
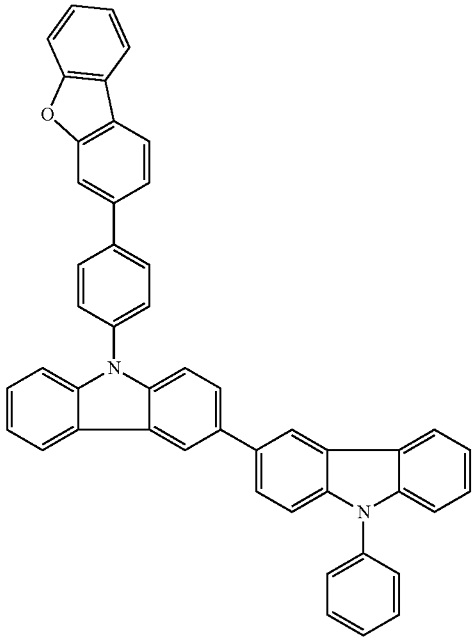 [SMILES: c1ccc(-n2c3ccccc3c3cc(-c4ccc5c(c4)c4ccccc4n5-c4ccc(-c5ccc6c(c5)oc5ccccc56)cc4)ccc32)cc1]
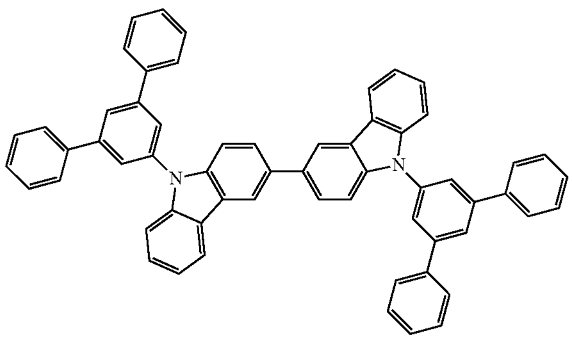
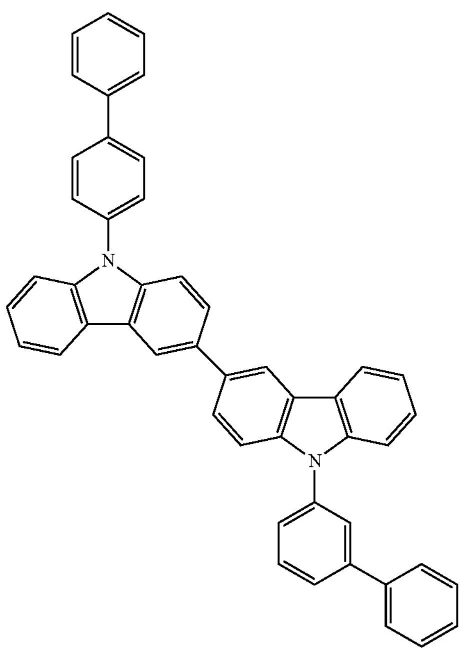
-continued
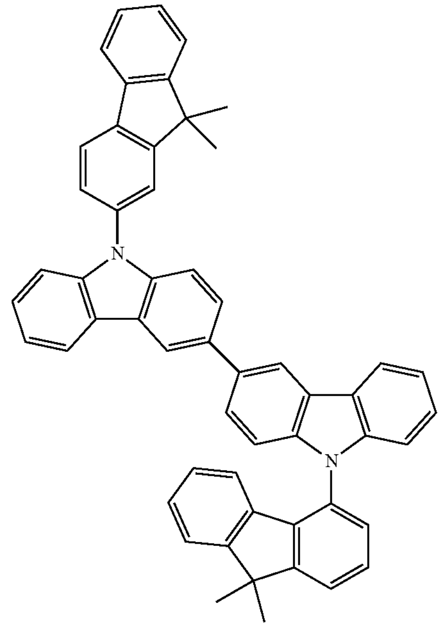
Examples of amines which can be used as hole-transporting matrix materials are the following compounds:
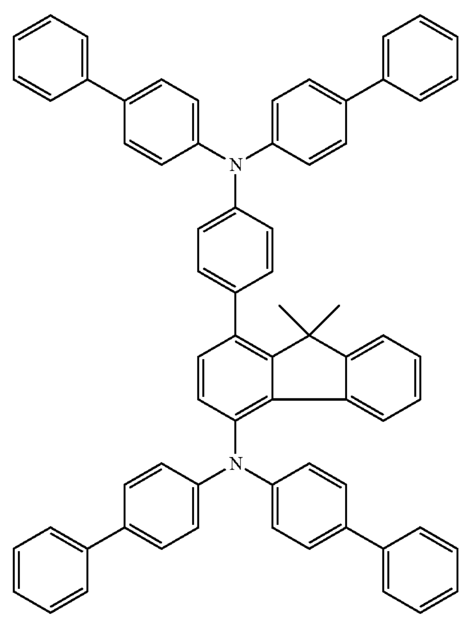

-continued
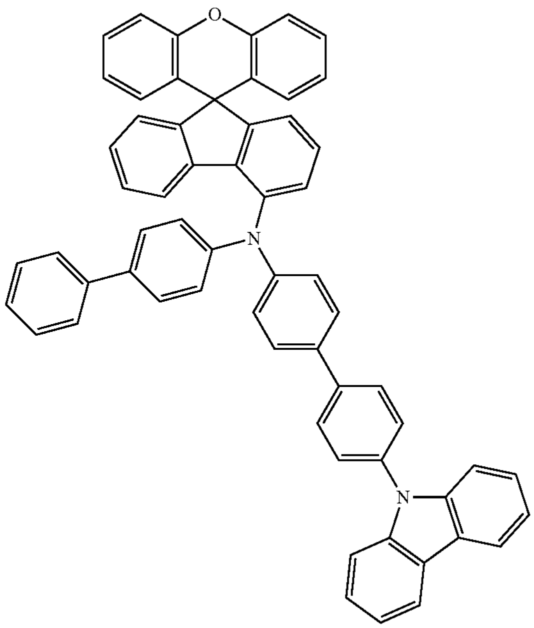
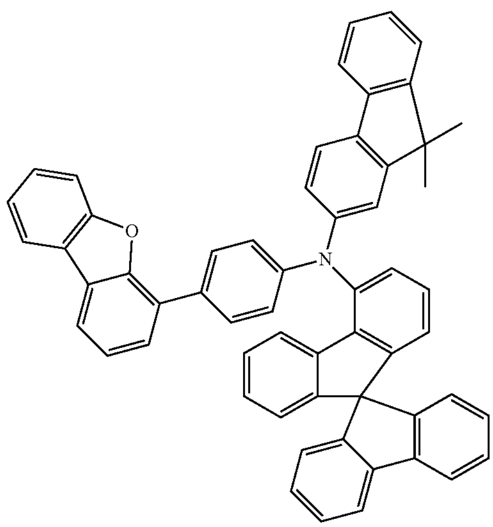
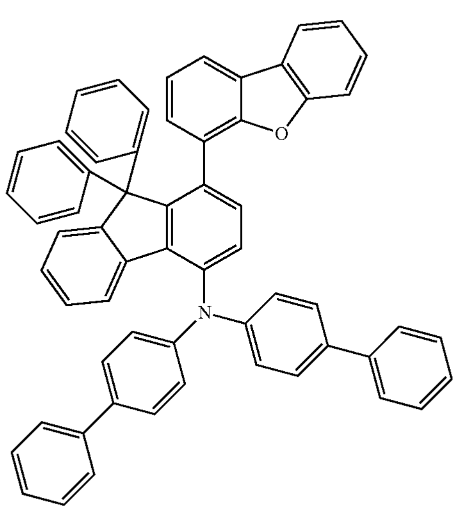
-continued
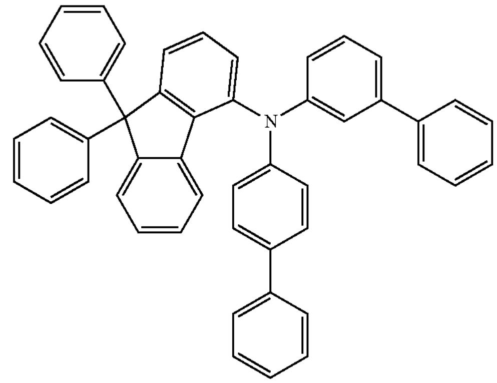
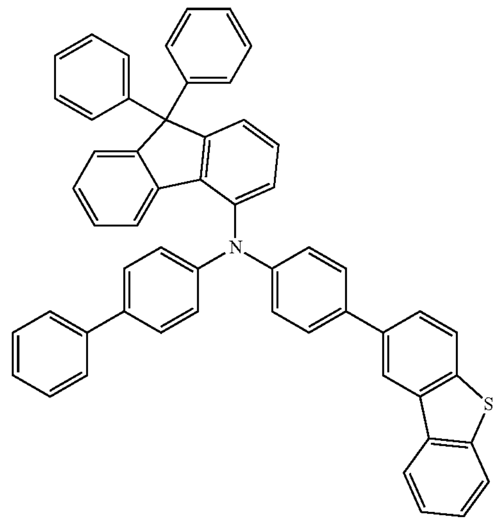
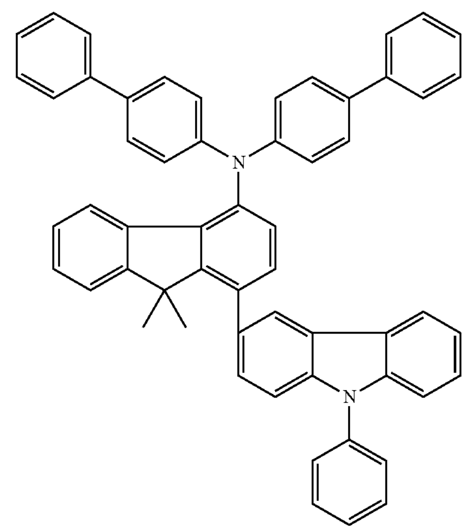
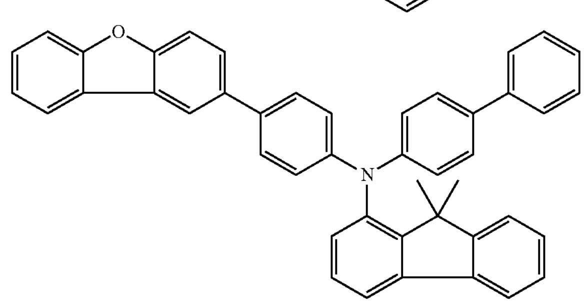

-continued
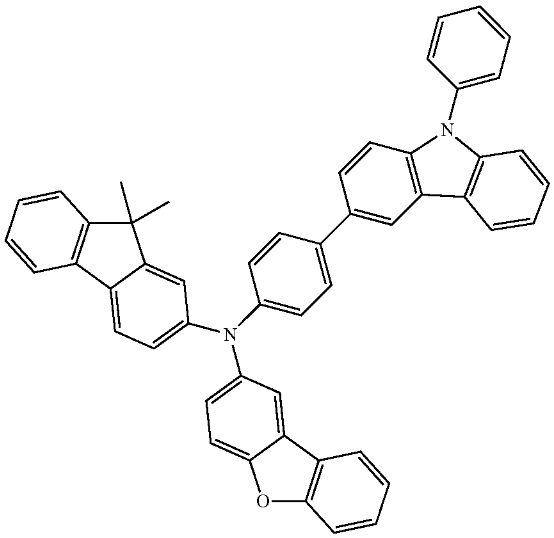
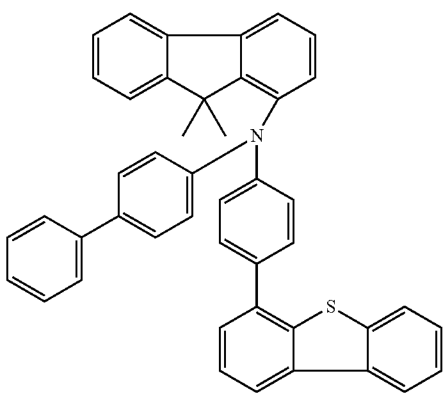
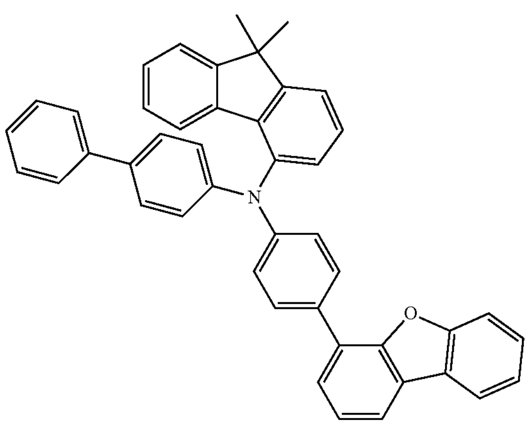
-continued
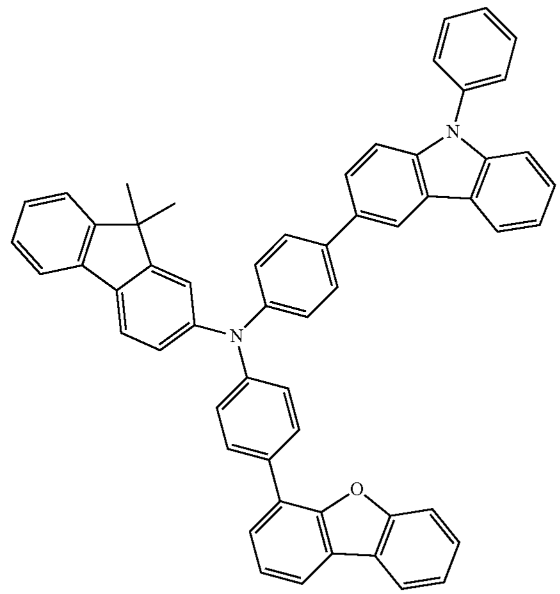
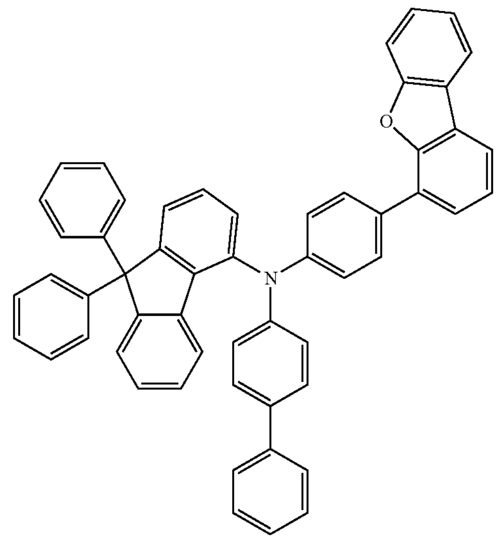
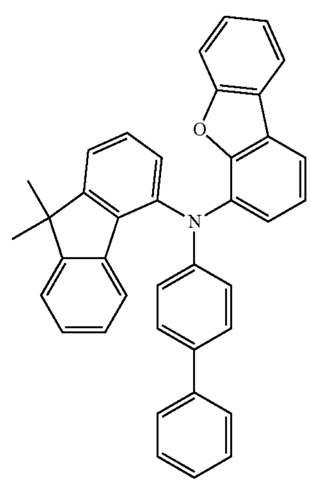

-continued
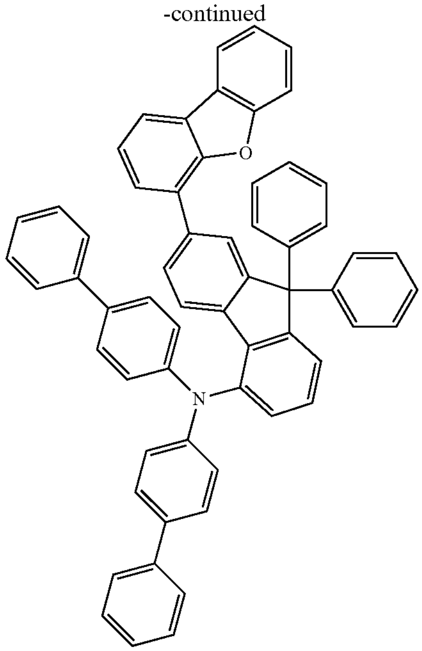
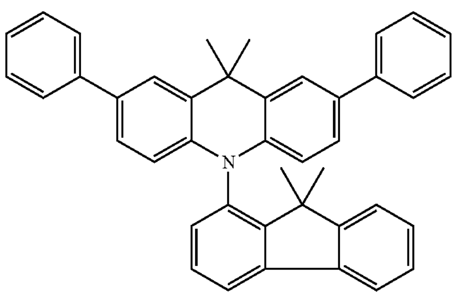
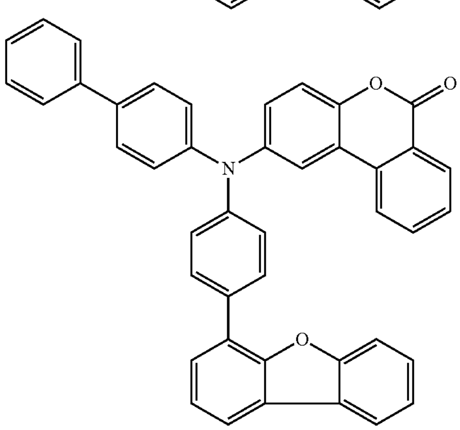
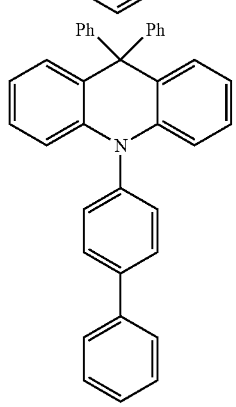
-continued
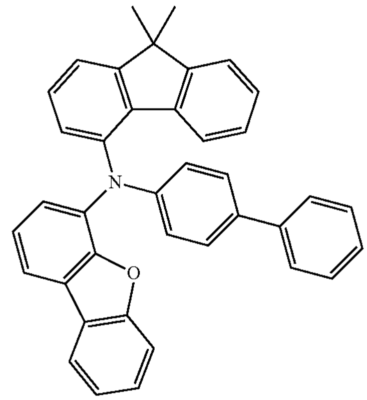
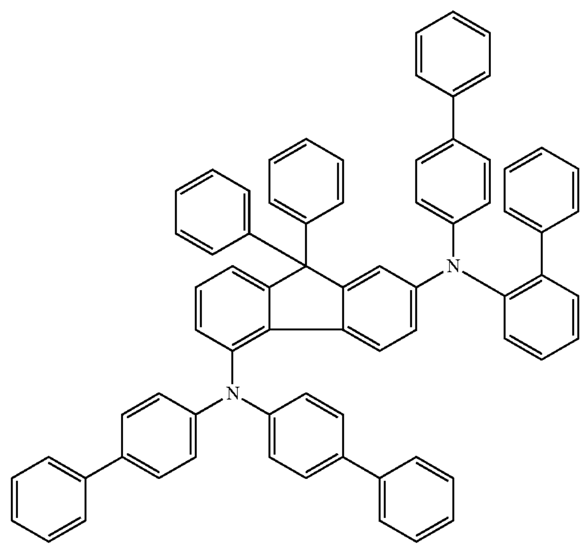
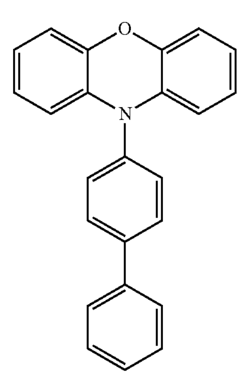

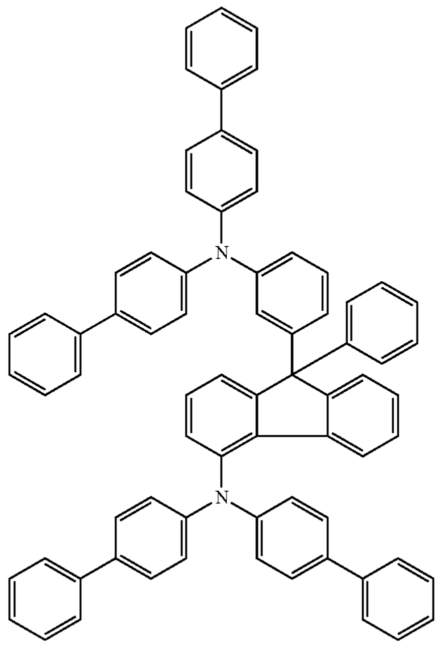
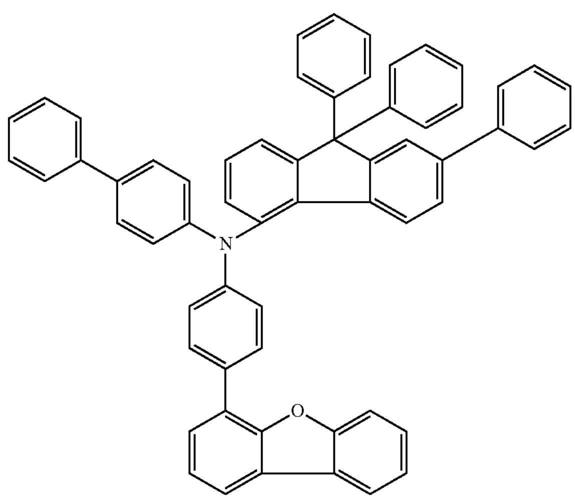
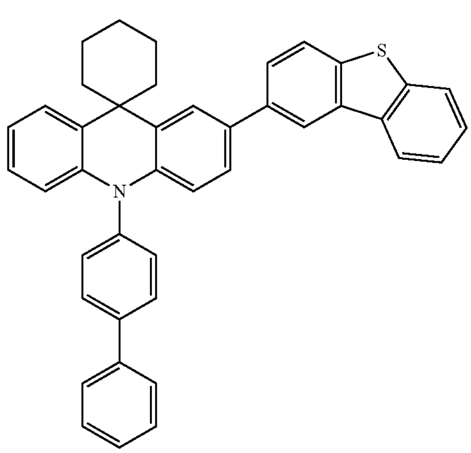
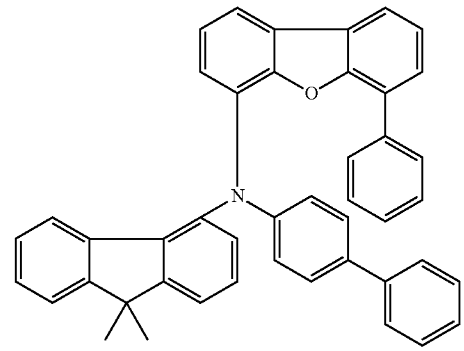
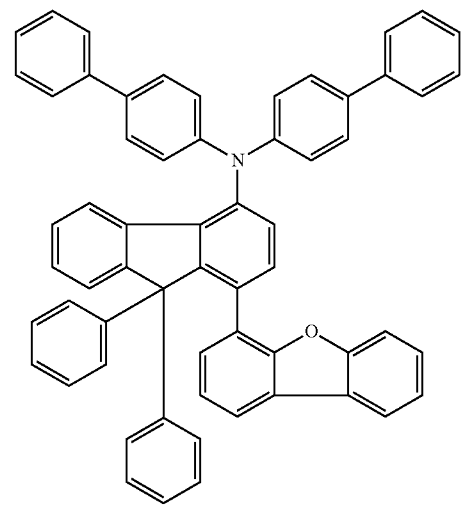
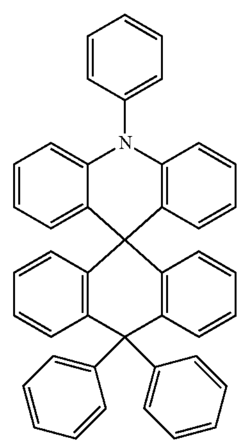
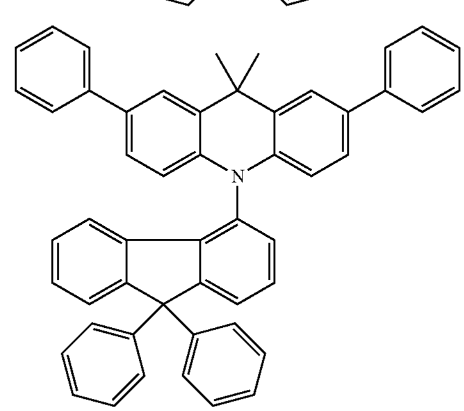

-continued
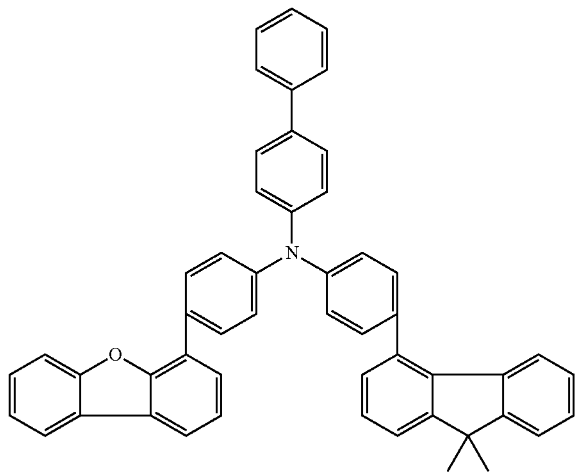
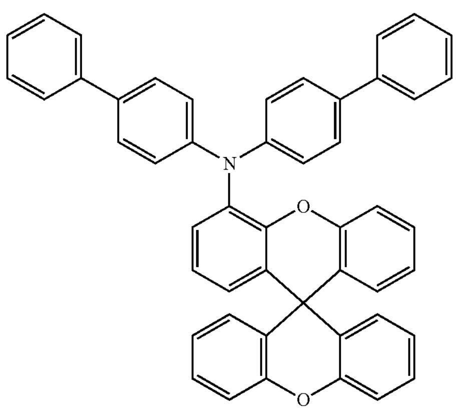
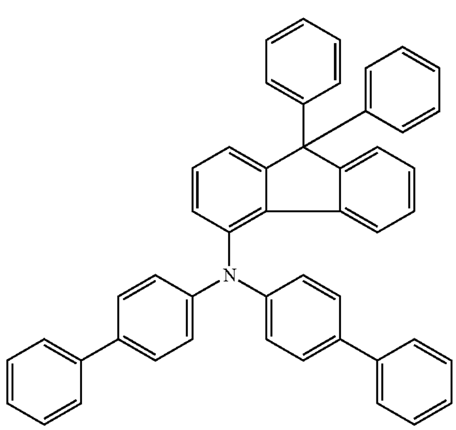
-continued
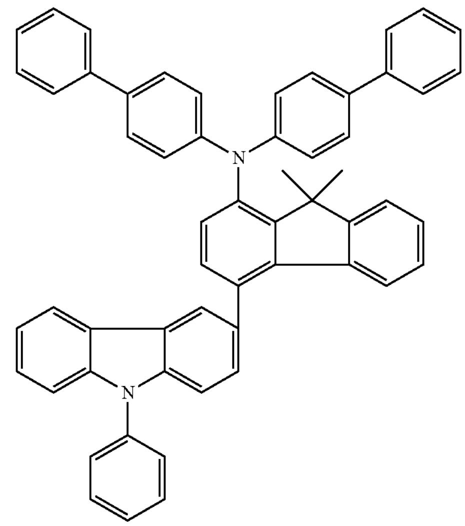
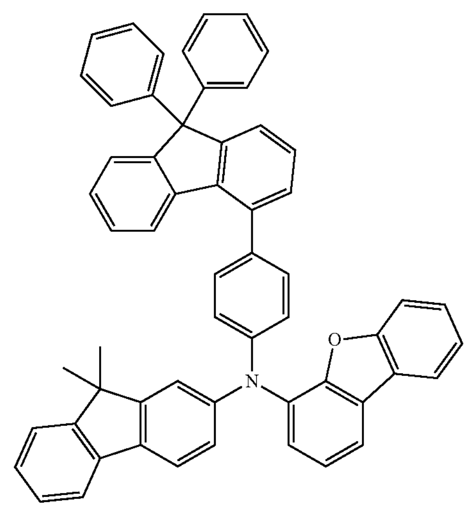
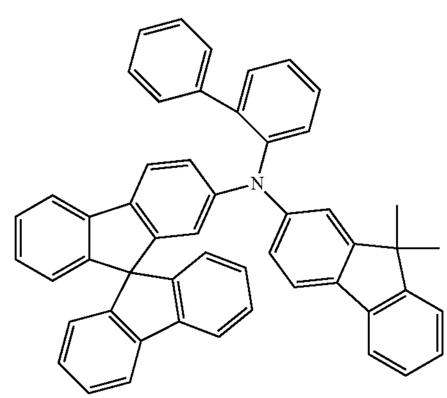

-continued
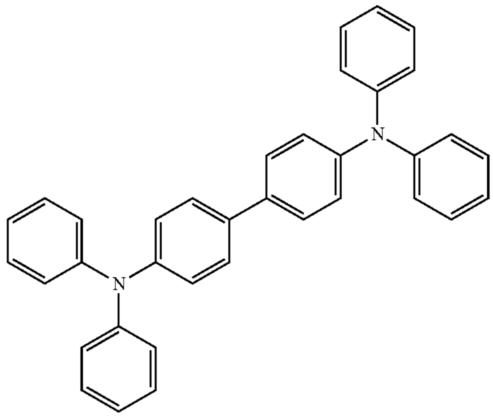
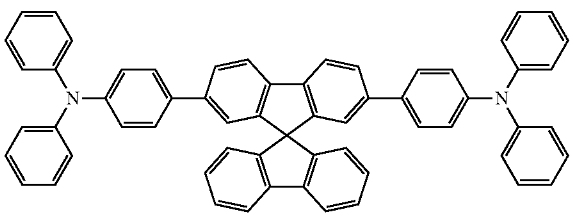
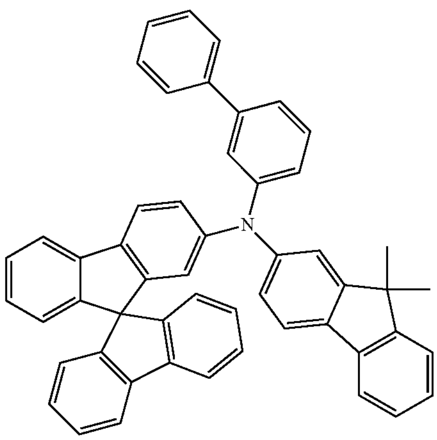
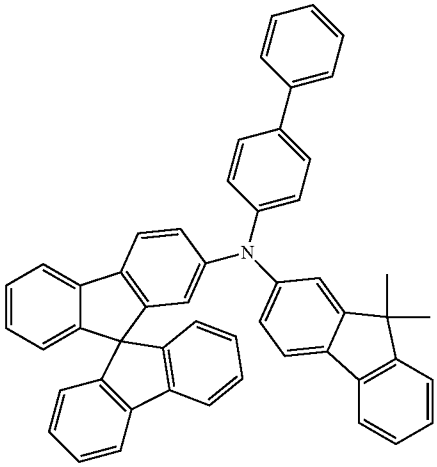
-continued
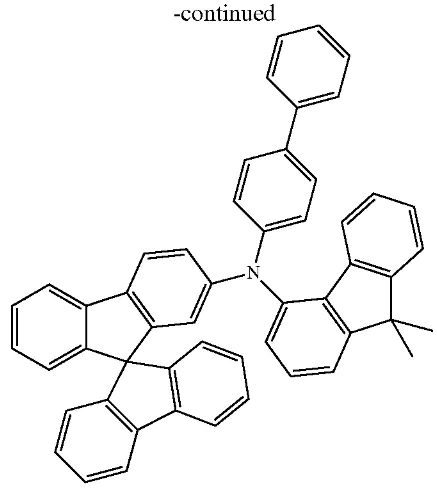
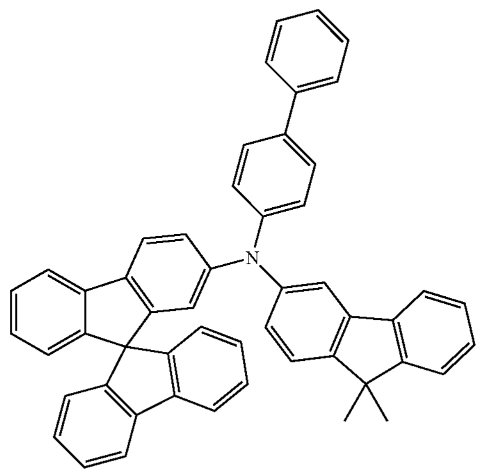
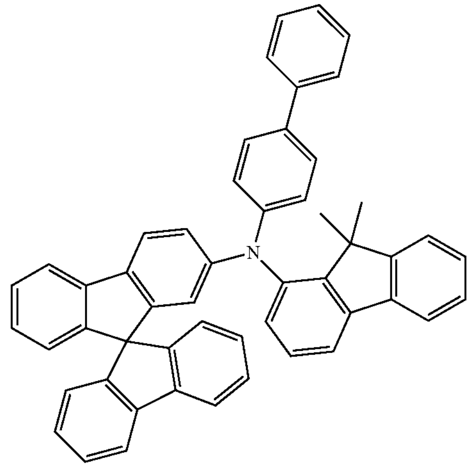

-continued
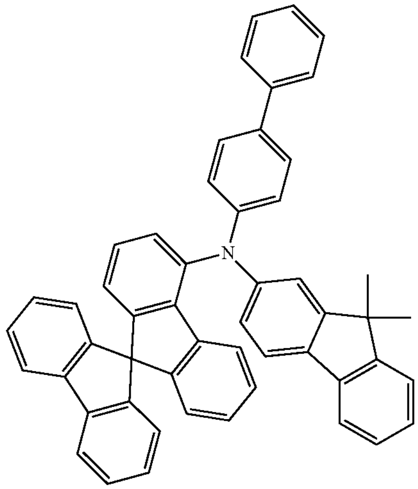
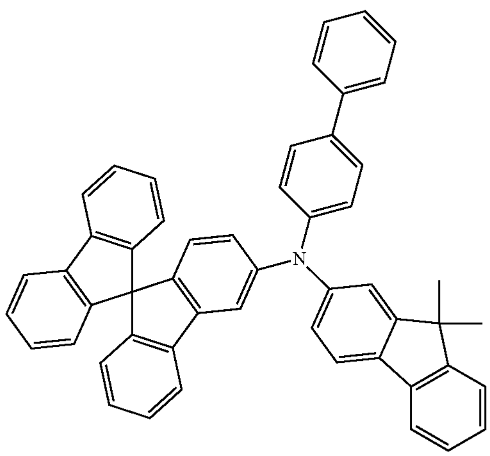
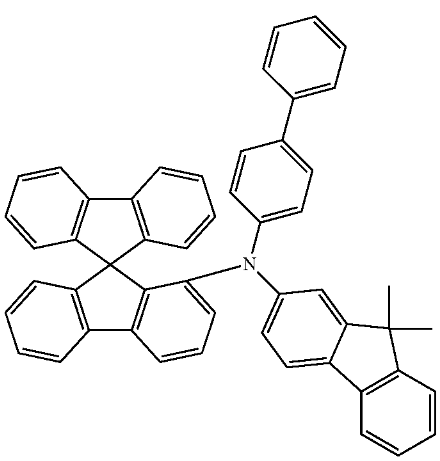
-continued
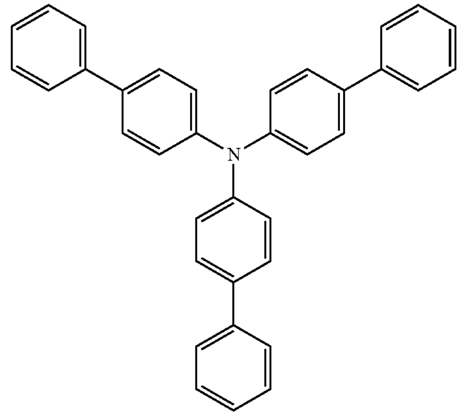
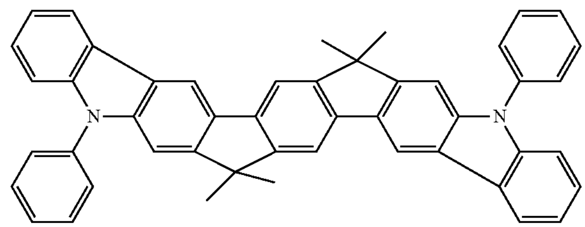
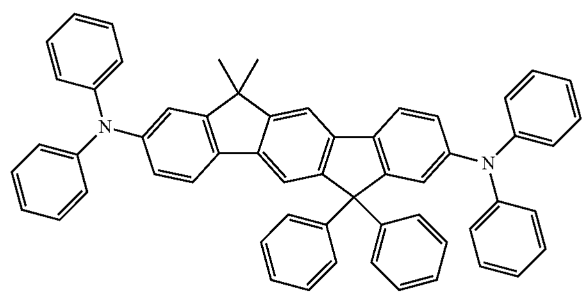
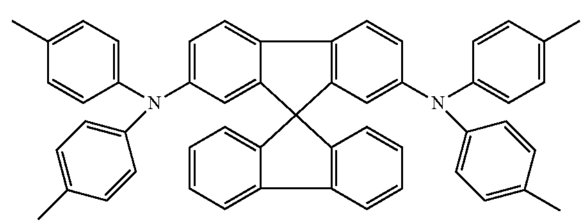
Examples of materials which can be used as wide band-gap matrix materials are the following compounds:

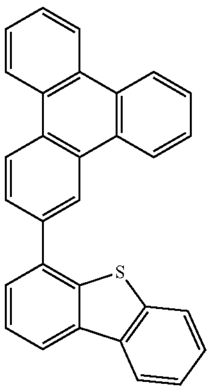
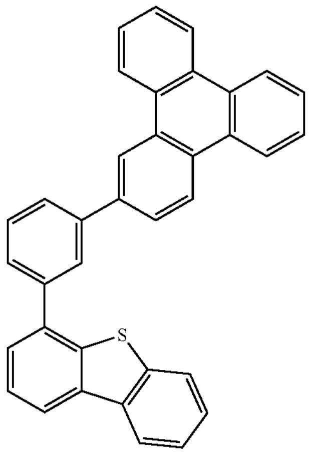
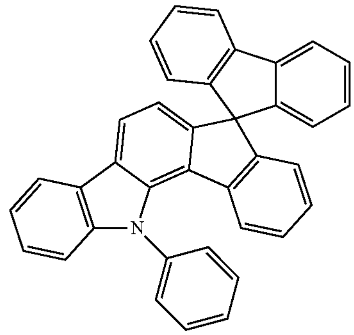
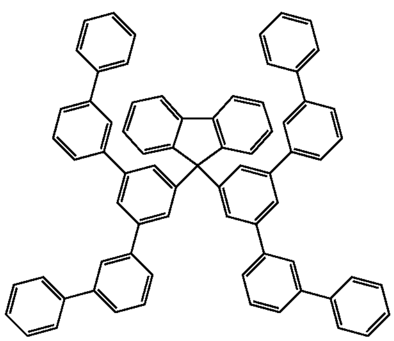
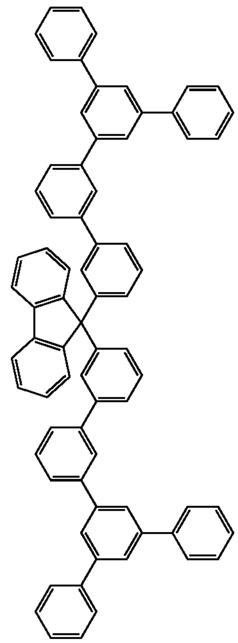
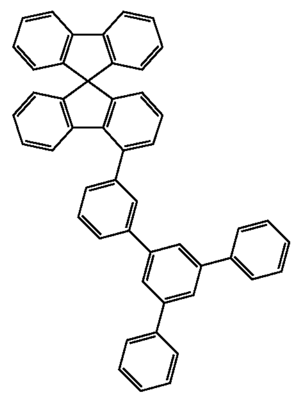
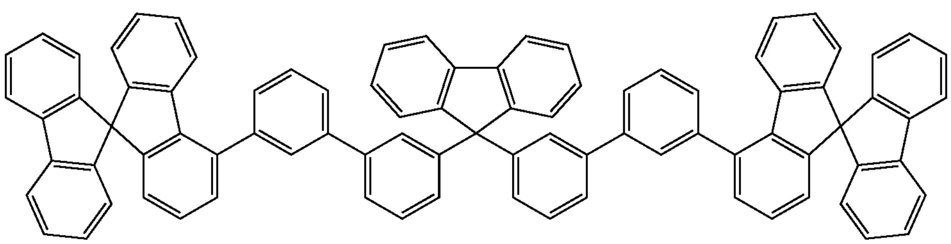
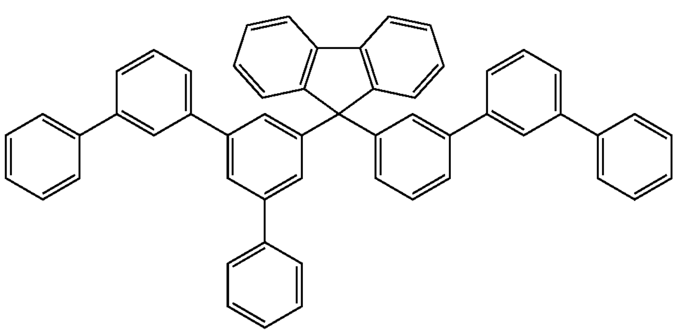

-continued
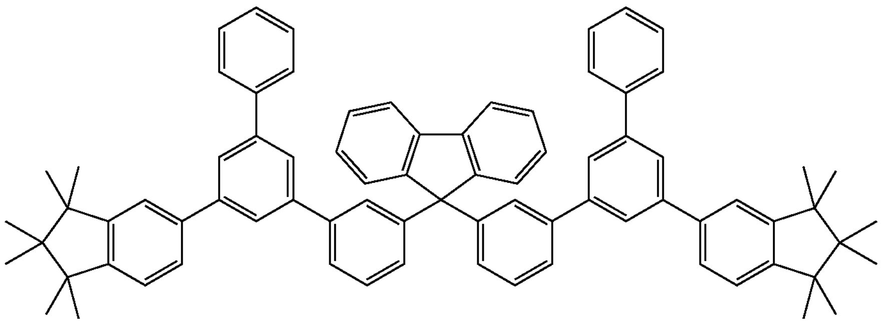
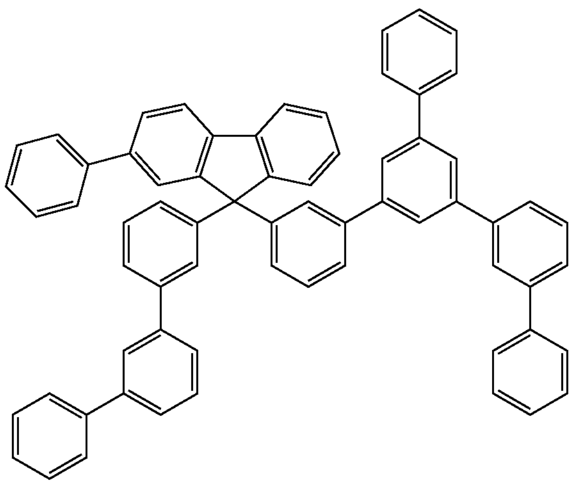
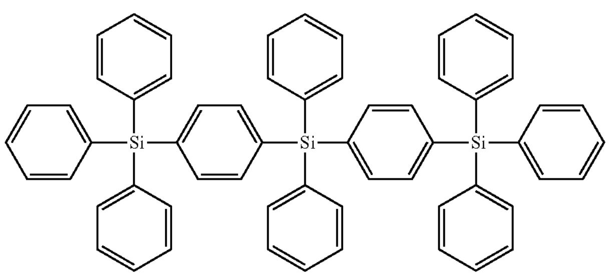
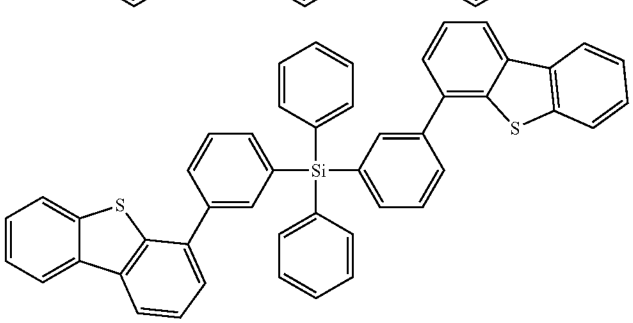
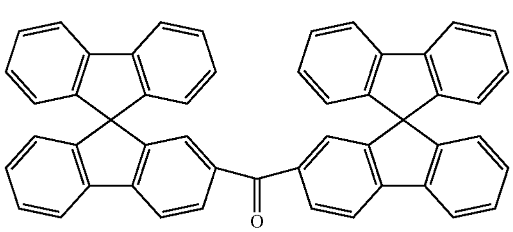
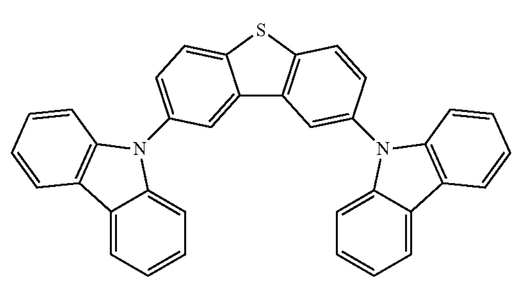

-continued

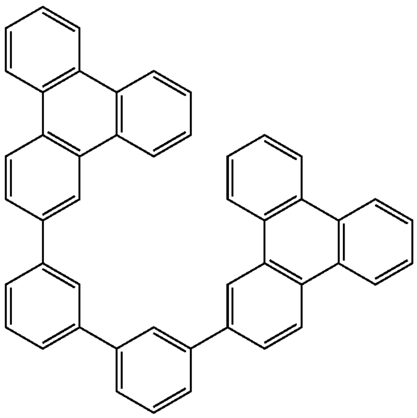

It is further preferable to use a mixture of two or more triplet emitters together with a matrix. In the case, the triplet emitter having the shorter-wave emission spectrum serves as co-matrix for the triplet emitter having the longer-wave emission spectrum. For example, it is possible to use a emitting metal complex of the invention. In the case, it may also be materials are especially also the compounds disclosed in WO 2016/124304 and WO 2017/032439.

Examples of suitable triplet emitters that may be used as co-dopants for the compounds of the invention are depicted in the table below.

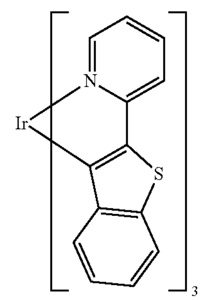

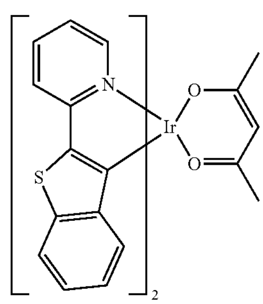

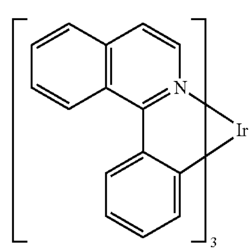

-continued
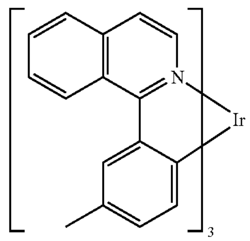
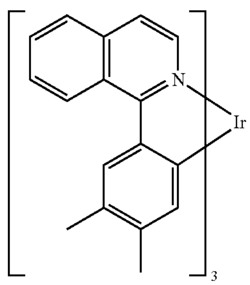
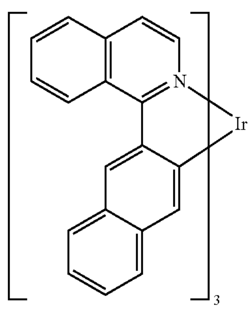
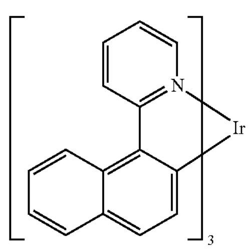
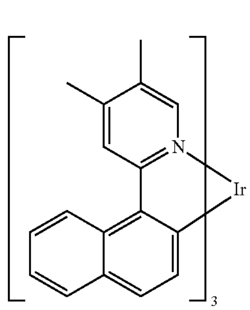

-continued
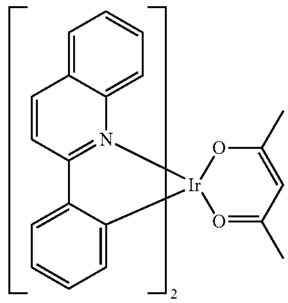
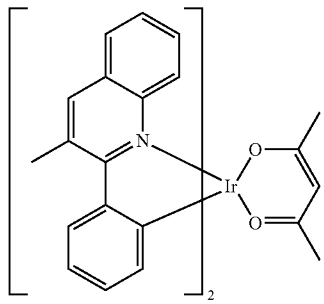
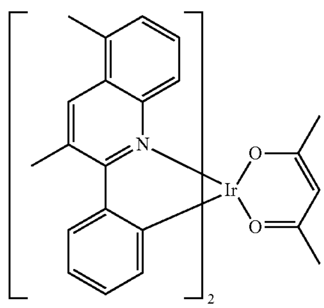
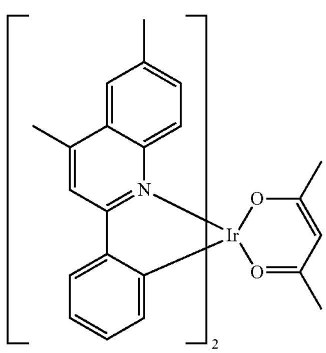
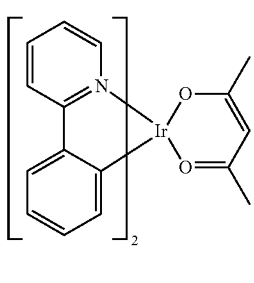

-continued
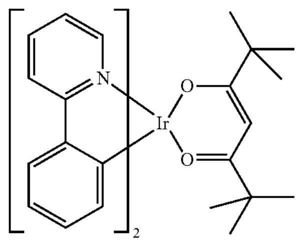
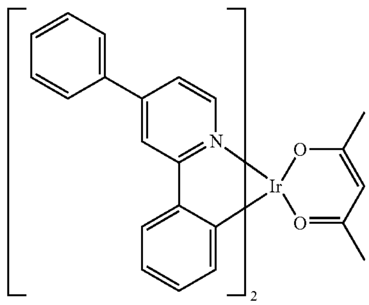
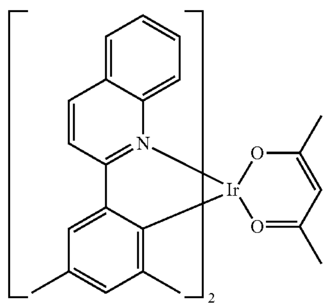
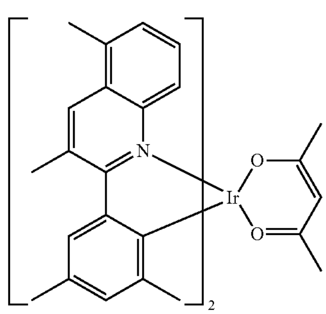
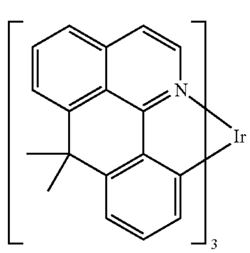

-continued
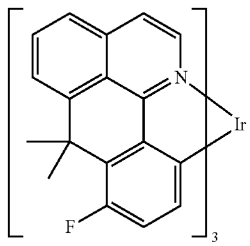
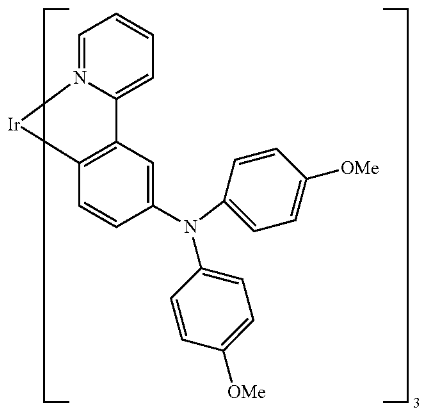
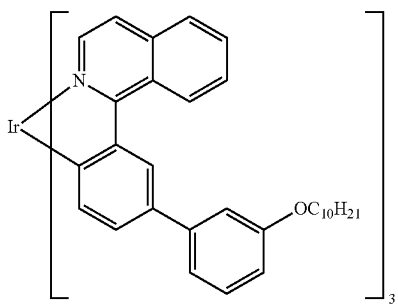
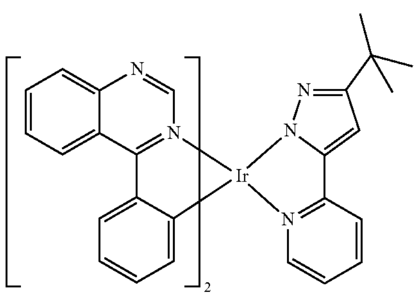
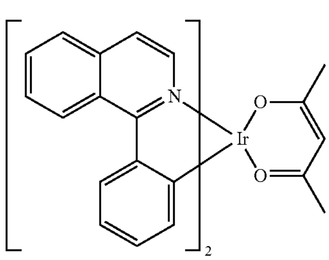

-continued
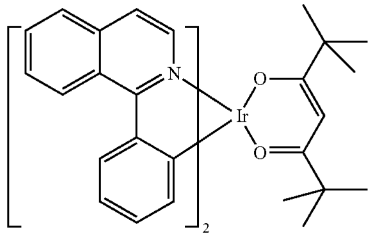
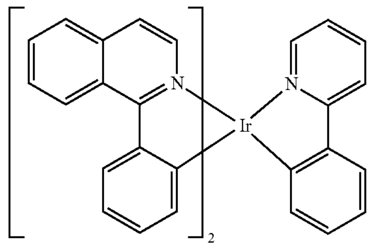
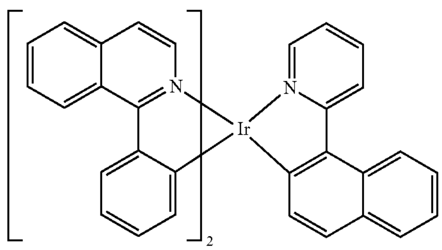
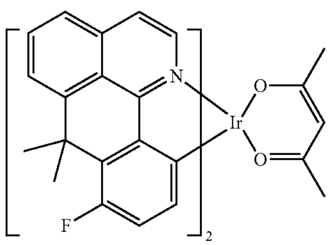
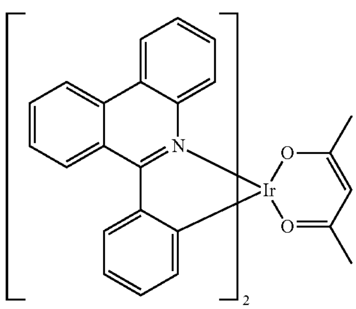
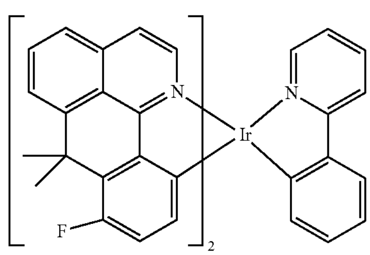

-continued
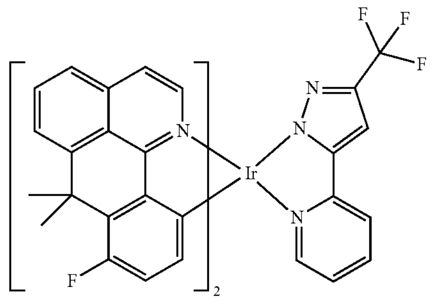
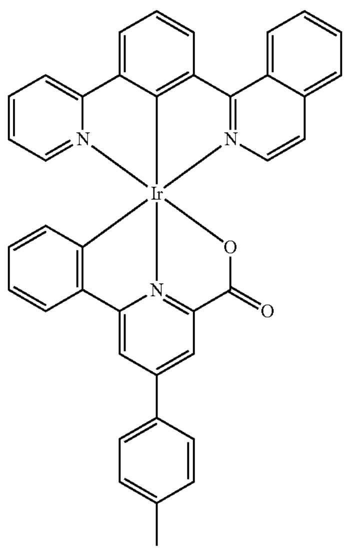
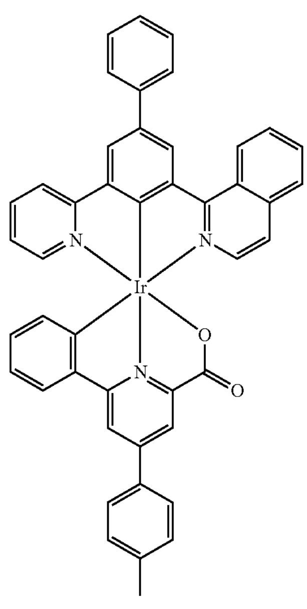

-continued
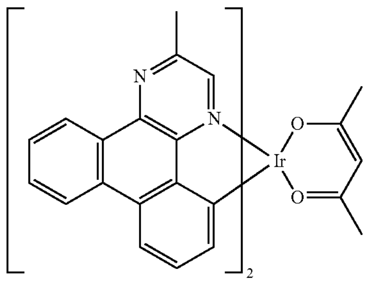
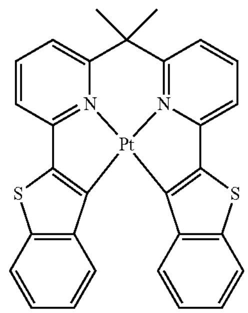
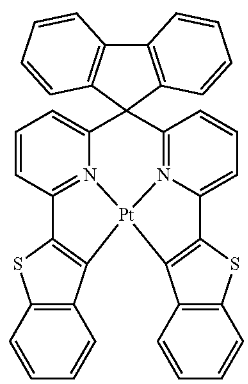
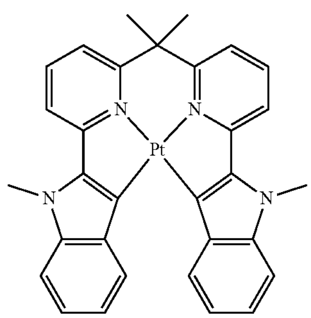
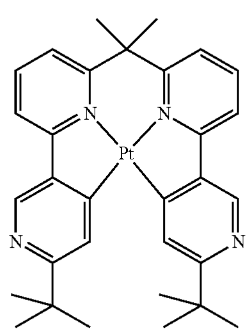

-continued
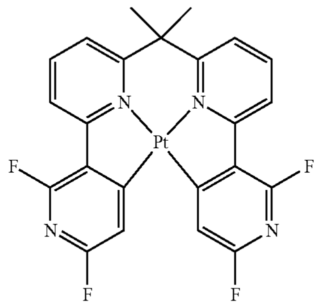
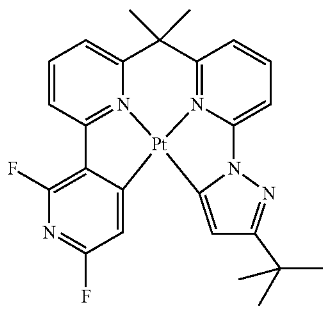
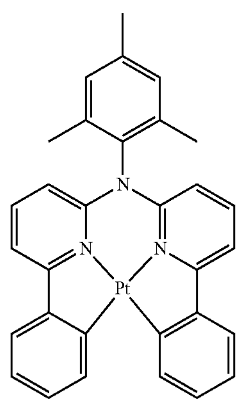
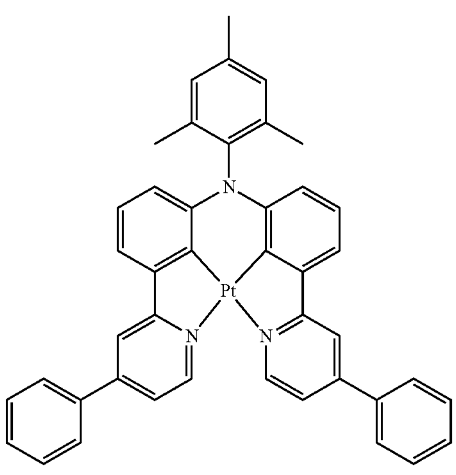

-continued
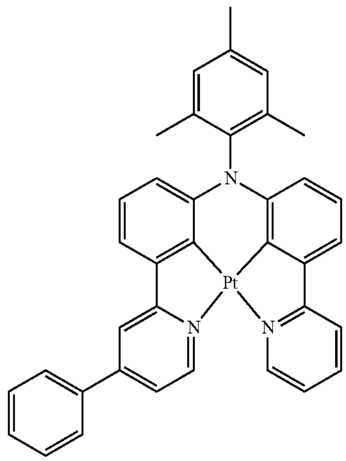
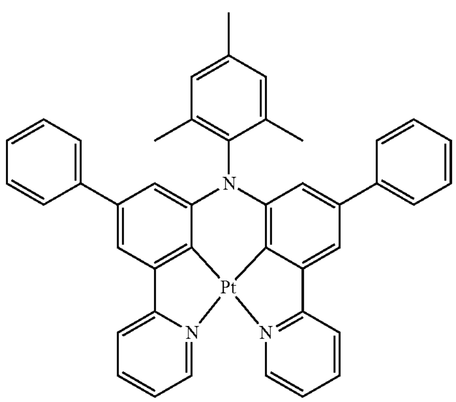
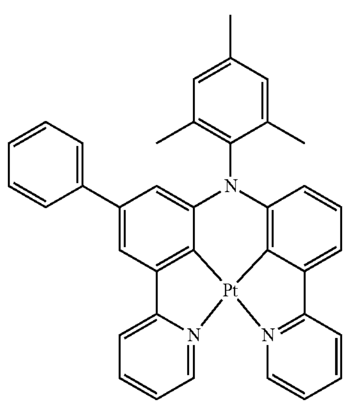
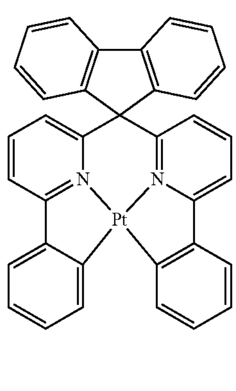

-continued
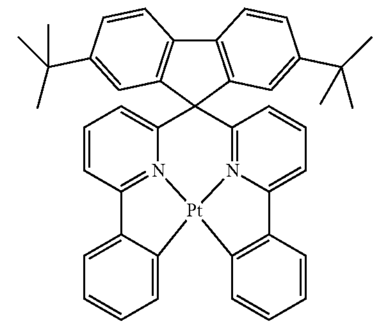
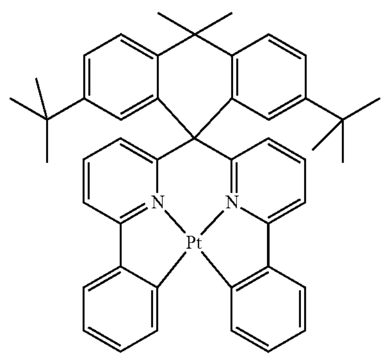
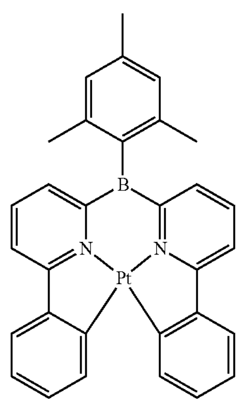
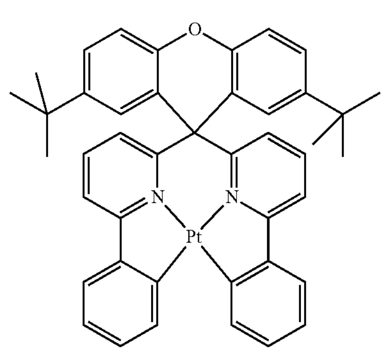

-continued
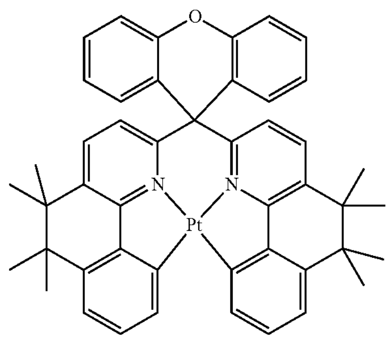
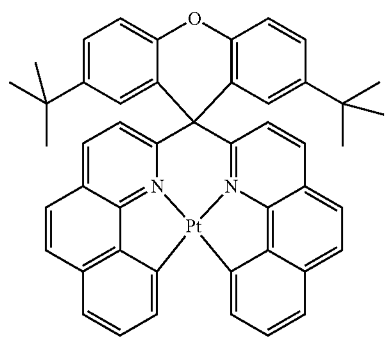
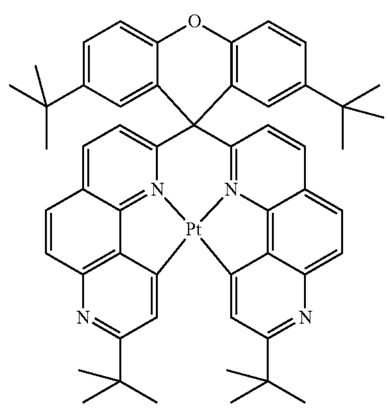
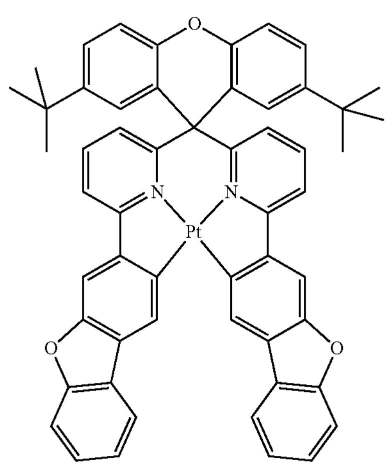

-continued
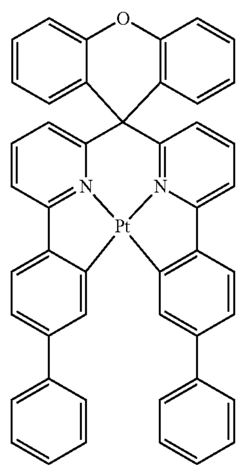
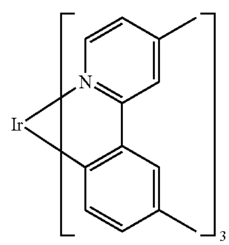
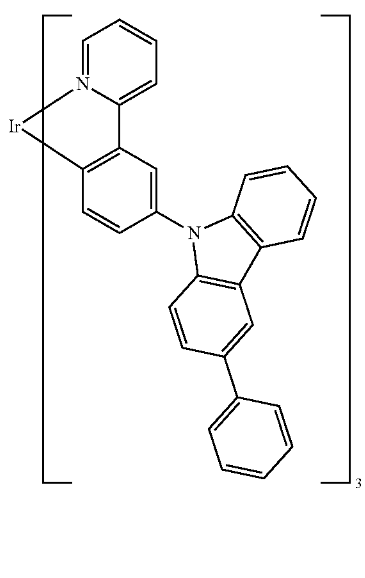

-continued
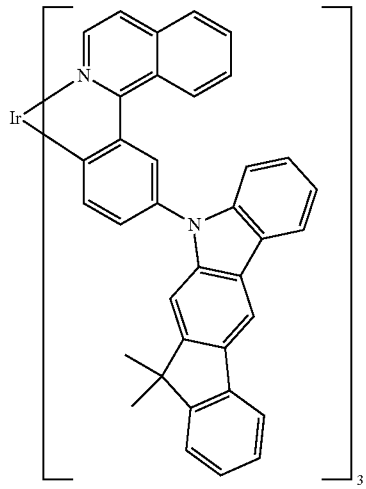
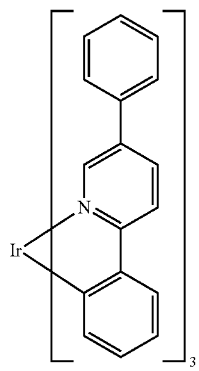
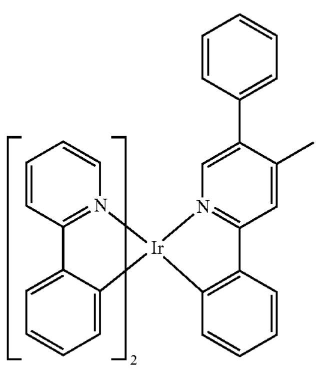
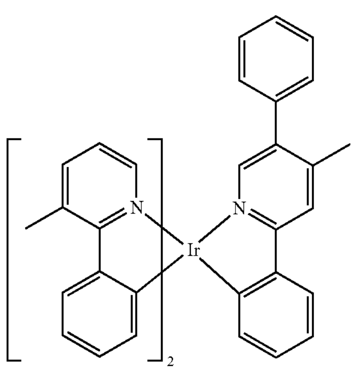

-continued
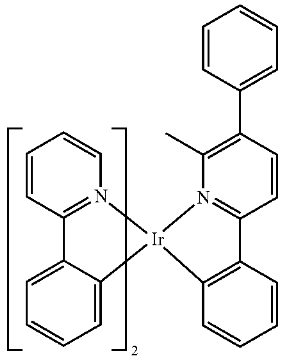
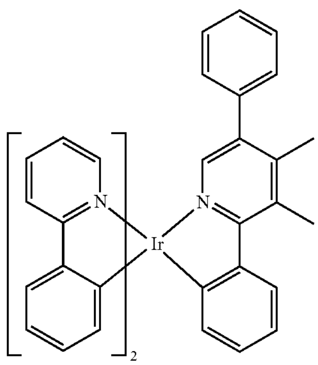
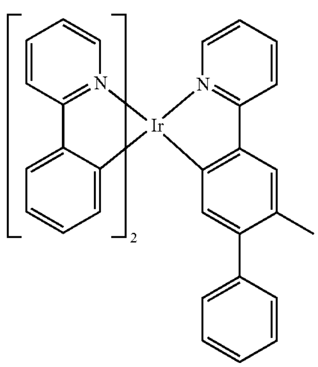
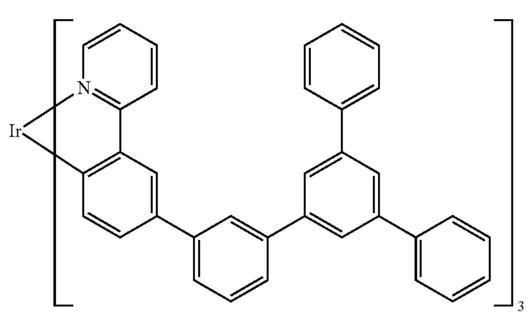

-continued
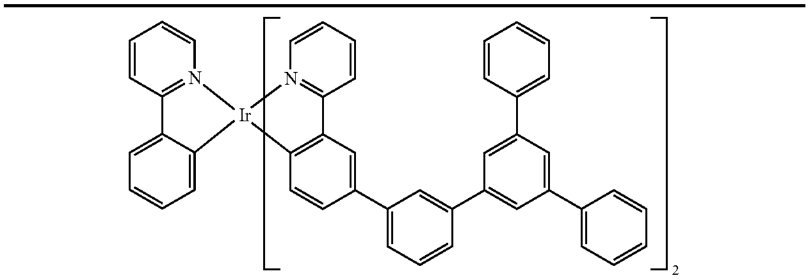
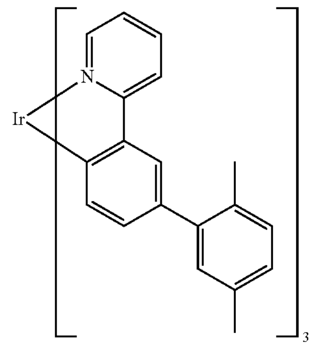
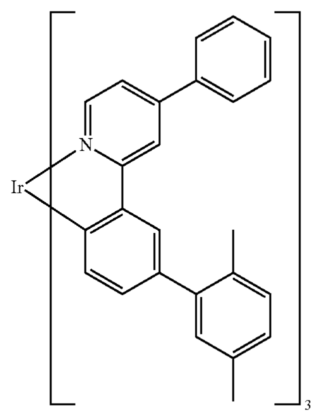
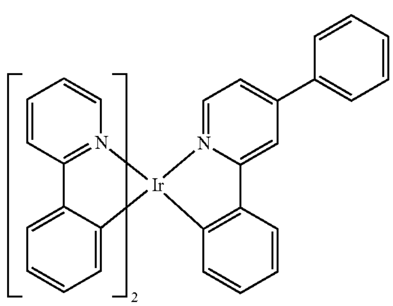
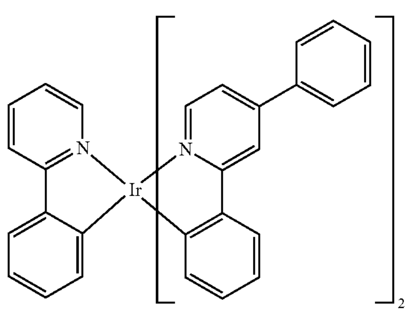

-continued
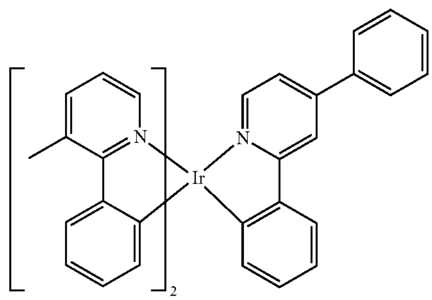
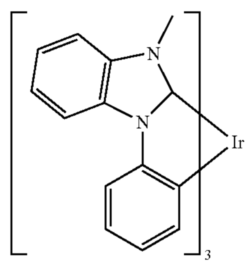
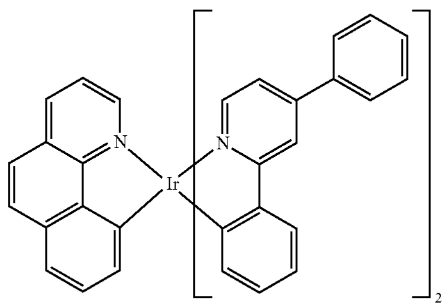
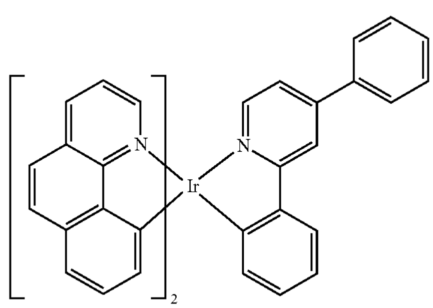
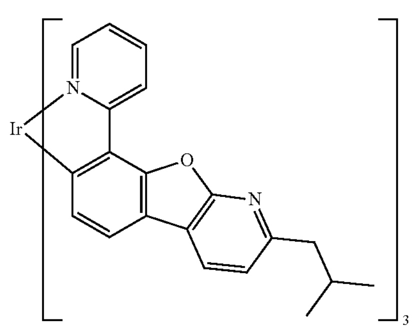

-continued
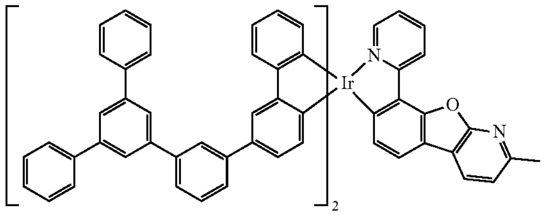
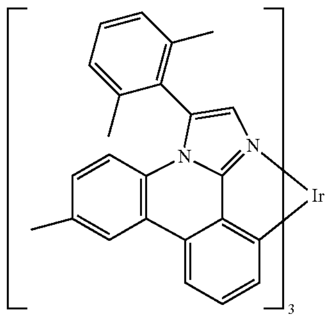
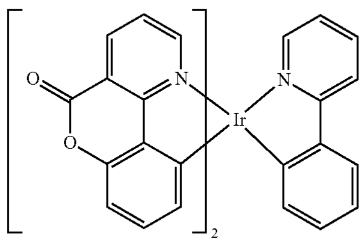
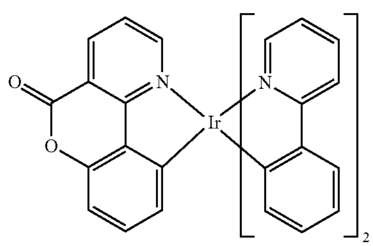
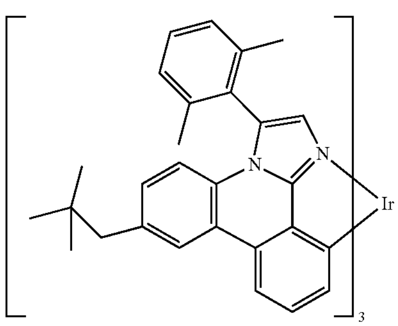

-continued
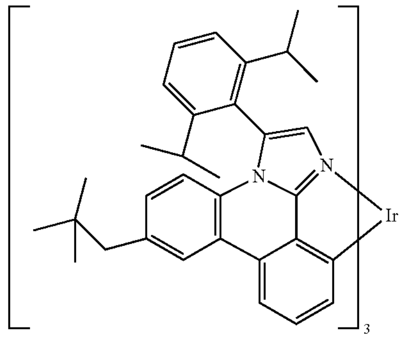
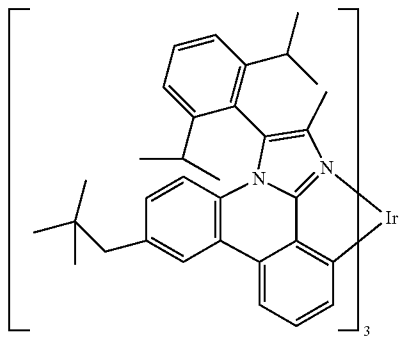
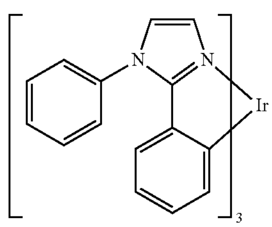
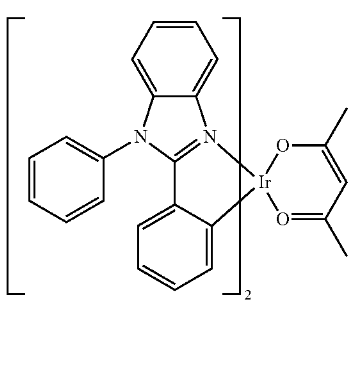

-continued
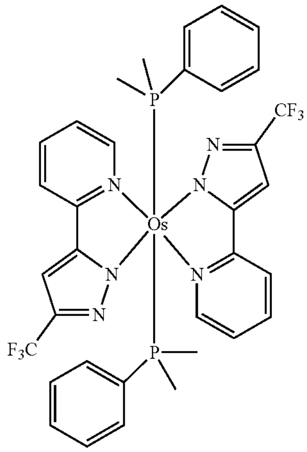
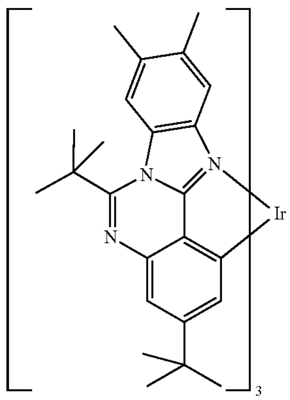
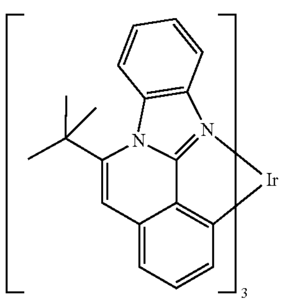
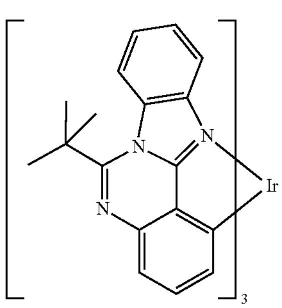

-continued
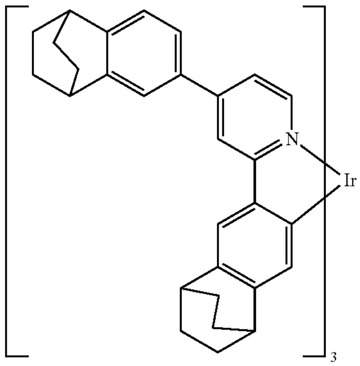
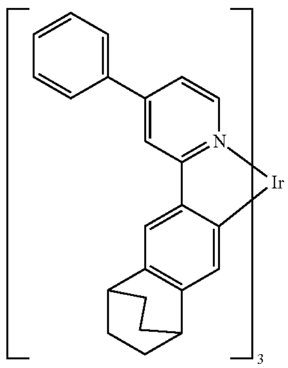
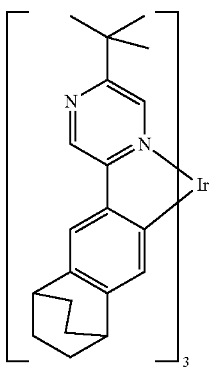
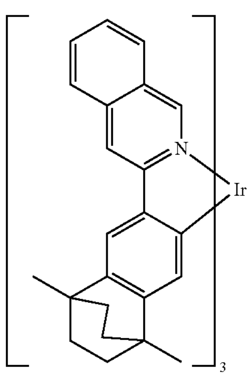

-continued
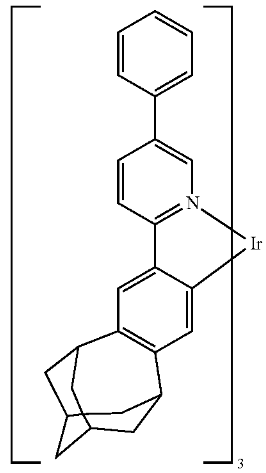
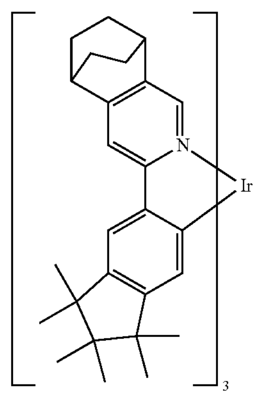
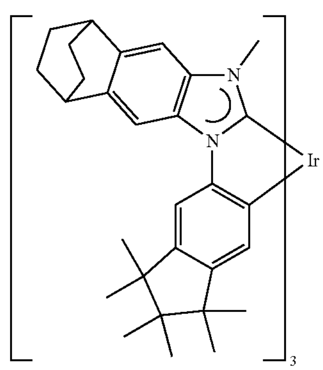
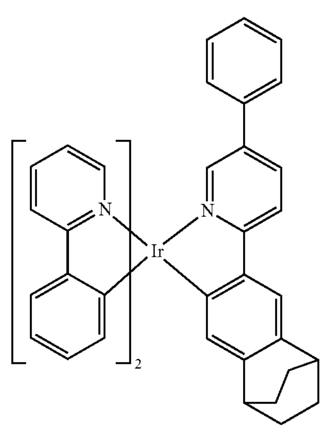

-continued
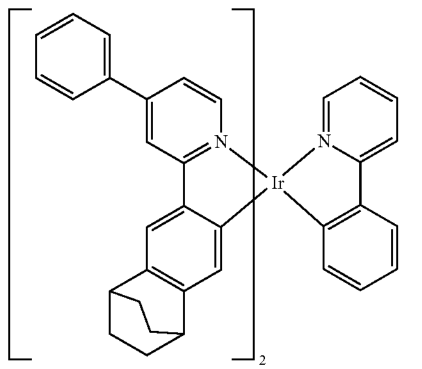
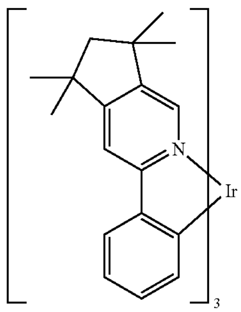
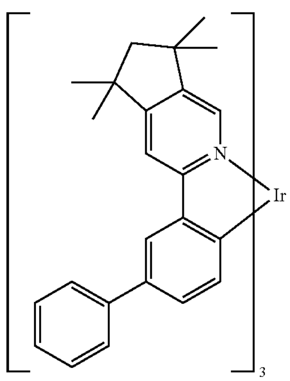
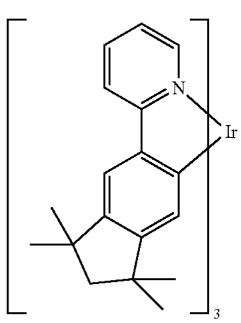

-continued
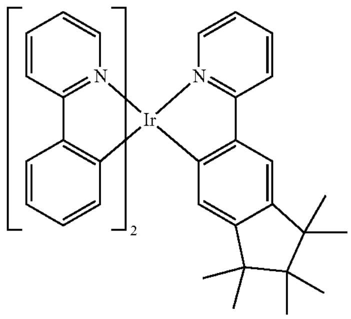
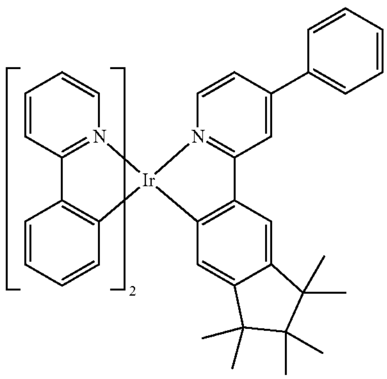
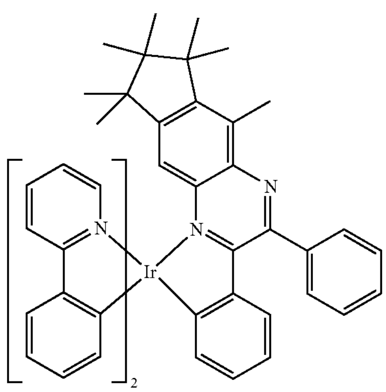
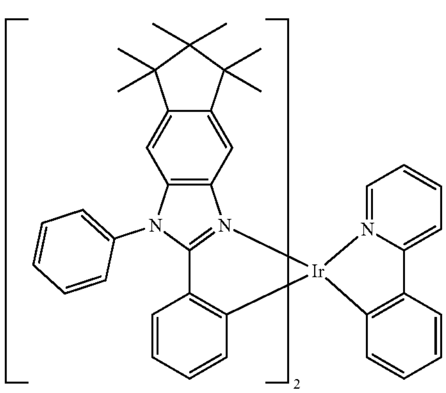

-continued
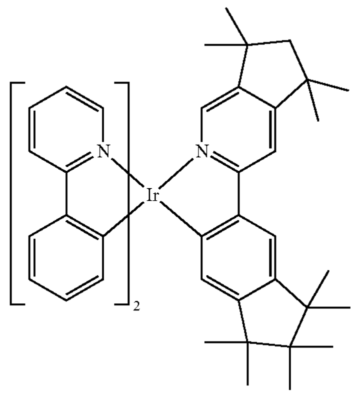
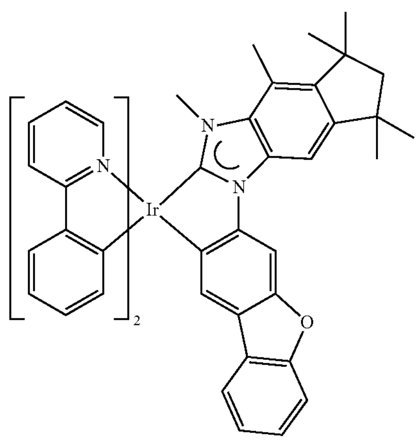
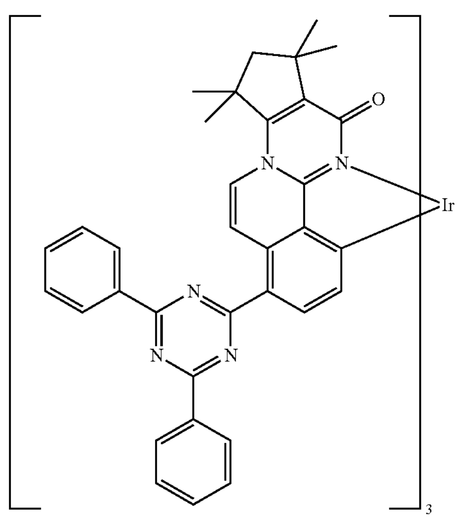

-continued
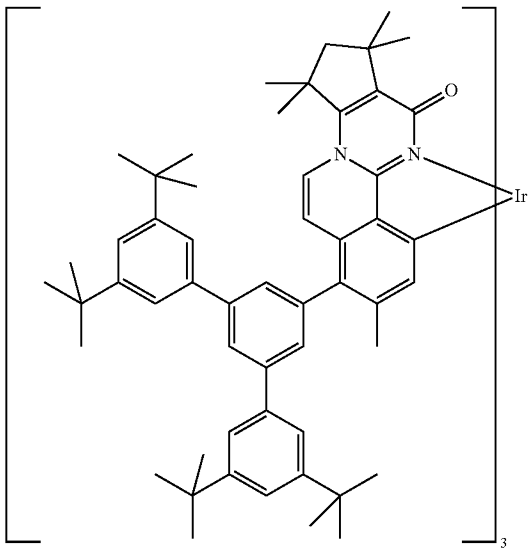
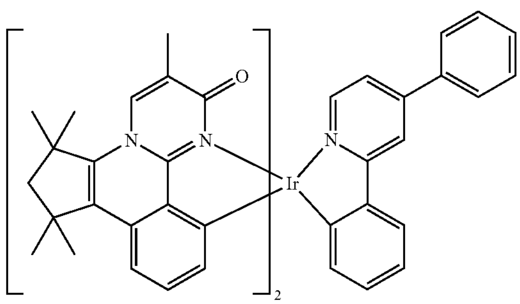
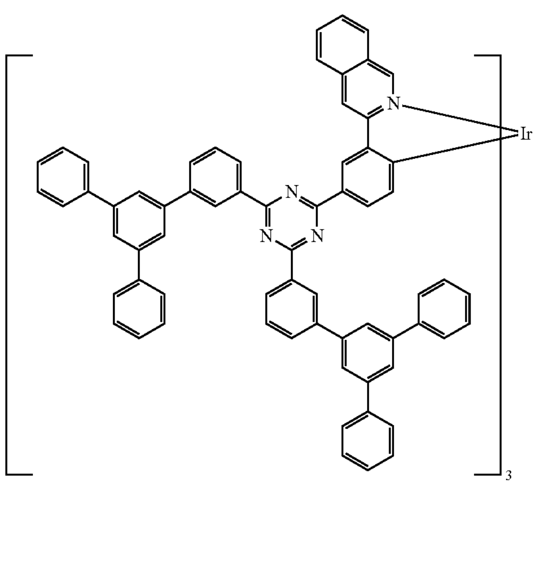

-continued
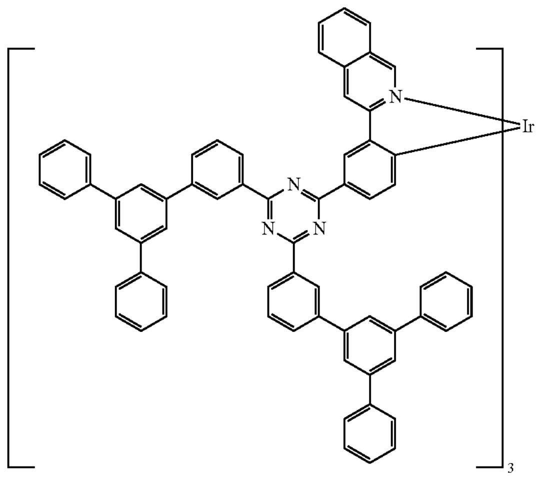
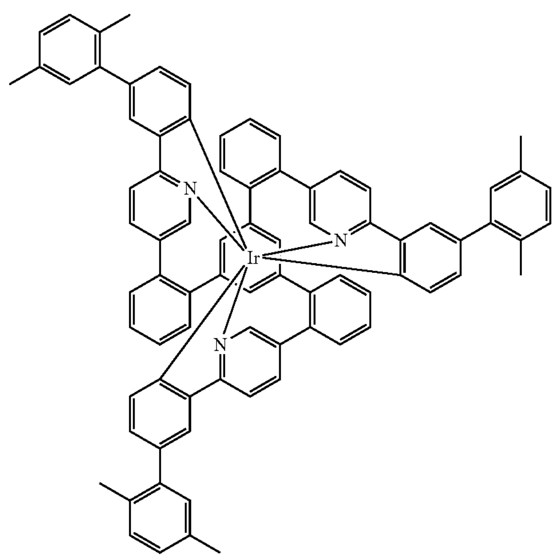
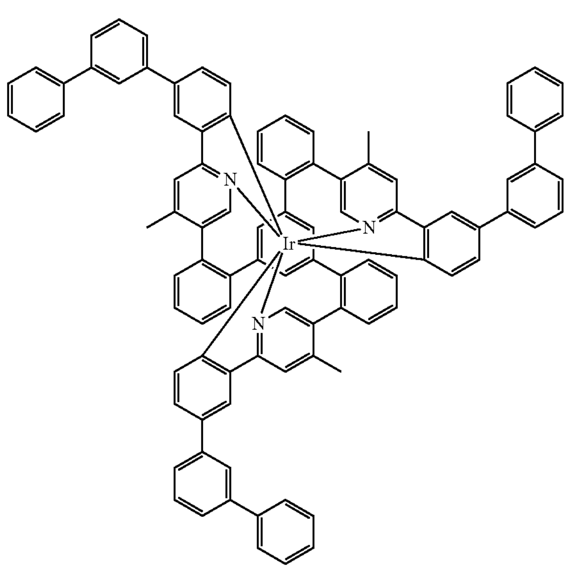

-continued
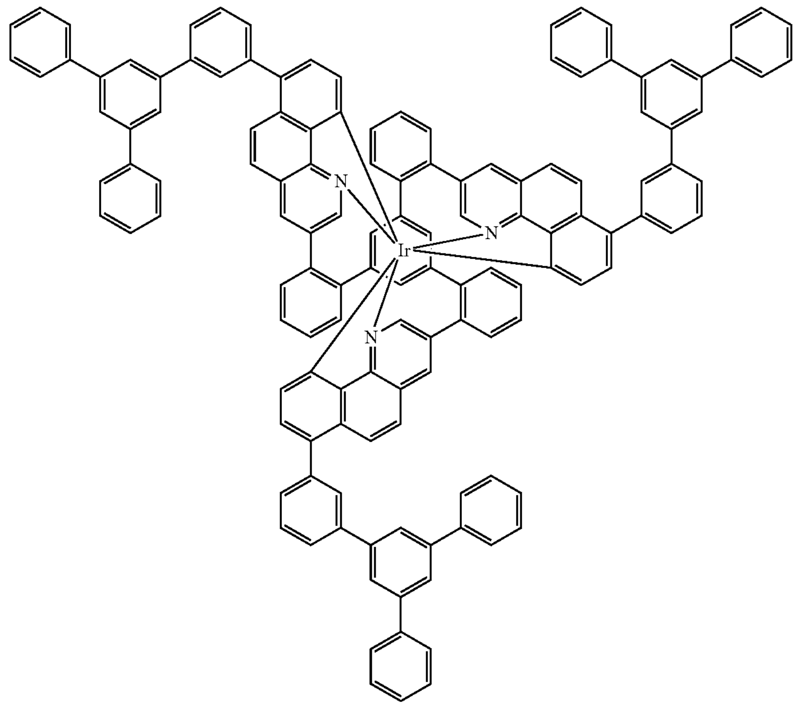
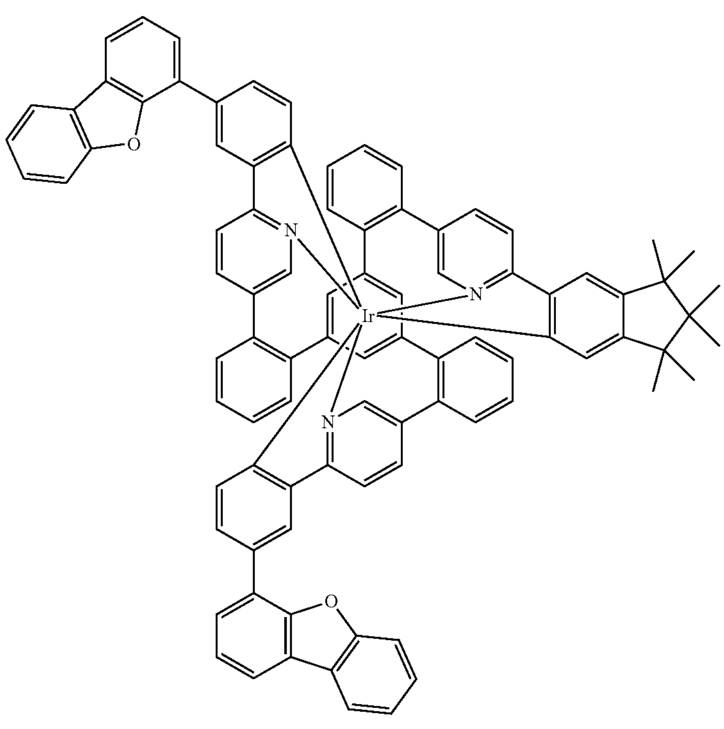

-continued
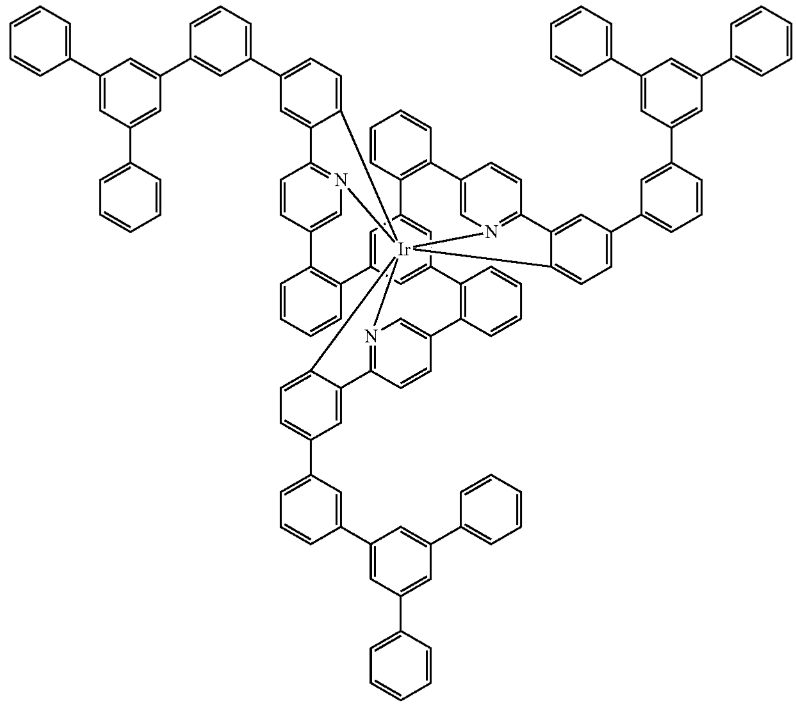
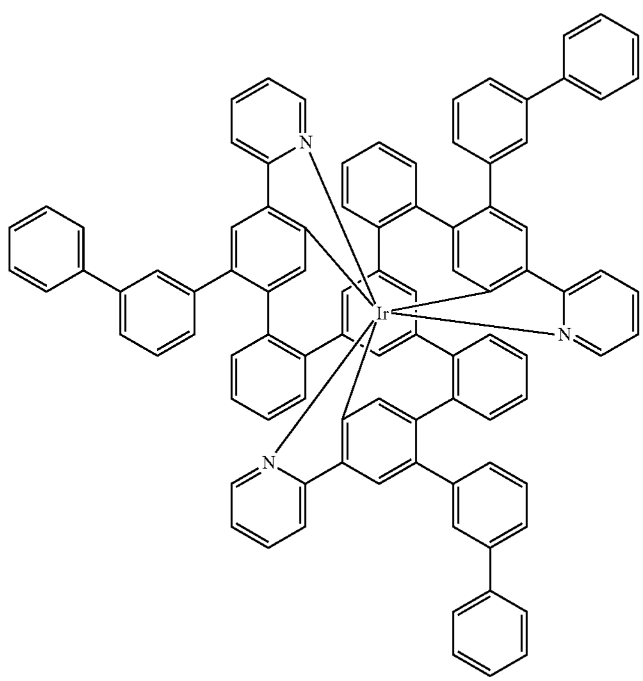

-continued
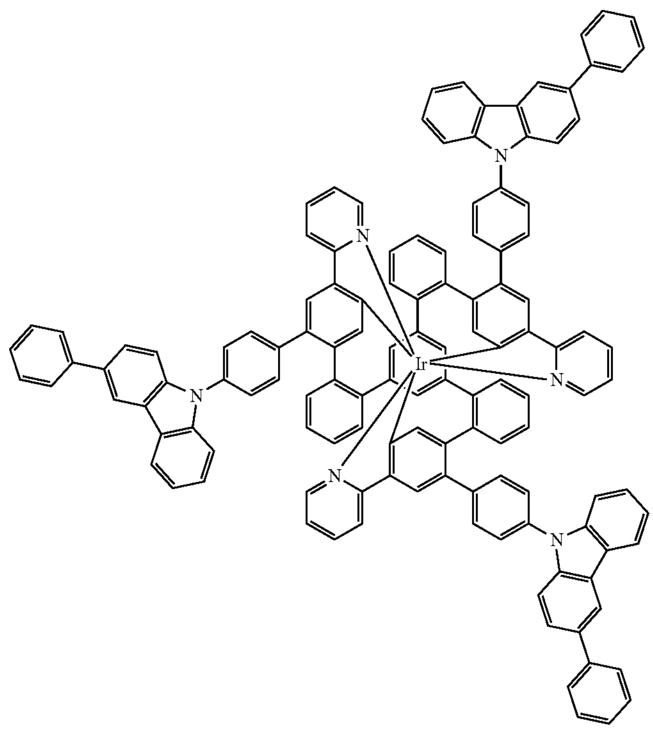
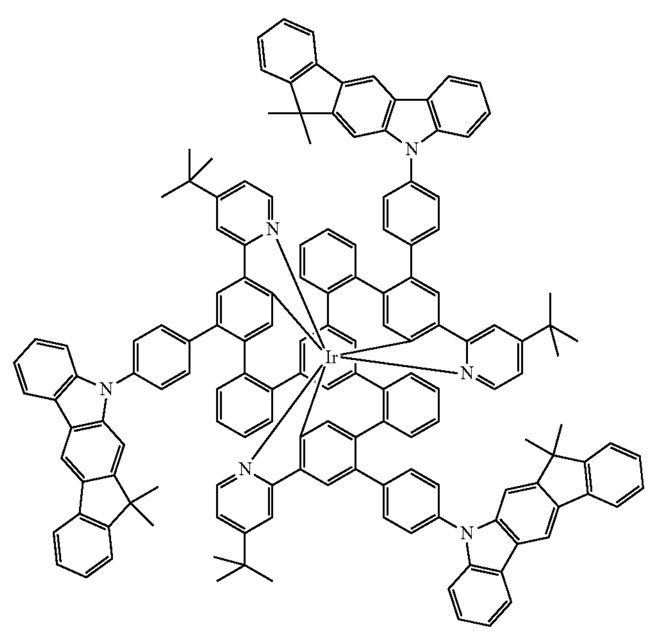

-continued
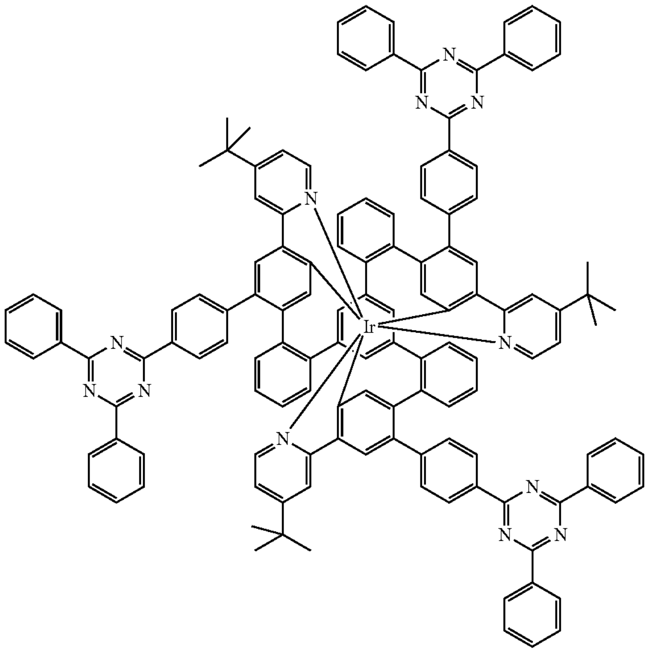
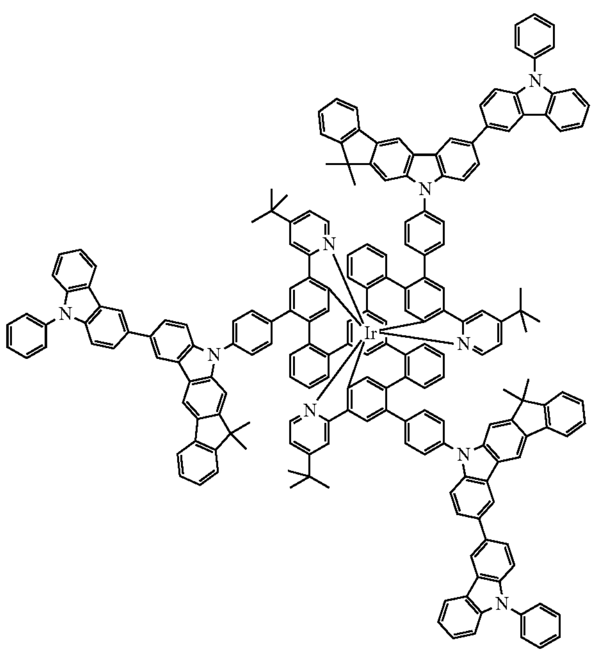

-continued
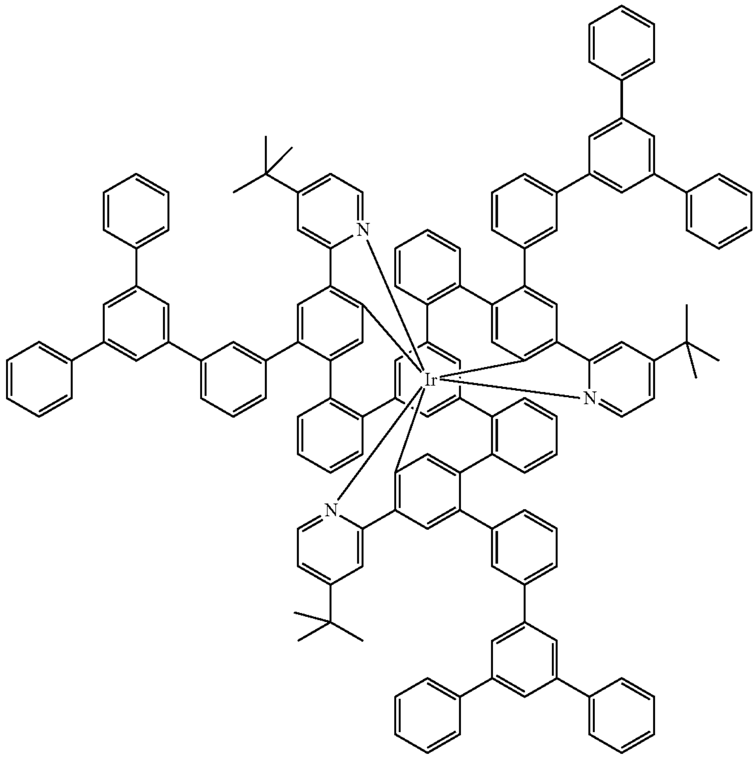
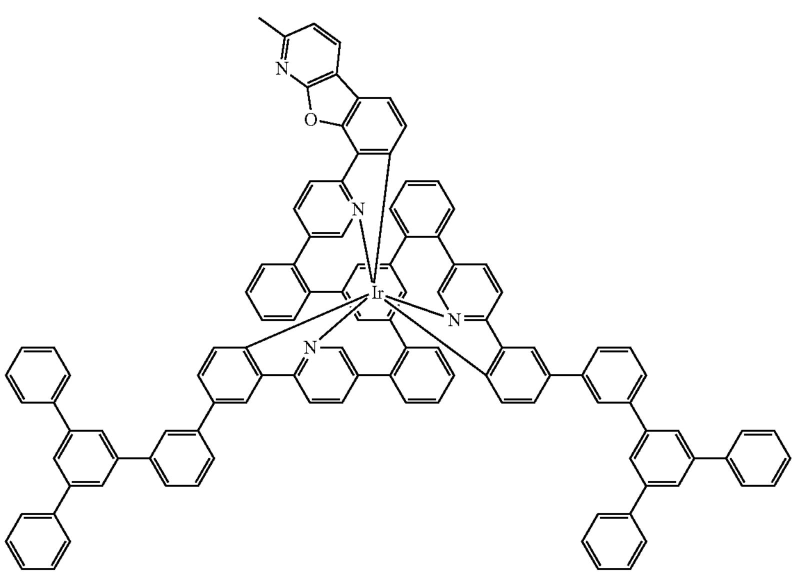

-continued
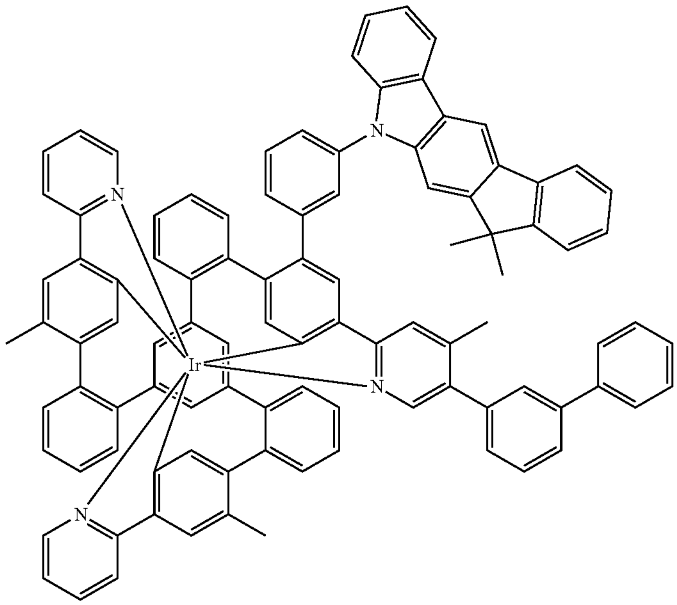
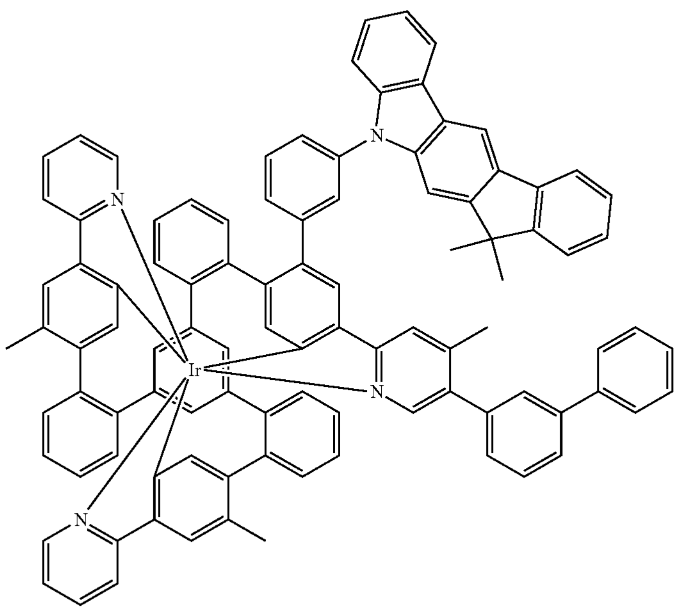

-continued
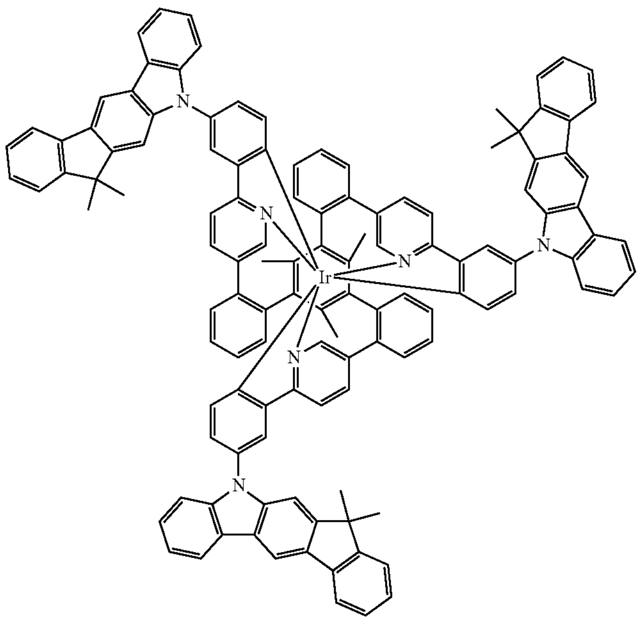
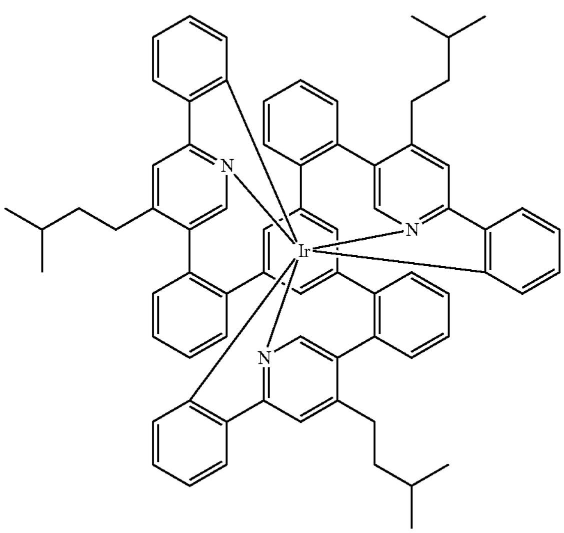

-continued

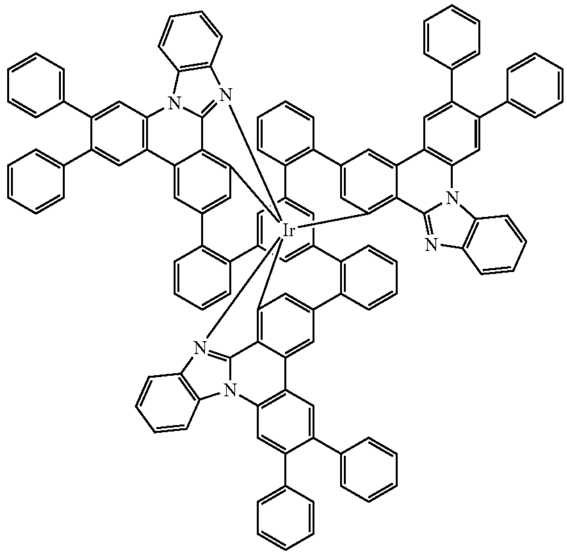

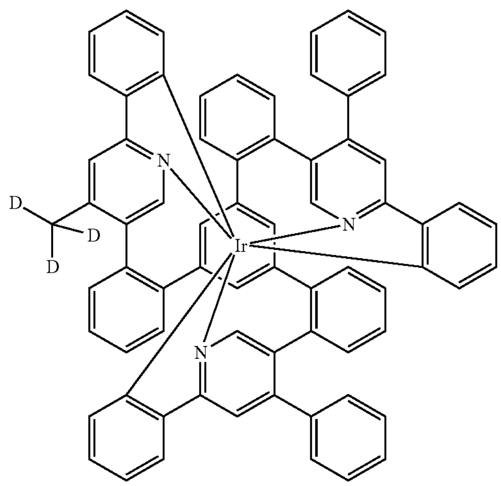

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled.

Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 10 bar. A special case of this method is the OVJP (organic vapour jet printing) method, in which the materials are applied directly by a nozzle and thus structured.

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. In a preferred embodiment of the invention, the layer comprising the compound of the invention is applied from solution.

The organic electroluminescent device can also be produced as a hybrid system by applying one or more layers from solution and applying one or more other layers by vapour deposition. For example, it is possible to apply an emitting layer comprising a metal complex of the invention and a matrix material from solution, and to apply a hole blocker layer and/or an electron transport layer thereto by vapour deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

1. The compounds of the invention enable deep red and infrared emission.
2. The compounds of the invention have a very high photoluminescence quantum yield for the infrared region. When used in an infrared-emitting organic electroluminescent device, this leads to excellent efficiencies.
3. The compounds of the invention have a very short luminescence lifetime. When used in an organic electroluminescent device, this leads to improved roll-off characteristics, and also, through avoidance of non-radiative relaxation channels, to a higher luminescence quantum yield.
4. The compounds of the invention, especially compounds with n=1, show oriented emission and therefore have high efficiency.

The invention is illustrated in more detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature. In the case of compounds that can have multiple tautomeric forms, one tautomeric form is shown representatively. The Ir complexes are typically obtained as mixtures of the Δ and Λ enantiomers.

A: Synthesis of the Synthons S

Example S1

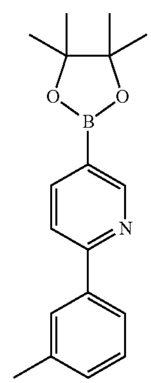

Preparation analogous to Example 21 in WO 2016/124304, see page 116. Reactant: 24.8 g (100 mmol) of 5-bromo-2-(3-methylphenyl)pyridine [1215073-45-2]. Yield: 22.2 g (75 mmol); 75% of theory; purity: 98% by $^{1}$H NMR.

Example S50

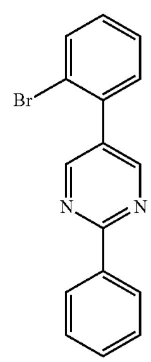 [SMILES: Brc1ccccc1-c1cnc(-c2ccccc2)nc1]

Preparation analogous to Example 200 in WO 2016/124304, see page 140. Reactant: 28.2 g (100 mmol) of 2-phenyl-5-(4,4,5,5-tetramethyl-1,3,2-dioxaborolan-2-yl) pyrimidine [1319255-85-0]. Yield: 22.2 g (75 mmol); 75% of theory; purity: 98% by $^{1}$H NMR.

In an analogous manner, it is possible to prepare the following compounds:
| Ex. | Reactant | Product | Yield |
|---|---|---|---|
| S51 | 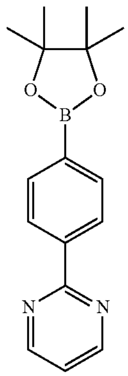 1220526-74-8 | 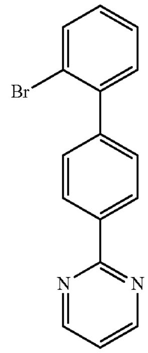 [SMILES: Brc1ccccc1-c1ccc(-c2ncccn2)cc1] | 70% |
| S52 | 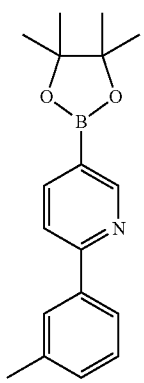 S1 | 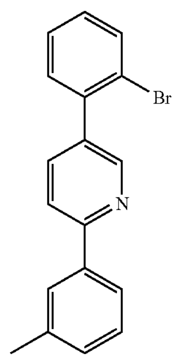 [SMILES: Cc1cccc(-c2ccc(-c3ccccc3Br)cn2)c1] | 83% |
| S53 | 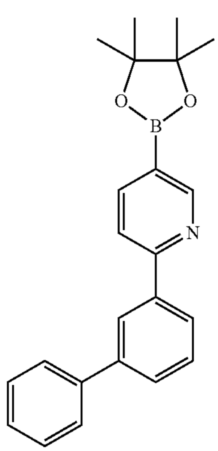 1989596-34-0 | 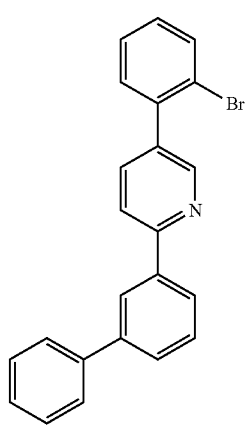 [SMILES: Brc1ccccc1-c1ccc(-c2cccc(-c3ccccc3)c2)nc1] | 79% |

-continued
| Ex. | Reactant | Product | Yield |
|---|---|---|---|
| S54 | 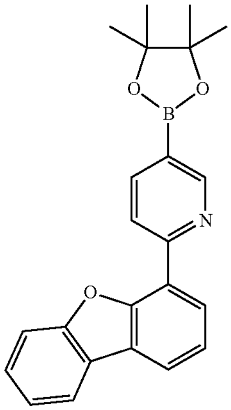 1621690-56-9 | 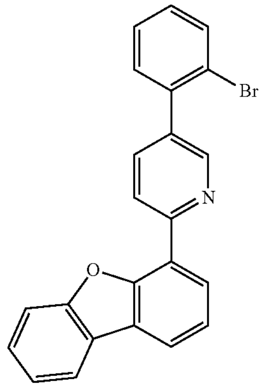 [SMILES: Brc1ccccc1-c1ccc(-c2cccc3c2oc2ccccc23)nc1] | 81% |
Example S100
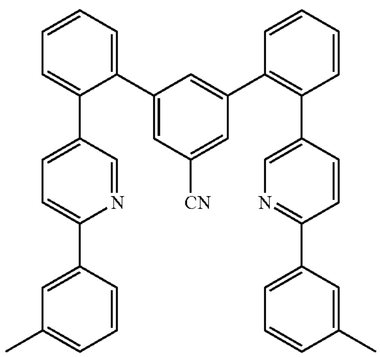
Preparation analogous to Example 5 in WO 2017/032439, see page 93. Reactant: 68.1 g (210 mmol) of S52. Yield: 42.5 g (71 mmol); 71% of theory; purity: 98% by $^{1}$H NMR.
In an analogous manner, it is possible to prepare the following compounds:
| Ex. | Reactant | Product | Yield |
|---|---|---|---|
| S101 | S53 | 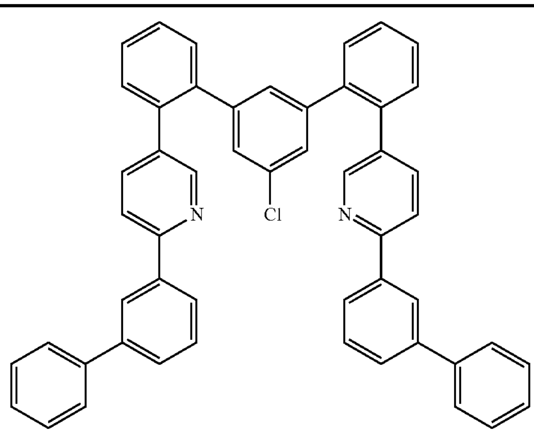 | 70% |

-continued

| Ex. | Reactant | Product | Yield |
|---|---|---|---|
| S102 | S54 | 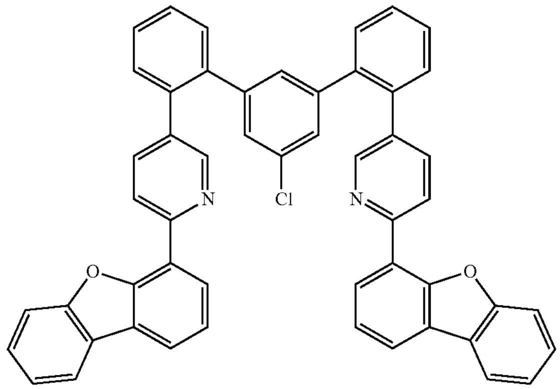 [SMILES: Clc1cc(-c2ccccc2-c2ccc(-c3cccc4c3oc3ccccc34)nc2)cc(-c2ccccc2-c2ccc(-c3cccc4c3oc3ccccc34)nc2)c1] | 75% |
| S103 | S55 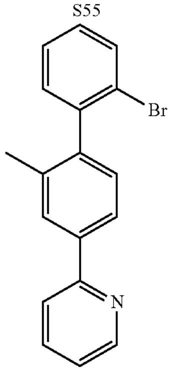 1989597-31-0 | 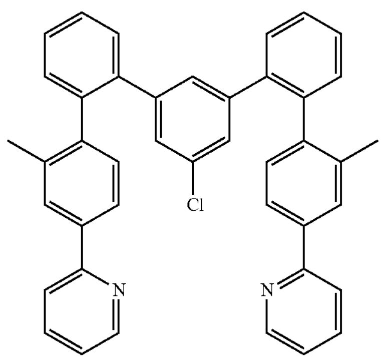 | 77% |

Example S150

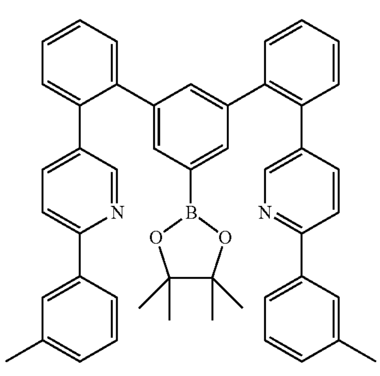

To a mixture of 59.9 g (100 mmol) of S100, 26.7 g (105 mmol) of bis(pinacolato)diborane, 29.4 g (300 mmol) of potassium acetate (anhydrous), 50 g of glass beads (diameter 3 mm) and 500 ml of THF are added, with good stirring, 821 mg (2 mmol) of SPhos and then 225 mg (1 mmol) of palladium(II) acetate, and the mixture is heated under reflux for 24 h. After cooling, the salts and glass beads are removed by suction filtration through a Celite bed in the form of a THF slurry, which is washed through with a little THF, and the filtrate is concentrated to dryness. The residue is taken up in 150 ml of MeOH and stirred in the warm solvent, and the crystallized product is filtered off with suction, washed twice with 30 ml each time of methanol and dried under reduced pressure. Yield: 56.0 g (81 mmol); 81% of theory purity: about 95% by $^{1}$H NMR.

In an analogous manner, it is possible to prepare the following compounds:

| Ex. | Reactant | Product | Yield |
|---|---|---|---|
| S151 | S101 | 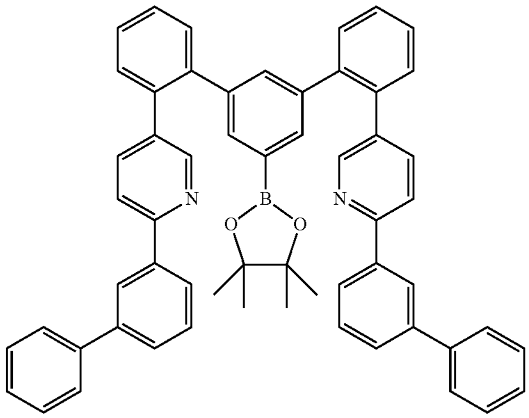 [SMILES: CC1(C)OB(c2cc(-c3ccccc3-c3ccc(-c4cccc(-c5ccccc5)c4)nc3)cc(-c3ccccc3-c3ccc(-c4cccc(-c5ccccc5)c4)nc3)c2)OC1(C)C] | 76% |
| S152 | S102 | 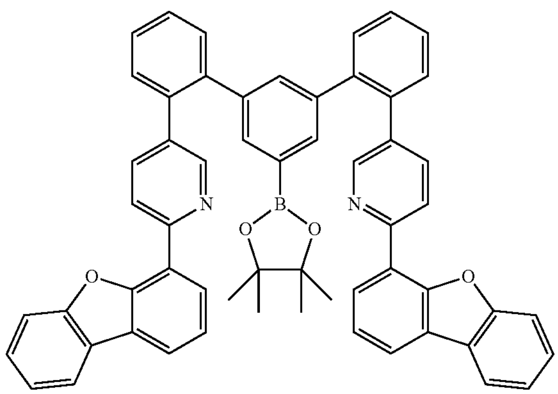 [SMILES: CC1(C)OB(c2cc(-c3ccccc3-c3ccc(-c4cccc5c4oc4ccccc45)nc3)cc(-c3ccccc3-c3ccc(-c4cccc5c4oc4ccccc45)nc3)c2)OC1(C)C] | 79% |
| S153 | S103 | 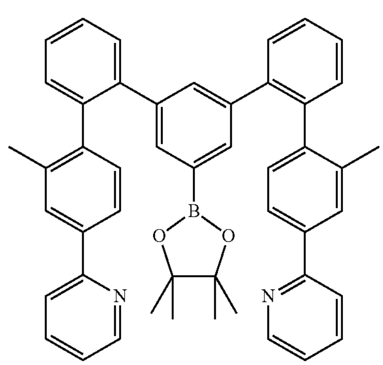 | 83% |

B: Synthesis of the Ir Ligands L

Example L1

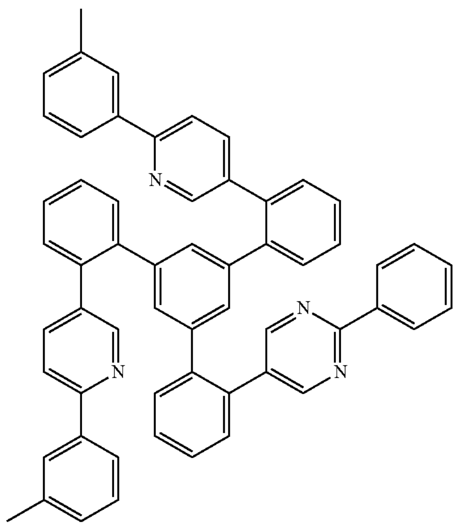 [SMILES: Cc1cccc(-c2ccc(-c3ccccc3-c3cc(-c4ccccc4-c4ccc(-c5cccc(C)c5)nc4)cc(-c4ccccc4-c4cnc(-c5ccccc5)nc4)c3)cn2)c1]

To a mixture of 69.1 g (100 mmol) of S150, 31.1 g (100 mmol) of S50, 63.7 g (300 mmol) of tripotassium phosphate, 400 ml of toluene, 200 ml of dioxane and 400 ml of water are added, with good stirring, 1.64 g (4 mmol) of SPhos and then 449 mg (2 mmol) of palladium(II) acetate, and the mixture is heated under reflux for 24 h. After cooling, the organic phase is removed and washed twice with 300 ml each time of water and once with 300 ml of saturated sodium chloride solution, and dried over magnesium sulfate. The desiccant is filtered off through a Celite bed in the form of a toluene slurry, the filtrate is concentrated to dryness under reduced pressure and the vitreous crude product is recrystallized from acetonitrile/ethyl acetate at boiling. Yield: 56.5 g (71 mmol); 71% of theory; purity: about 95% by $^{1}$H NMR.

In an analogous manner, it is possible to prepare the following compounds:

| Ex. | Reactant | Product | Yield |
|---|---|---|---|
| L2 | S151<br>S50 | 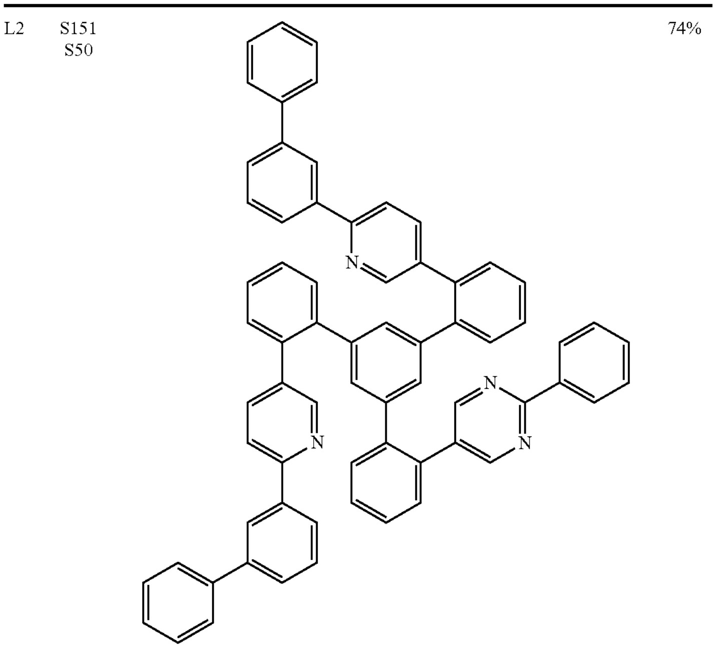 | 74% |

-continued
| Ex. | Reactant | Product | Yield |
|---|---|---|---|
| L3 | S152<br>S50 | 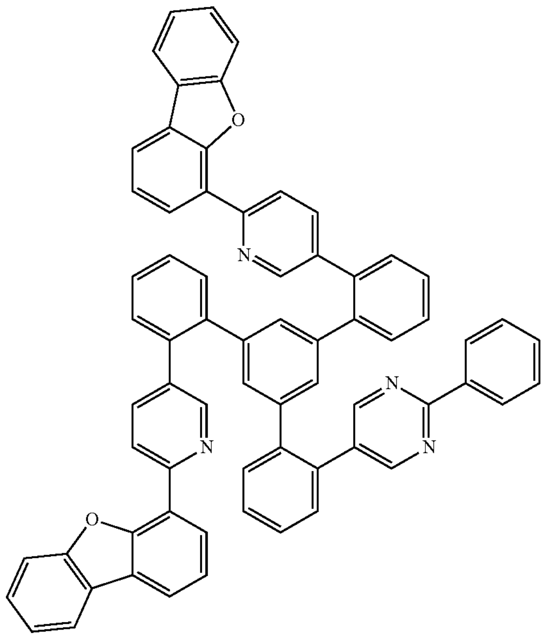 [SMILES: c1ccc(-c2ncc(-c3ccccc3-c3cc(-c4ccccc4-c4ccc(-c5cccc6c5oc5ccccc56)nc4)cc(-c4ccccc4-c4ccc(-c5cccc6c5oc5ccccc56)nc4)c3)cn2)cc1] | 77% |
| L4 | S153<br>S51 | 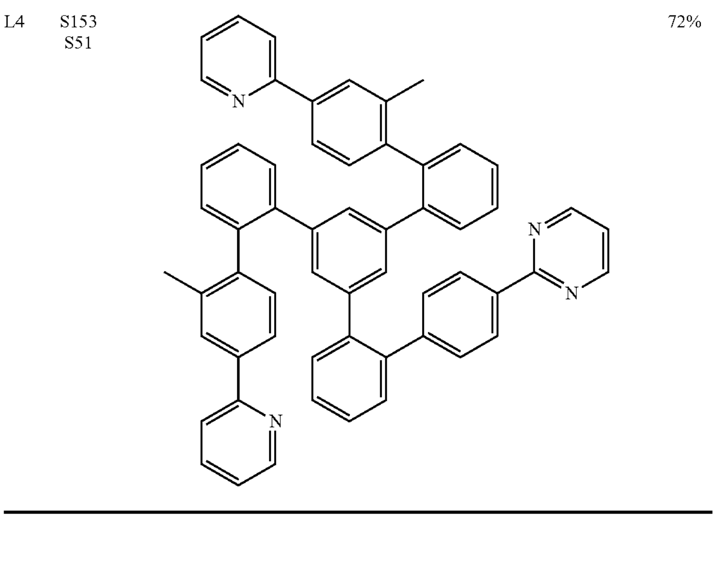 | 72% |

C: Synthesis of the Ir Complexes and Bromination Thereof

Example Ir(L1)

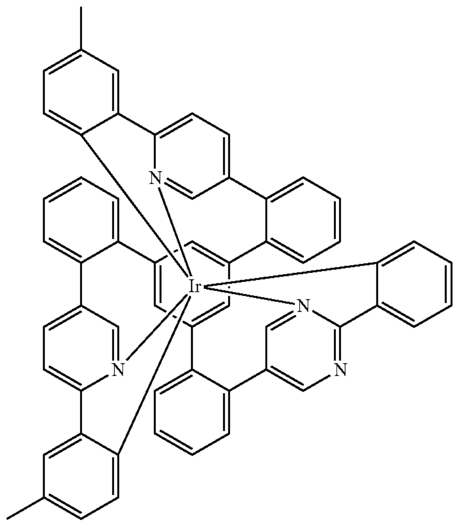

A mixture of 7.95 g (10 mmol) of ligand L1, 4.90 g (10 mmol) of trisacetylacetonatoiridium(III) [15635-87-7] and 120 g of hydroquinone [123-31-9] is initially charged in a 1000 ml two-neck round-bottom flask with a glass-sheathed magnetic bar. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer bar. Then the apparatus is thermally insulated with several loose windings of domestic aluminium foil, the insulation being run up to the middle of the riser tube of the water separator. Then the apparatus is heated rapidly with a heated laboratory stirrer system to 250-255° C., measured with the Pt-100 temperature sensor which dips into the molten stirred reaction mixture. Over the next 2 h, the reaction mixture is kept at 250-255° C., in the course of which a small amount of condensate is distilled off and collects in the water separator. After 2 h, the mixture is allowed to cool down to 190° C., the heating mantle is removed and then 100 ml of ethylene glycol are added dropwise. After cooling to 100° C., 400 ml of methanol are slowly added dropwise. The yellow-orange suspension thus obtained is filtered through a double-ended frit, and the yellow solids are washed three times with 50 ml of methanol and then dried under reduced pressure. Crude yield: quantitative. The solids thus obtained are dissolved in about 200 ml of dichloromethane and filtered through about 1 kg of silica gel in the form of a dichloromethane slurry (column diameter about 18 cm) with exclusion of air in the dark, leaving dark-coloured components at the start. The core fraction is cut out and concentrated on a rotary evaporator, with simultaneous continuous dropwise addition of MeOH until crystallization. After filtration with suction, washing with a little MeOH and drying under reduced pressure, the orange product is purified further by continuous hot extraction three times with dichloromethane/i-propanol 1:1 (vv) and then hot extraction twice with dichloromethane/acetonitrile (amount initially charged in each case about 200 ml, extraction thimble: standard Soxhlet thimbles made of cellulose from Whatman) with careful exclusion of air and light. The loss into the mother liquor can be adjusted via the ratio of dichloromethane (low boilers and good dissolvers):isopropanol or acetonitrile (high boilers and poor dissolvers). It should typically be 3-6% by weight of the amount used. Hot extraction can also be accomplished using other solvents such as toluene, xylene, ethyl acetate, butyl acetate, etc. Finally, the product is subjected to heat treatment under high vacuum at $p \sim 10^{-6}$ mbar and T~350-400° C. Yield: 7.48 g (7.6 mmol), 76%; purity: about 99.8% by HPLC.

In an analogous manner, it is possible to prepare the following compounds:

| Ex. | Reactant | Product | Yield |
|---|---|---|---|
| Ir(L2) | L2 | 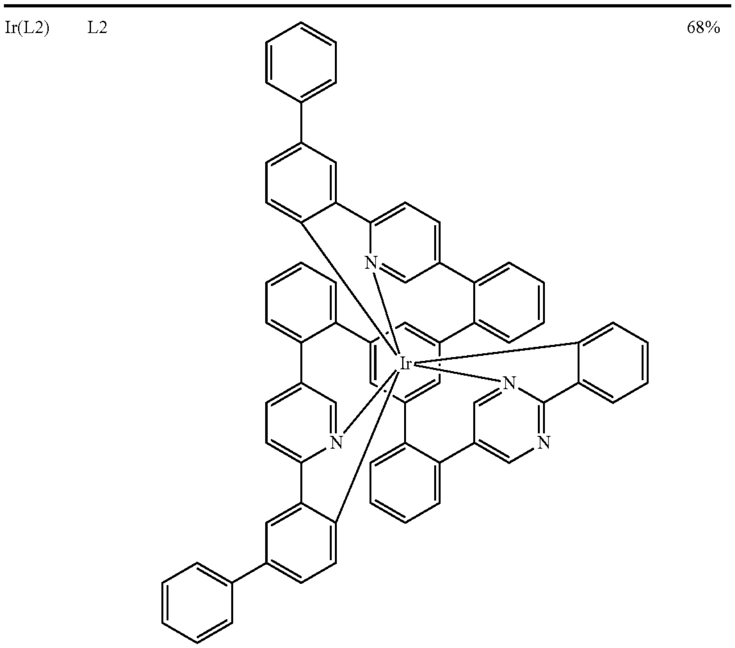 | 68% |

-continued
| Ex. | Reactant | Product | Yield |
|---|---|---|---|
| Ir(L3) | L3 | 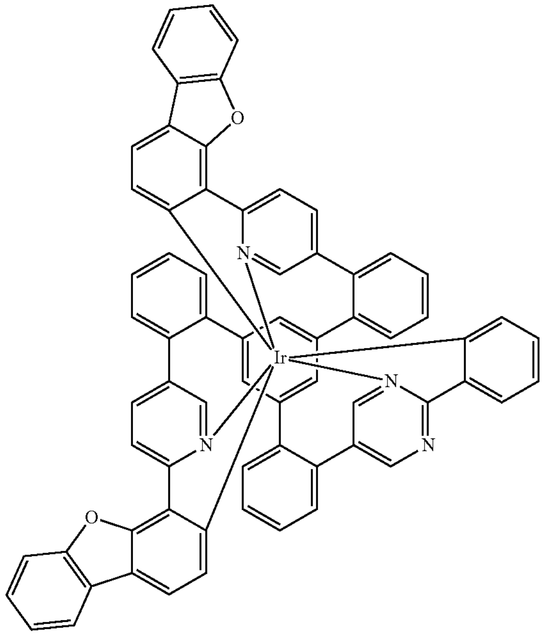 | 71% |
| Ir(L4) | L4 | 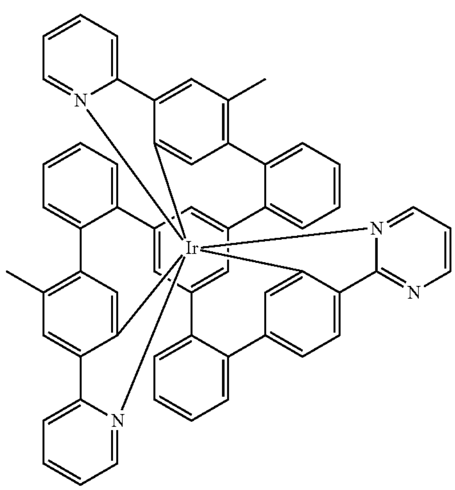 | 70% |

Example Ir(L1-Br)

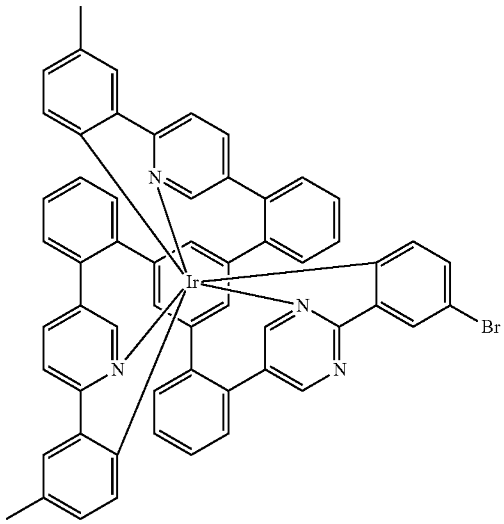

To a well-stirred suspension of 9.84 g (10 mmol) of Ir(L1) in 500 ml of DCM are added all at once, at room temperature in the dark, 1.78 g (10.5 mmol) of N-bromosuccinimide and then the mixture is stirred for a further 16 h. After removing about 450 ml of the DCM under reduced pressure, 100 ml of methanol and 0.3 ml of hydrazine hydrate are added to the yellow-green suspension, and the yellow solids are filtered off with suction, washed three times with about 50 ml of methanol and then dried under reduced pressure. Yield: 9.78 g (9.2 mmol); 92% of theory; purity: >99.0% by NMR.

In an analogous manner, it is possible to prepare the following compounds:

| Ex. | Reactant | Product | Yield |
|---|---|---|---|
| Ir(L2-Br) | Ir(L2) | 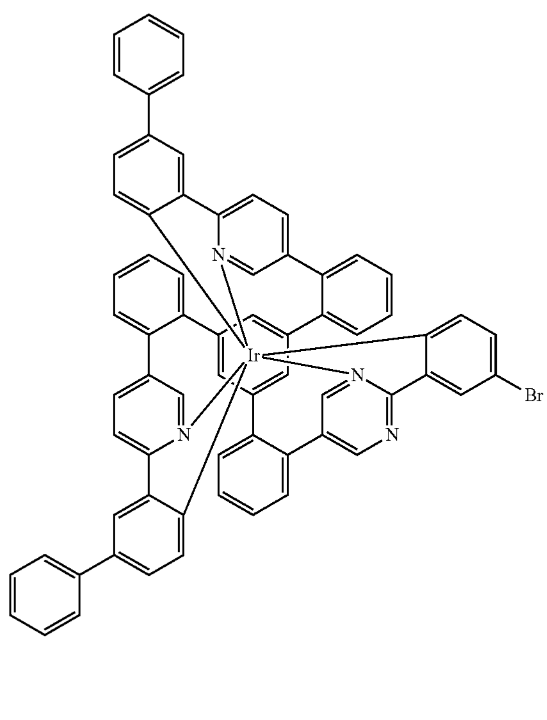 | 90% |

-continued
| Ex. | Reactant | Product | Yield |
|---|---|---|---|
| Ir(L3-Br) | Ir(L3) | 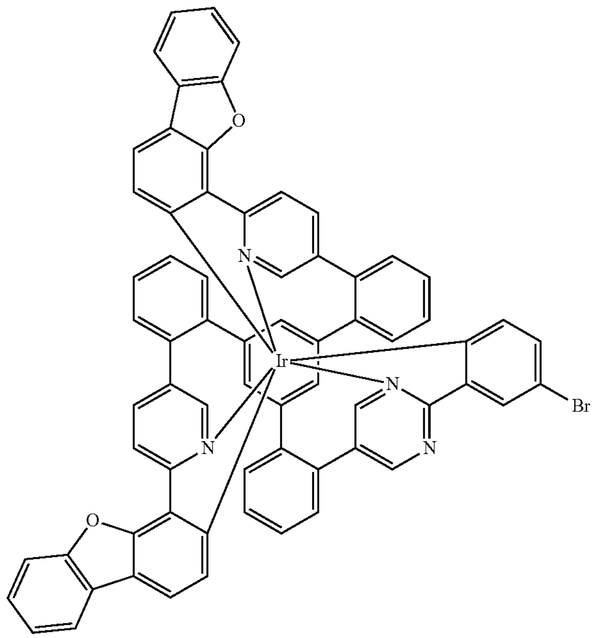 | 86% |
| Ir(L4-Br) | Ir(L4) | 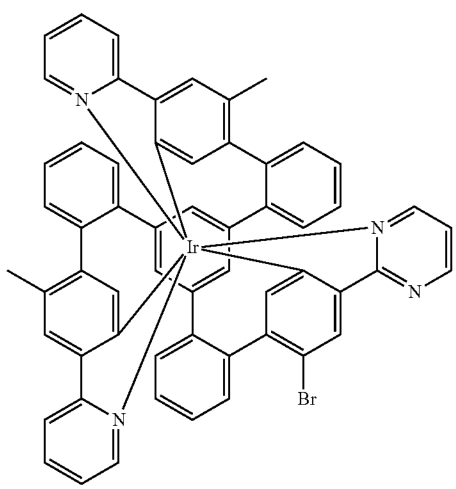 | 94% |

D: Synthesis of the Ir Complexes with Pt Ligands

Example Ir(L1A)

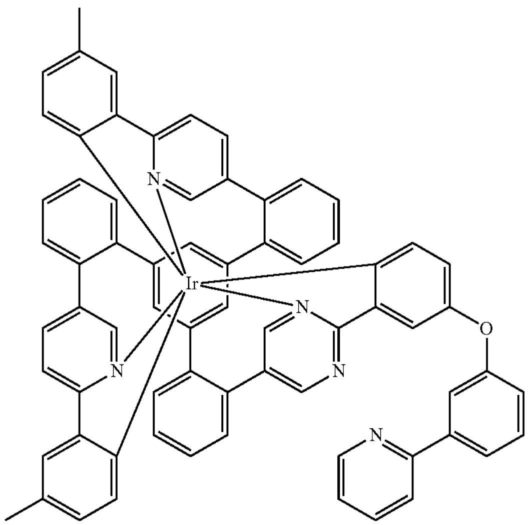

A mixture of 10.66 g (10 mmol) of Ir(L1-Br), 3.43 g (20 mmol) of 3-(2-pyridinyl)phenol [98061-22-4], 5.53 g (40 mmol) of potassium carbonate, 930 mg (1 mmol) of triphenylphosphine-copper(I) bromide [15709-74-7], 50 g of glass beads, 70 ml of DMF and 90 ml of o-xylene is heated on a water separator until no further water separates out (about 18 h). The reaction mixture is left to cool to 70° C. and filtered with suction through a Celite bed in the form of an o-xylene slurry, and the filtrate is concentrated to dryness. The residue is subjected to hot extraction with 150 ml of MeOH, and the solids are filtered off with suction, washed three times with 20 ml each time of MeOH and dried. The solids are taken up in about 200 ml of dichloromethane (DCM):ethyl acetate (EA) (9:1 vv) and filtered through a silica gel column (diameter 8 cm, length 30 cm) in the form of a DCM:EA (9:1 vv) slurry, and the orange core fraction is cut out. The dichloromethane is distilled off on a rotary evaporator under standard pressure, while continuously replacing the volume distilled off with methanol, and the product crystallizes out. The orange product is filtered off with suction, washed twice with 20 ml each time of methanol and dried under reduced pressure. Yield: 8.85 g (7.6 mmol); 76% of theory; purity: >99.0% by NMR.

In an analogous manner, it is possible to prepare the following compounds:

| Ex. | Reactant | Product | Yield |
|---|---|---|---|
| Ir(L1B) | Ir(L1-Br) 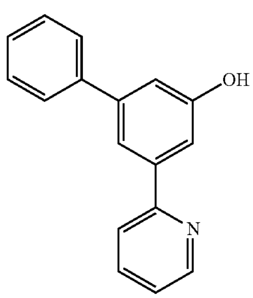  1939918-12-3 | 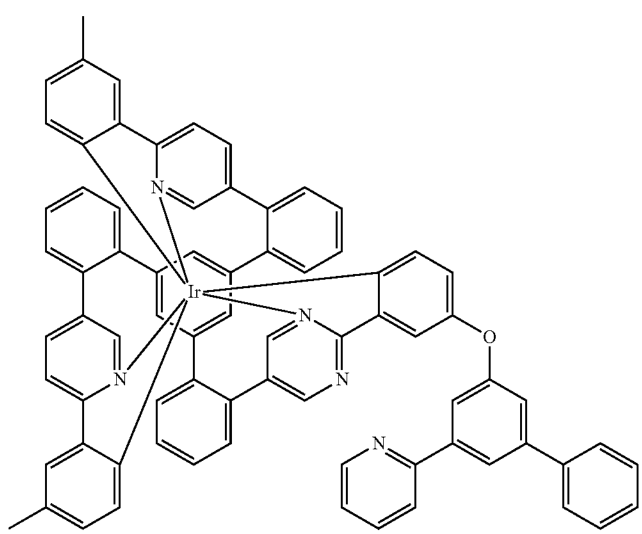  | 71% |

-continued
| Ex. | Reactant | Product | Yield |
| --- | --- | --- | --- |
| Ir(L1C) | Ir(L1-Br) 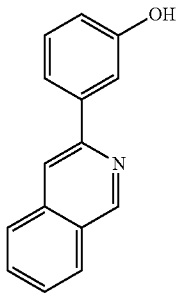 134949-01-2 | 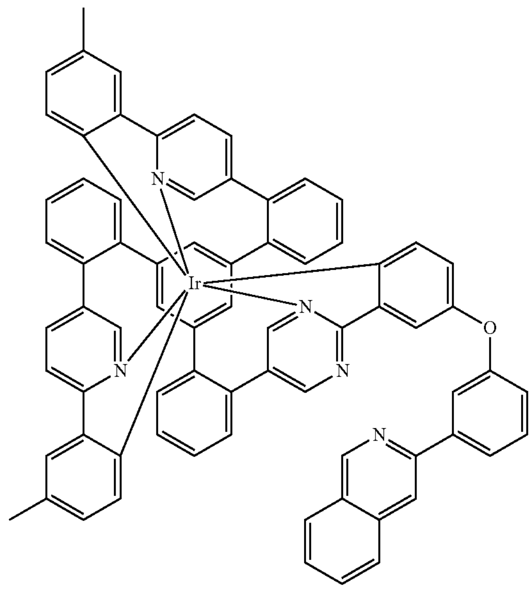 | 73% |
| Ir(L1D) | Ir(L1-Br) 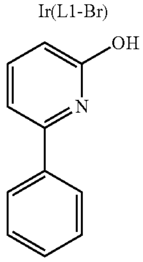 19006-82-7 | 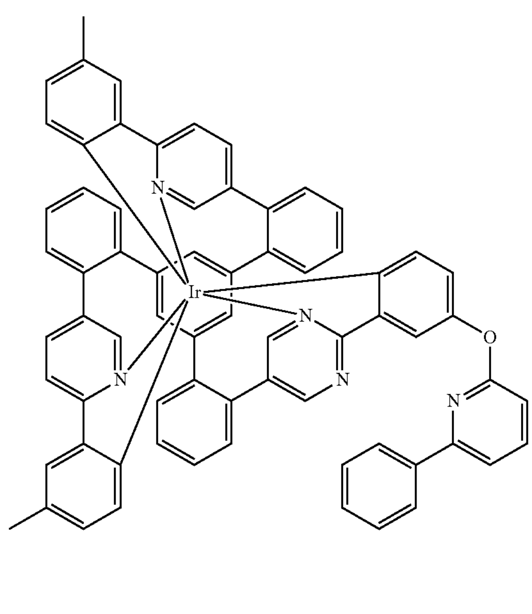 | 56% |

-continued
| Ex. | Reactant | Product | Yield |
|---|---|---|---|
| Ir(L1E) | Ir(L1-Br)<br>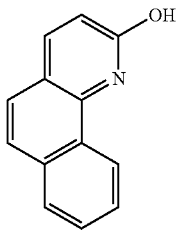<br>23981-06-8 | 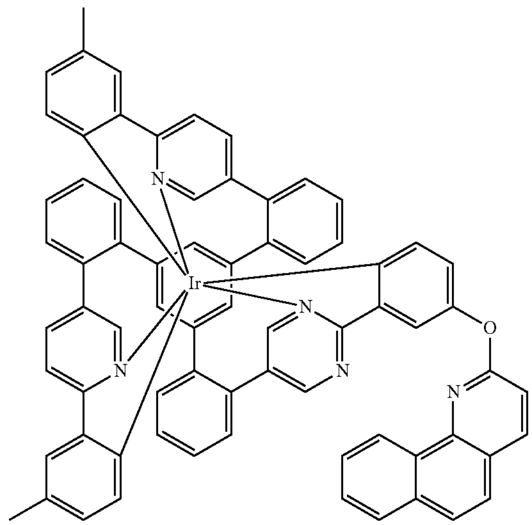 | 56% |
| Ir(L2A) | Ir(L2-Br)<br>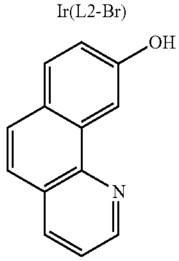<br>57442-06-5 | 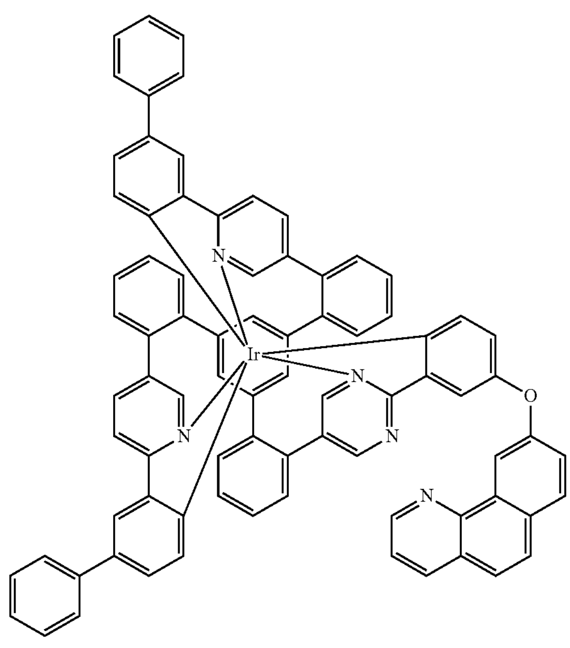 | 65% |

-continued
| Ex. | Reactant | Product | Yield |
|---|---|---|---|
| Ir(L3A) | Ir(L3-Br) 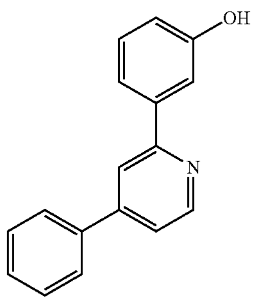 1939917-94-8 | 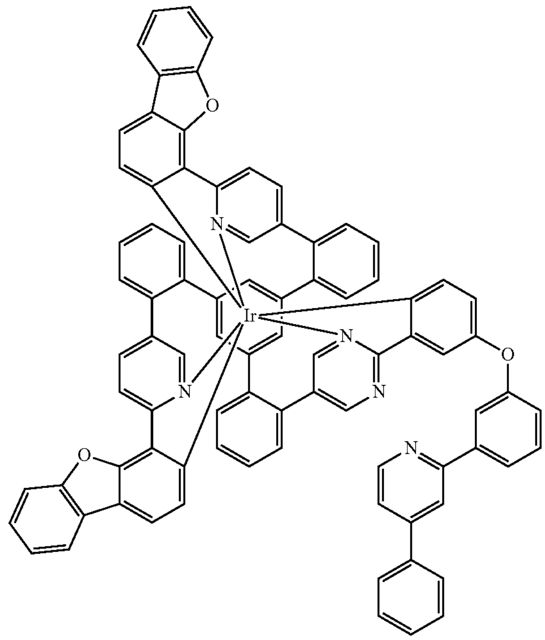 | 68% |
| Ir(L4A) | Ir(L4-Br) 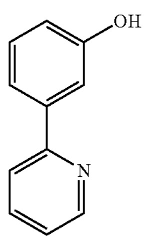 98061-22-4 | 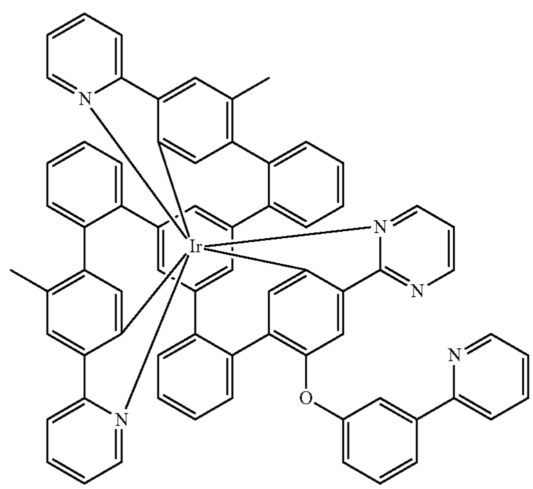 | 63% |
| Ir(L5A) | 2170151-15-0 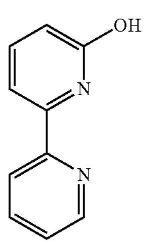 101001-09-5 | 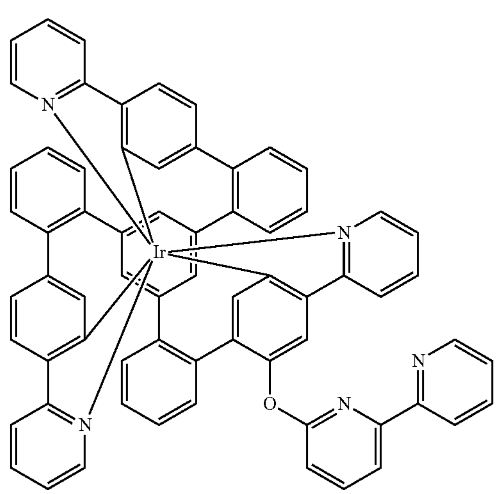 | 49% |

-continued
| Ex. | Reactant | Product | Yield |
| --- | --- | --- | --- |
| Ir(L5B) | 2170151-15-0 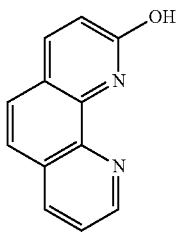 92695-50-6 | 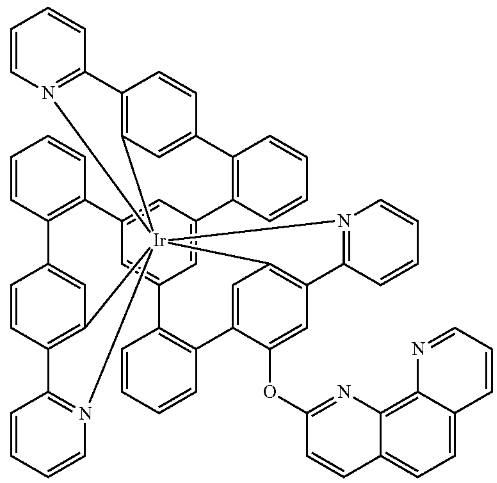 | 53% |
| Ir(L6A) | 1989601-73-1 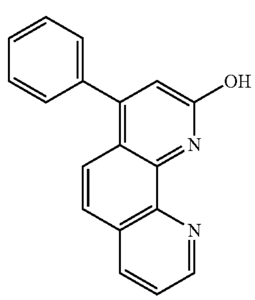 2172780-00-4 30 mmol | 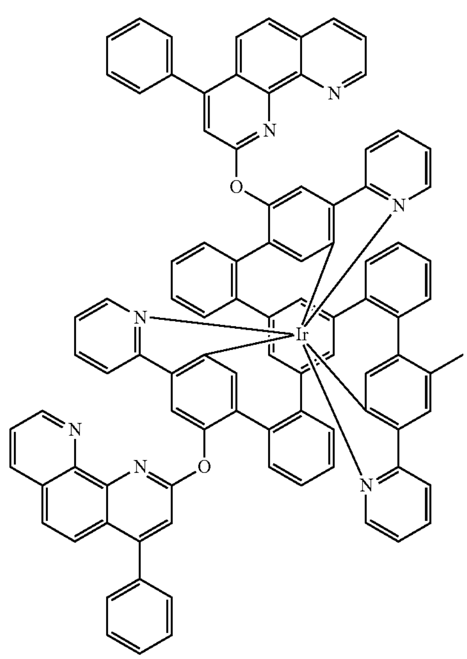 | 45% |

-continued
| Ex. | Reactant | Product | Yield |
|---|---|---|---|
| Ir(L7A) | 1989601-53-7 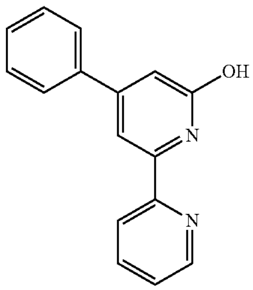 220482-78-0 50 mmol | 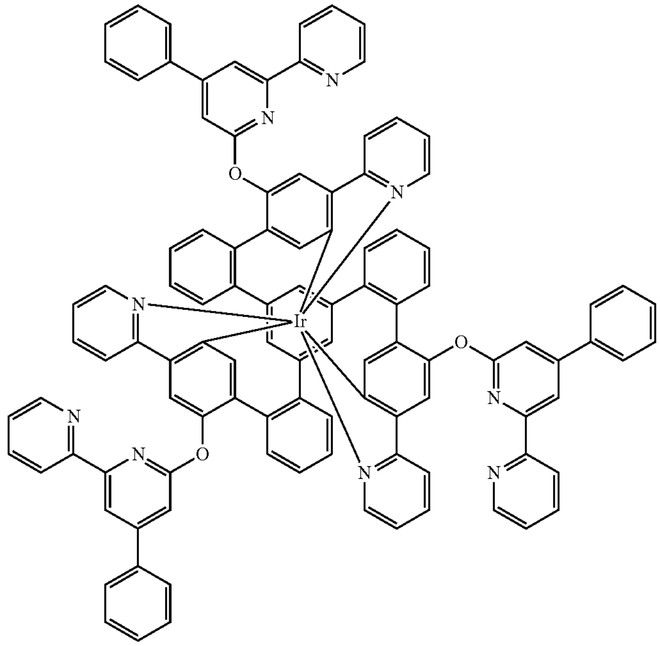 | 31% |
| Ir(L8A) | 1989601-74-2 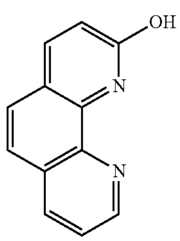 92695-50-6 | 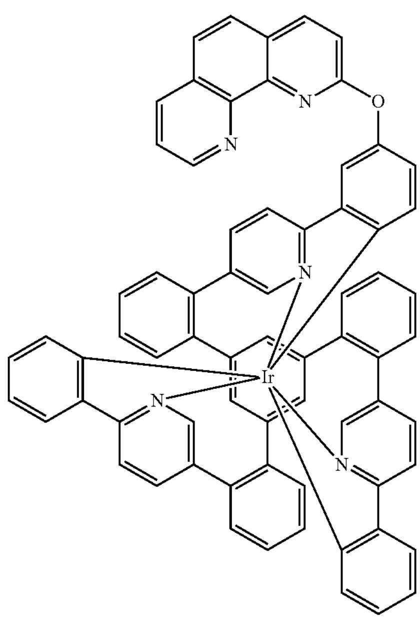 | 49% |

Example Ir(L1F)

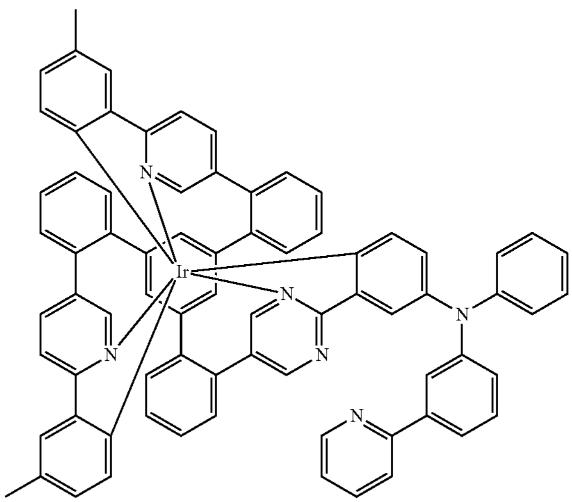

A well-stirred mixture of 10.66 g (10 mmol) of Ir(L1-Br), 4.92 g (20 mmol) of N-phenyl-3-(2-pyridinyl)phenylamine

[1325592-74-2], 1.94 g (20 mmol) of sodium tert-butoxide, 202 mg (1 mmol) of tri-tert-butylphosphine, 157 mg (0.7 mmol) of palladium(II) acetate and 150 ml of o-xylene is heated under reflux for 18 h. The reaction mixture is left to cool to 70° C. and filtered with suction through a Celite bed in the form of an o-xylene slurry, and the filtrate is concentrated to dryness. The solids are taken up in about 200 ml of dichloromethane (DCM):ethyl acetate (EA) (9:1 vv) and filtered through a silica gel column (diameter 8 cm, length 30 cm) in the form of a DCM:EA (9:1 vv) slurry, and the orange core fraction is cut out.

The dichloromethane is distilled off on a rotary evaporator under reduced pressure, while continuously replacing the volume distilled off with methanol, and the product crystallizes out. The orange product is filtered off with suction, washed twice with 20 ml each time of methanol and dried under reduced pressure. Yield: 8.37 g (6.8 mmol); 68% of theory; purity: >99.0% by NMR.

In an analogous manner, itis possible to prepare the following compounds:

| Ex. | Reactant | Product | Yield |
|---|---|---|---|
| Ir(L1G) | Ir(L1-Br) 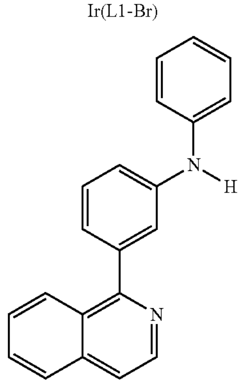 1325592-71-9 | 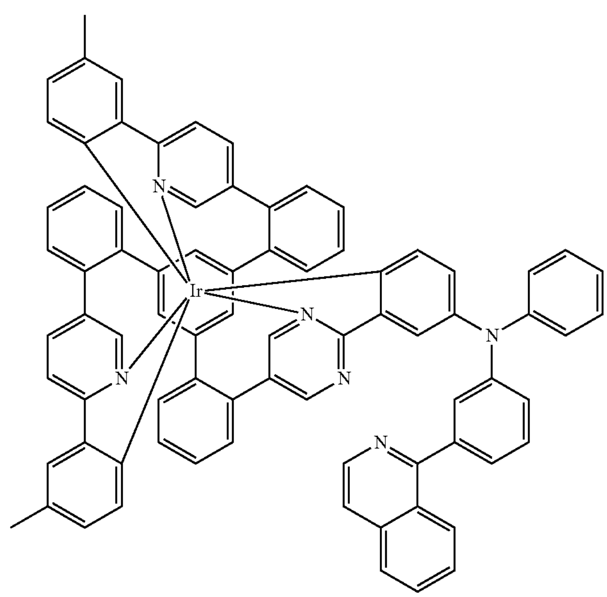 | 63% |

-continued
| Ex. | Reactant | Product | Yield |
|---|---|---|---|
| Ir(L1H) | Ir(L1-Br)<br>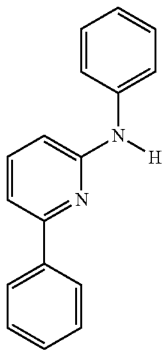<br>84794-03-6 | 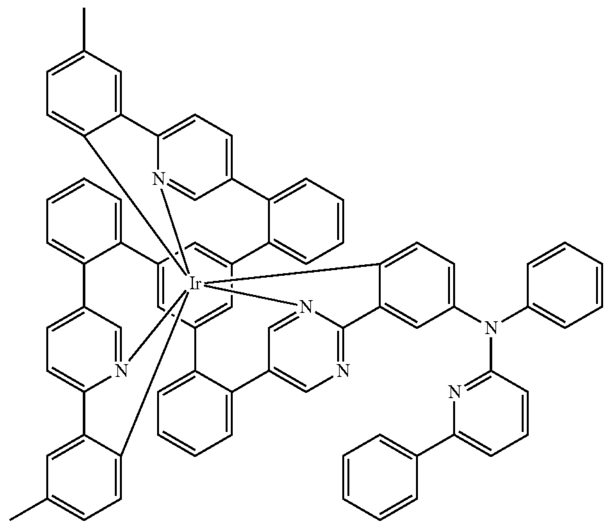 | 46% |
| Ir(L4B) | Ir(L4-Br)<br>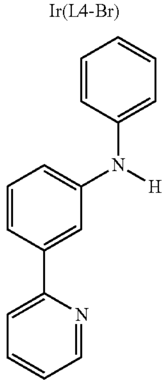<br>1325592-74-2 | 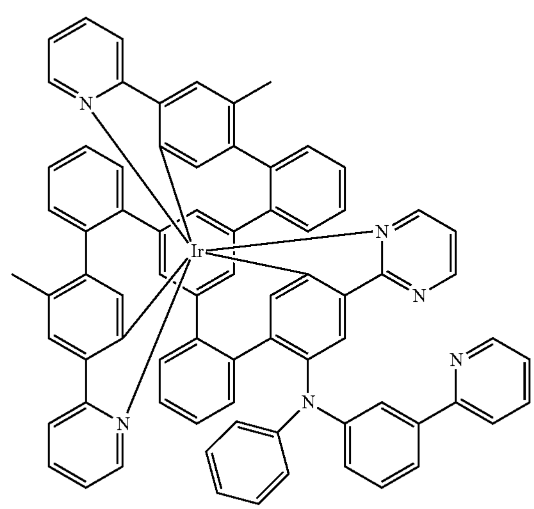 | 61% |

E: Synthesis of the Ir—Pt Complexes

Example IrPt(L1A)

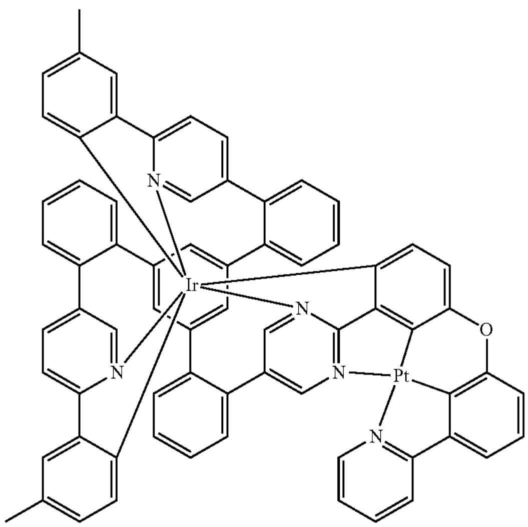

A mixture of 11.56 g (10 mmol) of Ir(L1A), 4.15 g (10 mmol) of potassium tetrachloroplatinate [10025-99-7], 3.4 g (80 mmol) of lithium chloride, anhydrous, 50 g of glass beads and 100 ml of glacial acetic acid is stirred at 80° C. with good stirring for 60 h. After cooling to about 50° C., 100 ml of water are added dropwise, and the precipitated crude product is filtered off with suction, washed three times with 30 ml of a mixture of methanol-water (1:1 vv) and three times with 30 ml each time of methanol and dried under reduced pressure. The solids are taken up in about 200 ml of DCM in the dark and filtered through a silica gel column (diameter 8 cm, length 30 cm) in the form of a DCM slurry, and the deep red core fraction is cut out. The DCM is distilled off on a rotary evaporator under reduced pressure, while continuously replacing the volume distilled off with methanol, and the product crystallizes out. The product is filtered off with suction, washed twice with 20 ml each time of methanol and dried under reduced pressure. The product is purified further by continuous hot extraction four times with dichloromethane/isopropanol 1:1 (vv) and then hot extraction four times with dichloromethane/acetonitrile (amount initially charged in each case about 200 ml, extraction thimble: standard Soxhlet thimbles made of cellulose from Whatman) with careful exclusion of air and light. The loss into the mother liquor can be adjusted via the ratio of dichloromethane (low boilers and good dissolvers):isopropanol or acetonitrile (high boilers and poor dissolvers). It should typically be 3-6% by weight of the amount used. Hot extraction can also be accomplished using other solvents such as toluene, xylene, ethyl acetate, butyl acetate, etc. Finally, the product is subjected to heat treatment or fractional sublimation under high vacuum at p~$10^{-6}$ mbar and T~370-450° C. Yield: 7.16 g (5.3 mmol); 53% of theory; purity: >99.8% by NMR.

In an analogous manner, it is possible to prepare the following compounds:

| Ex. | Reactant | Product | Yield |
|---|---|---|---|
| IrPt(L1B) | Ir(L1B) | 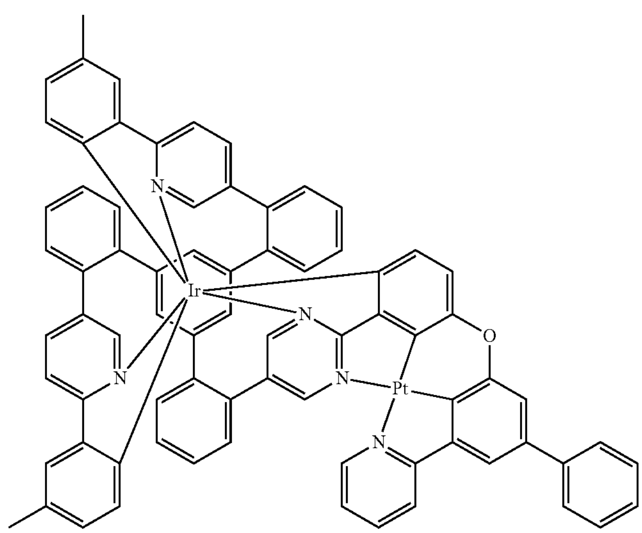 | 55% |

-continued
| Ex. | Reactant | Product | Yield |
|---|---|---|---|
| IrPt(L1C) | Ir(L1C) | 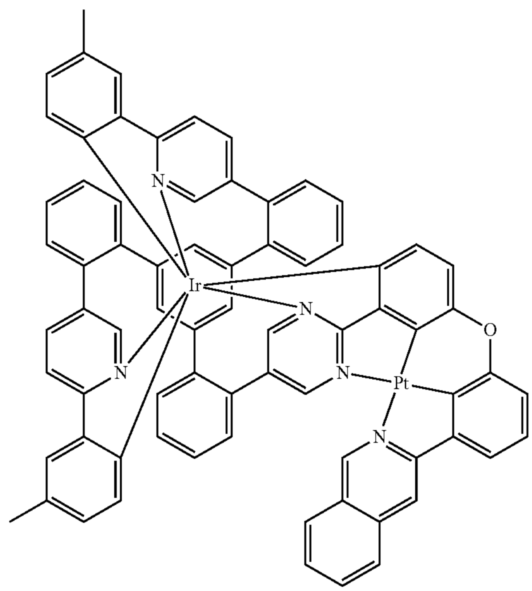 | 51% |
| IrPt(L1D) | Ir(L1D) | 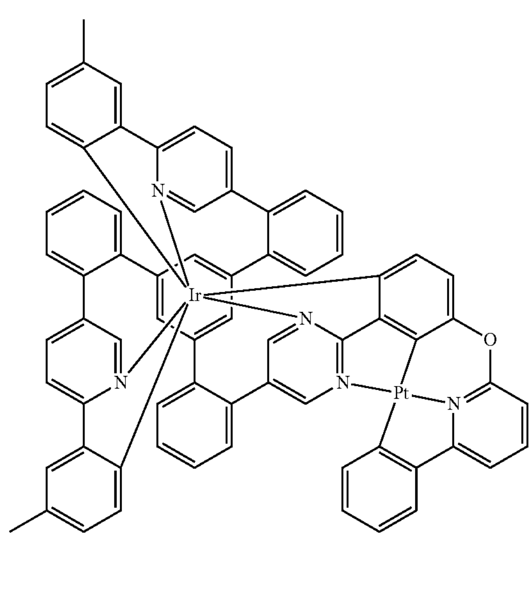 | 60% |

-continued
| Ex. | Reactant | Product | Yield |
| --- | --- | --- | --- |
| IrPt(L1E) | Ir(L1E) | 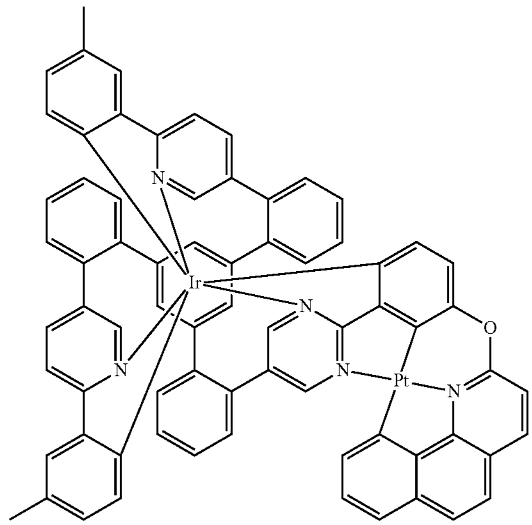 | 56% |
| IrPt(L2A) | Ir(L2A) | 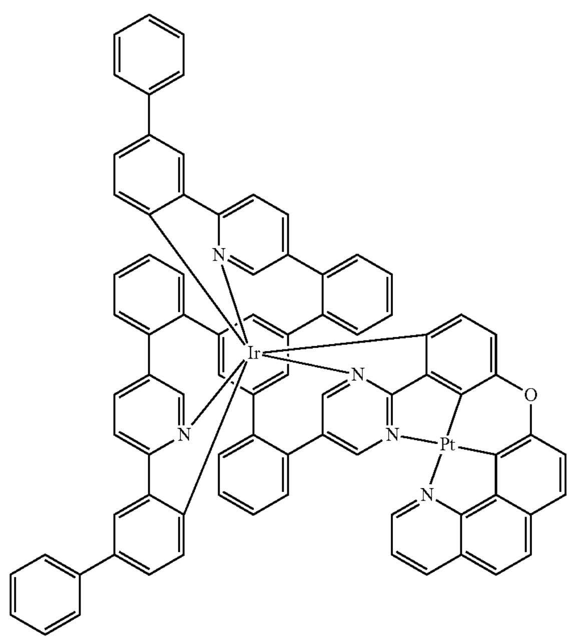 | 61% |

-continued
| Ex. | Reactant | Product | Yield |
|---|---|---|---|
| IrPt(L3A) | Ir(L3A) | 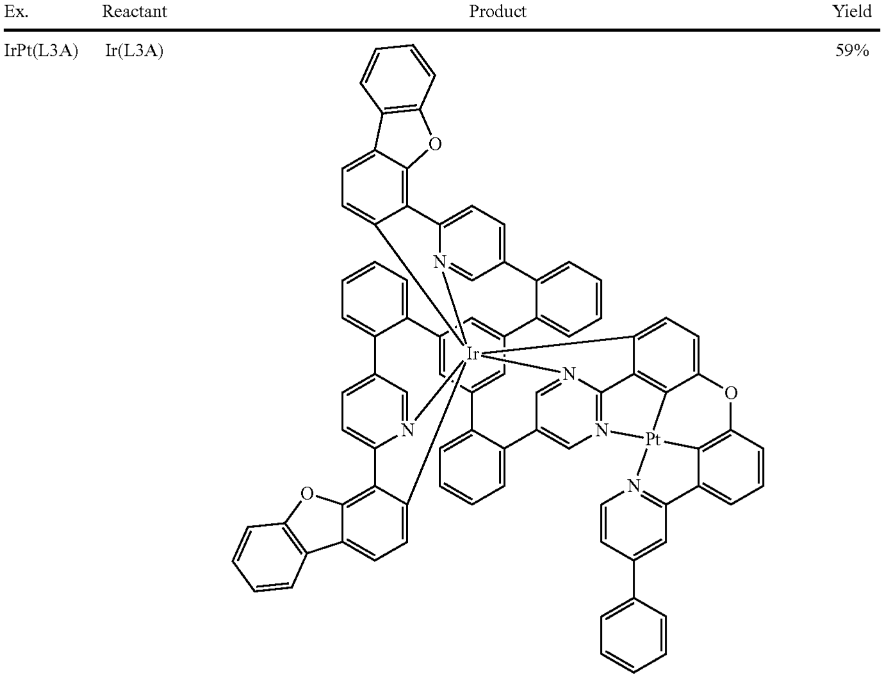 | 59% |
| IrPt(L4A) | Ir(L4A) | 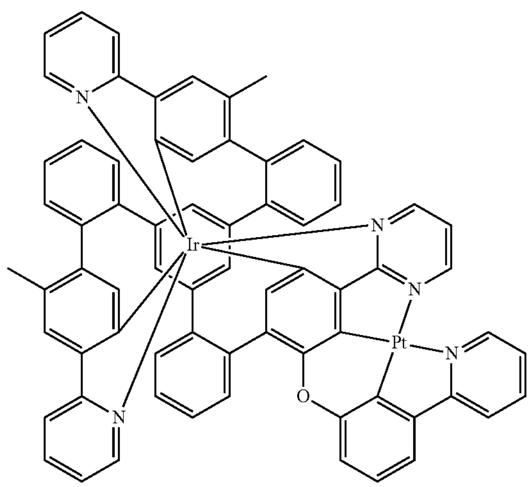 | 60% |
| IrPt(L5A) | Ir(L5A) | 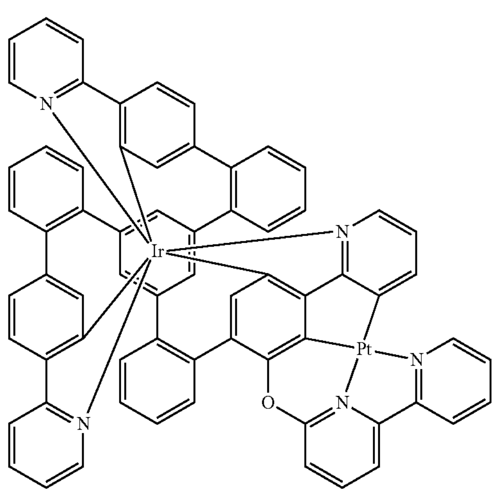 | 48% |

-continued
| Ex. | Reactant | Product | Yield |
|---|---|---|---|
| IrPt(L5B) | Ir(L5B) | 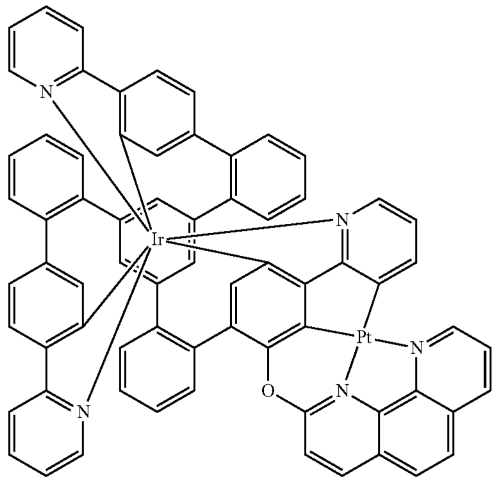 | 45% |
| IrPt(L6A) | Ir(L6A) | 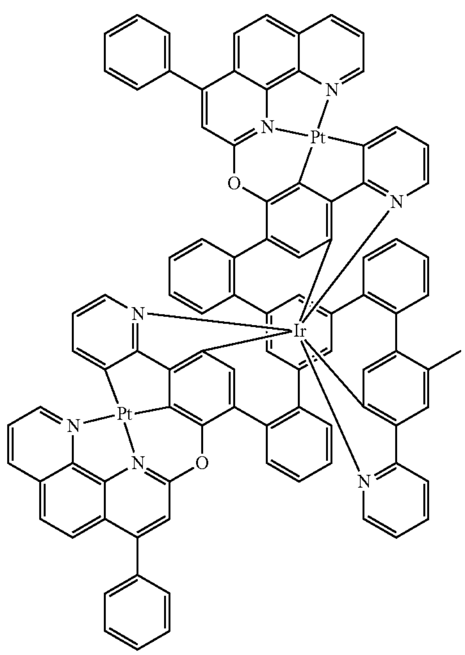 | 31% |

-continued
| Ex. | Reactant | Product | Yield |
| --- | --- | --- | --- |
| IrPt(L7A) | Ir(L7A) | 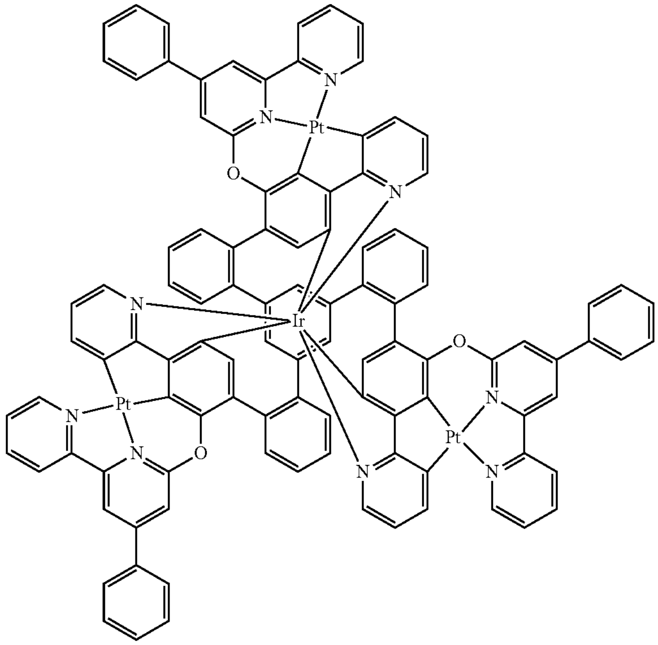 | 22% |
| IrPt(L8A) | Ir(L8A) | 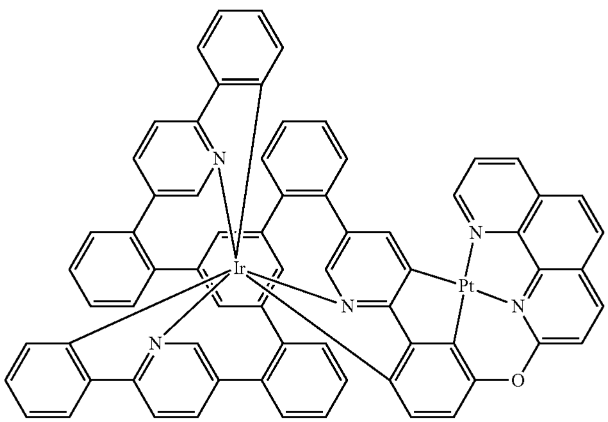 | 51$ |
| IrPt(L1F) | Ir(L1F) | 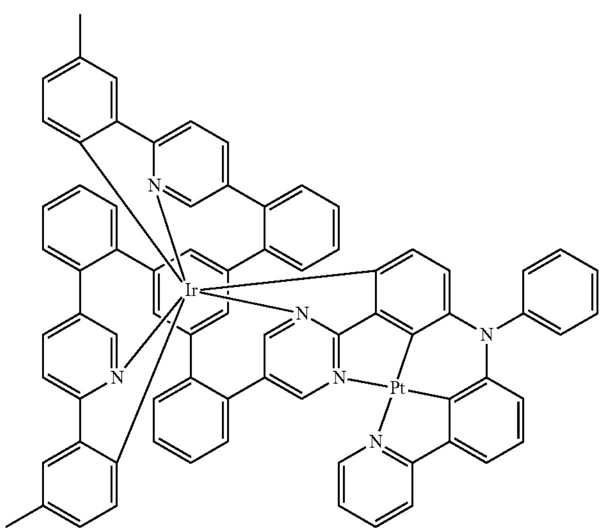 | 61% |

-continued
| Ex. | Reactant | Product | Yield |
| --- | --- | --- | --- |
| IrPt(L1G) | Ir(L1G) | 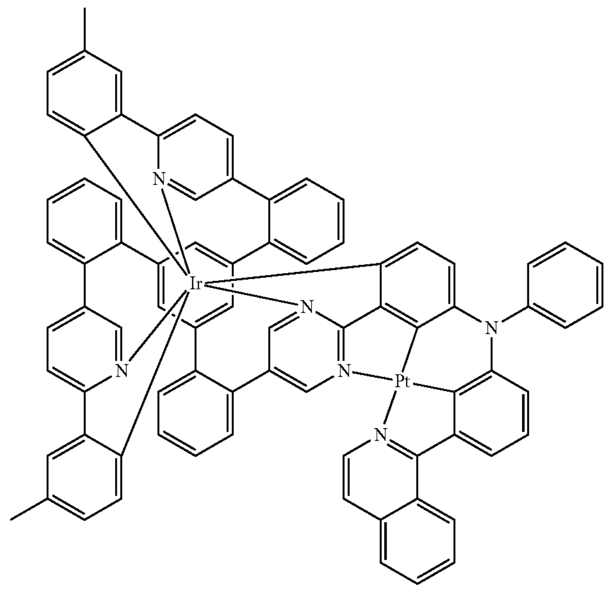 | 57% |
| IrPt(L1H) | Ir(L1H) | 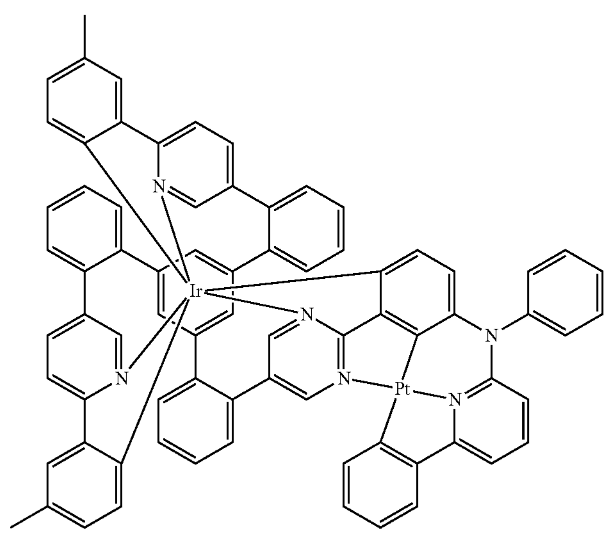 | 54% |

-continued

| Ex. | Reactant | Product | Yield |
|---|---|---|---|
| IrPt(L4B) | Ir(L4B) | 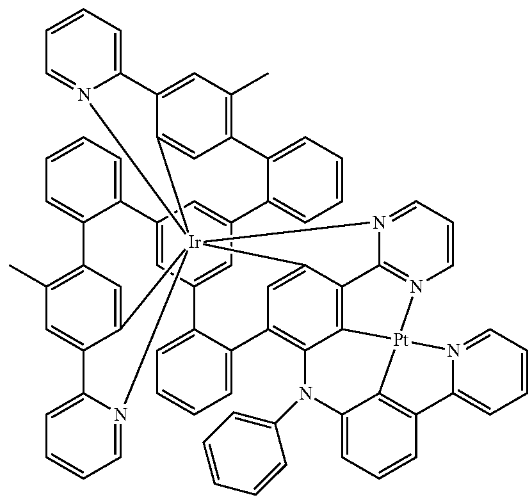 | 41% |

Example: Production of the OLEDs

1) Vacuum-Processed Devices:

OLEDs of the invention and OLEDs according to the prior art are produced by a general method according to WO 2004/058911, which is adapted to the circumstances described here (variation in layer thickness, materials used).

In the examples which follow, the results for various OLEDs are presented. Cleaned glass plaques (cleaning in Miele laboratory glass washer, Merck Extran detergent) coated with structured ITO (indium tin oxide) of thickness 50 nm are pretreated with UV ozone for 25 minutes (PR-100 UV ozone generator from UVP) and, within 30 min, for improved processing, coated with 20 nm of PEDOT:PSS (poly(3,4-ethylenedioxythiophene) poly(styrenesulfonate), purchased as CLEVIOS™ P VP AI 4083 from Heraeus Precious Metals GmbH Deutschland, spun on from aqueous solution) and then baked at 180° C. for 10 min. These coated glass plaques form the substrates to which the OLEDs are applied. The OLEDs basically have the following layer structure: substrate/hole injection layer 1 (HIL1) consisting of HTM1 doped with 5% NDP-9 (commercially available from Novaled), 20 nm/hole transport layer 1 (HTL1) consisting of HTM1, 150 nm/hole transport layer 2 (HTL2)/emission layer (EML)/hole blocker layer (HBL)/electron transport layer (ETL)/optional electron injection layer (EIL) and finally a cathode. The cathode is formed by an aluminium layer of thickness 100 nm.

First of all, vacuum-processed OLEDs are described. For this purpose, all the materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as M1:M2:IrPt(L) (55%:35%:10%) mean here that the material M1 is present in the layer in a proportion by volume of 55%, M2 in a proportion by volume of 35% and IrPt(L) in a proportion by volume of 10%. Analogously, the electron transport layer may also consist of a mixture of two materials. The exact structure of the OLEDs can be found in Table 1. The materials used for production of the OLEDs are shown in Table 4.

The OLEDs are characterized in a standard manner. For this purpose, the electroluminescence spectra, the current efficiency (measured in cd/A), the power efficiency (measured in lm/W) and the external quantum efficiency (EQE, measured in percent) as a function of luminance, calculated from current-voltage-luminance characteristics (IUL characteristics) assuming Lambertian radiation characteristics, and also the lifetime are determined. The electroluminescence spectra are measured at a luminance of 1000 cd/m$^2$.

Use of Compounds of the Invention as Emitter Materials in Phosphorescent OLEDs

One use of the compounds of the invention is as phosphorescent emitter materials in the emission layer in OLEDs. The materials used are shown in table 4. The results for the OLEDs that have not yet been fully optimized are summarized in Table 2.

TABLE 1

Structure of the OLEDs

| Ex. | HTL2 thickness | EML thickness | HBL thickness | ETL thickness |
|---|---|---|---|---|
| D1 | HTM2 10 nm | M1:IrPt(L1A) (95%:5%) 40 nm | ETM1 10 nm | ETM1:ETM2 (50%:50%) 60 nm |
| D2 | HTM2 10 nm | M1:M2:IrPt(L1A) (75%:20%:5%) 40 nm | ETM1 10 nm | ETM1:ETM2 (50%:50%) 60 nm |
| D3 | HTM2 10 nm | M1:IrPt(L1C) (95%:5%) 40 nm | ETM1 10 nm | ETM1:ETM2 (50%:50%) 60 nm |
| D4 | HTM2 10 nm | M1:IrPt(L1E) (95%:5%) 40 nm | ETM1 10 nm | ETM1:ETM2 (50%:50%) 60 nm |
| D5 | HTM2 10 nm | M1:IrPt(L4A) (95%:5%) 40 nm | ETM1 10 nm | ETM1:ETM2 (50%:50%) 60 nm |
| D6 | HTM2 10 nm | M1:IrPt(L5B) (95%:5%) 40 nm | ETM1 10 nm | ETM1:ETM2 (50%:50%) 60 nm |
| D7 | HTM2 10 nm | M1:IrPt(L8A) (90%:10%) 40 nm | ETM1 10 nm | ETM1:ETM2 (50%:50%) 60 nm |

TABLE 1-continued

| Structure of the OLEDs | | | | |
|---|---|---|---|---|
| Ex. | HTL2 thickness | EML thickness | HBL thickness | ETL thickness |
| D8 | HTM2 10 nm | M1:IrPt(L1G) (93%:7%) 40 nm | ETM1 10 nm | ETM1:ETM2 (50%:50%) 60 nm |

TABLE 2

| Results for the vacuum-processed OLEDs | | | | |
|---|---|---|---|---|
| Ex. | Voltage [V] @ 10 mA/cm$^2$ | EQE (%) @ 10 mA/cm$^2$ | Emission maximum [nm] | Visible residual emission* |
| D1 | 4.9 | 3.8 | >700 nm | weak |
| D2 | 4.5 | 3.7 | >700 nm | weak |
| D3 | 4.8 | 2.1 | >850 nm | none |
| D4 | 5.1 | 3.2 | >800 nm | none |
| D5 | 5.2 | 3.3 | >700 nm | weak |
| D6 | 4.7 | 2.8 | >750 nm | none |
| D7 | 4.8 | 2.3 | >800 nm | none |
| D8 | 4.6 | 1.7 | >850 nm | none |

*in darkness after adaptation

Solution-Processed Devices:

A: From Soluble Functional Materials of Low Molecular Weight

The iridium complexes of the invention may also be processed from solution and in that case lead to OLEDs which are much simpler in terms of process technology compared to the vacuum-processed OLEDs, but nevertheless have good properties. The production of such components is based on the production of polymeric light-emitting diodes (PLEDs), which has already been described many times in the literature (for example in WO 2004/037887). The structure is composed of substrate/ITO/hole injection layer (130 nm)/interlayer (20 nm)/emission layer (60 nm)/hole blocker layer (10 nm)/electron transport layer (50 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in a cleanroom, a 20 nm hole injection layer is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport; in this case, HL-X from Merck is used. The interlayer may alternatively also be replaced by one or more layers which merely have to fulfil the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16 and 25 g/l when, as here, the layer thickness of 60 nm which is typical of a device is to be achieved by means of spin-coating. The solution-processed devices of type 1 contain an emission layer composed of M1:M3:M4:IrPtL (20%:30%:30%:20%), and those of type 2 contain an emission layer composed of M3:M4:Ir-Red:IrPtL (30%:34%:28%:8%). The emission layer is spun on in an inert gas atmosphere, argon in the present case, and baked at 160° C. for 10 min. Vapour-deposited above the latter are the hole blocker layer (10 nm ETM1) and the electron transport layer (50 nm ETM1 (50%)/ETM2 (50%)) (vapour deposition systems from Lesker or the like, typical vapour deposition pressure $5\times10^{-6}$ mbar). Finally, a cathode of aluminium (100 nm) (high-purity metal from Aldrich) is applied by vapour deposition. In order to protect the device from air and air humidity, the device is finally encapsulated and then characterized. The OLED examples cited are yet to be optimized; Table 3 summarizes the data obtained.

TABLE 3

| Results with materials processed from solution | | | | | |
|---|---|---|---|---|---|
| Ex. | Emitter Device | Voltage [V] @ 10 mA/cm$^2$ | EQE (%) @ 10 mA/cm$^2$ | Emission maximum [nm] | Visible residual emission* |
| DS1 | IrPt(L1B) Typ1 | 5.8 | 2.1 | >700 | weak |
| DS2 | IrPt(L1B) Typ2 | 5.5 | 3.6 | >700 | weak |
| DS3 | IrPt(L2A) Typ2 | 5.8 | 2.0 | >850 | none |
| DS4 | IrPt(L3A) Typ2 | 5.7 | 3.1 | >750 | weak |
| DS5 | IrPt(L6A) Typ2 | 5.5 | 2.0 | >900 | none |
| DS6 | IrPt(L7A) Typ2 | 5.5 | 1.9 | >850 | none |
| DS7 | IrPt(L1G) Typ2 | 5.3 | 1.1 | >900 | none |

*in darkness after adaptation

TABLE 4

Structural formulae of the materials used

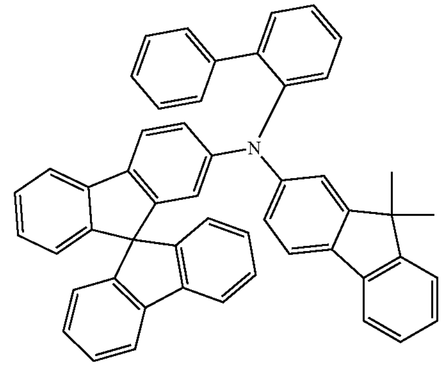 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

HTM1
[136463-07-5]

TABLE 4-continued
| Structural formulae of the materials used |
| --- |
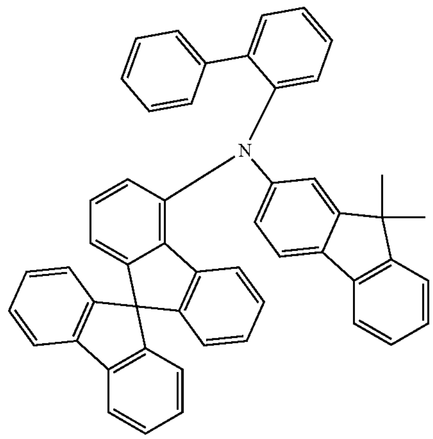 [SMILES: CC1(C)c2ccccc2-c2ccc(N(c3ccccc3-c3ccccc3)c3cccc4c3-c3ccccc3C43c4ccccc4-c4ccccc43)cc21]
HTM2
[1450933-44-4]
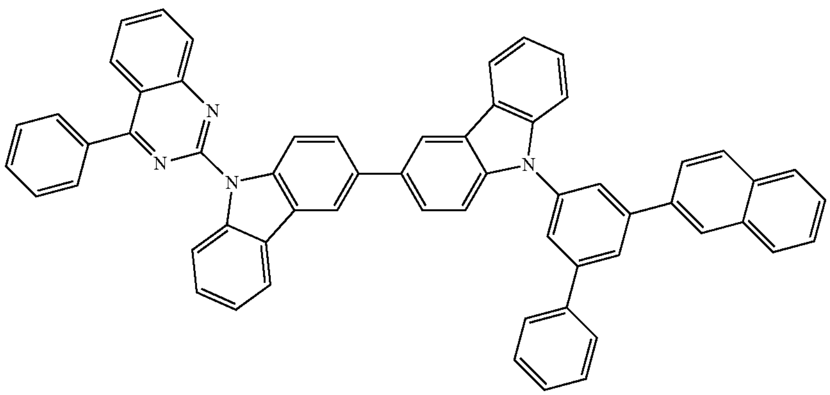 [SMILES: c1ccc(-c2cc(-c3ccc4ccccc4c3)cc(-n3c4ccccc4c4cc(-c5ccc6c(c5)c5ccccc5n6-c5nc(-c6ccccc6)c6ccccc6n5)ccc43)c2)cc1]
M1
1398399-68-2
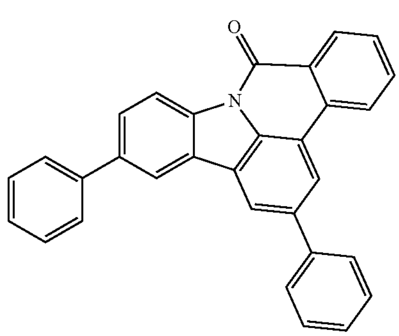 [SMILES: O=c1c2ccccc2c2cc(-c3ccccc3)cc3c4cc(-c5ccccc5)ccc4n1c23]
M2
1915695-76-5

TABLE 4-continued
| Structural formulae of the materials used |
|---|
| 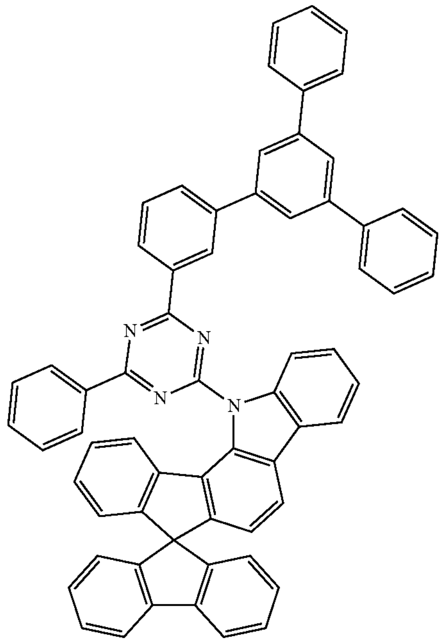 [SMILES: c1ccc(-c2cc(-c3ccccc3)cc(-c3cccc(-c4nc(-c5ccccc5)nc(-n5c6ccccc6c6ccc7c(c65)-c5ccccc5C75c6ccccc6-c6ccccc65)n4)c3)c2)cc1]<br>M3<br>1616231-60-7 |
| 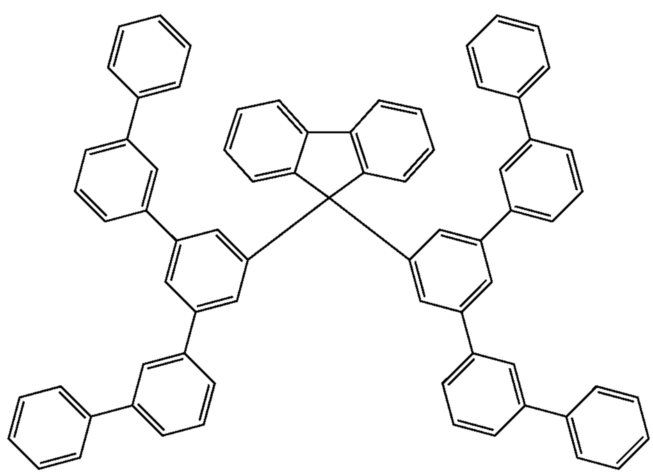 [SMILES: c1ccc(-c2cccc(-c3cc(-c4cccc(-c5ccccc5)c4)cc(C4(c5cc(-c6cccc(-c7ccccc7)c6)cc(-c6cccc(-c7ccccc7)c6)c5)c5ccccc5-c5ccccc54)c3)c2)cc1]<br>M4<br>1246496-85-4 |

TABLE 4-continued
| Structural formulae of the materials used |
|---|
| 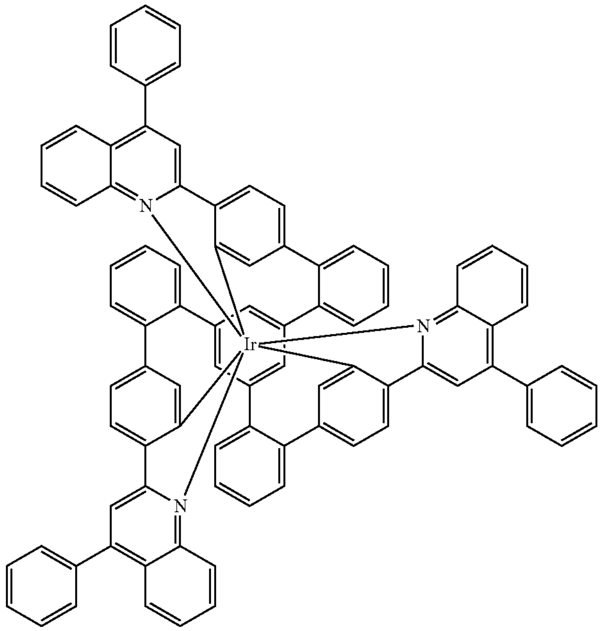 Ir-Red [1989605-98-2] |
| 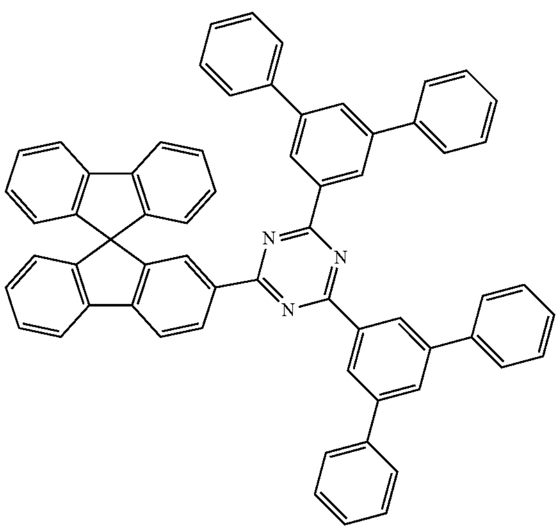 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1] ETM1 = M10 [1233200-52-6] |
| 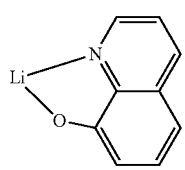 ETM2 [25387-93-3] |

The invention claimed is:

1. A compound of formula (1)

formula (1)

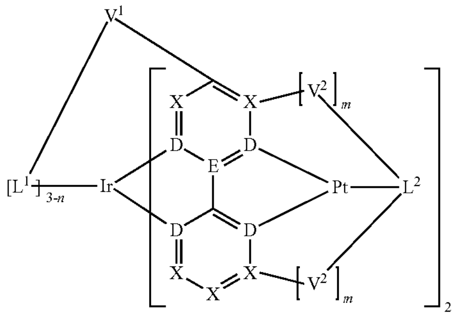

where the symbols and indices used are as follows:

D is the same or different at each instance and is C or N;

X is the same or different at each instance and is CR or N;

$L^1$, $L^2$ is the same or different at each instance and is a bidentate sub-ligand;

$V^1$ is a trivalent group that joins the central sub-ligand(s), according to the choice of n, to one another and to $L^1$;

$V^2$ is a bivalent group or a single bond that joins the central sub-ligand and $L^2$ to one another;

n is 1, 2 or 3;

m is the same or different at each instance and is 0 or 1, where, when m=1, the atom X to which the corresponding $V^2$ group is bonded is C, with the proviso that at least one m=1;

R is the same or different at each instance and is H, D, F, Cl, Br, I, $N(R^1)_2$, CN, $NO_2$, $OR^1$, $SR^1$, $COOR^1$, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals, where one or more nonadjacent $CH_2$ groups may be replaced by $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, CN, $NO_2$, $OR^2$, $SR^2$, $Si(R^2)_3$, $B(OR^2)_2$, $COOR^2$, $C(=O)R^2$, $P(=O)(R^2)_2$, $S(=O)R^2$, $S(=O)_2R^2$, $OSO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals, where one or more nonadjacent $CH_2$ groups may be replaced by $Si(R^2)_2$, C=O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic or heteroaromatic organic radical, in which one or more hydrogen atoms may also be replaced by F.

2. The compound according to claim 1, wherein in the compound is of the formula (1')

formula (1')

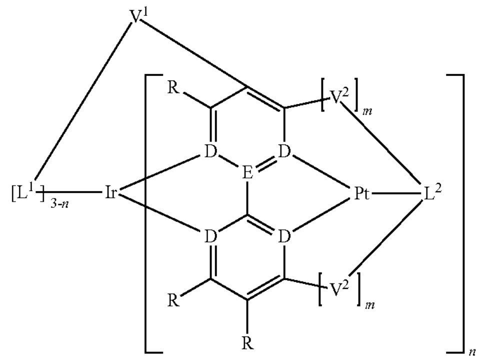

where, when m=0, an R radical is bonded to the carbon atom to which the corresponding $V^2$ would have been bonded, the R radicals in the ortho position to D are the same or different at each instance and are selected from the group consisting of H, D, F, $CH_3$ and $CD_3$, and the other symbols and indices used have the definitions detailed in claim 1.

3. The compound according to claim 1, wherein the compound is of one of the formulae (1a-1) to (1f-1)

formula (1a-1)

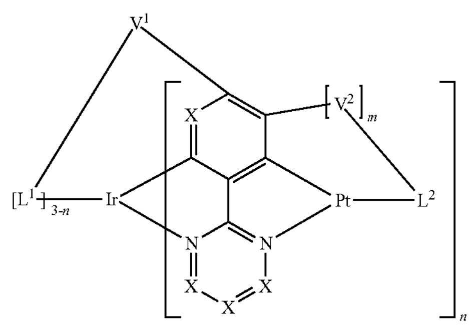

formula (1b-1)

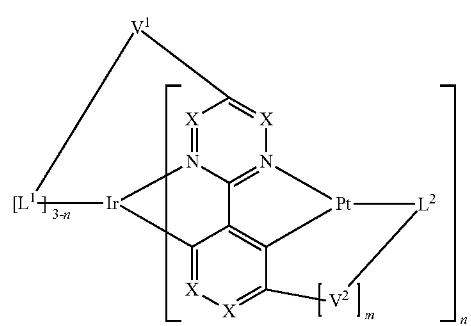

-continued
formula (1c-1)
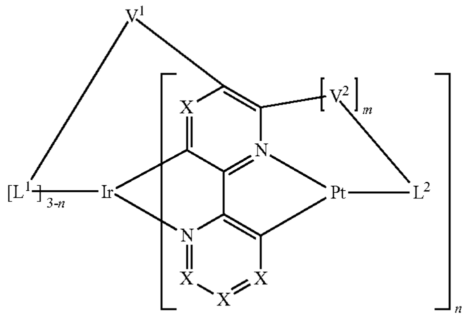
formula (1d-1)
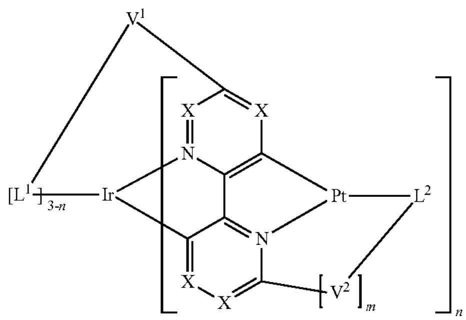
formula (1e-1)
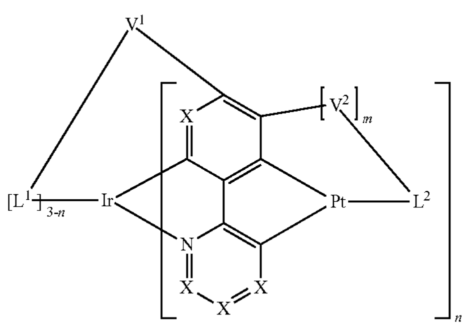
formula (1f-1)
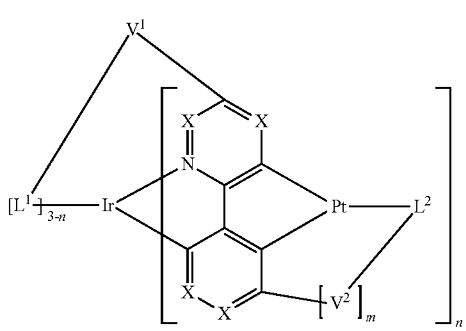
where symbols and indices used have the definitions given in claim 1.
4. The compound according to claim 1, wherein the compound is of one of the formulae (1a-3) to (1f-3)
formula (1a-3)
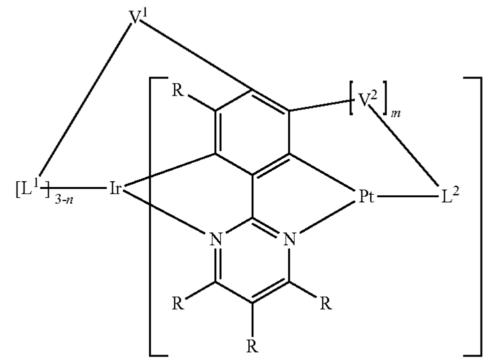
formula (1b-3)
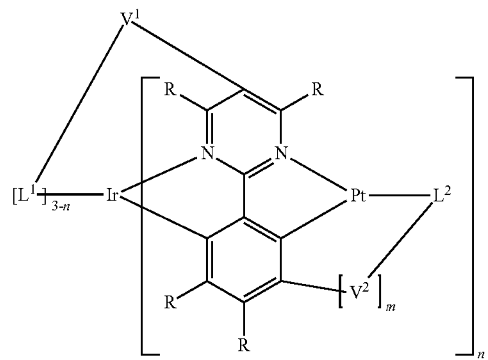
formula (1c-3)
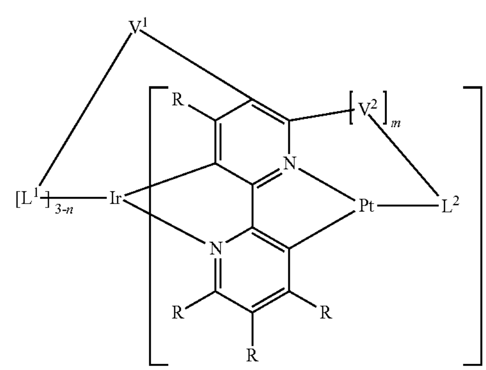
formula (1d-3)
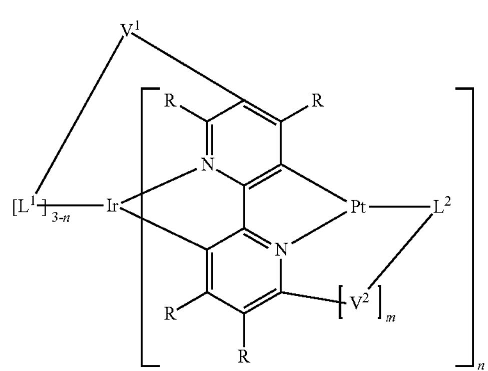

-continued formula (1e-3)

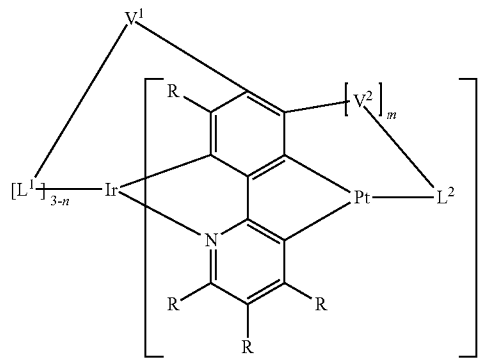

formula (1f-3)

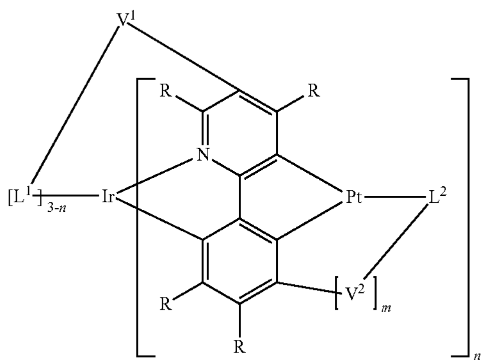

where the symbols and indices used have the definitions given in claim 1 and the R radicals in the ortho position to the coordination to the metal are the same or different at each instance and are selected from the group consisting of H, D, F, $CH_3$ and $CD_3$.

5. The compound according to claim 1, characterized in that $V^1$ is selected from the groups of the formulae (2) and (3)

formula (2)

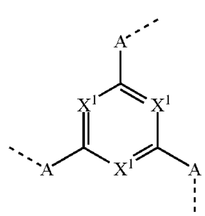

formula (3)

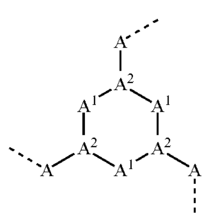

where the dotted bonds represent the bonds to the central sub-ligand or to the sub-ligand(s) $L^1$, R has the definitions given in claim 1 and the other symbols used are as follows:

A is the same or different at each instance and is —CR═CR—, —C(═O)—NR'—, —C(═O)—O—, —$CR_2$—$CR_2$—, —$CR_2$—O— or a group of the following formula (4):

formula (4)

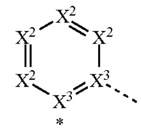

where the dotted bond represents the position of the bond of the central sub-ligand or of a sub-ligand $L^1$ to this structure and * represents the position of the linkage of the unit of the formula (4) to the central cyclic group, i.e. the group explicitly included in formula (2) or (3);

$X^1$ is the same or different at each instance and is CR or N;

$X^2$ is the same or different at each instance and is CR or N, or two adjacent $X^2$ groups together are NR, O or S, thus forming a five-membered ring, and the remaining $X^2$ are the same or different at each instance and are CR or N; or two adjacent $X^2$ groups together are CR or N when one of the $X^3$ groups in the cycle is N, thus forming a five-membered ring; with the proviso that not more than two adjacent $X^2$ groups are N;

$X^3$ is C at each instance or one $X^3$ group is N and the other $X^3$ groups in the same cycle are C; with the proviso that two adjacent $X^2$ groups together are CR or N when one of the $X^3$ groups in the cycle is N;

$A^1$ is the same or different at each instance and is $C(R)_2$ or O;

$A^2$ is the same or different at each instance and is CR, P(═O), B or SiR, with the proviso that, when $A^2$=P(═O), B or SiR, the symbol $A^1$ is O and the symbol A bonded to this $A^2$ is not —C(═O)—NR'— or —C(═O)—O—;

R' is the same or different at each instance and is H, D, a straight-chain alkyl group having 1 to 20 carbon atoms or a branched or cyclic alkyl group having 3 to 20 carbon atoms, where the alkyl group in each case may be substituted by one or more $R^1$ radicals and where one or more nonadjacent $CH_2$ groups may be replaced by $Si(R^1)_2$, or an aromatic or heteroaromatic ring system which has 5 to 40 aromatic ring atoms and may be substituted in each case by one or more $R^1$ radicals.

6. The compound according to claim 5, characterized in that the group of the formula (2) is selected from the structure of the formula (5') and the group of the formula (3) is selected from the structures of the formula (9') or (9") formula (5') formula (9') formula (9")

formula (5′)

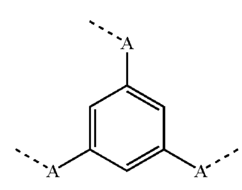

formula (9′)

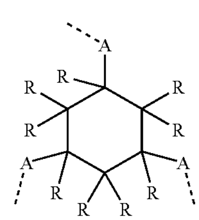

-continued formula (9″)

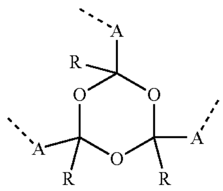

where the symbols have the definitions given in claims 1 and 5.

7. The compound according to claim 5, characterized in that the groups of the formula (4) are the same or different at each instance and are selected from the structures of the formulae (14) to (38):

formula (14)

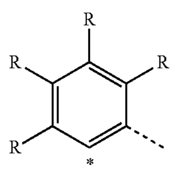

formula (15)

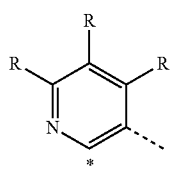

formula (16)

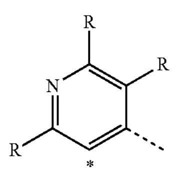

formula (17)

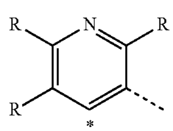

formula (18)

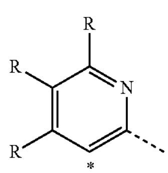

formula (19)

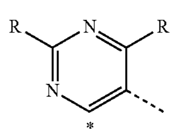

formula (20)

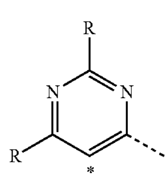

-continued formula (21)

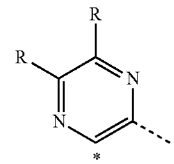

formula (22)

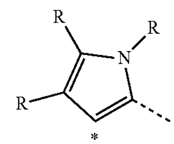

formula (23)

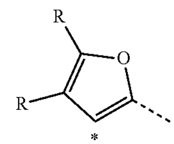

formula (24)

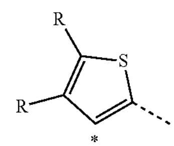

formula (25)

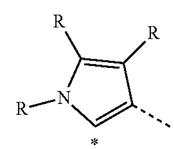

formula (26)

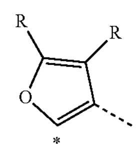

formula (27)

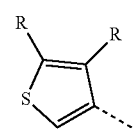

formula (28)

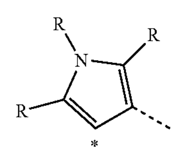

formula (29)

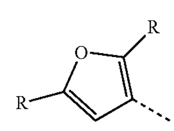

formula (30)

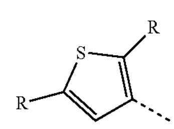

-continued formula (31)

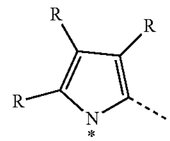

formula (32)

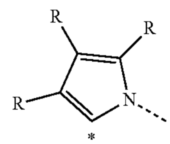

formula (33)

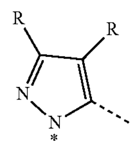

formula (34)

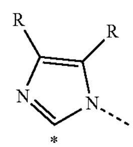

formula (35)

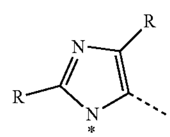

formula (36)

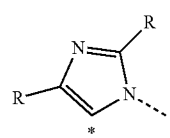

formula (37)

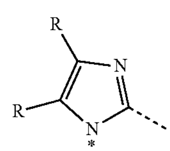

formula (38)

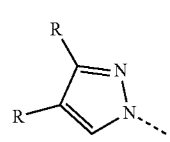

where the symbols have the definitions given in claims 1 and 5.

8. The compound according to claim 5, characterized in that the group of the formula (2) is selected from the structures of the formula (5a"):

formula (5a″)

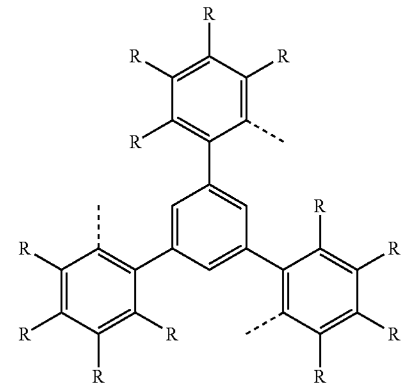

where the symbols have the definitions given in claims 1 and 5.

9. The compound according to claim 1, characterized in that $V^1$ are a structure of formula ($V^1$-a)

formula ($V^1$-a)

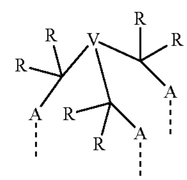

where R and A have the definitions given in claims 1 and 5 and V is CR, N, SiR, P or P═O.

10. The compound according to claim 1, characterized in that $V^2$ is selected from the group consisting of $CR_2$, NR, O, S, Se, —$CR_2$—$CR_2$—, —$CR_2$—O—, —CR═CR— or an ortho-bonded arylene or heteroarylene group which has 5 or 6 aromatic ring atoms and may be substituted by one or more R radicals.

11. The compound according to claim 1, characterized in that one or both of sub-ligands $L^1$ and/or sub-ligand $L^2$ are the same or different at each instance and are selected from the structures of the formulae (L-1), (L-2) and (L-3)

formula (L-1)

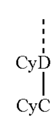

formula (L-2)

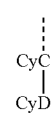

formula (L-3)

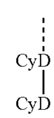

where the dotted bond represents the bond of the sub-ligand $L^1$ to $V^1$ or the bond of the sub-ligand $L^2$ to $V^2$ and the other symbols are as follows:

CyC is the same or different at each instance and is a substituted or unsubstituted aryl or heteroaryl group which has 5 to 14 aromatic ring atoms and coordinates to M via a carbon atom and is bonded to CyD via a covalent bond;

CyD is the same or different at each instance and is a substituted or unsubstituted heteroaryl group which has 5 to 14 aromatic ring atoms and coordinates to M via a nitrogen atom or via a carbene carbon atom and is bonded to CyC via a covalent bond;

at the same time, two or more of the optional substituents together may form a ring system.

12. The compound according to claim 1, characterized in that one or more of sub-ligands $L^1$ and/or $L^2$ are the same or different at each instance and have a structure of the formula (L-1-1), (L-1-2) or (L-2-1) to (L-2-3)

(L-1-1)

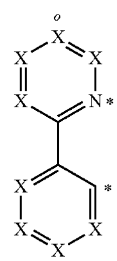

(L-1-2)

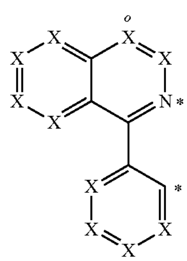

(L-2-1)

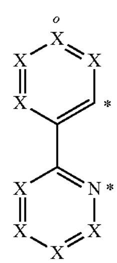

(L-2-2)

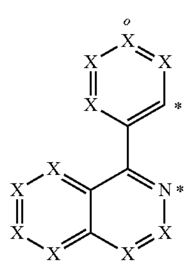

-continued (L-2-3)

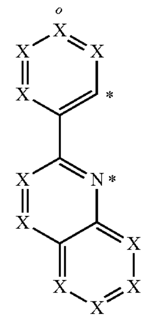

where the symbols have the definitions given in claim 1, * indicates the position of coordination to the Ir or the Pt and "o" represents the position of the bond to $V^1$ if the structures are an embodiment of $L^1$; if the structures are an embodiment of $L^2$, $V^2$ is bonded in a position ortho to the coordination to the Pt; at the same time, the symbol X to which $V^1$ or $V^2$ is bonded is C.

13. A process for preparing a compound according to claim 1, characterized by the following process steps:

a) synthesis of a hexadentate ligand that does not yet contain the $L^2$-$V^2$ group;

b) synthesis of an Ir complex from the hexadentate ligand;

c) functionalization of the Ir complex;

d) introduction of the $L^2$-$V^2$ group by a coupling reaction; and e) synthesis of the Pt complex.

14. A formulation comprising at least one compound according to claim 1 and at least one further compound wherein the at least one further compound is an organic compound, an inorganic compound, a polymeric compound, a solvent or mixture of solvents.

15. An electronic device comprising at least one compound according to claim 1.

16. The electronic device according to claim 15 which is an organic electroluminescent device, characterized in that the compound is used as emitting compound in one or more emitting layers.

17. A formulation comprising at least one compound according to claim 1 and at least one solvent or a matrix material.

18. An oxygen sensitizer comprising at least one compound according to claim 1.

19. A photocatalyst comprising at least one compound according to claim 1.

* * * * *

UNITED STATES PATENT AND TRADEMARK OFFICE

CERTIFICATE OF CORRECTION

PATENT NO. : 11,917,903 B2
APPLICATION NO. : 16/982089
DATED : February 27, 2024
INVENTOR(S) : Philipp Stoessel, Christian Ehrenreich and Armin Auch It is certified that error appears in the above-identified patent and that said Letters Patent is hereby corrected as shown below:

In the Claims

Claim 1 at Column 431, Line 5 - Line 18, should read as follows:

formula (1)

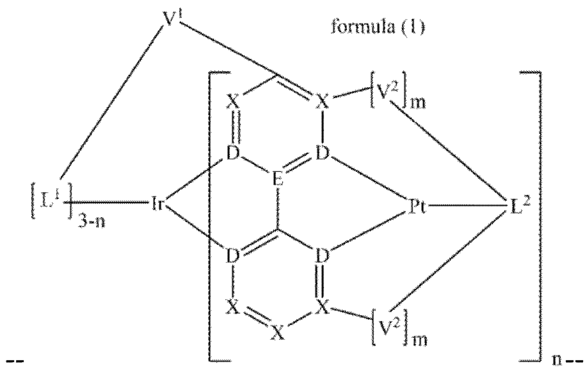

Claim 4 at Column 434, Line 1 - Line 17, should read as follows:

formula (1a-3)

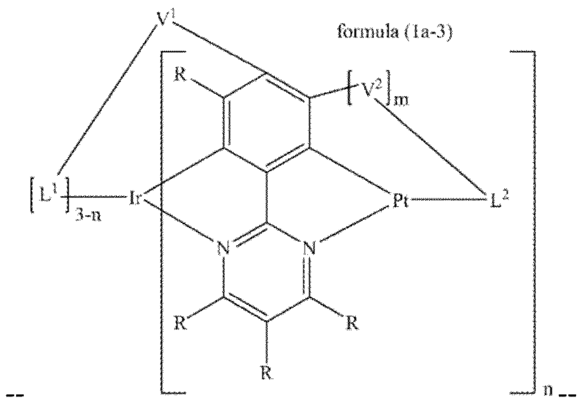

Signed and Sealed this
Eighteenth Day of June, 2024

Katherine Kelly Vidal

Katherine Kelly Vidal
*Director of the United States Patent and Trademark Office*

Claim 4 at Column 434, Line 33 - Line 49, should read as follows:
-- 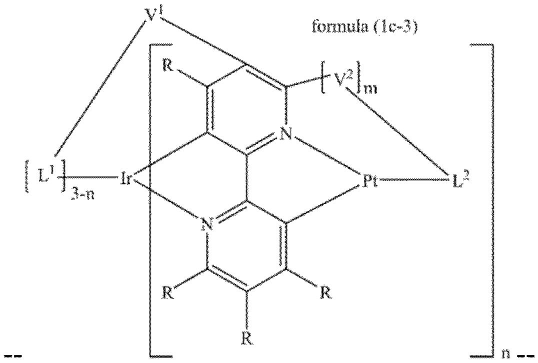 --
formula (1c-3)
Claim 4 at Column 435, Line 1 - Line 16, should read as follows:
-- 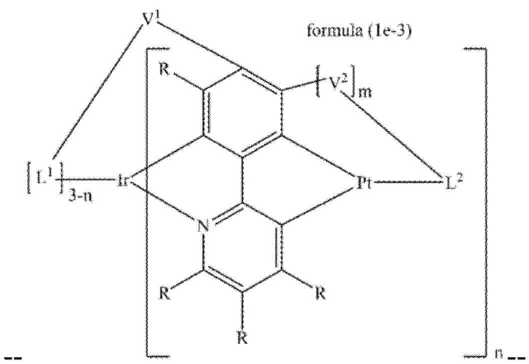 --
formula (1e-3)